United States Patent
Yamanaka et al.

(10) Patent No.: US 9,885,956 B2
(45) Date of Patent: Feb. 6, 2018

(54) PATTERN FORMING METHOD, AND, ELECTRONIC DEVICE PRODUCING METHOD AND ELECTRONIC DEVICE, EACH USING THE SAME

(71) Applicant: FUJIFILM Corporation, Minato-ku, Tokyo (JP)

(72) Inventors: Tsukasa Yamanaka, Haibara-gun (JP); Naoya Iguchi, Haibara-gun (JP); Ryosuke Ueba, Haibara-gun (JP); Kei Yamamoto, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/606,161

(22) Filed: Jan. 27, 2015

(65) Prior Publication Data

US 2015/0140482 A1  May 21, 2015

Related U.S. Application Data

(63) Continuation of application No. PCT/JP2013/072634, filed on Aug. 19, 2013.

(60) Provisional application No. 61/694,894, filed on Aug. 30, 2012.

(30) Foreign Application Priority Data

Aug. 30, 2012 (JP) .................................. 2012-190184

(51) Int. Cl.
| | |
|---|---|
| G03F 7/004 | (2006.01) |
| G03F 7/20 | (2006.01) |
| G03F 7/00 | (2006.01) |
| G03F 7/039 | (2006.01) |
| G03F 7/11 | (2006.01) |
| G03F 7/32 | (2006.01) |

(52) U.S. Cl.
CPC .......... *G03F 7/2022* (2013.01); *G03F 7/0035* (2013.01); *G03F 7/0392* (2013.01); *G03F 7/0397* (2013.01); *G03F 7/11* (2013.01); *G03F 7/2041* (2013.01); *G03F 7/325* (2013.01); *G03F 7/70466* (2013.01)

(58) Field of Classification Search
CPC ... G03F 7/0035; G03F 7/70466; G03F 7/2022
USPC ........................................ 430/312, 325, 394
See application file for complete search history.

(56) References Cited

U.S. PATENT DOCUMENTS

| | | | | |
|---|---|---|---|---|
| 4,743,529 A | * | 5/1988 | Farid .................... | C07D 311/16 430/281.1 |
| 8,927,200 B2 | | 1/2015 | Meya et al. | |
| 9,023,577 B2 | * | 5/2015 | Takeshita .............. | G03F 7/0048 430/270.1 |
| 2010/0068650 A1 | * | 3/2010 | Nishimura ............ | G03F 7/0035 430/280.1 |
| 2010/0209849 A1 | * | 8/2010 | Watanabe ............. | G03F 7/0035 430/285.1 |
| 2011/0223544 A1 | * | 9/2011 | Yada ..................... | G03F 7/0035 430/324 |
| 2012/0315449 A1 | | 12/2012 | Tsubaki et al. | |
| 2014/0080066 A1 | | 3/2014 | Meya et al. | |

FOREIGN PATENT DOCUMENTS

| | | |
|---|---|---|
| JP | 2009-282224 A | 12/2009 |
| JP | 4554665 B2 | 9/2010 |
| JP | 2012-53307 A | 3/2012 |
| KR | 10-2014-0018955 A | 2/2014 |
| WO | 2011/122336 A1 | 10/2011 |
| WO | 2012/157433 A1 | 11/2012 |

OTHER PUBLICATIONS

Takeaki Ebihara et al., "Beyond $k_1$=0.25 lithography: 70nm L/S patterning using KrF scanners", Proceedings of SPIE, 2003, 23rd Annual BACUS Symposium on Photomask Technology, pp. 985-994, vol. 5256.
Yan Borodovsky, "Marching to the beat of Moore's Law", Proceedings of SPIE, 2006, Advances in Resist Technology and Processing XXIII, pp. 615301-1-615301-19, vol. 6153.
International Search Report for PCT/JP2013/072634 dated Sep. 17, 2013, 2 pages.
Written Opinion for PCT/JP2013/072634 dated Sep. 17, 2013, 5 pages.
Notice of Reasons for Rejection, mailed Aug. 18, 2015, issued in corresponding JP Application No. 2012-190184, 12 pages in English and Japanese.
Office Action dated Jan. 19, 2016 in Japanese Application No. 2012-190184.
Office Action dated May 20, 2016 from Korean Intellectual Property Office in counterpart Korean Application No. 10-2014-7036506.
English Translation of an Office Action dated Dec. 15, 2016 from the Intellectual Property Office of Taiwan in corresponding application No. 102130954.
Extended European Search Report dated Feb. 2, 2017 in counterpart European Application No. 13832915.6.

* cited by examiner

*Primary Examiner* — John S Chu
(74) *Attorney, Agent, or Firm* — Sughrue Mion, PLLC

(57) ABSTRACT

A pattern forming method includes: (a) forming a first film on a substrate using an actinic ray-sensitive or radiation-sensitive resin composition (I) containing a resin of which solubility in a developer containing an organic solvent decreases due to polarity increased by an action of an acid; (b) exposing the first film; (c) developing the exposed first film using a developer containing an organic solvent to form a first negative pattern; (e) forming a second film on the substrate using an actinic ray-sensitive or radiation-sensitive resin composition (II) containing a resin of which solubility in a developer containing an organic solvent decreases due to polarity increased by an action of an acid; (f) exposing the second film; and (g) developing the exposed second film using a developer containing an organic solvent to form a second negative pattern in this order.

10 Claims, 3 Drawing Sheets

PATTERN FORMING METHOD, AND, ELECTRONIC DEVICE PRODUCING METHOD AND ELECTRONIC DEVICE, EACH USING THE SAME

CROSS-REFERENCE TO RELATED APPLICATIONS

This application is a Continuation of PCT International Application No. PCT/JP2013/072634, filed on Aug. 19, 2013, which claims priority under 35 U.S.C. § 119(a) to Japanese Patent Application No. 2012-190184, filed on Aug. 30, 2012, and to U.S. provisional application No. 61/694,894, filed on Aug. 30, 2012. Each of the above application(s) is hereby expressly incorporated by reference, in its entirety, into the present application.

BACKGROUND OF THE INVENTION

1. Field of the Invention

The present invention relates to a pattern forming method, and, a method of producing an electronic device and the electronic device, each using the same. More specifically, the present invention relates to a pattern forming process appropriate for a producing process of a semiconductor such as an integrated circuit (IC), a producing process of a circuit board such as a liquid crystal and a thermal head, and further a lithography process of photofabrication in addition to these, and, a method of producing an electronic device and the electronic device, each using the same. Particularly, the present invention relates to a pattern forming method appropriate for an exposure with an argon fluoride (ArF) exposure apparatus of which the light source is a far-ultraviolet light with a wavelength of 300 nm or less and an exposure with an ArF liquid immersion projection exposure apparatus, and, a method of producing an electronic device and the electronic device, each using the same.

2. Description of the Related Art

Currently, at the forefront of forming a pattern, ArF liquid immersion lithography has been used, however, a limit resolution of line:space=1:1, which is reachable by liquid immersion lithography using an NA 1.2 lens is approximately 43 nm.

In recent years, further improvement of the resolution has been required. As one of the newly proposed lithography technology, a double patterning process forming a resist pattern by carrying out two times or more patterning may be exemplified (for example, see Proceedings of SPIE, vol. 5256, p. 985 to 994 (2003) and Proceedings of SPIE, vol. 6153, p. 615301-1 to 615301-19 (2006)).

According to the double patterning process, for example, after patterning is carried out using a first resist composition to form a first resist pattern on a support, it is considered that a resist pattern with higher resolution than the resist pattern formed by one time patterning can be formed on the support on which the first resist pattern is formed by carrying out patterning using a second resist composition.

In the above-described double patterning process, the first resist pattern can be easily affected at the time of patterning using the second resist composition. For this reason, for example, there is a problem in that decrease in line width of the first resist pattern (thinning of the pattern) or film thickness reduction is occurred such that the shape thereof is damaged, therefore, a fine resist pattern with an excellent shape may not be formed.

In order not to damage the shape of the resist pattern, there is a technique of using, for example, a freezing material after the first resist pattern is formed, however, the technique is not preferable from the viewpoint of throughput improvement.

Accordingly, a resist in which a first resist or a second resist is designed for double patterning has been proposed (for example, see JP2009-282224A).

In a positive developing process combining an alkaline developer and a positive chemically amplified resist composition, which is a chemically amplified resist composition of which solubility in the alkaline developer increases by exposure, the exposed portion of a resist film is dissolved by the alkaline developer to be removed, and then a resist pattern is formed. When the positive developing process is compared to a negative developing process combining a negative chemically amplified resist composition and the alkaline developer, there are following advantages: (1) a structure of a photomask can be simplified, (2) a contrast sufficient enough to form an image can be easily obtained, and (3) properties of a pattern to be formed are excellent. For these reasons, there has been a tendency that the positive developing process is used for forming a fine resist pattern.

However, as devices are made finer, a trench pattern (isolated space pattern) or a hole pattern are hard to be formed than a line pattern.

When the trench pattern (isolated space pattern) or the hole pattern is formed using the positive developing process, the pattern is needed to be formed under the condition of weak intensity of incident light, so that the contrast of the intensity of light incident to the exposed portion and the unexposed portion is small, compared to the case in which the line pattern or a dot pattern is formed.

Therefore, the pattern forming ability such as resolution or the like is easily limited, a resist pattern with high resolution tends to be hardly formed. Here, a negative developing process (negative tone imaging process) combining the positive chemically amplified resist composition which is versatile and has priorities in various properties in order to form a trench pattern or the like with high resolution and a developer containing an organic solvent has been proposed (for example, see JP4554665B).

However, in regard to the negative tone imaging process, an optical image used in image formation is a negative image even though the positive chemically amplified resist composition is used as a resist, so that it is considered that the negative tone imaging process is not suitable for forming a line pattern or a dot pattern in which a positive image is favorable.

SUMMARY OF THE INVENTION

In light of the above-described problems, an object of the present invention is to provide a pattern forming method capable of easily forming an ultrafine line and space pattern (for example, a line and space pattern of which the line width and space width are 40 nm or less), a method of producing an electronic device and the electronic device.

The problems of the present invention are to be solved by providing the following configurations.

[1] A pattern forming method including: (a) a process of forming a first film on a substrate using an actinic ray-sensitive or radiation-sensitive resin composition (I) containing a resin of which solubility in a developer containing an organic solvent decreases due to polarity increased by an action of an acid; (b) a process of exposing the first film; (c) a process of developing the exposed first film using a developer containing an organic solvent to form a first negative pattern; (e) a process of forming a second film on the substrate on which the first negative pattern is formed using an actinic ray-sensitive or radiation-sensitive resin composition (II) containing a resin of which solubility in a developer containing an organic solvent decreases due to polarity increased by an action of an acid; (f) a process of exposing the second film; and (g) a process of developing the exposed second film using a developer containing an organic solvent to form a second negative pattern, in this order.

[2] The pattern forming method according to item [1], further including a heating process (d) between the process (c) and the process (e).

[3] The pattern forming method according to item [2], in which the heating temperature of the process (d) is 150° C. or more.

[4] The pattern forming method according to any one of items [1] to [3], in which the film thickness of the second film to be formed by the process (e) is thinner than that of the first film to be formed by the process (a).

[5] The pattern forming method according to any one of items [1] to [4], in which the resin which is contained in the actinic ray-sensitive or radiation-sensitive resin composition (I), of which solubility in the developer containing an organic solvent decreases due to the polarity increased by the action of an acid includes a repeating unit represented by following the general formula (AI),

[Chem. 1]

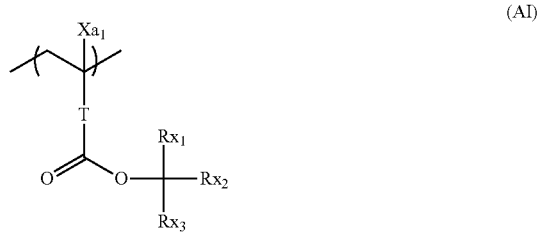

(AI)

In the general formula (AI), $X_{a1}$ represents a hydrogen atom, an alkyl group, a cyano group or a halogen atom.

T represents a single bond or a divalent linking group.

$Rx_1$ to $Rx_3$ each independently represent an alkyl group or a cycloalkyl group.

Two of $Rx_1$ to $Rx_3$ may be bonded to each other to form a ring structure.

[6] The pattern forming method according to item [5], in which $Rx_1$ to $Rx_3$ each independently represent an alkyl group, and two of $Rx_1$ to $Rx_3$ are not bonded to each other to form a ring structure in the general formula (AI).

[7] The pattern forming method according to item [5] or [6], in which the content of the repeating unit represented by the general formula (AI) is 40% by mole or more based on the total content of the repeating units of the resin which is contained in the actinic ray-sensitive or radiation-sensitive resin composition (I), of which solubility in the developer containing an organic solvent decreases due to the polarity increased by the action of an acid.

[8] The pattern forming method according to any one of items [1] to [7], in which the actinic ray-sensitive or radiation-sensitive resin composition (I) and the actinic ray-sensitive or radiation-sensitive resin composition (II) are the same compositions.

[9] A method of producing an electronic device, including the pattern forming method according to any one of items [1] to [8].

[10] An electronic device produced by the method of producing an electronic device according to item [9].

According to the present invention, there can be provided a pattern forming method capable of easily forming an ultrafine line and space pattern (for example, a line and space pattern of which the line width and space width are 40 nm or less), a method of producing an electronic device and the electronic device.

DESCRIPTION OF THE PREFERRED EMBODIMENT

Figure 1A:
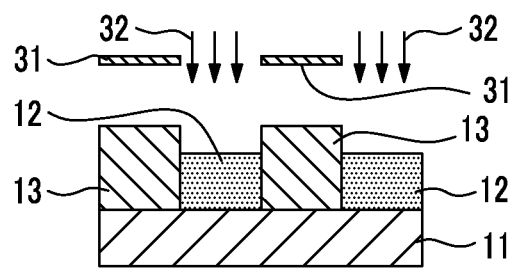
FIGS. 1A to 1C are cross-sectional views schematically describing action effects of the present invention.

Hereinafter, the embodiments of the present invention will be described in detail.

In the notation of a group (an atomic group) in the present specification, a notation in which substituted and unsubstituted are not specified includes not only a group (an atomic group) having no substituents, but also a group (an atomic group) having a substituent. For example, an "alkyl group" includes not only an alkyl group having no substituents (an unsubstituted alkyl group), but also an alkyl group having a substituent (a substituted alkyl group).

The term "an actinic ray" or "radiation" in the present specification means a bright line spectrum of a mercury lamp, a far-ultraviolet ray represented by an excimer laser, an extreme ultraviolet (EUV light) ray, an X-ray or an electron beam (EB). In addition, in the present invention, light means actinic rays or radiation.

Further, the term "exposure" of the present specification, unless otherwise stated, means not only exposure exposed by a mercury lamp, a far-ultraviolet ray represented by an excimer laser, an X-ray, EUV light, and the like, but also lithography carried out by a particle beam such as an electron beam, an ion beam and the like.

The pattern forming method of the present invention includes the processes in the following order, which are: (a) a process of forming a first film on a substrate using an actinic ray-sensitive or radiation-sensitive resin composition (I) containing a resin of which solubility in a developer containing an organic solvent decreases due to polarity increased by the action of an acid; (b) a process of exposing the first film; (c) a process of developing the exposed first film using a developer containing an organic solvent to form a first negative pattern; (e) a process of forming a second film on the substrate on which the first negative pattern is formed using an actinic ray-sensitive or radiation-sensitive resin composition (II) containing a resin of which the solubility in a developer containing an organic solvent decreases due to polarity increased by an action of an acid; (f) a process of exposing the second film; and (g) a process of developing the exposed second film using a developer containing an organic solvent to form a second negative pattern.

The reason why the ultrafine line and space pattern (for example, a line and space pattern of which the line width and space width are 40 nm or less) can be easily formed by the above-described pattern forming method is not clear, but it can be speculated as follows.

First, the pattern forming method includes at least two times of patterning containing patterning by the processes (a) to (c) and patterning by the processes (e) to (g).

For example, in the case where the pattern forming method of the present invention contains two times of patterning (that is, double patterning), a pattern of line: space=1:1 can be formed by allowing the space width to be 3 times of the line width in the first patterning.

According to the pattern forming method of the present invention, since the space width in the first patterning can be set to be wider than the line width, insufficiency of resolution which tends to be occur when a pattern having a fine line width is formed by a negative tone imaging process can be compensated by improvement of mask bias. Accordingly, in the negative imaging process having high expectation for designing the future electronic device (particularly, forming a fine trench or a fine hole), a dense pattern (as a representative example, an ultrafine pattern of line:space=1:1) in which the negative tone imaging process does not work well can be certainly formed by the pattern forming method of the present invention. As a result, for example, the uniformity of materials between a resist composition for forming a fine trench or a fine hole and a resist composition for forming a dense pattern can be promoted, therefore, it is immensely effective to reduce the cost of forming a pattern and to apply the technology.

In addition, in the double patterning, it is necessary that the first pattern formed by the first patterning is insoluble or sparingly soluble in not only a developer used for the first patterning but also a solvent in the actinic ray-sensitive or radiation-sensitive resin composition (II) used for the second patterning.

After the inventor conducted thorough research, they found that it is possible to allow the first negative pattern to be insoluble or sparingly soluble in the developer used for the first patterning and the solvent in the actinic ray-sensitive or radiation-sensitive resin composition (II) used for the second patterning while the shape of the first negative pattern is maintained by adopting the patterning carried out by the above-described processes (a) to (c) as the first patterning.

The configuration in which the first negative pattern is insoluble or sparingly soluble in the solvent in the actinic ray-sensitive or radiation-sensitive resin composition (II) while the shape of the pattern is maintained is speculated to be as follows.

As shown in the schematic cross-sectional view of FIG. 1A, an exposed portion 12 and an unexposed portion 13 are provided by irradiating a resist film formed on a substrate 11 with an actinic ray or radiation 32 through a mask 31.

At this time, in the exposed portion 12, it is considered that stress is generated causing the reduction of the film thickness along with a reaction of increasing the polarity of the resin by the action of an acid, however, at least a part of the stress escapes to the unexposed portion 13, so that the shape change of the exposed portion 12 is suppressed.

Figure 1B:
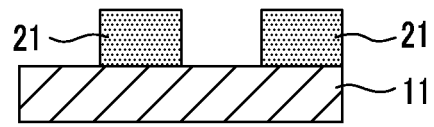

Next, as shown in the schematic cross-sectional view of FIG. 1B, the unexposed portion 13 is removed by developing using a developer containing an organic solvent (organic developer), thereby obtaining a negative pattern 21.

In the negative pattern 21 to be formed as described above, the exposed portion 12 forms a pattern. That is, the negative pattern 21 contains a resin in which the polarity thereof is increased by the action of an acid (as a representative example, a resin having a polar group such as a carboxyl group).

It is considered that since the polar group in such a resin is a hydrophilic group, the negative pattern 21 can be insoluble or sparingly soluble not only in the organic developing solvent to be used in the first patterning but also in the solvent in the actinic ray-sensitive or radiation-sensitive resin composition (II) to be used in the second patterning while the shape of the negative pattern 21 is maintained.

Further, in a resin having polar groups which are present in the negative pattern 21, since the polar groups interacts with each other (a hydrogen bond or the like), durability of the film constituting the negative pattern 21 is high, it is considered that this factor also contributes to the fact that the negative pattern 21 can be insoluble or sparingly soluble in the solvent in the actinic ray-sensitive or radiation-sensitive resin composition (II) while the shape of the negative pattern 21 is maintained.

Figure 1C:
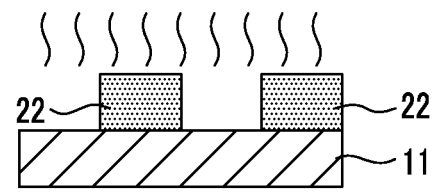

In addition, as shown in the schematic cross-sectional view of FIG. 1C, it is preferable that a negative pattern 22 be formed by heating the negative pattern 21 at a high temperature (for example, about 200° C.) and further improving insolubility or sparing solubility in a solvent.

As described above, in the resin having polar groups which are present in the negative pattern 21, the polar groups interact with each other (a hydrogen bond or the like), glass transition temperature of the resin is high (the glass transition temperature of the resin that is formed by reacting acids with an acrylic-based resin or a methacrylic-based resin typically used in a resist composition, and has a polar group is generally 200° C. or more).

Accordingly, the negative pattern 21 is barely deformed by heat even when the negative pattern 21 is heated at a high temperature (for example, about 200° C.).

In addition, it is considered that there are non-reacted resins, decomposed residues of organic matters generated along with the generation of acids, and acids with low concentration to an extent that it cannot contribute to a reaction with a resin at a normal temperature inside of the negative pattern 21 to be formed immediately after the developing process.

It is considered that volatilization of the decomposed residues of the organic matters, "the reaction of increasing the polarity of a resin by the action of an acid" in the non-reacted resins, and a crosslinking reaction of a resin of which the cross-linking agent is the decomposed residues of the organic matters occur by carrying out the heating process in the presence of the decomposed residues of organic matters and acids, so that the insolubility or sparing solubility in the solvent in the second resist composition of the negative pattern 21 can be accelerated.

On the other hand, when the positive imaging process using an alkaline development solution is carried out, the inventors examined whether the same effects as the patterning carried out using the above-described negative imaging process can be acquired, as a result, they found that a defect in which the pattern is collapsed in the middle of the process occurs when, in particular, the line and space pattern of which the line width and space width are 40 nm or less is formed, and therefore an excellent pattern may not be formed. The inventors also found that the above-described defect becomes evident when the pattern is heated at a high temperature (for example, about 200° C.) in order to improve the insolubility or sparing solubility in a solvent. The reasons thereof can be speculated as follows.

Figure 2A:
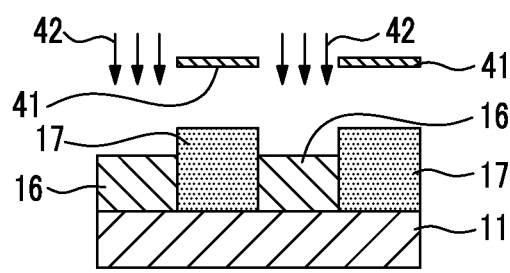
FIGS. 2A to 2D are cross-sectional views schematically describing action effects of examples in the related art.

First of all, as shown in the schematic cross-sectional view of FIG. 2A, an exposed portion 16 and an unexposed portion 17 are provided by irradiating a resist film formed on the substrate 11 with actinic rays or radiation 42 through a mask 41.

At this time, in the exposed portion 16, it is considered that stress is generated causing the reduction of the film thickness along with the reaction of increasing the polarity of the resin by the action of an acid, however, at least a part of the stress escapes to the unexposed portion 17.

Figure 2B:
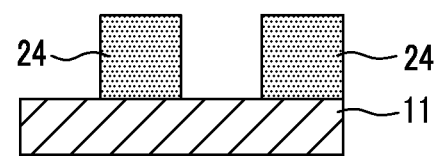

Next, as shown in the schematic cross-sectional view of FIG. 2B, the exposed portion 16 is removed by developing using an alkaline developer, thereby obtaining a positive pattern 24.

In the positive pattern 24 to be formed as described above, a pattern is formed by the unexposed portion 17. Accordingly, it is known that stress from the unexposed portion 17 is applied to the positive pattern 24, and the pattern is swollen at the time of development at the positive imaging in which an alkaline developer is used, therefore, a large quantity of stress can be accumulated on the positive pattern 24. As a result, the pattern collapse can be easily occurred, therefore, it is difficult to form a pattern having fine a line width by the positive imaging process.

Furthermore, since the positive pattern 24 is different from the above-described negative pattern 21 and contains a resin before the polarity is increased by the action of an acid, that is, a resin of which the polarity is not high, it is difficult for the positive pattern 24 to be insoluble or sparingly soluble in a solvent in the second resist composition.

Figure 2C:
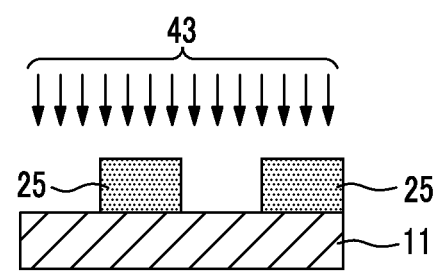

Accordingly, as shown in the schematic cross-sectional view of FIG. 2C, it is considered that a process of converting the positive pattern 24 to a positive pattern 25 containing a resin of which the polarity is increased by the action of an acid (typically, a resin having a polar group such as a carboxyl group or the like) is carried out by irradiating the positive pattern 24 with actinic rays or radiation 43 and heating the positive pattern 24 after the exposure as needed.

However, the positive pattern 25 which is obtained by this process can be easily collapsed. The reason thereof is speculated that when the stress causing the reduction of the film thickness is applied to the positive pattern 25 by the above-described process, there is no inclusion in the positive pattern 25, in which the stress may escape, such as the unexposed portion 13 in the negative tone imaging process.

Figure 2D:
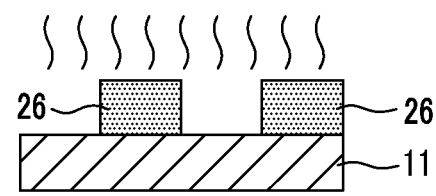

Furthermore, as shown in the schematic cross-sectional view of FIG. 2D, since a large quantity of stress is already applied to the positive pattern 25 and accumulated, and stress is newly applied thereto by a high temperature heating process when the high temperature heating process which is preferable for the negative pattern 22 is carried out to the positive pattern 25, therefore, a positive pattern 26 to be formed through this process is exceedingly easily collapsed.

According to the pattern forming method using the negative tone imaging of the present invention, as described above, since the stress is barely accumulated on the pattern formed by the first patterning when compared to the case of using the positive imaging, and a process in which further stress is applied to the pattern (a process of irradiating the positive pattern 24 with the actinic rays or radiation 43 and heating the same after the exposure as needed in the positive imaging) need not be carried out, and therefore a pattern having a fine line width can be certainly formed and the process cost thereof can be reduced, so that the pattern is easily formed.

Further, according to the pattern forming method of the present invention, even when the composition used in the first patterning is the same as the composition used in the second patterning, the negative pattern formed by the first patterning can be made to be insoluble or sparingly soluble in a solvent of the composition used for the second patterning and the freezing material need not be applied to the negative pattern formed by the first patterning, thereby forming a pattern easily from this point of view.

Moreover, in the case where an ultrafine line and space pattern (for example, a line and space pattern of which the line width and space width are 40 nm or less) is formed, further strong capillary force is easily generated particularly in a fine space room formed at the time of development of the second patterning, and the capillary force is applied to a side wall of the pattern having the fine line width when a developer is discharged from the space room. Further, since an affinity between a pattern of which the main component is a resin and an alkaline developer is likely to be low when the positive imaging using the alkaline developer is adopted, so that the capillary force applied to the side wall of the pattern is large, thereby occurring the pattern collapse easily.

On the other hand, according to the present invention, an affinity between a pattern of which the main component is a resin and an organic developer is likely to be high when the negative tone imaging using the organic developer is adopted, particularly in the second patterning, the capillary force applied to the side wall of the pattern is small, and then the pattern collapse is barely occurred. From this reason, it is considered that the high resolution can be acquired (having an excellent limit resolution) according to the present invention. That is, it is considered that an ultrafine line and space pattern can be formed (for example, a line and space pattern of which the line width and space width is 40 nm or less).

<Pattern Forming Method>

Hereinafter, the pattern forming method of the present invention will be specifically described.

The pattern forming method of the present invention includes: (a) a process of forming a first film on a substrate using an actinic ray-sensitive or radiation-sensitive resin composition (I) containing a resin of which solubility in a developer containing an organic solvent decreases due to polarity increased by the action of an acid; (b) a process of exposing the first film; (c) a process of developing the exposed first film using a developer containing an organic solvent to form a first negative pattern; (e) a process of forming a second film on the substrate on which the first negative pattern is formed using an actinic ray-sensitive or radiation-sensitive resin composition (II) containing a resin of which solubility in a developer containing an organic solvent decreases due to the polarity increased by an action of an acid; (f) a process of exposing the second film; and (g) a process of developing the exposed second film using a developer containing an organic solvent to form a second negative pattern, in this order.

The pattern forming method of the present invention, the respective processes (a) to (g) may be performed by a generally known method.

Figure 3A:
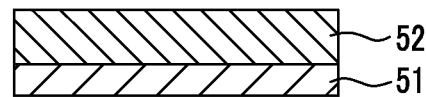
FIGS. 3A to 3G are cross-sectional views schematically describing an embodiment of the present invention.

In an embodiment of the present invention, as shown in the schematic cross-sectional view of FIG. 3A, firstly, on a substrate 51, a resist film (a first film) 52 is formed using an actinic ray-sensitive or radiation-sensitive resin composition (I) containing the resin of which the solubility in the developer containing an organic solvent decreases due to the polarity increased by the action of an acid (process (a)).

In the process (a), the method of forming first film using the actinic ray-sensitive or radiation-sensitive resin composition (I) may be typically implemented by coating the substrate with the actinic ray-ray sensitive or radiation-sensitive resin composition (I), as the coating method, a spin coat method, a spray method, a roller coat method, or a dipping method which are known methods in the related art may be used, and preferably, the actinic ray-sensitive or radiation-sensitive resin composition (I) is coated using the spin coat method.

The film thickness of the first film is preferably 20 nm to 160 nm, more preferably 50 nm to 140 nm, and still more preferably 60 nm to 120 nm.

The substrate 51 forming a first film is not particularly limited, and a substrate generally used in a semiconductor manufacturing process such as IC, a circuit board manufacturing process such as liquid crystal and thermal head, and also a lithography process of photofabrication in addition to these, such as an inorganic substrate such as silicon, SiN or $SiO_2$, or a coated inorganic substrate such as SOG, or the like, may be used. Further, a lower layer film such as an antireflection film may be formed between the first film and the substrate as needed. The lower layer film can be appropriately selected from an organic antireflection film, an inorganic antireflection film, and the like. The materials of the lower layer film can be obtained from Brewer Science, Inc., Nissan Chemical Industries, Ltd. and the like. Examples of the lower layer film appropriate for a developing process using a developer containing an organic solvent include a lower layer film disclosed in WO2012/039337A.

The pattern forming method of the present invention, a prebake (PB) process may be preferably carried out between the process (a) and the process (b).

Further, the pattern forming method of the present invention, a post exposure bake process can be carried out between the process (b) and the process (c).

The heating temperature for both PB and PEB is preferably 70° C. to 130° C., and more preferably 80° C. to 120° C.

The heating time is preferably 30 seconds to 300 seconds, more preferably 30 seconds to 180 seconds, and even more preferably 30 seconds to 90 seconds.

The heating can be performed using means provided to a general exposing and developing machine, and a hot plate or the like may also be used.

The reaction of the exposed area is accelerated due to bake, so that sensitivity or pattern profile is improved.

At least one of the prebake process and the post exposure bake process may include a plurality times of heating processes.

Figure 3B:
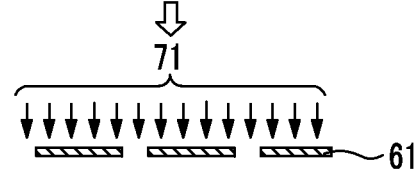

Moreover, as shown in the schematic cross-sectional view of FIG. 3B, an exposed resist film 53 is obtained by irradiating (that is, exposing) a resist film 52 with actinic rays or radiation 71 through a mask 61 (process (b)).

Here, the mask pattern in the mask 61 is not particularly limited, for example, a mask which includes a line and space pattern having a line portion as a light shielding portion and a space portion as a light transmission portion, and the width ratio of the line portion to the space portion is 3:1.

In the process (b), the wavelength of the light source used in the exposure apparatus is not particularly limited, however, may include infrared light, visible light, an ultraviolet ray, a far-ultraviolet ray, an extreme ultraviolet ray, an X-ray, an electron beam, or the like, is preferably a far-ultraviolet ray with the wavelength of 250 nm or less, more preferably 220 nm or less and particularly preferably 1 nm to 200 nm. More specifically, the light source is a KrF excimer laser (248 nm), an ArF excimer laser (193 nm), a $F_2$ excimer laser (157 nm), X-rays, EUV (13 nm), an electron beam or the like, preferably a KrF excimer laser, an ArF excimer laser, EUV or an electron beam, and more preferably an ArF excimer laser.

The process (b) may contain the exposure process performing plural times.

In addition, the liquid immersion exposure method can be applied to the process (b).

The liquid immersion exposure method is a technology of improving resolution, and is a technology of exposure in which an area between the projection lens and a sample is filled with a liquid (hereinafter, also referred to as an "a liquid for liquid immersion") with a high refractive index.

As for the effect of the liquid immersion, when $\lambda_0$ is set to a wavelength of the exposure light in the air, n is set to a refractive index of a liquid for liquid immersion against the air, θ is set to a convergence half angle of a ray, so that it becomes $NA_0 = \sin\theta$, the resolution and the depth of focus will be expressed by the following expression in the case of immersing in a liquid. Here, $k_1$ and $k_2$ are coefficients related to the process.

(Resolution)=$k_1 \cdot (\lambda_0/n)/NA_0$ (Depth of focus)=$\pm k_2 \cdot (\lambda_0/n)/NA_0^2$ That is, the effect of the liquid immersion is equivalent to the effect of using the exposure wavelength with a wavelength of 1/n. In other words, in a case of the projection optical system having the same NA, the depth of focus may be made to be n times by the liquid immersion. This is valid for all pattern shapes, and furthermore, combining with super-resolution technologies such as a phase shift method or a modified illumination method currently considered is possible.

In the case of performing the liquid immersion exposure, a process of washing the surface of the first film with an aqueous liquid medicine may be carried out before (1) a process of exposing the first film after the first film is formed on the substrate, and/or before (2) a process of heating the first film after exposing the first film through a liquid for liquid immersion.

The liquid for liquid immersion is preferably a liquid which is transparent to the exposure wavelength and has as small a temperature coefficient of a refractive index as possible so as to minimize the distortion of an optical image projected onto the first film. Particularly, when the exposure light source is an ArF excimer laser (wavelength: 193 nm), it is preferable to use water in respect that water is easily obtained and handled, in addition to the above-described viewpoints.

When water is used, an additive (liquid) which decreases the surface tension of water and increases surfactant potency may be added in a slight proportion. This additive is preferably an additive which does not dissolve the resist layer on a wafer and can ignore the effects on the optical coat at the lower surface of the lens element.

Such an additive is preferably an aliphatic alcohol having approximately the same refractive index as water, and specific examples thereof may include methyl alcohol, ethyl alcohol, isopropyl alcohol, or the like. An advantage of adding the alcohol having approximately the same refractive index as water is that changes in the refractive index of the liquid as a whole may be extremely small even when the content concentration changes by the alcohol component in water being evaporated.

On the other hand, if materials opaque to light with a wavelength of 193 nm or impurities whose refractive index is significantly different from water are incorporated, they cause a distortion of the optical image projected on the resist, therefore, distilled water is preferable as the water to be used. Pure water filtered through an ion exchange filter or the like may also be used.

Electrical resistance of the water to be used as a liquid for liquid immersion is preferably 18.3 MΩcm or more, TOC (Total Organic Carbon) is preferably 20 ppb or less, and it is preferable that a degassing treatment be carried out.

In addition, the performance of lithography can be improved by increasing the refractive index of a liquid for liquid immersion. From this point of view, the addition of additives increasing the refractive index to water or using heavy water ($D_2O$) instead of water is possible.

In the case where the first film formed using the actinic ray-sensitive or radiation-sensitive resin composition (I) of the present invention is exposed through a liquid immersion medium, a hydrophobic resin (D) which is described below may be further added as needed. By adding the hydrophobic resin (D), the receding contact angle of the surface is improved. The receding contact angle of the first film is preferably 60° C. to 90° C., and more preferably 70° C. or more.

In the liquid immersion exposure process, the contact angle of a liquid for liquid immersion for the resist film (first film) in a dynamic state becomes critical since the liquid for liquid immersion has to move on the wafer following the movement of the exposure head scanning on the wafer at high speed and forming an exposure pattern, therefore, the resist is required to have an ability to follow the high-speed scan of the exposure head without the remaining droplets.

A film sparingly soluble in a liquid for liquid immersion (hereinafter, also referred to as a "top coat") may be provided between the first film formed using the actinic ray-sensitive or radiation-sensitive resin composition (I) and the liquid for liquid immersion in order to avoid direct contacting of the film with the liquid for liquid immersion. Examples of the necessary functions to the top coat include an aptitude for coating on an upper layer portion of a resist, transparency with respect to radiation, particularly radiation having a wavelength of 193 nm and sparingly solubility in the liquid for liquid immersion. The top coat is preferably the one which is not mixed with the resist, and is capable of uniformly coating on the upper layer of the resist.

The top coat is preferably a polymer containing no aromatic series from the viewpoint of transparency at 193 nm.

Specific examples of such a polymer include a hydrocarbon polymer, an acrylic acid ester polymer, a polymethacrylic acid, a polyacrylic acid, polyvinyl ether, a silicon-containing polymer, and a fluorine-containing polymer. The hydrophobic resin (D) described above is preferable as the top coat. Since an optical lens is contaminated when impurities are eluted from the top coat to the liquid for liquid immersion, residual monomer components of the polymer contained in the top coat is preferably small.

In stripping the top coat, the developer may be used, or a stripper may be separately used. As the stripper, a solvent which poorly infiltrates into the first film is preferred. In view of the matter that the stripping process can be carried out simultaneously with the developing treatment process of the first film, it is preferable that stripping can be achieved by an alkaline developer. Further, the top coat is preferably acidic from the viewpoint of stripping with the alkaline developer, but it may be neutral or alkaline from the viewpoint of non-intermixing property with the first film.

It is preferable that there be a small difference or no difference in the refractive index between the top coat and the liquid for liquid immersion. In this case, it is possible to increase the resolution. Since using water as the liquid for liquid immersion is preferable when the exposure light source is ArF excimer laser (wavelength: 193 nm), so that the top coat for ArF liquid immersion exposure is near to the refractive index of water (1.44), which is preferable. Further, the top coat is preferably a thin film from the viewpoint of the transparency and the refractive index.

Preferably, the top coat is not mixed with the first film and more preferably not mixed with the liquid for liquid immersion. From this viewpoint, in the case where the liquid for liquid immersion is water, the solvent to be used for the top coat is preferably sparingly soluble in the solvent to be used for the composition of the present invention and a water-insoluble medium. In addition, when the liquid for liquid immersion is an organic solvent, the top coat may be soluble in water or may be insoluble in water.

Figure 3C:

Next, as shown in the schematic cross-sectional view of FIG. 3C, the exposed resist film 53 is developed using the developer containing an organic solvent to form a first negative pattern 54 (process (c)).

In the process (c), as the developer (hereinafter, also referred to as an "organic developer") in the process of developing the first film using the developer containing an organic solvent to form a negative pattern, a polar solvent and a hydrocarbon-based solvent such as a ketone-based solvent, an ester-based solvent, an alcohol-based solvent, an amide-based solvent, or an ether-based solvent may be used.

Examples of the ketone-based solvents may include 1-octanone, 2-octanone, 1-nonanone, 2-nonanone, acetone, 2-heptanone(methyl amyl ketone), 4-heptanone, 1-hexanone, 2-hexanone, diisobutyl ketone, cyclohexanone, methyl cyclohexanone, phenyl acetone, methyl ethyl ketone, methyl isobutyl ketone, acetylacetone, acetonylacetone, ionone, diacetonyl alcohol, acetyl carbinol, acetophenone, methyl naphthyl ketone, isophorone, propylene carbonate, or the like.

Examples of the ester-based solvents may include methyl acetate, butyl acetate, ethyl acetate, isopropyl acetate, pentyl acetate, isopentyl acetate, amyl acetate, cyclohexyl acetate, isobutyl isobutyrate, propylene glycol monomethyl ether acetate, ethylene glycol monoethyl ether acetate, diethylene glycol monobutyl ether acetate, diethylene glycol monoethyl ether acetate, ethyl-3-ethoxy propionate, 3-methoxy butyl acetate, 3-methyl-3-methoxy butyl acetate, methyl formate, ethyl formate, butyl formate, propyl formate, ethyl lactate, butyl lactate, propyl lactate, or the like.

Examples of the alcohol-based solvents may include alcohols such as methyl alcohol, ethyl alcohol, n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol or n-decanol, glycol-based solvents such as ethylene glycol, diethylene glycol or triethylene glycol, glycol ether-based solvents such as ethylene glycol monomethyl ether, propylene glycol monomethyl ether, ethylene glycol monoethyl ether, propylene glycol monoethyl ether, diethylene glycol monomethyl ether, triethylene glycol monoethyl ether, methoxymethyl butanol, or the like.

Examples of the ether-based solvents may include dioxane, tetrahydrofuran, phenetole, and dibutyl ether in addition to the above-described glycol ether-based solvent.

Examples of the amide-based solvents may include N-methyl-2-pyrrolidone, N,N-dimethylacetamide, N,N-dimethylformamide, hexamethylphosphoric triamide, 1,3-dimethyl-2-imidazolidinone, or the like.

Examples of the hydrocarbon-based solvents may include aromatic hydrocarbon-based solvents such as toluene or xylene, or aliphatic hydrocarbon-based solvents such as pentane, hexane, octane or decane.

The above solvents may be mixed plurally, or may be used being mixed with other types of solvents or water. However, in order to exert sufficient effects of the present invention, the water content of the developer as a whole is preferably less than 10% by mass, and practically, it is more preferable that water be not included.

That is, the used amount of the organic solvent with respect to the organic-based developer is preferably greater than or equal to 90% by mass and less than or equal to 100% by mass, and more preferably greater than or equal to 95% by mass and less than or equal to 100% by mass based on the total amount of the developer.

In particular, the organic-based developer is preferably a developer including at least one organic solvent selected from the group consisting of ketone-based solvents, ester-based solvents, alcohol-based solvents, amide-based solvents, and ether-based solvents.

Vapor pressure of the organic-based developer is preferably 5 kPa or less, more preferably 3 kPa or less, particularly preferably 2 kPa or less, at 20° C. By making the vapor pressure of the organic-based developer be 5 kPa or less, evaporation of the developer on the substrate or in the development cup is suppressed, and temperature uniformity within the wafer surface is improved, and as a result, dimension uniformity within the wafer surface is improved.

Specific examples of the solvents having the vapor pressure of 5 kPa or less include a ketone-based solvent such as 1-octanone, 2-octanone, 1-nonanone, 2-nonanone, 2-heptanone, (methylamylketone), 4-heptanone, 2-hexanone, diisobutylketone, cyclohexanone, methylcyclohexanone, phenylacetone, or methylisobutylketone; an ester-based solvent such as butyl acetate, pentyl acetate, isopentyl acetate, amyl acetate, cyclohexyl acetate, isobutyl isobutyrate, propylene glycol monomethyl ether acetate, ethylene glycol monoethyl ether acetate, diethyl glycol monobutyl ether acetate, diethylene glycol monoethyl acetate, ethyl-3-ethoxypropionate, 3-methoxybuthyl acetate, 3-methyl-3-methoxybutyl acetate, butyl formate, propyl formate, ethyl lactate, butyl lactate, or propyl lactate; an alcohol-based solvent such as n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol, or n-decanone; a glycol-based solvent such as ethylene glycol, diethylene glycol, or triethylene glycol; a glycol ether-based solvent such as ethylene glycol monomethyl ether, propylene glycol monomethyl ether, ethylene glycol monoethyl ether, propylene glycol monoethyl ether, diethylene glycol monomethyl ether, triethylene glycol monoethyl ether, or methoxy methyl butanol; an ether-based solvent such as tetrahydrofuran, phenetole, or dibutyl ether; an amide-based solvent such as N-methyl-2-pirrolidone, N,N-dimethylacetamide, or N,N-dimethylformamide; an aromatic hydrocarbon-based solvent such as toluene or xylene; and an alipathic hydrocarbon-based solvent such as octane or decane.

Further, specific examples of the solvents having the vapor pressure of 2 kPa or less, which is a particularly preferable range, include a ketone-based solvent such as 1-octanone, 2-octanone, 1-nonanone, 2-nonanone, 4-heptanone, 2-hexanone, diisobutylketone, cyclohexanone, methylcyclohexanone, or phenylacetone; an ester-based solvent such as butyl acetate, amyl acetate, cyclohexyl acetate, isobutyl isobutyrate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybuthyl acetate, 3-methyl-3-methoxybutyl acetate, ethyl lactate, butyl lactate, or propyl lactate; an alcohol-based solvent such as n-butyl alcohol, sec-butyl alcohol, tert-butyl alcohol, isobutyl alcohol, n-hexyl alcohol, n-heptyl alcohol, n-octyl alcohol, or n-decanol; a glycol-based solvent such as ethylene glycol, diethylene glycol, or triethylene glycol; a glycol ether-based solvent such as ethylene glycol monomethyl ether, propylene glycol monomethyl ether, ethylene glycol monoethyl ether, propylene glycol monoethyl ether, diethylene glycol monomethyl ether, triethylene glycol monoethyl ether, or methoxy methyl butanol; an ether-based solvent such as phenetole or dibutyl ether; an amide-based solvent such as N-methyl-2-pirrolidone, N,N-dimethylacetamide, or N,N-dimethylformamide; an aromatic hydrocarbon-based solvent such as xylene; and an alipathic hydrocarbon-based solvent such as octane or decane.

An appropriate amount of a surfactant may be added to the organic-based developer, if necessary.

The surfactant is not particularly limited, however, for example, an ionic or non-ionic fluorine-based and/or silicon-based surfactants or the like may be used. These fluorine-based and/or silicon-based surfactants may include surfactants, disclosed in, for example, JP1987-36663A (JP-S62-36663A), JP1986-226746A (JP-S61-226746A), JP1986-226745A (JP-S61-226745A), JP1987-170950A (JP-S62-170950A), JP1988-34540A (JP-S63-34540A), JP1995-230165A (JP-H07-230165A), JP1996-62834A (JP-H08-62834A), JP1997-54432A (JP-H09-54432A), JP1997-5988A (JP-H09-5988A), U.S. Pat. No. 5,405,720A, U.S. Pat. No. 5,360,692A, U.S. Pat. No. 5,529,881A, U.S. Pat. No. 5,296,330A, U.S. Pat. No. 5,436,098A, U.S. Pat. No. 5,576,143A, U.S. Pat. No. 5,294,511A and U.S. Pat. No. 5,824,451A, and are preferably non-ionic surfactants. The non-ionic surfactant is not particularly limited, however, the use of fluorine-based surfactants or silicon-based surfactants is more preferable.

The amount of surfactant used is typically 0.001% by mass to 5% by mass, preferably 0.005% by mass to 2% by mass, and more preferably 0.01% by mass to 0.5% by mass based on the total amount of the developer.

In addition, the pattern forming method of the present invention may further include a process of developing using an alkaline developer between the process (b) and the process (c), or the process (c) and the process (e) (between the process (c) and the process (d) in the case where the process (d) described below is carried out).

If the pattern forming method of the present invention further includes a process for developing using an alkaline developer, and, as the alkaline developer, for example, an alkaline aqueous solution such as inorganic alkalis such as sodium hydroxide, potassium hydroxide, sodium carbonate, sodium silicate, sodium metasilicate or ammonia water, primary amines such as ethylamine or n-propyl amine, secondary amines such as diethylamine or di-n-butylamine, tertiary amines such as triethylamine or methyldiethylamine, alcohol amines such as dimethylethanolamine or triethanolamine, quaternary ammonium salts such as tetramethylammonium hydroxide or tetraethylammonium hydroxide, cyclic amines such as pyrrole or piperidine, may be used.

In addition, an appropriate amount of alcohols or surfactants may be added to the alkaline aqueous solution described above and used.

An alkali concentration of the alkaline developer is generally 0.1% by mass to 20% by mass.

The pH of the alkaline developer is generally 10.0 to 15.0.

In particular, an aqueous solution of 2.38% by mass tetramethylammonium hydroxide is preferable.

As the developing method, for example, a method in which a substrate is immersed in a tank filled with a developer for a certain period of time (dip method), a method in which a developer is heaped up on the surface of a substrate by surface tension and development is performed by resting for a certain period of time (a paddle method), a method in which a developer is sprayed on the surface of the substrate (a spray method), a method in which a developer is continuously discharged on a substrate rotated at a constant rate while a developer discharging nozzle is being scanned at a constant rate (a dynamic dispense method), or the like, may be applied.

In the case where the variety of developing methods described above include a process in which a developer is discharged from a development nozzle of a development apparatus toward a resist film, discharge pressure of the developer to be discharged (flow rate per unit area of the developer to be discharged) is preferably 2 mL/sec/mm$^2$ or less, more preferably 1.5 mL/sec/mm$^2$ or less, and even more preferably 1 mL/sec/mm$^2$ or less. There is no particular lower limit of the flow rate, however, 0.2 mL/sec/mm$^2$ or more is preferable when throughput is considered.

By allowing the discharge pressure of the developer discharged to be in this range, defects of the pattern derived from the resist residue after development may be significantly reduced.

Details of this mechanism is not clear, however, it is believed that, by allowing the discharge pressure to be in the above range, pressure on the resist film applied by the developer becomes smaller, therefore, the resist film and the resist pattern being scraped or broken carelessly is suppressed.

In addition, the discharge pressure of the developer (mL/sec/mm$^2$) is a value at the developing nozzle exit in the development apparatus.

Examples of the method of adjusting the discharge pressure of the developer may include a method in which discharge pressure is adjusted by a pump and the like, and a method in which pressure is adjusted by the supply from pressurized tank and changed.

In addition, a process for stopping the development may be performed, while the solvent is substituted with other solvents, after the developing process using the developer including an organic solvent.

The pattern forming method of the present invention preferably includes a process (rinsing process) of washing with a rinsing solution containing an organic solvent between the process (c) and the process (e) (between the process (c) and the process (d) in the case where the process (d) described below is carried out), that is after the process of developing using the developer containing an organic solution.

The rinsing solution used in the rinsing process after the developing process using the developer containing an organic solvent is not particularly limited as long as it does not dissolve the resist pattern, and a solution including general organic solvents may be used. As the rinsing solution, a rinsing solution containing at least one organic solvent selected from the group consisting of hydrocarbon-based solvents, ketone-based solvents, ester-based solvents, alcohol-based solvents, amide-based solvents, and ether-based solvents is preferably used.

Specific examples of the hydrocarbon solvents, the ketone-based solvents, the ester-based solvents, the alcohol-based solvents, the amide-based solvents, and the ether-based solvents may be the same as those described for the developer including an organic solvent.

After the developing process using a developer that contains an organic solvent, the process of cleaning is more preferably performed using the rinsing solution containing at least one organic solvent selected from a group consisting of ketone-based solvents, ester-based solvents, alcohol-based solvents, and amide-based solvents, the process of cleaning is even more preferably performed using the rinsing solution containing alcohol-based solvents or ester-based solvents, the process of cleaning is particularly preferably performed using the rinsing solution containing monohydric alcohol, and the process of cleaning is most preferably performed using the rinsing solution containing monohydric alcohol having 5 or more carbon atoms.

Here, examples of the monohydric alcohol used in the rinsing process may include a linear, branched, or cyclic monohydric alcohol, and specifically, 1-butanol, 2-butanol, 3-methyl-1-butanol, tert-butyl alcohol, 1-pentanol, 2-pentanol, 1-hexanol, 4-methyl-2-pentanol, 1-heptanol, 1-octanol, 2-hexanol, cyclopentanol, 2-heptanol, 2-octanol, 3-hexanol, 3-heptanol, 3-octanol, 4-octanol or the like, may be used, and as the particularly preferable monohydric alcohol having 5 or more carbon atoms, 1-hexanol, 2-hexanol, 4-methyl-2-pentanol, 1-pentanol, 3-methyl-1-butanol or the like, may be used.

Each component described above may be mixed plurally, or may be used being mixed with organic solvents other than those described above.

Water content in the rinsing solution is preferably 10% by mass or less, more preferably 5% by mass or less, and particularly preferably 3% by mass or less. By making the water content be 10% by mass or less, satisfactory development characteristics may be obtained.

Vapor pressure of the rinsing solution used after the developing process using the developer containing an organic solvent is preferably greater than or equal to 0.05 kPa and less than or equal to 5 kPa, more preferably greater than or equal to 0.1 kPa and less than or equal to 5 kPa, most preferably greater than or equal to 0.12 kPa and less than or equal to 3 kPa at 20° C. By making the vapor pressure of the rinsing solution be greater than or equal to 0.05 kPa and less than or equal to 5 kPa, temperature uniformity within the wafer surface is improved and swelling due to the penetration of the rinsing solution is suppressed, therefore, dimension uniformity within the wafer surface is improved.

The pattern forming method of the present invention preferably includes the process (rinsing process) of washing with the rinsing solution when the pattern forming method further includes the process of developing using the alkaline developer. In this case, pure water may be used as the rinsing solution, and an appropriate amount of a surfactant is added thereto and then used.

The cleaning method in the above-described rinsing process is not particularly limited. However, for example, a method in which a rinsing solution is continuously discharged on a substrate rotating at a constant rate (a spin coating method), a method in which a substrate is immersed in a tank filled with a rinsing solution for a certain period of time (a dip method), a method in which a rinsing solution is sprayed on a substrate surface (a spray method), or the like, may be applied, and among these, it is preferable that cleaning treatment be carried out using the spin coating method, the substrate be rotated at a rotational speed of 2,000 rpm to 4,000 rpm after cleaning, and the rinsing solution be removed from the surface of the substrate. It is also preferable that the heating process (Post Bake) be included after the rinsing process. The residual developer and the rinsing solution between and inside the patterns are removed by bake. The heating process after the rinsing process is generally performed at 40° C. to 160° C. and preferably at 70° C. to 95° C., and generally for 10 seconds to 3 minutes and preferably 30 seconds to 90 seconds.

In addition, a treatment for removing the developer or the rinsing solution deposited on the pattern may be carried out using supercritical fluid after the development or the rinsing treatment.

Figure 3D:
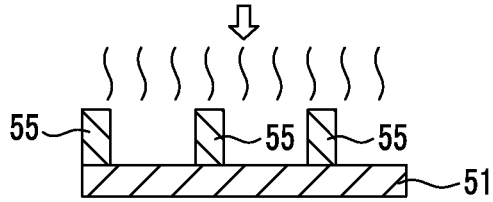

As shown in the schematic cross-sectional view of FIG. 3D, a process (d) of heating the first negative pattern (hereinafter, also referred to as a "heating process (d)) may be further carried out between the process (c) and the process (e) to be described later, by doing this, as described above, the solvent resistance of the negative pattern formed in the process (c) can be further improved, and the negative pattern can be converted to a first negative pattern 55 which is rarely damaged when the solution composed of the actinic ray-sensitive or radiation-sensitive resin composition (II) is coated onto the negative pattern in the subsequent process (e). The temperature of the heating process (d) is preferably 150° C. or more, and more preferably 170° C. or more. The temperature is generally 240° C. or less. In addition, the heating time in the heating process (d) is approximately 30 seconds to 120 seconds.

Preferably, the process (d) may be carried out under the reduced pressure from the viewpoint that the heating temperature and the heating time can be reduced as the volatilization of the decomposed residues of the organic matters is accelerated.

Further, as described above, the present invention does not exclude the application of known freezing materials, which is not necessary, to the first negative pattern 54 or the first negative pattern 55 in order for the first negative pattern 54 to have the sufficient solvent resistance.

Figure 3E:
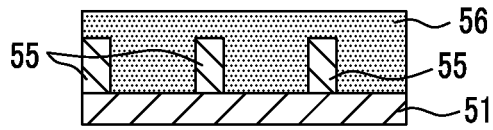

Next, as shown in the schematic cross-sectional view of FIG. 3E, a resist film (second film) 56 is formed on the substrate 51 on which the first negative pattern 55 is formed (process (e)) using the actinic ray-sensitive or radiation-sensitive resin composition (II) containing the resin of which solubility in the developer containing an organic solvent decreases due to the polarity increased by the action of an acid.

The method of forming the second film using the actinic ray-sensitive or radiation-sensitive resin composition (II) in the process (e) is the same as the method of forming the first film using the actinic ray-sensitive or radiation-sensitive resin composition (I) in the process (a).

The preferable range of the second film thickness is also the same as the range which is preferable for the first film thickness, but it is preferable that the film thickness of the first pattern be the same as the film thickness of the second pattern after the second pattern is formed. In order to satisfy the condition, since the thickness of the first film is reduced at the time of the heat treatment to form the second pattern, the thickness of the second film to be formed in the process (e) (that is, at the time of film formation) is preferably thinner than the thickness of the first film to be formed in the process (a) (that is, at the time of film formation).

The pattern forming method of the present invention preferably includes a prebake (PB) process between the process (e) and the process (f).

Further, the pattern forming method of the present invention preferably includes a post exposure bake (PEB) process between the process (f) and the process (g).

The heating temperature for both PB and PEB is preferably 70° C. to 130° C., and more preferably 80° C. to 120° C.

The heating time is preferably 30 seconds to 300 seconds, more preferably 30 seconds to 180 seconds, and even more preferably 30 seconds to 90 seconds.

The heating can be performed using means provided to a general exposing and developing machine, and a hot plate or the like may also be used.

Sensitivity or pattern profile is improved by the reaction of the exposed area being accelerated due to bake.

At least either of the prebake process and the post exposure bake process may include a plurality of times of heating processes.

Figure 3F:
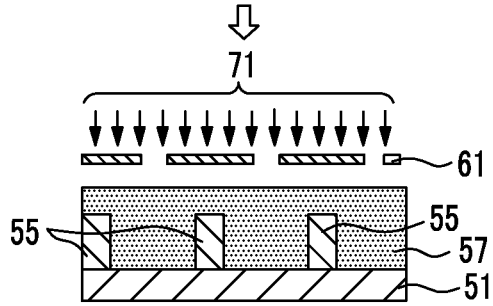

Next, as shown in the schematic cross-sectional view of FIG. 3F, an exposed resist film 57 is obtained by irradiating (that is, exposing) a resist film 56 with actinic rays or radiation 71 through the mask 61 (process (f)).

Here, the mask pattern in the mask 61 is not particularly limited, but examples thereof may include the same mask as the mask used in the process (b) (for example, a mask which includes a line and space pattern having a line portion as a light shielding portion and a space portion as a light transmission portion, and the width ratio of the line portion to the space portion is 3:1).

In addition, the mask 61 is preferably positioned such that the position of a light transmission line portion is deviated from the position in the process (b) by a half pitch, thereby forming an ultrafine pattern of line:space=1:1.

As the exposure method in the process (f), the same exposure method described in the process (b) may be adopted.

Figure 3G:
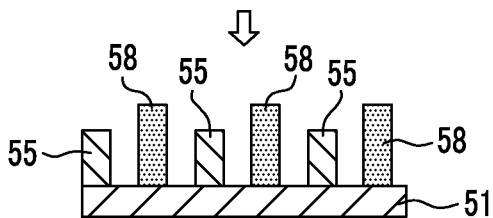

Next, as shown in the schematic cross-sectional view of FIG. 3G, the exposed resist film 57 is developed using the developer containing an organic solution to form a second negative pattern 58 (process (g)).

In the process (g), as the organic developer in the process of developing the second film using the developer containing an organic solvent to form the negative pattern, the same solution described for the organic developing method in the process (c) may be used.

Moreover, the pattern forming method of the present invention may further include a process of developing using the alkaline developer between the process (f) and the process (g) or subsequent to the process (g).

The alkaline developer may be used between the process (b) and the process (c), or between the process (c) and the (e) (between the process (c) and the process (d) in the case of carrying out the process (d)), and the alkaline developer, which is the same solution described in the process of developing using the above-described alkaline developer may be used.

As the developing method in the process of developing using the alkaline developer which may be carried out in the process (g), and before or after the process (g), the same method described in the process (c) may be adopted.

Further, the pattern forming method of the present invention preferably includes the process (rinsing process) of washing with the rinsing solution containing an organic solvent after the process (g), that is, after the process of developing using the developer containing an organic solvent. As the rinsing solution in this case, the same solution described in the process (rinsing process) of washing with the rinsing solution containing an organic solution, which may be carried out after the process of developing using the developer containing an organic solution may be used.

Furthermore, when the pattern forming method of the present invention further includes the process of developing using the alkaline developer between the process (f) and the process (g), or after the process (g), it is preferably that the pattern forming method of the present invention include the process (rinsing process) of washing using the rinsing solution after the process of developing using the alkaline developer. In this case, pure water may be used as the rinsing solution, and an appropriate amount of a surfactant is added thereto and then used.

As the method of the washing treatment in the rinsing process, the same methods described above may be included.

<Actinic Ray-Sensitive or Radiation-Sensitive Resin Composition (I)>

Hereinafter, the actinic ray-sensitive or the radiation-sensitive resin composition (I) to be used in the pattern forming method of the present invention will be described.

The actinic ray-sensitive or radiation-sensitive resin composition (I) is typically a resist composition, specifically, a negative resist composition (that is, a resist composition for organic solvent development). In addition the actinic ray-sensitive or radiation-sensitive resin composition (I) is typically a chemically amplified resist composition.

[1] Resin (A) Increasing Polarity by Action of Acid and Decreasing Solubility in Developer Containing Organic Solution Examples of the resin (A) which is contained in the actinic ray-sensitive or radiation-sensitive resin composition (I), of which solubility in the developer containing an organic solvent decreases due to the polarity include a resin containing a group which decomposes by the action of an acid and generates a polar group (hereinafter, also referred to as an "acid-decomposable group") at the main chain or the side chain of the resin, or both the main chain and the side chain of the resin (hereinafter, also referred to as an "acid-decomposable resin" or a "resin (A)").

The acid-decomposable group preferably includes a structure protected by a group which decomposes the polar group to be detached by the action of an acid.

The polar group is not particularly limited as long as it is a group which is sparingly soluble or insoluble in a developer containing an organic solvent, but examples thereof may include acidic groups (groups which dissociate in a 2.38% by mass aqueous solution of tetramethylammonium hydroxide that is used as a conventional developer for resists) such as a phenolic hydroxyl group, a carboxyl group, a fluorinated alcohol group (preferably, a hexafluoroisopropanol group), a sulfonic acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group, and a tris(alkylsulfonyl)methylene group; or alcoholic hydroxyl groups.

Meanwhile, the alcoholic hydroxyl group means a hydroxyl group bonded to a hydrocarbon group, and is a hydroxyl group other than the hydroxyl group directly bonded to an aromatic ring (phenolic hydroxyl group), but as a hydroxyl group, an aliphatic alcohol in which the α-position has been substituted with an electron-withdrawing group such as a fluorine atom (for example, a fluorinated alcohol group (a hexafluoroisopropanol group or the like)) is excluded. As the alcoholic hydroxyl group, a hydroxyl group of which pKa is greater than or equal to 12 and less than or equal to 20 is preferable.

Preferred examples of the polar group may include a carboxyl group, a fluorinated alcohol group (preferably a hexafluoroisopropanol group), and a sulfonic acid group.

The group preferable as the acid-decomposable group is a group in which hydrogen atoms of these groups are substituted with a group to be detached by an acid.

As the group to be detached by an acid, for example, $-C(R_{36})(R_{37})(R_{38})$, $-C(R_{36})(R_{37})(OR_{39})$, $-C(R_{01})(R_{02})(OR_{39})$, or the like, may be included.

In the formula, $R_{36}$ to $R_{39}$ each independently represent an alkyl group, a cycloalkyl group, an aryl group, an aralkyl group, or an alkenyl group. $R_{36}$ and $R_{37}$ may be bonded to each other to form a ring.

$R_{01}$ and $R_{02}$ each independently represent a hydrogen atom, an alkyl group, a cycloalkyl group, an aryl group, an aralkyl group, or an alkenyl group.

The alkyl group of $R_{36}$ to $R_{39}$, $R_{01}$ and $R_{02}$ is preferably an alkyl group having 1 to 8 carbon atoms and, for example, a methyl group, an ethyl group, a propyl group, an n-butyl group, a sec-butyl group, a hexyl group, an octyl group, or the like, may be included.

The cycloalkyl group of $R_{36}$ to $R_{39}$, $R_{01}$ and $R_{02}$ may be monocyclic or polycyclic. As the monocyclic group, a cycloalkyl group having 3 to 8 carbon atoms is preferable and, for example, a cyclopropyl group, a cyclobutyl group, a cyclopentyl group, a cyclohexyl group, a cyclooctyl group, or the like, may be included. As the polycyclic group, a cycloalkyl group having 6 to 20 carbon atoms is preferable and, for example, an adamantyl group, a norbornyl group, an isobornyl group, a camphanyl group, a dicyclopentyl group, an α-pinel group, a tricyclodecanyl group, a tetracyclododecyl group, an androstanyl group, or the like, may be included. In addition, at least one of the carbon atoms in the cycloalkyl group may be substituted with a hetero atom such as an oxygen atom.

The aryl group of $R_{36}$ to $R_{39}$, $R_{01}$ and $R_{02}$ is preferably an aryl group having 6 to 10 carbon atoms and, for example, a phenyl group, a naphthyl group, an anthryl group, or the like may be included.

The aralkyl group of $R_{36}$ to $R_{39}$, $R_{01}$ and $R_{02}$ is preferably an aralkyl group having 7 to 12 carbon atoms and, for example, a benzyl group, a phenethyl group, a naphthylmethyl group, or the like, may be included.

The alkenyl group of $R_{36}$ to $R_{39}$, $R_{01}$ and $R_{02}$ is preferably an alkenyl group having 2 to 8 carbon atoms and, for example, a vinyl group, an allyl group, a butenyl group, a cyclohexenyl group, or the like, may be included.

As the ring formed by $R_{36}$ and $R_{37}$ being bonded, a cycloalkyl group (monocyclic or polycyclic) is preferable. As the cycloalkyl group, a monocyclic cycloalkyl group such as a cyclopentyl group or a cyclohexyl group, or a polycyclic cycloalkyl group such as a norbornyl group, a tetracyclodecanyl group, a tetracyclododecanyl group or an adamantyl group is preferable. A monocyclic cycloalkyl group having 5 to 6 carbon atoms is more preferable, and a monocyclic cycloalkyl group having 5 carbon atoms is particularly preferable.

The acid-decomposable group is preferably a cumyl ester group, an enol ester group, an acetal ester group, a tertiary alkyl ester group or the like. More preferably, the acid-decomposable group is a tertiary alkyl ester group.

The resin (A) preferably includes a repeating unit having an acid-decomposable group.

In addition, the resin (A) preferably includes the repeating unit represented by the following general formula (AI) as the repeating unit having an acid-decomposable group. The repeating unit represented by the general formula (AI) generates a carboxyl group by the action of an acid as a polar group, and since high interaction between a plurality of the carboxyl group by a hydrogen bond is indicated, it is possible to make the negative pattern to be formed insoluble or sparingly soluble in the solvent in the actinic ray-sensitive or radiation-sensitive resin composition (II) more certainly.

[Chem. 2]

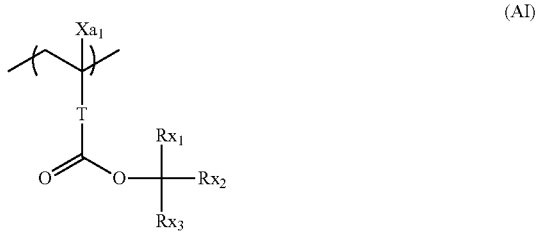

(AI)

In the general formula (AI), $X_{a1}$ represents a hydrogen atom, an alkyl group, a cyano group or a halogen atom.

T represents a single bond or a divalent linking group.

$Rx_1$ to $Rx_3$ each independently represent an alkyl group or a cycloalkyl group.

Two of $Rx_1$ to $Rx_3$ may be bonded to each other to form a ring structure.

Examples of the divalent linking group of T include an alkylene group, a —COO-Rt- group, a —O-Rt- group, and a phenylene group. In the formula, Rt represents an alkylene group or a cycloalkylene group.

T is preferably a single bond or a —COO-Rt- group. Rt is preferably an alkylene group having 1 to 5 carbon atoms, and more preferably a —CH$_2$— group, —(CH$_2$)$_2$— group, and —(CH$_2$)$_3$— group. T is more preferably a single bond.

The alkyl group of $X_{a1}$ may have a substituent, and examples of the substituent include a hydroxyl group and a halogen atom (preferably, a fluorine atom).

The alkyl group of $X_{a1}$ preferably has 1 to 4 carbon atoms and examples thereof may include a methyl group, an ethyl group, a propyl group, a hydroxymethyl group, a trifluoromethyl group, or the like. Among these, a methyl group is preferable.

$X_{a1}$ is preferably a hydrogen atom or a methyl group.

The alkyl group of $Rx_1$, $Rx_2$, and $Rx_3$ may be linear or branched, and preferred examples thereof include a methyl group, an ethyl group, an n-propyl group, an isopropyl group, an n-butyl group, an isobutyl group, and a t-butyl group. The number of carbon atoms of the alkyl group is preferably 1 to 10, and more preferably 1 to 5.

The cycloalkyl group of $R_{x1}$ to $R_{x3}$ is preferably a monocyclic cycloalkyl group such as a cyclopentyl group or a cyclohexyl group; or a polycyclic cycloalkyl group such as a norbornyl group, a tetracyclodecanyl group, a tetracyclododecanyl group, or an adamantyl group.

As the ring structure formed by mutual bonding of two of $Rx_1$, $Rx_2$, and $Rx_3$, a monocyclic cycloalkane ring such as a cyclopentyl ring and a cyclohexyl ring, or a polycyclic cycloalkyl group such as a norbornane ring, a tetracyclodecane ring, a tetracyclododecane ring, and an adamantane ring is preferable. Further, a monocyclic cycloalkane ring having 5 or 6 carbon atoms is particularly preferable.

It is preferable that each of $Rx_1$, $Rx_2$, and $Rx_3$ be independently an alkyl group, and more preferable that each of $Rx_1$, $Rx_2$, and $Rx_3$ be a linear or branched alkyl group having 1 to 4 carbon atoms.

The respective groups may have substituents, and examples of the substituents may include an alkyl group (having 1 to 4 carbon atoms), a cycloalkyl group (having 3 to 8 carbon atoms), a halogen atom, an alkoxy group (having 1 to 4 carbon atoms), a carboxyl group, and an alkoxycarbonyl group (having 2 to 6 carbon atoms), and the number of carbon atoms thereof is preferably 8 or less. Among these, a substituent which does not have a hetero atom such as an oxygen atom, a nitrogen atom or a sulfur atom is more preferable (for example, a group which is not an alkyl group substituted with a hydroxyl group or the like is more preferable) from the viewpoint of further improving dissolution contrast on a developer containing an organic solvent before and after acid decomposition, a group formed only from hydrogen atoms and carbon atoms is even more preferable and a linear or branched alkyl group, or a cycloalkyl group is particularly preferable.

In the general formula (AI), it is preferable that each of $Rx_1$ to $Rx_3$ be independently an alkyl group, and two of $Rx_1$ to $Rx_3$ be not linked to each other to form a ring. In this way, increase in volume of the group represented by —C($Rx_1$)($Rx_2$)($Rx_3$) as a group that decomposes by the action of an acid to be detached can be suppressed, and decrease in volume of the exposed portion in the post exposure bake process which may be carried out in the exposure process or subsequent to the exposure process tends to be suppressed.

Hereinafter, specific examples of the repeating unit represented by the general formula (AI) will be described, but the present invention is not limited thereto.

Among the specific examples, Rx represents a hydrogen atom, CH$_3$, CF$_3$, or CH$_2$OH. Rxa and Rxb each independently represent an alkyl group (preferably an alkyl group having 1 to 10 carbon atoms, and more preferably an alkyl group having 1 to 5 carbon atoms). $Xa_1$ represents a hydrogen atom, CH$_3$, CF$_3$ or CH$_2$OH. Z represents a substituent and when a plurality of Z's are present, the plurality of Z's may be the same as or different from each other. p represents 0 or a positive integer. Specific examples and preferred examples of Z are the same as the specific examples and preferred examples of the substituent that each group of $Rx_1$ to $Rx_3$ may have.

[Chem. 3]

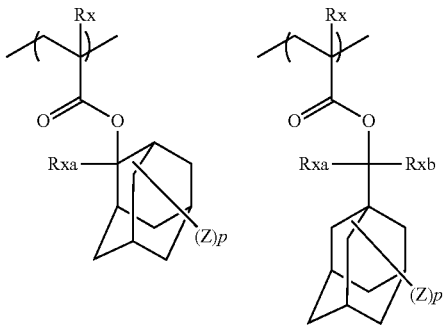

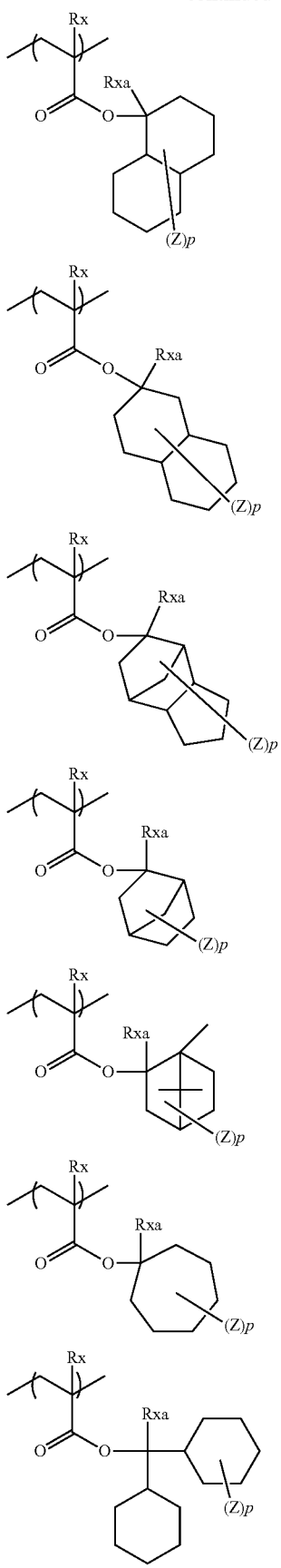
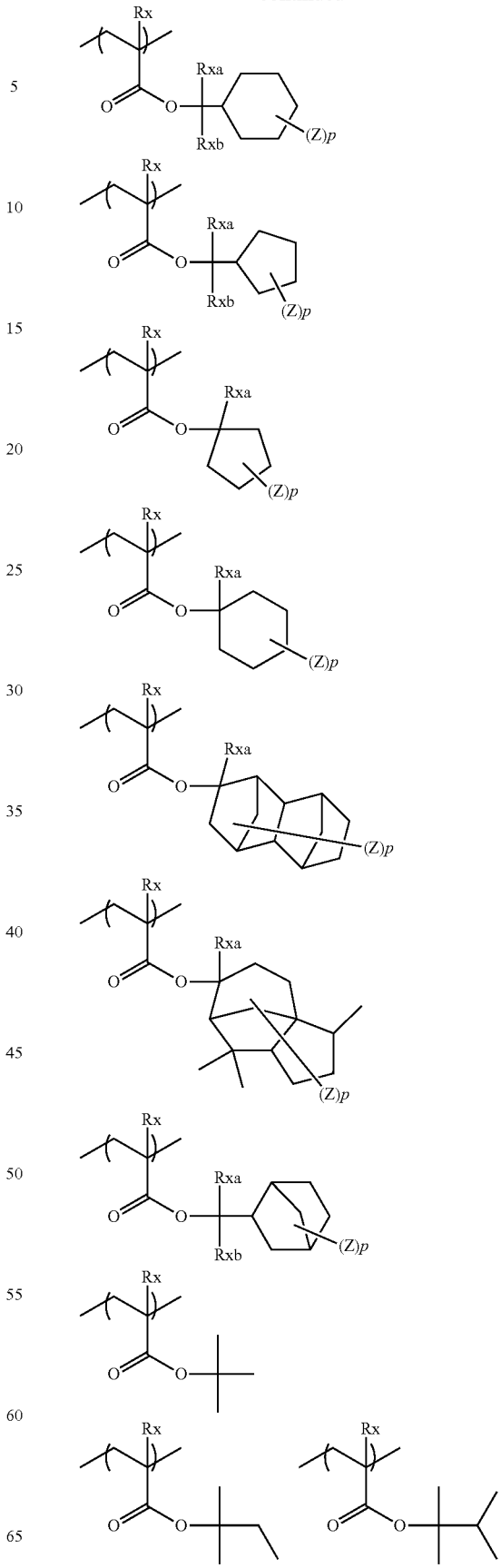

-continued
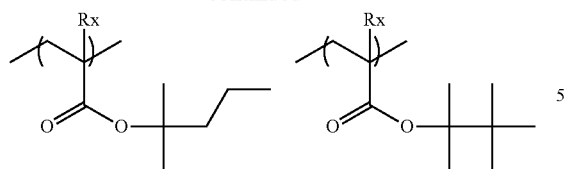
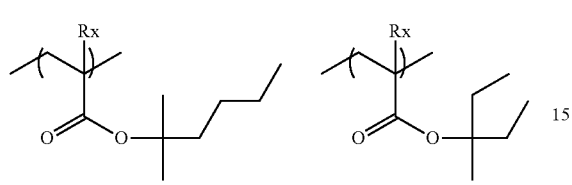
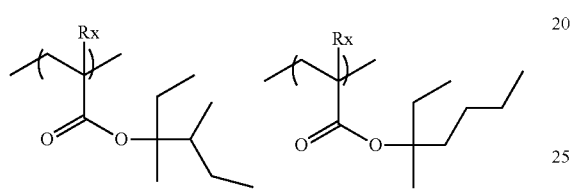
[Chem. 4]
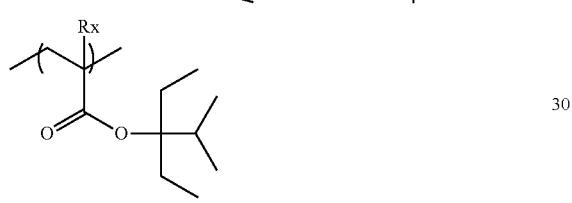
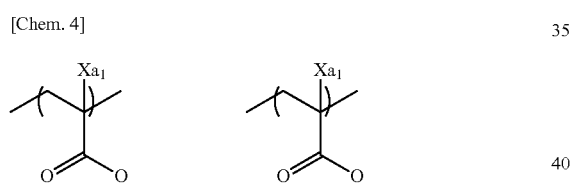
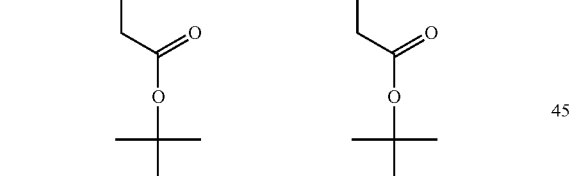
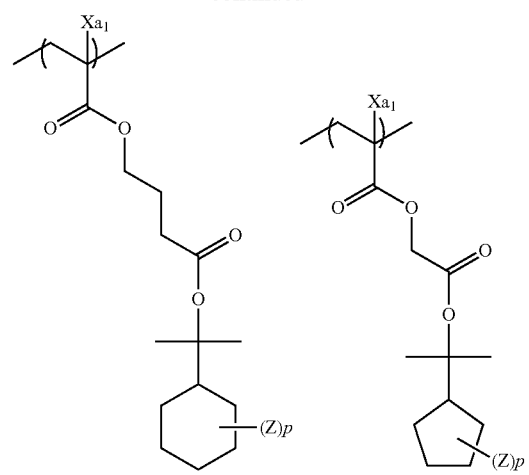
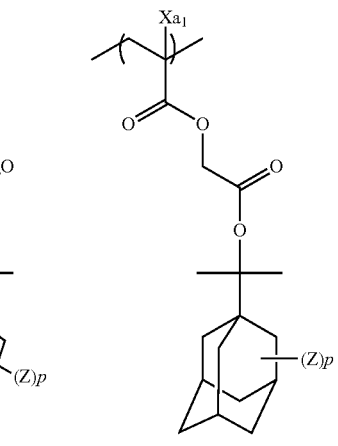
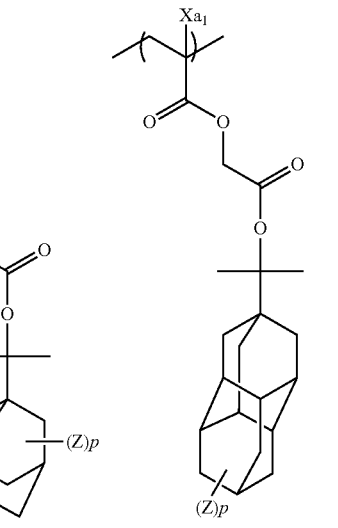

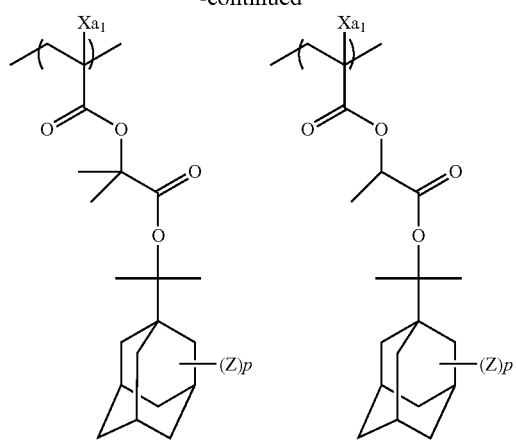
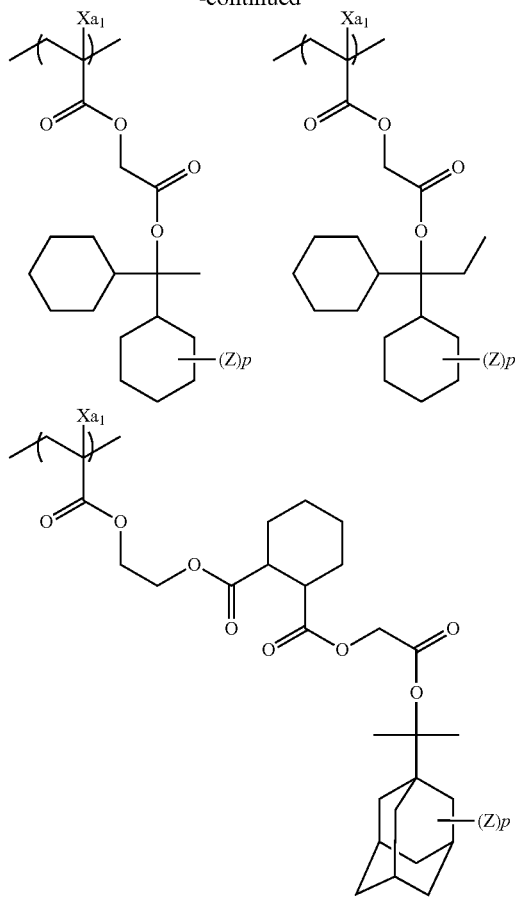
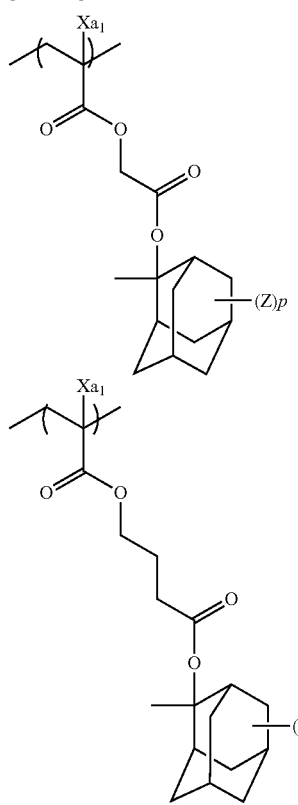
[Chem. 5]

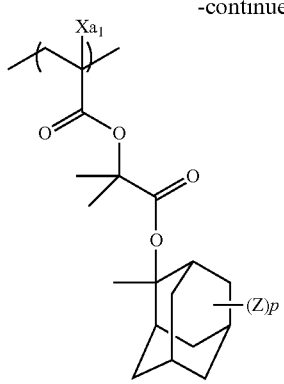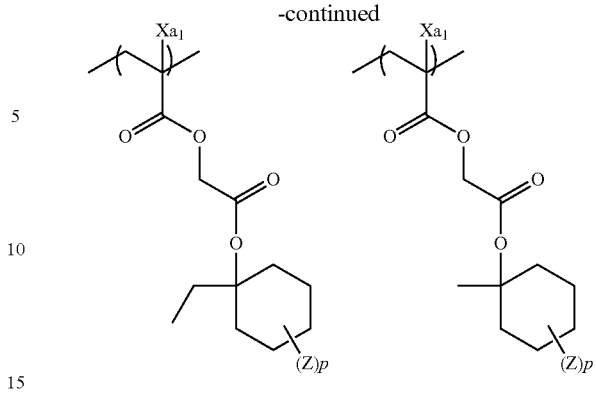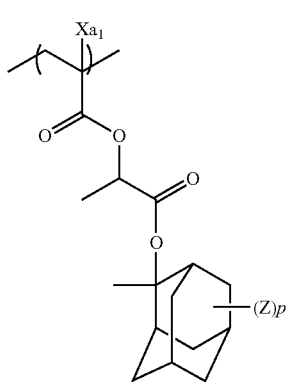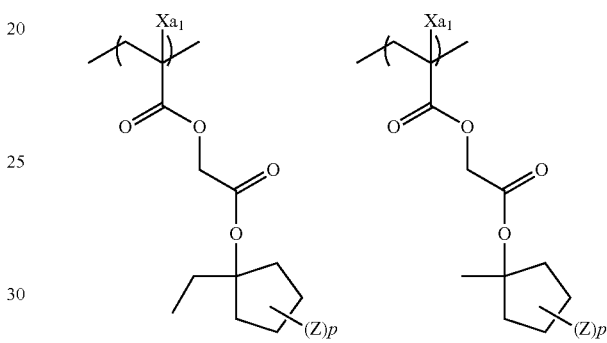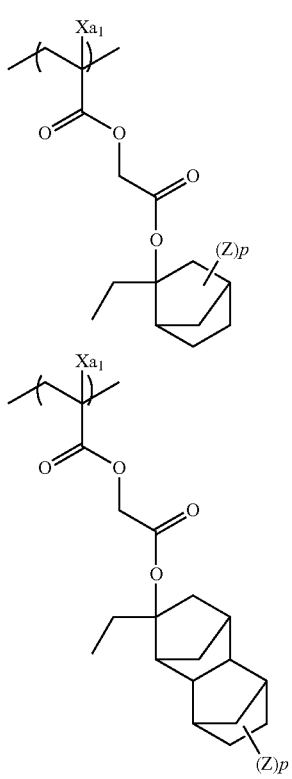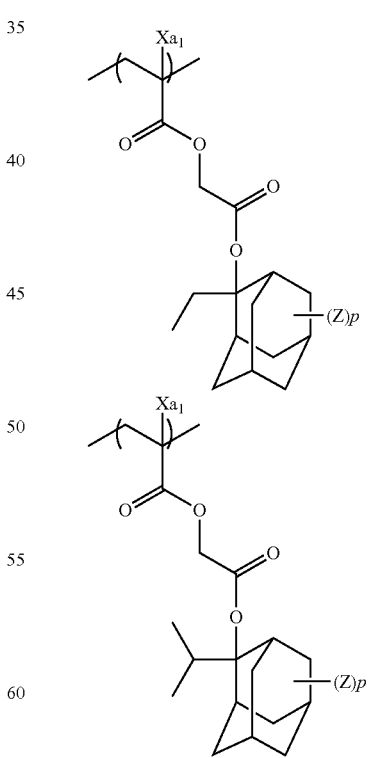
Further, the resin (A) preferably includes the repeating unit represented by the general formula (IV) below as a repeating unit having an acid-decomposable group.

[Chem. 6]

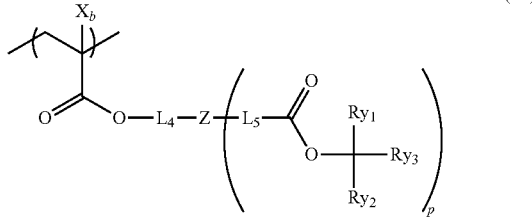

(IV)

In the general formula (IV) above, $X_b$ represents a hydrogen atom, an alkyl group, a cyano group, or a halogen atom.

$Ry_1$ to $Ry_3$ each independently represent an alkyl group or a cycloalkyl group. Any two of $Ry_1$ to $Ry_3$ may be linked to each other to form a ring.

Z represents a linking group having a valence of (p+1) and having a polycyclic hydrocarbon structure which may have a hetero atom as a ring member. Z preferably does not contain an ester bond as an atomic group constituting a polycyclic ring (in other words, Z preferably does not contain a lactone ring as a ring constituting a polycyclic ring).

$L_4$ and $L_5$ each independently represent a single bond or divalent linking group.

p represents an integer of 1 to 3.

When p is 2 or 3, plural $L_5$'s, plural $Ry_1$'s, plural $Ry_1$'s, and plural $Ry_1$'s may be the same as or different from each other.

The alkyl group of $X_b$ may have a substituent, and examples of the substituent include a hydroxyl group and a halogen atom (preferably, a fluorine atom).

The alkyl group of $X_b$ preferably has 1 to 4 carbon atoms and examples thereof may include a methyl group, an ethyl group, a propyl group, a hydroxymethyl group, a trifluoromethyl group, or the like. Among these, a methyl group is preferable.

$X_b$ is preferably a hydrogen atom or a methyl group.

Specific examples and preferred examples of the alkyl group and the cycloalkyl group of $Ry_1$ to $Ry_3$ are the same as the specific examples and the preferred examples of the alkyl group and the cycloalkyl group of $Rx_1$ to $Rx_3$ in the general formula (AI) above.

Specific examples and preferred examples of the ring structure formed by mutual linking of two of $Ry_1$ to $Ry_3$ are the same as the specific examples and the preferred examples of the ring structure formed by mutual linking of $Rx_1$ to $Rx_3$ in the general formula (AI) above.

$Ry_1$ to $Ry_3$ are each independently preferably an alkyl group, and more preferably a linear or branched alkyl group having 1 to 4 carbon atoms. In addition, the total number of carbon atoms of the linear or branched alkyl group as $Ry_1$ to $Ry_3$ is preferably 5 or less.

$Ry_1$ to $Ry_3$ may further include a substituent, and examples of the substituent are the same as those described for the substituent that $Rx_1$ to $Rx_3$ may include in the general formula (AI) above.

The linking group having a polycyclic hydrocarbon structure of Z may include a ring assembly hydrocarbon ring group or a crosslinked cyclic hydrocarbon ring group, and examples thereof may include a group obtained by removing any (p+1) hydrogen atoms from a ring assembly hydrocarbon ring, and a group obtained by removing any (p+1) hydrogen atoms from a crosslinked cyclic hydrocarbon ring.

Examples of the ring assembly hydrocarbon ring group may include a bicyclohexane ring group and a perhydronaphthalene ring group. Examples of the crosslinked cyclic hydrocarbon ring group may include bicyclic hydrocarbon ring groups such as a pinane ring group, a bornane ring group, a norpinane ring group, a norbornane ring group, and a bicyclooctane ring group, (a bicyclo[2.2.2]octane ring group, a bicyclo[3.2.1]octane ring group, or the like); tricyclic hydrocarbon ring groups such as a homobrendane ring group, an adamantane ring group, a tricyclo[5.2.1.0$^{2,6}$]decane ring group, and a tricyclo[4.3.1.1$^{2,5}$]undecane ring group; and tetracyclic hydrocarbon ring groups such as a tetracyclo[4.4.0.1$^{2,5}$.1$^{7,1}$]dodecane ring group, and a perhydro-1,4-methano-5,8-methanonaphthalene ring group. In addition, as the crosslinked cyclic hydrocarbon ring group, a condensed cyclic hydrocarbon ring group, for example, a condensed cyclic group in which a plurality of 5- to 8-membered cycloalkane ring groups such as a perhydronaphthalene (decalin) ring group, a perhydroanthracene ring group, a perhydrophenanthrene ring group, a perhydroacenaphthene ring group, a perhydrofluorene ring group, a perhydroindene ring group, a perhydrophenalene ring group are condensed, may be included.

The preferred examples of the crosslinked hydrocarbon ring group may include a norbornane ring group, an adamantane ring group, a bicyclooctane ring group, and a tricycle[5,2,1,0$^{2,6}$]decane ring group. As the more preferable crosslinked cyclic hydrocarbon ring group, a norbornane ring group or an adamantane ring group may be included.

The linking group represented by Z having a polycyclic hydrocarbon structure may have a substituent. Examples of the substituent that Z may include an alkyl group, a hydroxyl group, a cyano group, a keto group (an alkyl carbonyl group and the like), an acyloxy group, —COOR, —CON(R)$_2$, —SO$_2$R, —SO$_3$R, and —SO$_2$N(R)$_2$. Here, R represents a hydrogen atom, an alkyl group, a cycloalkyl group or an aryl group.

The alkyl group, alkyl carbonyl group, acyloxy group, —COOR, —CON(R)$_2$, —SO$_2$R, —SO$_3$R, and —SO$_2$N(R)$_2$ as the substituents that Z may contain may further have substituents, and examples of the substituents may include a halogen atom (preferably, a fluorine atom).

In the linking group having a polycyclic hydrocarbon structure represented by Z, the carbon atoms constituting the polycyclic ring (carbon atoms contributing to ring formation) may be carbonyl carbon atoms. In addition, the polycyclic ring thereof, as described above, may have a hetero atom such as an oxygen atom, sulfur atom, or the like as a ring member. However, as described above, Z does not contain an ester bond as an atomic group constituting a polycyclic ring.

Examples of the linking group represented by $L_4$ and $L_5$ may include —COO—, —OCO—, —CONH—, —NHCO—, —CO—, —O—, —S—, —SO—, —SO$_2$—, an alkylene group (preferably, having 1 to 6 carbon atoms), a cycloalkylene group (preferably, having 3 to 10 carbon atoms), an alkenylene group (preferably having 2 to 6 carbon atoms), or a linking group combining plural groups of these, while a linking group having 12 or less carbon atoms in total is preferable.

$L_4$ is preferably a single bond, an alkylene group, —COO—, —OCO—, —CONH—, —NHCO—, an -alkylene group-COO—, an -alkylene group-OCO—, an -alkylene group-CONH—, an -alkylene group-NHCO—, —CO—, —O—, —SO$_2$—, or an -alkylene group-O—, and more preferably a single bond, an alkylene group, an -alkylene group-COO—, or an -alkylene group-O—.

$L_5$ is preferably a single bond, an alkylene group, —COO—, —OCO—, —CONH—, —NHCO—, a —COO-alkylene group-, a —OCO-alkylene group-, a —CONH-alkylene group-, a —NHCO-alkylene group-, —CO—, —O—, —SO$_2$—, a —O-alkylene group-, or a —O-cycloalkylene group, and more preferably a single bond, an alkylene group, a —COO-alkylene group-, a —O-alkylene group-, or a —O-cycloalkylene group.

In the method described above, the bond "—" at the left end means that in the case of $L_4$, the linking group is connected to the ester bond on the main chain side, while in the case of $L_5$, the linking group is connected to Z. The bond "—" at the right end means that in the case of $L_4$, the linking group is connected to Z, while in the case of $L_5$, the linking group is bonded to the ester bond that is connected to a group represented by $(Ry_1)(Ry_2)(Ry_3)C$—.

Meanwhile, $L_4$ and $L_5$ may be bonded to the same atom constituting the polycyclic ring for Z.

p is preferably 1 or 2, and more preferably 1.

Specific examples of the repeating unit represented by the general formula (IV) will be shown below, but the present invention is not limited to these. In the following specific examples, Xa represents a hydrogen atom, an alkyl group, a cyano group or a halogen atom.

[Chem. 7]

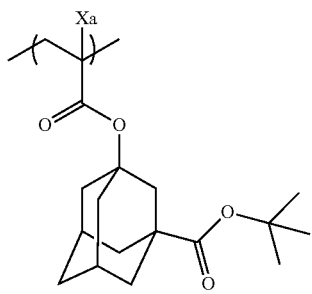

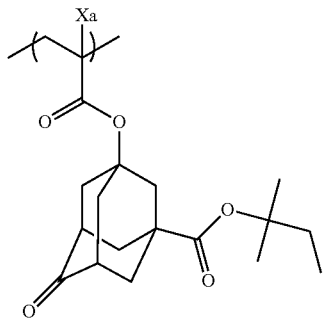

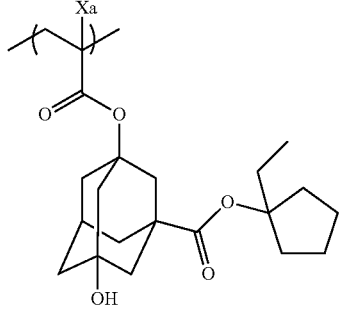

-continued

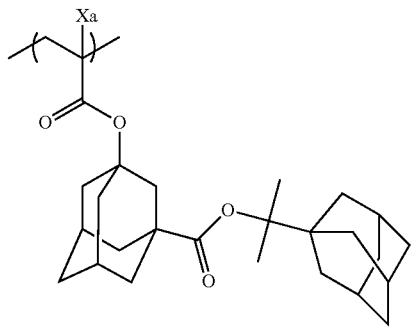

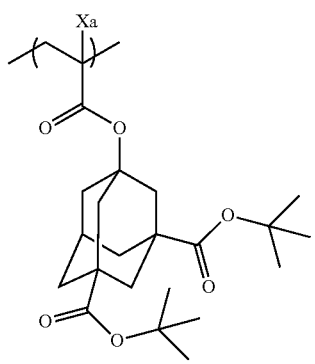

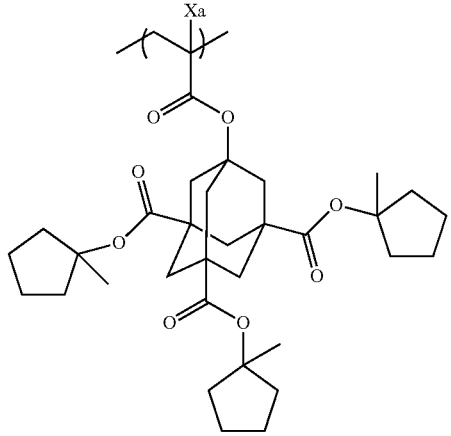

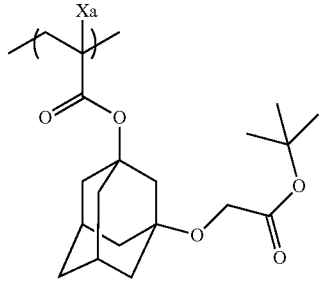

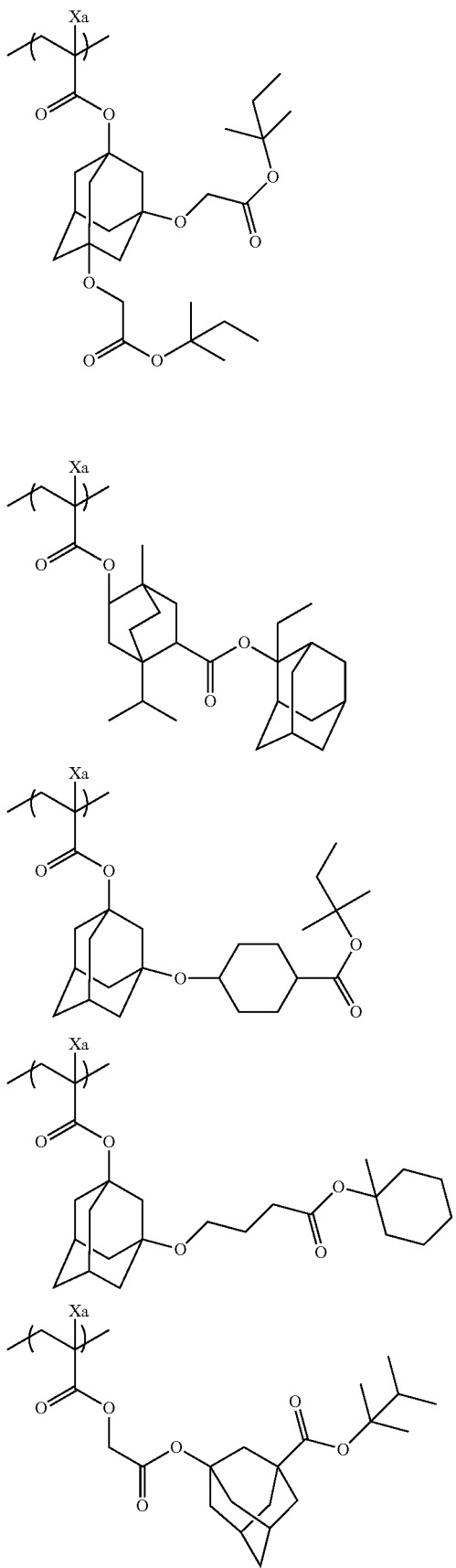
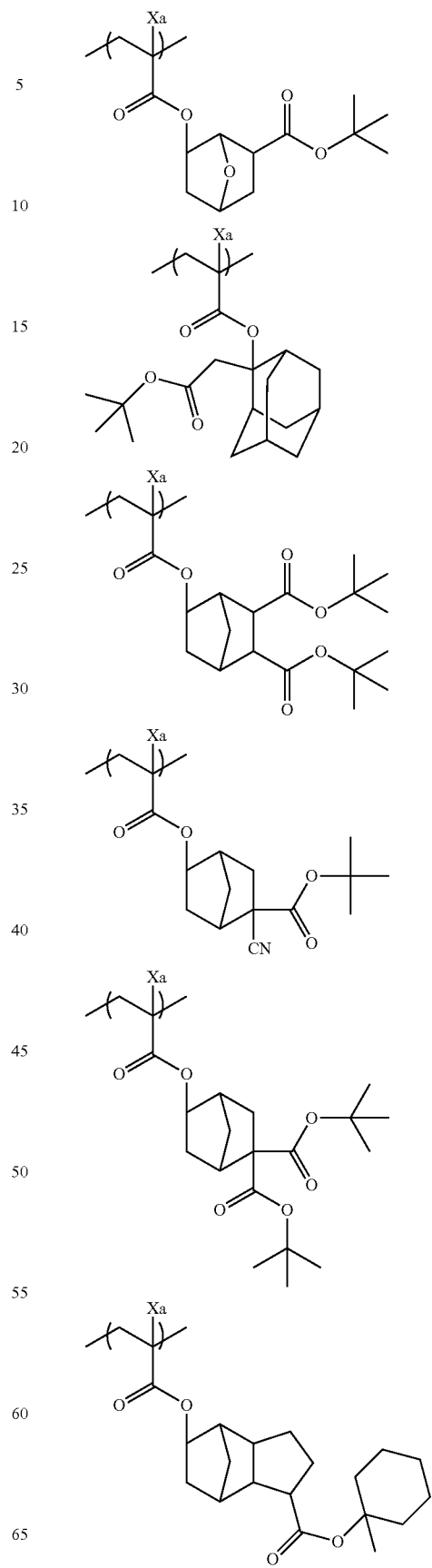

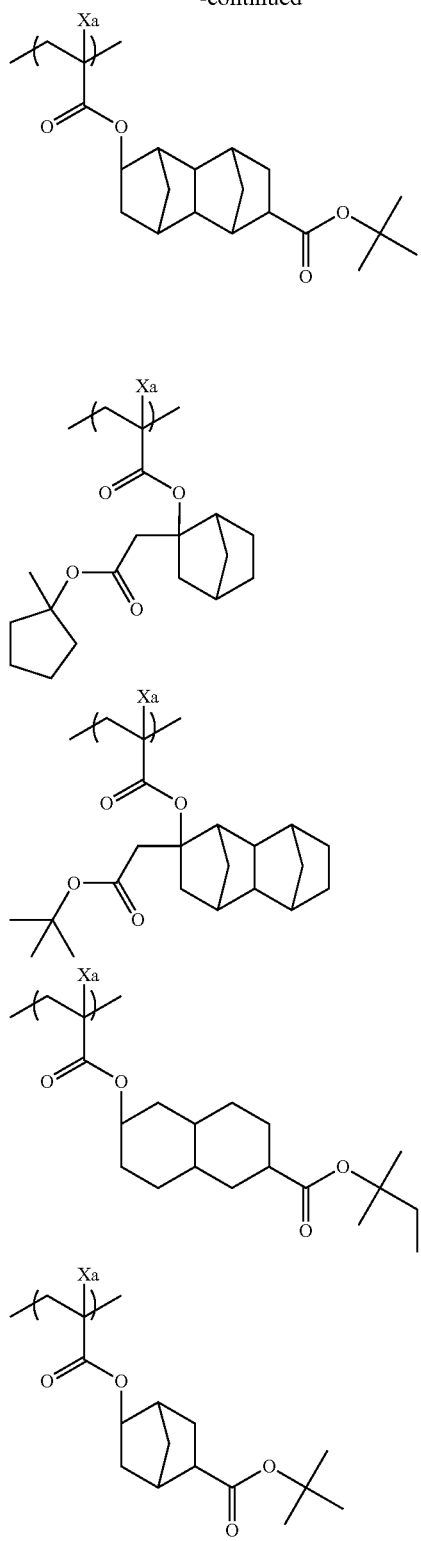
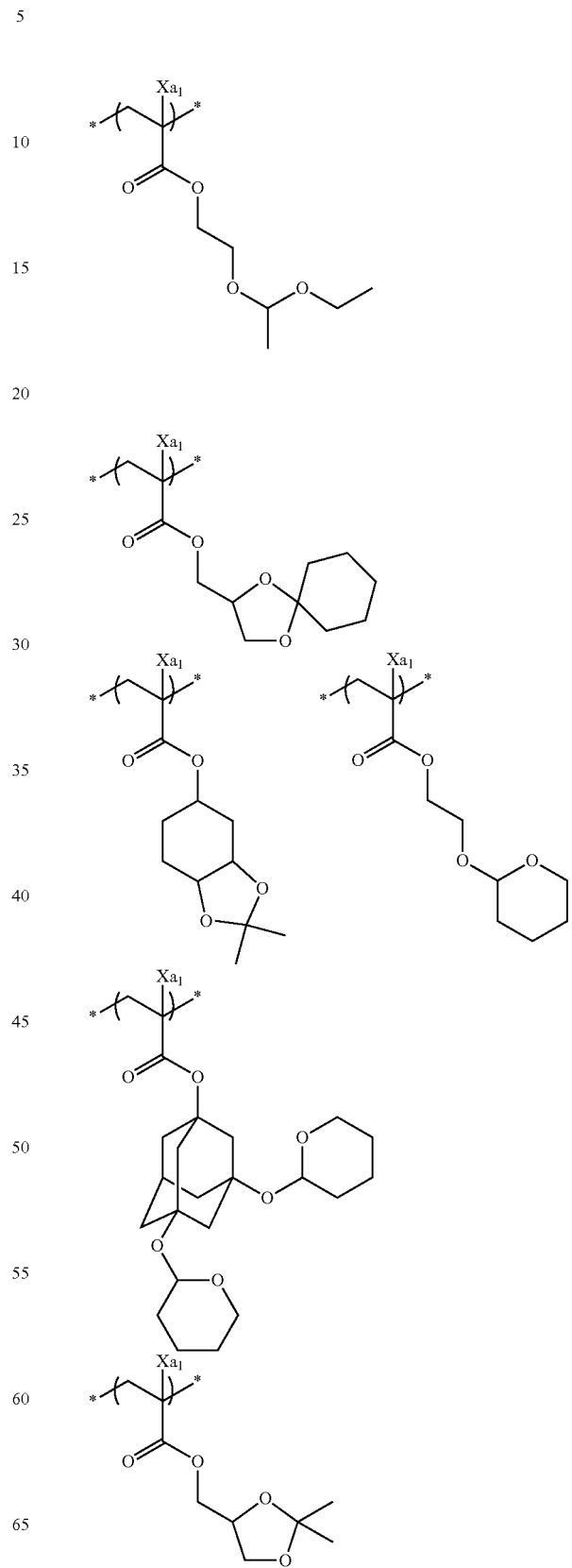
[Chem. 8]
In addition, the resin (A) may include a repeating unit that decomposes by the action of an acid and generates an alcoholic hydroxyl group, as represented below, as the repeating unit having an acid-decomposable group.
In the following specific examples, $Xa_1$ represents a hydrogen atom, $CH_3$, $CF_3$, or $CH_2OH$.

39
-continued
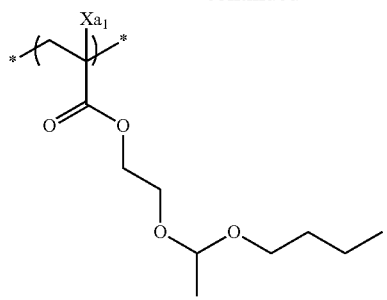
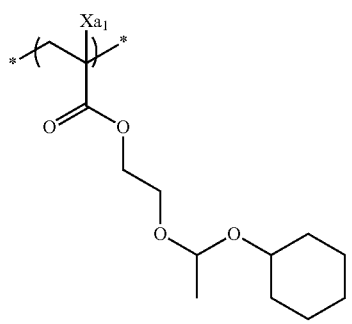
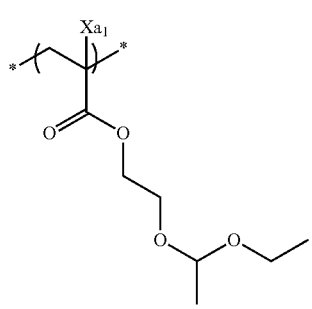
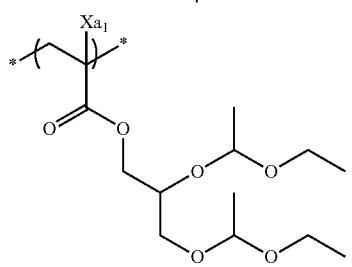
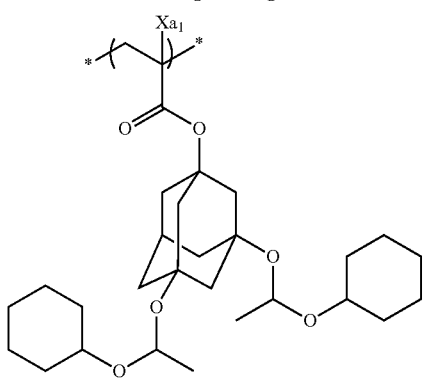
40
-continued
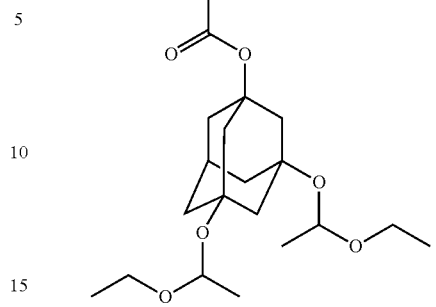
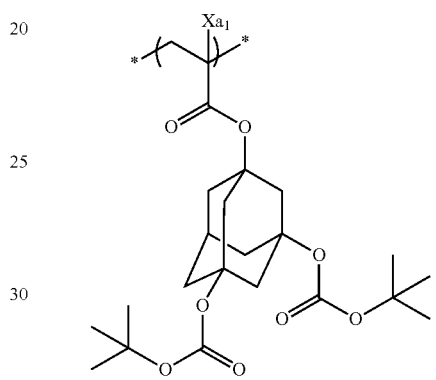
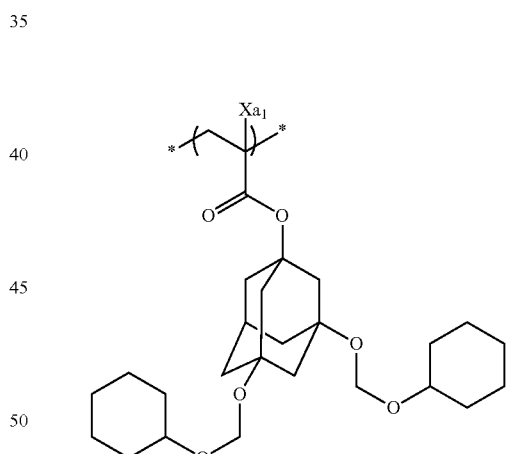
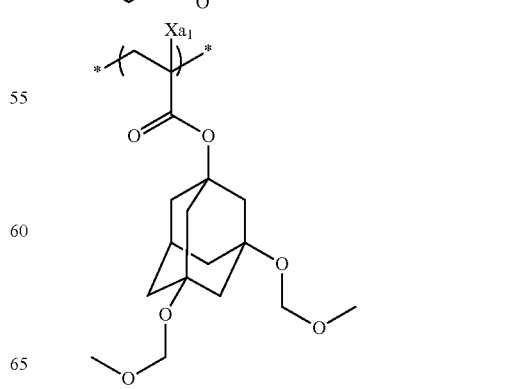

-continued

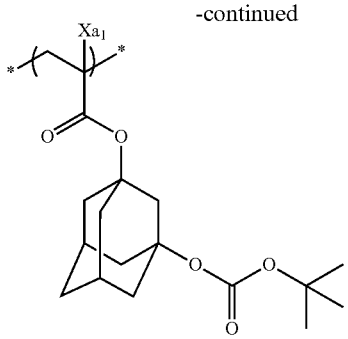

The repeating unit having an acid-decomposable group may be of one kind, or two or more kinds may be used in combination.

The content of the repeating unit having an acid-decomposable group contained in the resin (A) (when a plurality of the repeating units having an acid-decomposable group are contained, the sum thereof) is preferably 15% by mole or more, more preferably 20% by mole or more, still more preferably 25% by mole or more, and particularly preferably 40% by mole or more based on the total content of the repeating units of the resin (A). Among these, the resin (A) includes a repeating unit represented by the general formula (AI), and the content of the repeating unit represented by the general formula (AI) above is preferably 40% by mole or more based on the total content of the repeating units of the resin (A).

The resin present in the formed negative pattern is to have a large amount of polar groups by setting the content of the repeating unit having an acid-decomposable group to 40% by mole or more based on the total content of the repeating units of the resin (A). As a result, since the polar groups sufficiently interact with each other (a hydrogen bond or the like), it is possible to make the negative pattern be insoluble or sparingly soluble in the solvent in the actinic ray-sensitive or radiation-sensitive resin composition (II) more certainly.

Further, the content of the repeating unit having an acid-decomposable group is preferably 80% by mole or less, more preferably 70% by mole or less, and still more preferably 65% by mole or less based on the total content of the repeating units of the resin (A).

The resin (A) may include a repeating unit having a lactone structure or a sultone structure.

As the lactone structure or the sultone structure, any structure can be used as long as a structure includes a lactone structure or a sultone structure, but preferred examples thereof include a 5- to 7-membered lactone structure or a 5- to 7-membered sultone structure, and more preferred examples thereof include a structure in which a bicycle structure and a spiro structure are formed in a 5- to 7-membered lactone structure and another ring structure is condensed thereto, or a structure in which a bicycle structure and a spiro structure are formed in a 5- to 7-membered sultone structure and another ring structure is condensed thereto. It is more preferable to have a repeating unit having a lactone structure represented by any one of the following general formulae (LC1-1) to (LC1-21) or a sultone structure represented by any one of the following general formulae (SL1-1) to (SL1-3). In addition, the lactone structure or the sultone structure may be bonded directly to a main chain. Preferred lactone structures include (LC1-1), (LC1-4), (LC1-5), (LC1-6), (LC1-13), (LC1-14), and (LC1-17), and a particularly preferred lactone structure is (LC1-4). By using the specific lactone structure, line edge roughness (LER) and developing defects are improved.

[Chem. 9]

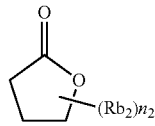

LC1-1

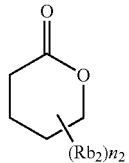

LC1-2

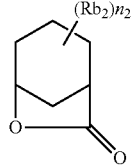

LC1-3

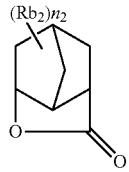

LC1-4

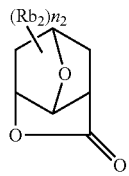

LC1-5

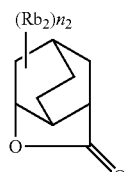

LC1-6

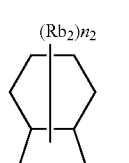

LC1-7

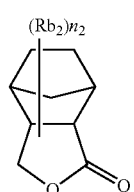

LC1-8

LC1-9 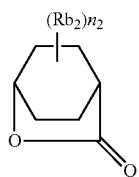

LC1-10 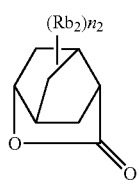

LC1-11 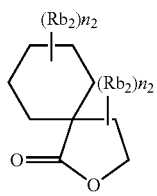

LC1-12 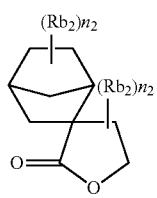

LC1-13 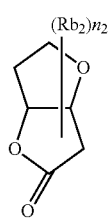

LC1-14 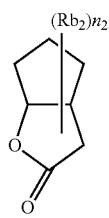

LC1-15 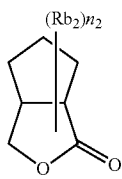

LC1-16 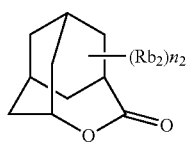

LC1-17 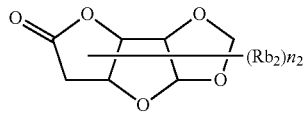

LC1-18 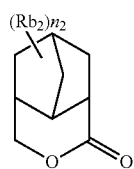

LC1-19 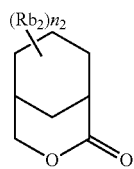

LC1-20 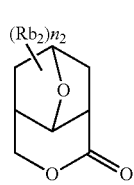

LC1-21 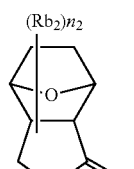

SL1-1 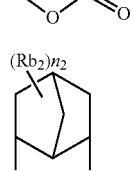

SL1-2 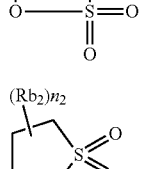

SL1-3 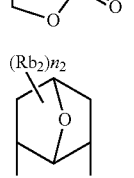

The lactone structure or the sultone structure moiety may or may not have a substituent ($Rb_2$). Preferred examples of the substituent ($Rb_2$) include an alkyl group having 1 to 8 carbon atoms, a cycloalkyl group having 4 to 7 carbon atoms, an alkoxy group having 1 to 8 carbon atoms, an alkoxycarbonyl group having 2 to 8 carbon atoms, a carboxyl group, a halogen atom, a hydroxyl group, a cyano group, and an acid-decomposable group. An alkyl group having 1 to 4 carbon atoms, a cyano group or an acid-decomposable group is more preferable. $n_2$ represents an integer of 0 to 4. When $n_2$ is 2 or greater, the plural substituents ($Rb_2$) may the same as or different from each other. Also, plural substituents ($Rb_2$) may be bonded with each other to form a ring.

The repeating unit having a lactone structure or a sultone structure generally includes optical isomers, however, any optical isomer may be used. In addition, one kind of optical isomer may be used alone or a plurality of optical isomers may be mixed and used. If one kind of optical isomer is mainly used, optical purity (ee) thereof is preferably 90% or more, and more preferably 95% or more.

The repeating unit including a lactone structure or a sultone structure is preferably a repeating unit represented by the general formula (III) below.

[Chem. 10]

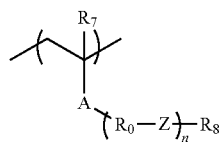

(III)

In the general formula (III), A represents an ester bond (a group represented by —COO—) or an amide bond (a group represented by —CONH—).

When a plurality of $R_0$'s are present, $R_0$'s each independently represent an alkylene group, a cycloalkylene group, or a combination thereof.

When a plurality of Z's are present, Z's each independently represent a single bond, an ether bond, an ester bond, an amide bond, a urethane bond, or a urea bond.

[Chem. 11]

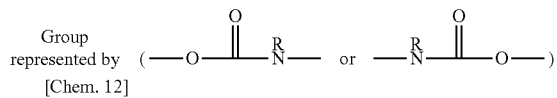

[Chem. 12]

Group represented by ( —N—CO—N— )

Here, R's each independently represent a hydrogen atom, an alkyl group, a cycloalkyl group, or an aryl group.

$R_8$ represents a monovalent organic group having a lactone structure or a sultone structure.

n is a repetition number of a structure represented by —$R_0$—Z— and represents an integer of 0 to 5, preferably 0 or 1, and more preferably 0. When n is 0, —$R_0$—Z— is not present, therefore, n becomes a single bond.

$R_7$ represents a hydrogen atom, a halogen atom, or an alkyl group.

The alkylene group or the cycloalkylene group of $R_0$ may have a substituent.

Z is preferably an ether bond or an ester bond, and particularly preferably an ester bond.

The alkyl group of $R_7$ is preferably an alkyl group having 1 to 4 carbon atoms, more preferably a methyl group or an ethyl group, and particularly preferably a methyl group.

The alkylene group and the cycloalkylene group of $R_0$, and the alkyl group in $R_7$ may be substituted, and examples of the substituent include halogen atoms such as a fluorine atom, a chlorine atom, and a bromine atom; an alkoxy group such as a mercapto group, a hydroxyl group, a methoxy group, an ethoxy group, an isopropoxy group, a t-butoxy group, or a benzyloxy group; an acyloxy group such as an acetyloxy group or a propionyloxy group.

$R_7$ is preferably a hydrogen atom, a methyl group, a trifluoromethyl group, or a hydroxymethyl group.

A chain alkylene group in $R_0$ is preferably a chain alkylene group having 1 to 10 carbon atoms, and more preferably having 1 to 5 carbon atoms, and examples thereof include a methylene group, an ethylene group, and a propylene group. The cycloalkylene group is preferably a cycloalkylene group having 3 to 20 carbon atoms, and examples thereof include a cyclohexylene group, a cyclopentylene group, a norbornylene group, and an adamantylene group. The chain alkylene groups are more preferred from the viewpoint of the exertion of the effect of the present invention, and a methylene group is particularly preferred.

The monovalent organic group having a sultone structure or a lactone structure represented by $R_8$ is not limited as long as the group has the lactone structure or the sultone structure, specific examples thereof include the sultone structure or the lactone structure represented by the general formulae (LC1-1) to (LC1-21), (SL1-1), and (SL1-3), and among these, the structure represented by (LC1-4) is particularly preferred. Further, $n_2$ in (LC1-1) to (LC1-21) is more preferably 2 or less.

Further, $R_8$ is preferably a monovalent organic group having an unsubstituted lactone structure or a sultone structure; or a monovalent organic group having a lactone structure or a sultone structure containing a methyl group, a cyano group or an alkoxycarbonyl group as a substituent; and more preferably a monovalent organic group having a lactone structure containing a cyano group (cyanolactone) as a substituent.

Specific examples of the repeating units containing a group having the lactone structure or sultone structure are shown below, but the present invention is not limited thereto.

[Chem. 13]

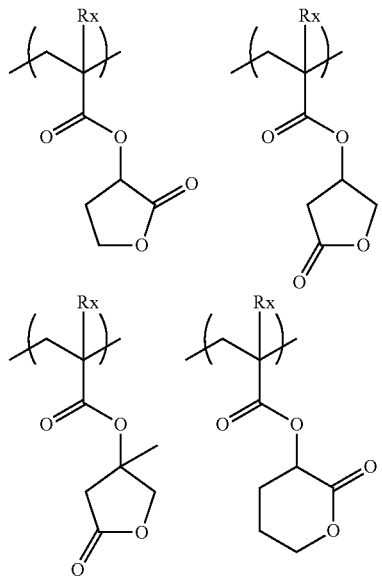

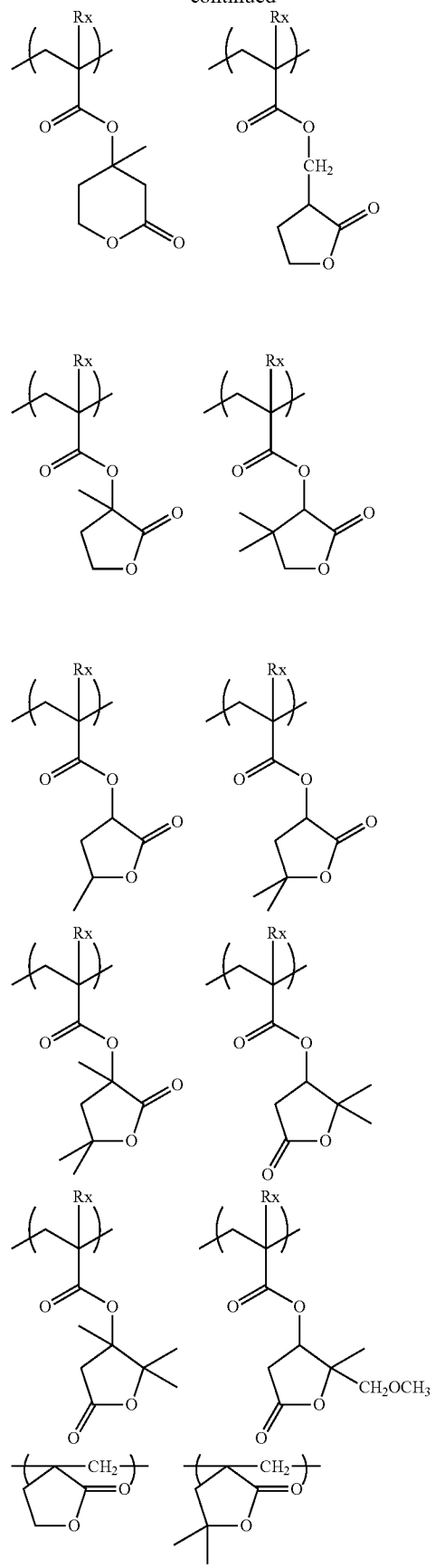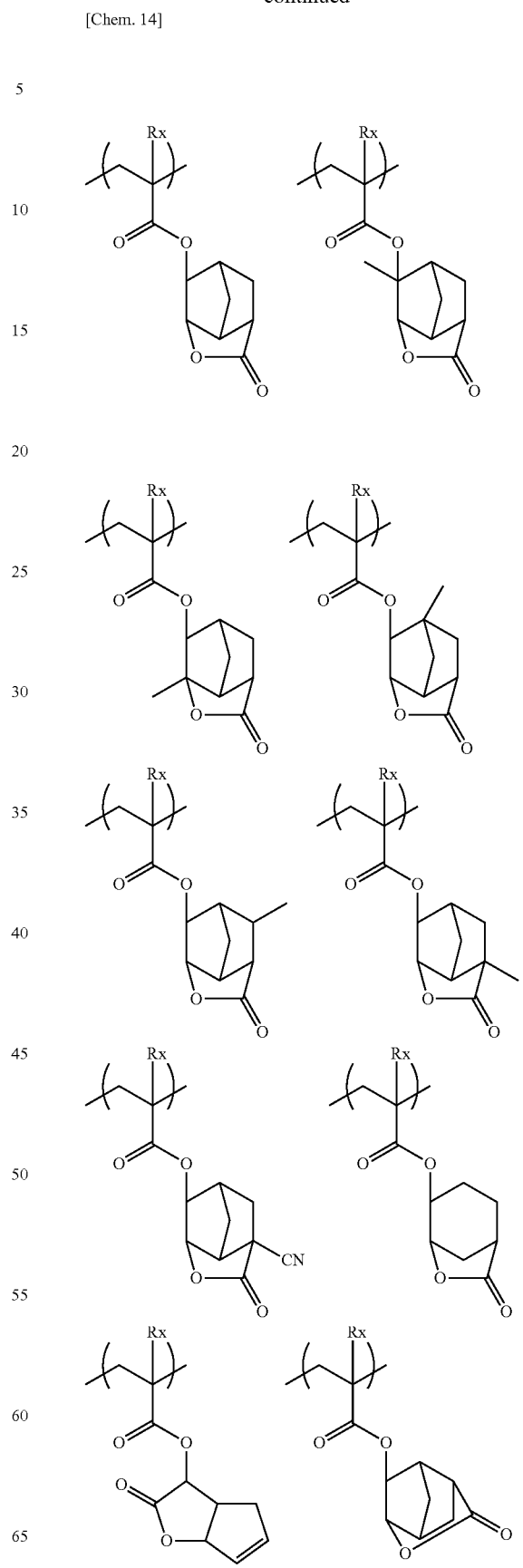
[Chem. 14]

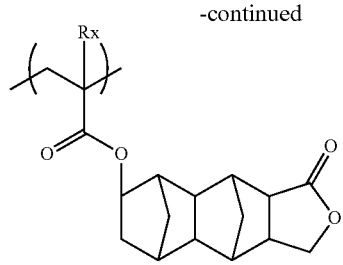
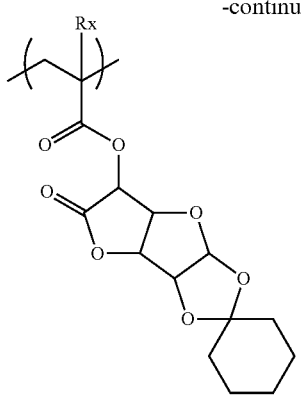
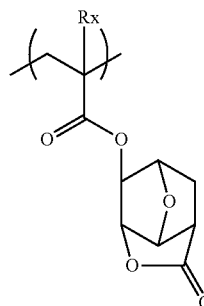
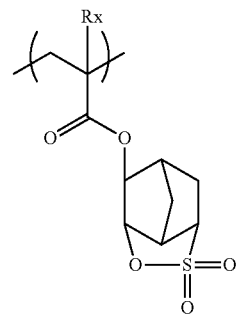
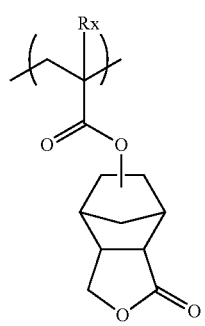
[Chem. 15]
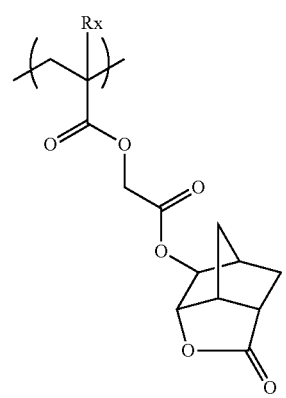
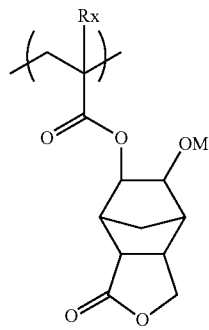
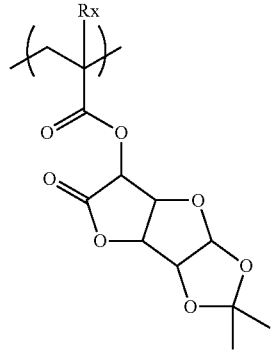
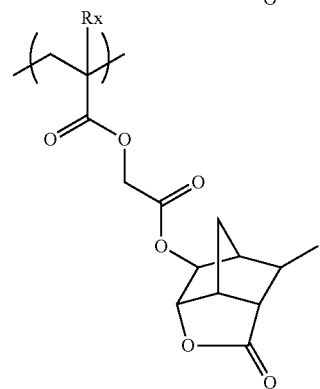

51
-continued
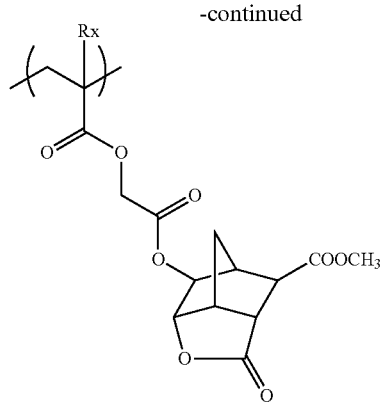
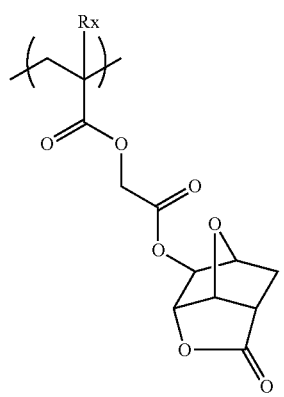
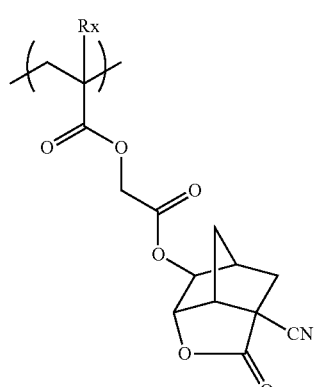
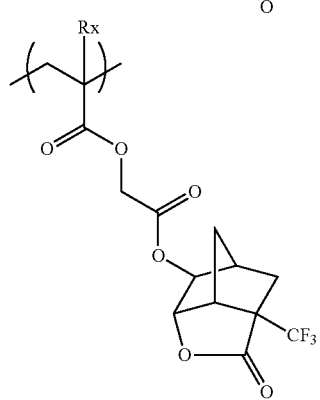
52
-continued
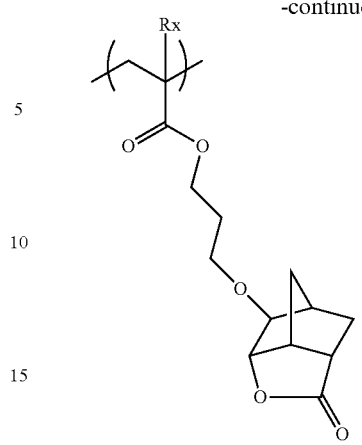
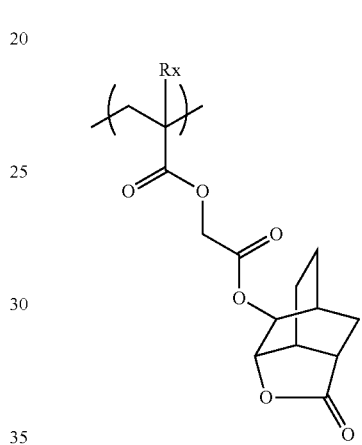
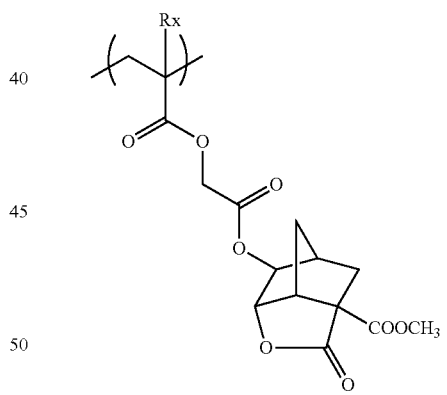
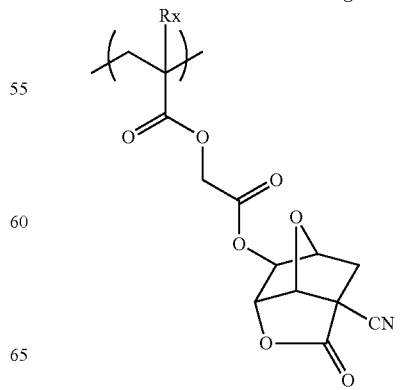

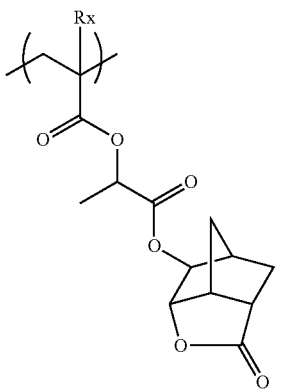

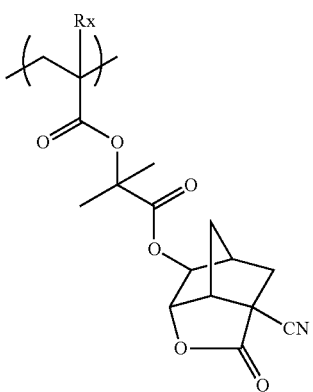

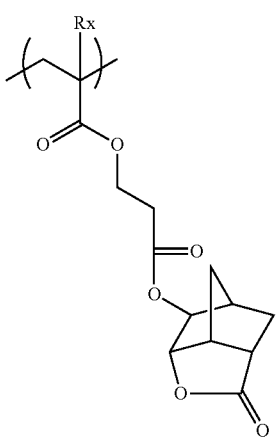

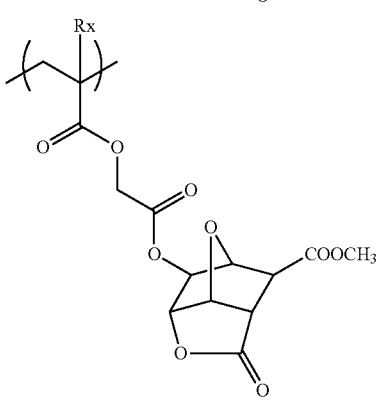

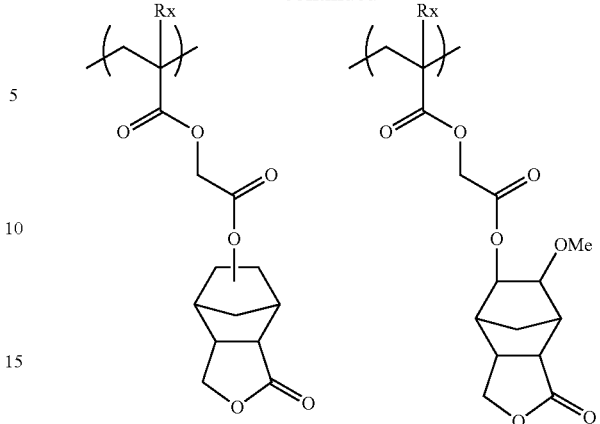

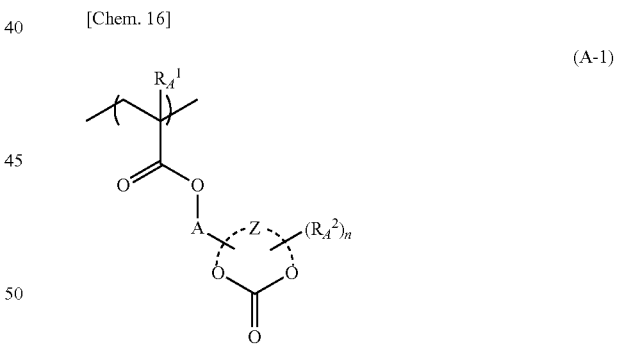

In formula, Rx represents H, CH$_3$, CH$_2$OH, or CF$_3$
In formula, Rx represents H, CH$_3$, CH$_2$OH, or CF$_3$
In formula, Rx represents H, CH$_3$, CH$_2$OH, or CF$_3$ The repeating units containing two or more kinds of lactone structures or sultone structures may be used together in order to increase the effect of the present invention.

In the case where the resin (A) includes a repeating unit having a lactone structure or a sultone structure, the content of the repeating unit having a lactone structure or a sultone structure is preferably 5% by mole to 60% by mole, more preferably 5% by mole to 55% by mole, and still more preferably 10% by mole to 50% by mole based on the total content of the repeating units in the resin (A).

Further, the resin (A) may include a repeating unit having a cyclic carbonic ester structure.

The repeating unit having a cyclic carbonic ester structure is preferably a repeating unit represented by the general formula (A-1) below.

[Chem. 16]

(A-1)

In the general formula (A-1), $R_A^1$ represents a hydrogen atom or an alkyl group.

When n is 2 or more, $R_A^2$'s each independently represent a substituent.

A represents a single bond or a divalent linking group.

Z represents an atomic group forming a cyclic or polycyclic structure together with a group represented by —O—C(=O)—O— in the formula.

n represents an integer of 0 or more.

The general formula (A-1) will be described in detail.

The alkyl group represented by $R_A^1$ may include a substituent such as a fluorine atom or the like. $R_A^1$ preferably represents a hydrogen atom, a methyl atom, or a trifluoromethyl group, and more preferably represents a methyl group.

Examples of the substituent represented by $R_A^2$ include an alkyl group, a cycloalkyl group, a hydroxyl group, an alkoxy group, an amino group, and an alkoxycarbonyl amino group. An alkyl group having 1 to 5 carbon atoms is preferred, examples thereof include a linear alkyl group having 1 to 5 carbon atoms such as a methyl group, an ethyl group, a propyl group, and a butyl group; and a branched alkyl group having 3 to 5 carbon atoms such as an isopropyl group, an isobutyl group, and a t-butyl group. The alkyl group may include a substituent such as a hydroxyl group and the like.

n is an integer of 0 or more which represents the number of substituents. n is preferably 0 to 4, and more preferably 0.

Examples of the divalent linking group represented by A include an alkylene group, a cycloalkylene group, an ester bond, an amide bond, an ether bond, a urethane bond, a urea bond, or the combinations thereof. The alkylene group is preferably an alkylene group having 1 to 10 carbon atoms, more preferably an alkylene group having 1 to 5 carbon atoms, and examples thereof include a methylene group, an ethylene group, and a propylene group.

According to an embodiment of the present invention, A is preferably a single bond or an alkylene group.

For example, in the cyclic carbonic ester represented by the general formula (a), the monocyclic ring containing —O—C(=O)—O— represented by Z may be a 5- to 7-membered ring which is $n_A$=2 to 4, is preferably a 5-membered ring or a 6-membered ring ($n_A$=2 or 3), and more preferably a 5-membered ring ($n_A$=2).

Examples of the polycyclic ring containing —O—C(=O)—O— represented by Z include a structure in which the cyclic carbonic ester represented by the general formula (a) below forms a condensed ring together with one or more other ring structures, and a structure forming a spiro ring. Other ring structures that may form a condensed ring or a spiro ring may be an alicyclic hydrocarbon group, an aromatic hydrocarbon group, or a heterocyclic group.

[Chem. 17]

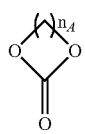

(a)

The monomers corresponding to the repeating unit represented by the general formula (A-1) below can be synthesized using a known method in the related art which is described in "Tetrahedron Letters", Vol. 27, No. 32, page 3741 (1986), "Organic Letters", Vol, 4, No. 15, page 2561 (2002), and the like.

The resin (A) may contain a single repeating unit among the repeating units represented by the general formula (A-1) or may contain two or more kinds thereof.

The content of the repeating unit having a cyclic carbonic ester structure (preferably the repeating unit represented by the general formula (A-1)) in the resin (A) is preferably 3% by mole to 80% by mole, more preferably 3% by mole to 60% by mole, particularly preferably 3% by mole to 30% by mole, and most preferably 10% by mole to 15% by mole based on the total content of the repeating units constituting the resin (A). In this content, developability as a resist, low defect property, low LWR, low PEB temperature dependency, profile and the like can be improved.

Hereinafter, specific examples of the repeating unit represented by the general formula (A-1) (repeating units (A-1a) to (A-1w)) will be described, but the present invention is not limited thereto.

In addition, $R_A^1$ in the specific examples below has the same definition as $R_A^1$ in the general formula (A-1).

[Chem. 18]

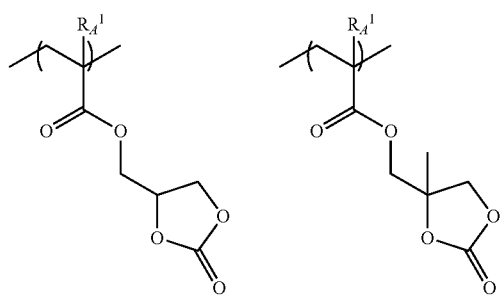

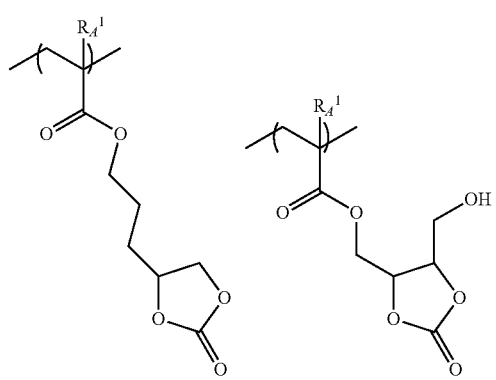

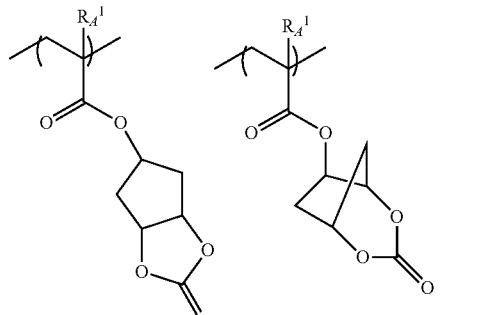

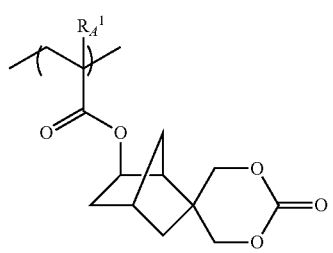

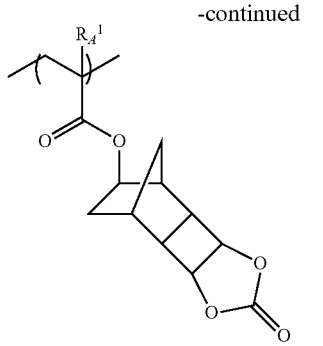
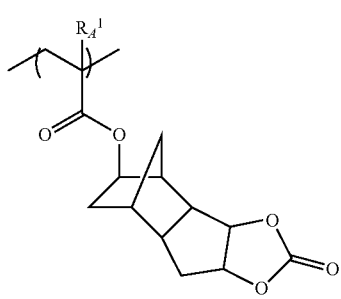
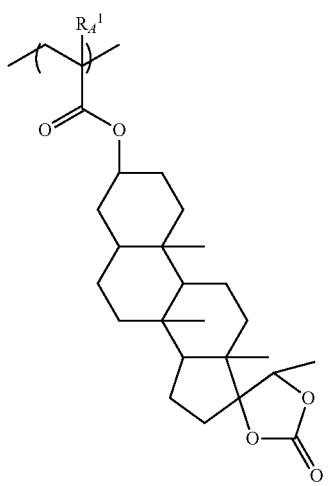
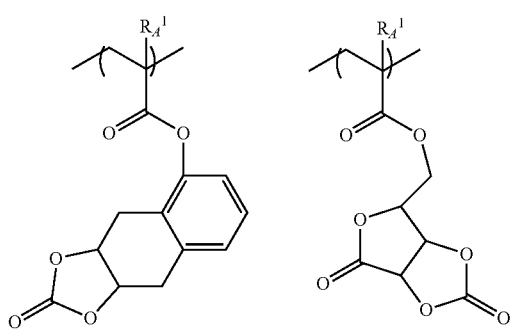
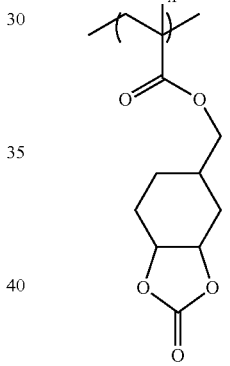
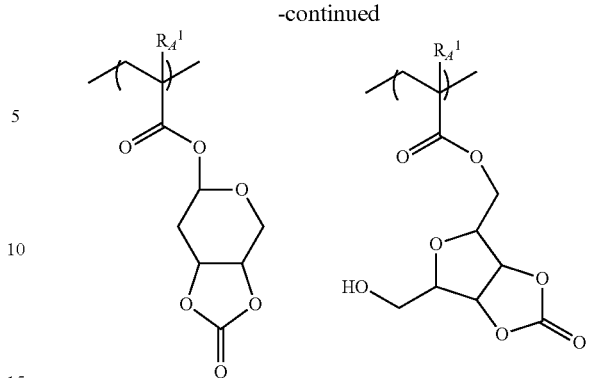
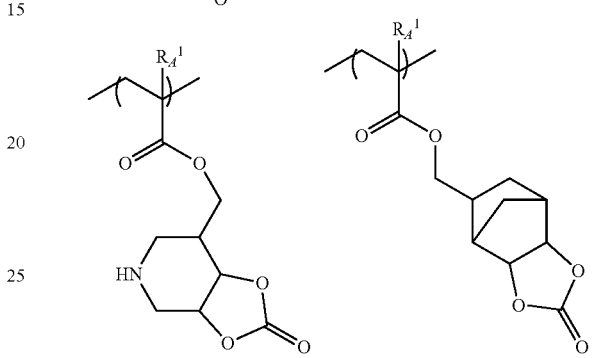

The resin (A) may have a repeating unit having a hydroxyl group or a cyano group. Thereby, the adhesiveness to substrates and the affinity to developers are enhanced. The repeating unit having a hydroxyl group or a cyano group is preferably a repeating unit having an alicyclic hydrocarbon structure substituted with a hydroxyl group or a cyano group, and preferably a repeating unit having no acid-decomposable groups.

Further, it is preferable that the repeating unit having an alicyclic hydrocarbon structure substituted with a hydroxyl group or a cyano group be different from the repeating unit having an acid-decomposable group (that is, preferably a repeating unit which is stable to an acid).

In the alicyclic hydrocarbon structure substituted with a hydroxyl group or a cyano group, the alicyclic hydrocarbon structure is preferably an adamantyl group, a diadamantyl group, or a norbornane group.

More preferred examples thereof include a repeating unit represented by any one of the general formulae (AIIa) to (AIIc) below.

[Chem. 19]

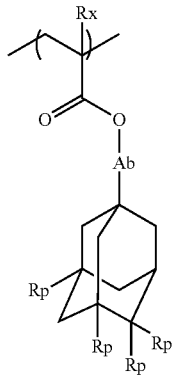
(AIIa)

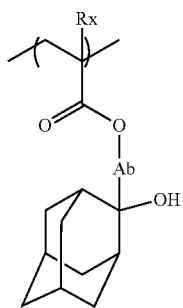
(AIIb)

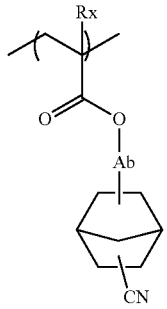
(AIIc)

In the formula, Rx represents a hydrogen group, a methyl group, a hydroxymethyl group, or a trifluoromethyl group.

Ab represents a single bond or a divalent linking group.

Examples of the divalent linking group represented by Ab include an alkylene group, a cycloalkylene group, an ester bond, an amide bond, an ether bond, a urethane bond, a urea bond, or a combination thereof. The alkylene group is preferably an alkylene group having 1 to 10 carbon atoms, more preferably an alkylene group having 1 to 5 carbon atoms, and examples thereof include a methylene group, an ethylene group, and a propylene group.

According to an embodiment of the present invention, Ab is preferably a single bond, or an alkylene group.

Rp represents a hydrogen atom, a hydroxyl group, or a hyrdoxyalkyl group. A plurality of Rp's may be the same as or different from each other, but at least one among the plurality of Rp's represents a hydroxyl group or a hydroxyalkyl group.

The resin (A) may or may not include a repeating unit having a hydroxyl group or a cyano group, but when the resin (A) includes a repeating unit having a hydroxyl group or a cyano group, the content of the repeating unit having a hydroxyl group or a cyano group is preferably 1% by mole to 40% by mole, more preferably 3% by mole to 30% by mole, and even more preferably 5% by mole to 25% by mole, based on the total content of the repeating units in the resin (A).

Specific examples of the repeating unit having a hydroxyl group or a cyano group will be shown below, but the present invention is not limited to these.

[Chem. 20]

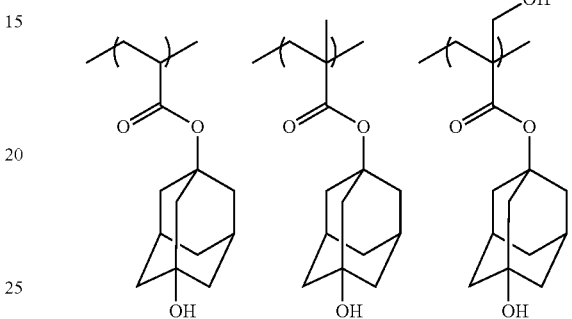

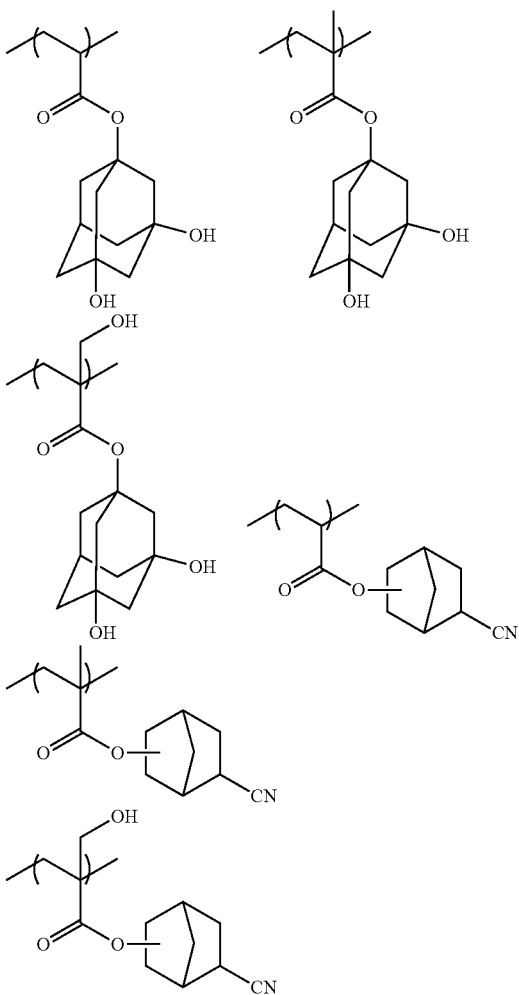

-continued

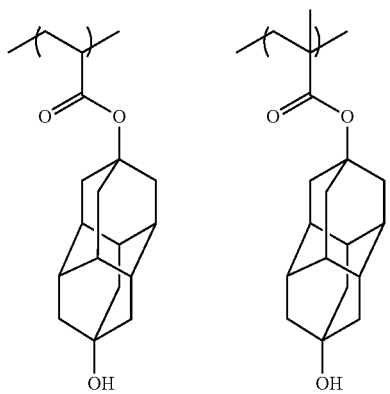

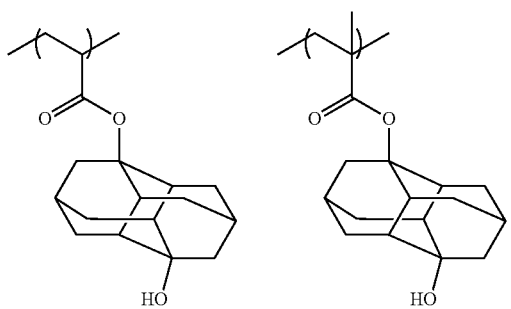

[Chem. 21]

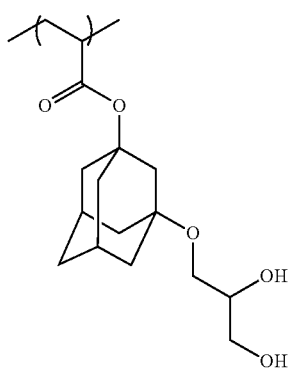

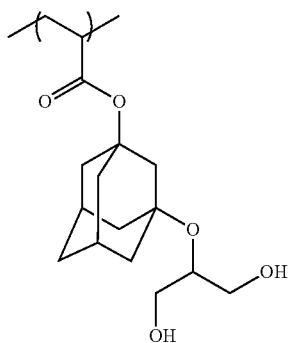

-continued

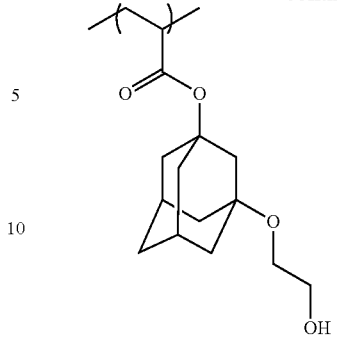

In addition, the monomers described in paragraph 0011 et seq in the specification of WO2011/122336A or repeating units or the like corresponding to these can be appropriately used.

The resin (A) may have a repeating unit having an acid group. Examples of the acid group include a carboxyl group, a sulfonamide group, a sulfonylimide group, a bissulfonylimide group, a naphthol structure, and an aliphatic alcohol group in which the α-position has been substituted with an electron-withdrawing group (for example, a hexafluoroisopropanol group), and it is more preferable that the resin (A) have a repeating unit having a carboxyl group. When the resin (A) includes a repeating unit having an acid group, the resolution for the use in contact hole increases. As the repeating unit having an acid group, any of repeating units in which the acid group is bonded directly to the main chain of the resin such as a repeating unit consisting of an acrylic acid or a methacrylic acid, a repeating unit in which the acid group is bonded to the main chain of the resin through a linking group, or introducing the repeating unit to the end of the polymer chain using a polymerization initiator or a chain transfer agent having an acid group at the time of polymerization is preferable, and the linking group may have a monocyclic or polycyclic cyclic hydrocarbon structure. A repeating unit consisting of an acrylic acid or a methacrylic acid is particularly preferable.

The resin (A) may or may not include a repeating unit having an acid group, but when the resin (A) includes the repeating unit, the content of the repeating unit having an acid group is preferably 25% by mole or less, and more preferably 20% by mole or less, based on the total content of the repeating units in the resin (A). When the resin (A) includes a repeating unit having an acid group, the content of the repeating unit having an acid group in the resin (A) is generally 1% by mole or more.

Specific examples of the repeating unit having an acid group will be shown below, but the present invention is not limited to these.

In the specific examples, Rx represents H, CH$_3$, CH$_2$OH, or CF$_3$.

[Chem. 22]

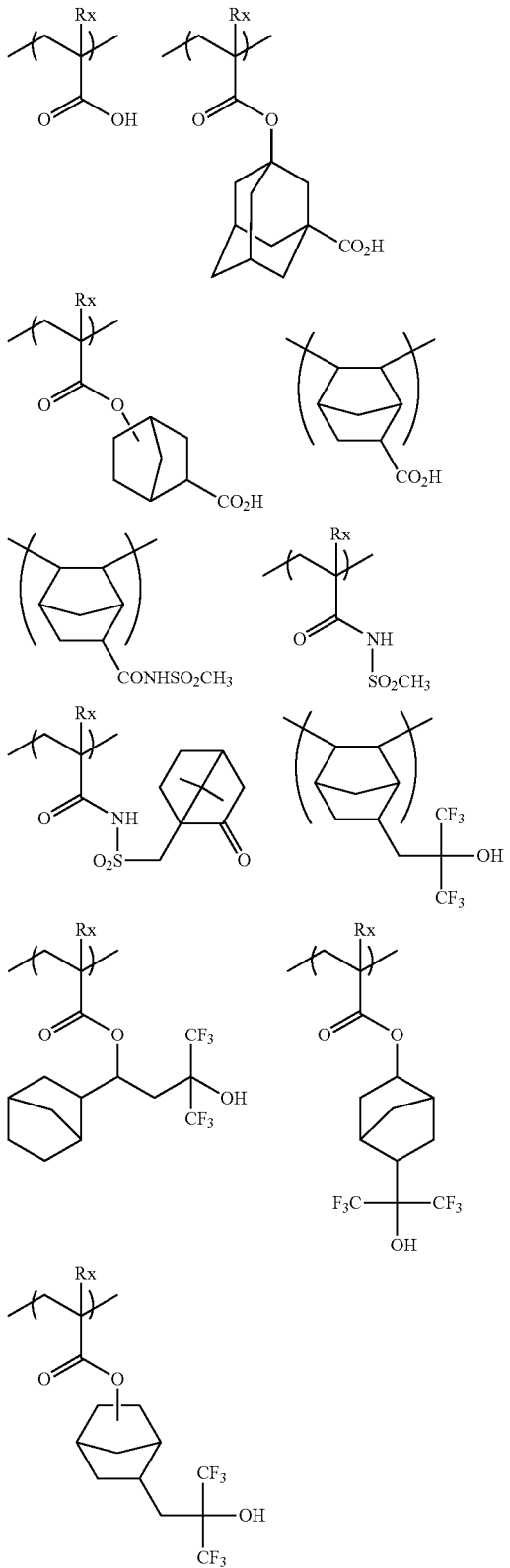

[Chem. 23]

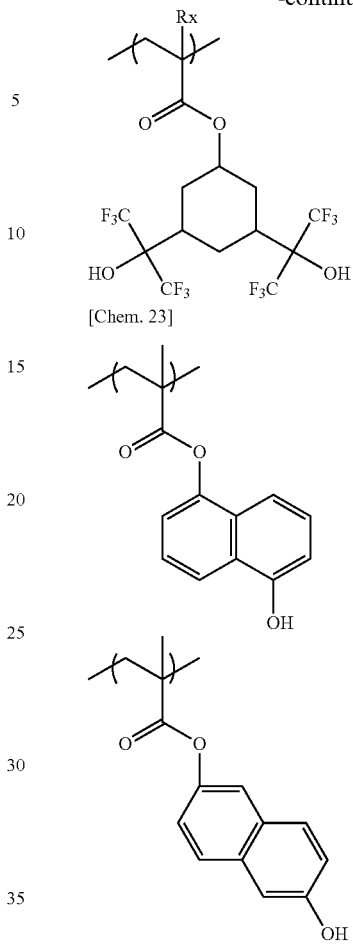

The resin (A) in the present invention may further include an alicyclic hydrocarbon structure free from a polar group (for example, the acid group, the hydroxyl group, and the cyano group) and a repeating unit not exhibiting acid decomposability. Thereby, elution of low molecular components from the resist film to the liquid for liquid immersion during the liquid immersion exposure may be reduced, and solubility of the resin may be properly adjusted during the development using the developer including an organic solvent. In addition, dry etching resistance can be improved. As the repeating unit such as this, a repeating unit represented by the general formula (IV) may be included.

[Chem. 24]

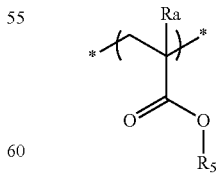

(IV)

In the general formula (IV), R$_5$ includes at least one cyclic structure, and represents a hydrocarbon group free from a polar group.

Ra represents a hydrogen atom, an alkyl group or —CH$_2$—O—Ra$_2$ group. In the formula, Ra$_2$ represents a hydrogen atom, an alkyl group or an acyl group. Ra is preferably a hydrogen atom, a methyl group, a hydroxymethyl group or a trifluoromethyl group, and a hydrogen atom or a methyl group is particularly preferable.

The cyclic structure, which $R_5$ has, includes a monocyclic hydrocarbon group and a polycyclic hydrocarbon group. Examples of the monocyclic hydrocarbon group include cycloalkyl groups having 3 to 12 carbon atoms, such as a cyclopentyl group, a cyclohexyl group, a cycloheptyl group, and a cyclooctyl group; and cycloalkenyl groups having 3 to 12 carbon atoms, such as a cyclohexenyl group. The preferable monocyclic hydrocarbon group is a monocyclic hydrocarbon group having 3 to 7 carbon atoms and more preferably includes a cyclopentyl group or a cyclohexyl group.

The polycyclic hydrocarbon group includes a ring assembly hydrocarbon group and a crosslinked cyclic hydrocarbon group, and examples of the ring assembly hydrocarbon group include a bicyclohexyl group or a perhydronaphthalenyl group. Examples of the crosslinked cyclic hydrocarbon ring include a bicyclic hydrocarbon ring such as pinane, bornane, norpinane, norbornane or a bicyclooctane ring (a bicyclo[2.2.2]octane ring or a bicyclo[3.2.1]octane ring or the like); a tricyclic hydrocarbon ring such as homobrendane, adamantane, tricyclo[5.2.1.0$^{2,6}$]decane or a tricyclo[4.3.1.1$^{2,5}$]undecane ring; and a tetracyclic hydrocarbon ring such as tetracyclo[4.4.0.1$^{2,5}$.1$^{7,10}$]dodecane or a perhydro-1,4-methano-5,8-methanonaphthalene ring. In addition, as the crosslinked cyclic hydrocarbon ring, a condensed cyclic hydrocarbon ring, for example, a condensed cyclic ring in which a plurality of 5- to 8-membered cycloalkane rings such as a perhydronaphthalene (decalin) ring, a perhydroanthracene ring, a perhydrophenanthrene ring, a perhydroacenaphthene ring, a perhydrofluorene ring, a perhydroindene ring, a perhydrophenalene ring are condensed, may be also included.

As the preferable crosslinked cyclic hydrocarbon ring, a norbornyl group, an adamantyl group, a bicyclo octanyl group, a tricyclo[5.2.1.0$^{2,6}$]decanyl group, or the like, may be included. As the more preferable crosslinked cyclic hydrocarbon ring, a norbornyl group or an adamantyl group may be included.

These alicyclic hydrocarbon groups may have a substituent, and as the preferable substituent, a halogen atom, an alkyl group, a hydroxyl group of which a hydrogen atom is substituted, an amino group of which a hydrogen atom is substituted or the like may be included. As the preferable halogen atom, a bromine atom, a chlorine atom or a fluorine atom may be included, and as the preferable alkyl group, a methyl group, an ethyl group, an n-butyl group or a t-butyl group may be included. The above alkyl group may further have substituents, and as the substituent which the alkyl group may further have, a halogen atom, an alkyl group, a hydroxyl group of which a hydrogen atom is substituted, an amino group of which a hydrogen atom is substituted may be included.

Examples of the substituent of the hydrogen atom may include an alkyl group, a cycloalkyl group, an aralkyl group, a substituted methyl group, a substituted ethyl group, an alkoxycarbonyl group, and an aralkyloxycarbonyl group. As the preferable alkyl groups, an alkyl group having 1 to 4 carbon atoms may be included, as the preferable substituted methyl group, a methoxymethyl group, a methoxythiomethyl group, a benzyloxymethyl group, a t-butoxymethyl group or a 2-methoxyethoxymethyl group, as the preferable substituted ethyl group, a 1-ethoxyethyl group or a 1-methyl-1-methoxyethyl group may be included, as the preferable acyl group, an aliphatic acyl group having 1 to 6 carbon atoms such as a formyl group, an acetyl group, a propionyl group, a butyryl group, an isobutyryl group, a valeryl group or a pivaloyl group may be included, and as the alkoxycarbonyl group, an alkoxycarbonyl group having 1 to 4 carbon atoms or the like may be included.

The resin (A) may or may not include a repeating unit which has an alicyclic hydrocarbon structure that does not have a polar group, and which does not exhibit acid decomposibility, but when the resin (A) includes the repeating unit, the content of this repeating unit is preferably 1% by mole to 50% mole, and more preferably 5% by mole to 50% by mole, based on the total content of the repeating units in the resin (A).

Specific examples of the repeating unit which has an alicyclic hydrocarbon structure that does not have a polar group, and which does not exhibit acid decomposibility will be shown below, but the present invention is not limited to these. In the formula, Ra represents H, $CH_3$, $CH_2OH$, or $CF_3$.

[Chem. 25]

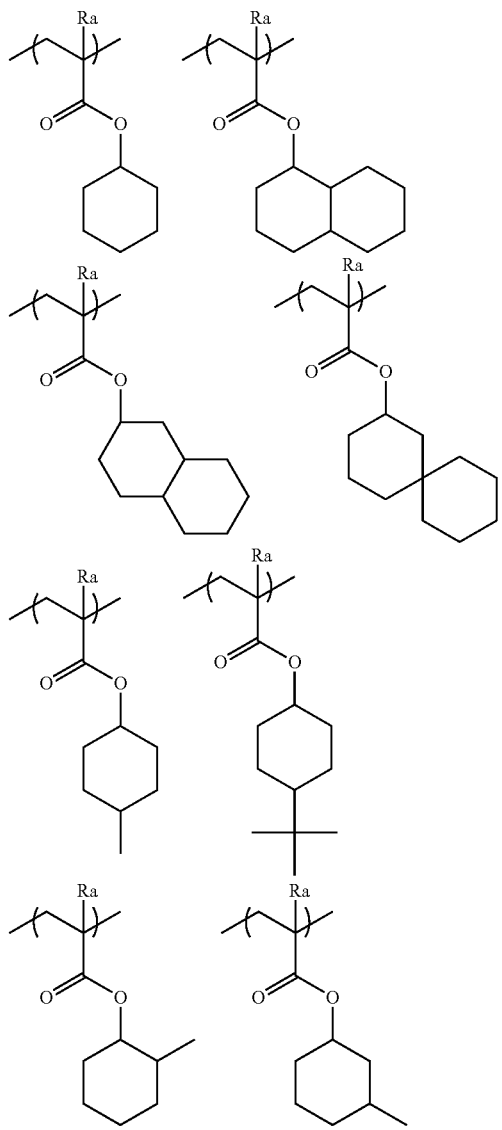

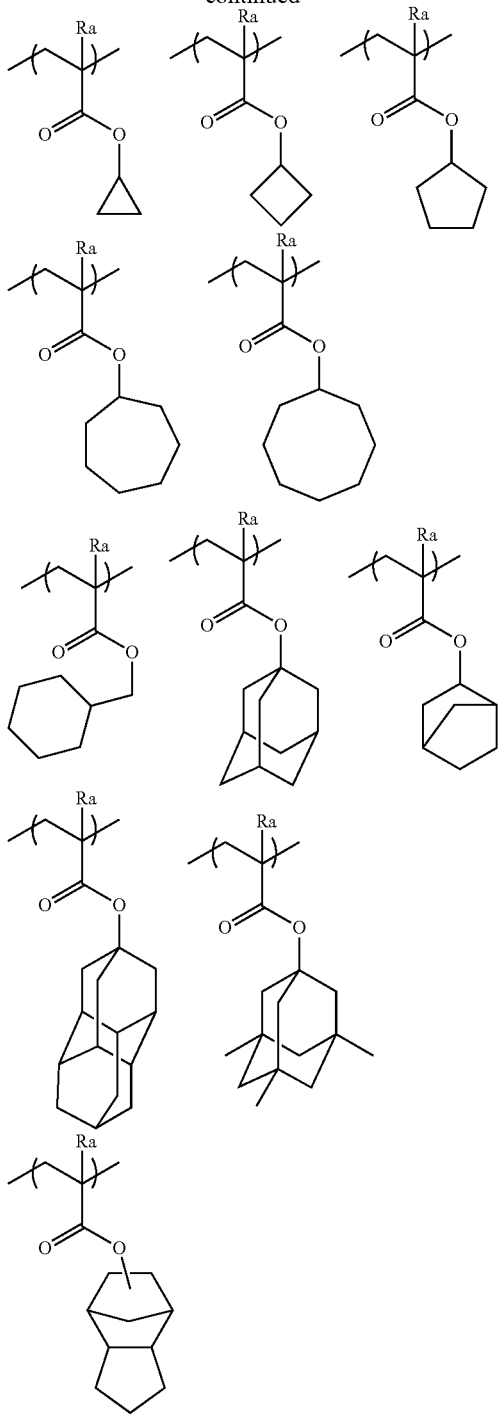

The resin (A) used in the composition of the present invention may contain, in addition to the above-described repeating structural units, various repeating structural units for the purpose of adjusting the dry etching resistance, suitability for a standard developer, adhesion to a substrate, resist profile, and properties that are generally required for the actinic ray-sensitive or radiation-sensitive resin composition (I), such as resolution, heat resistance, and sensitivity.

Such a repeating structural unit may include a repeating structural unit corresponding to the following monomers, however, are not limited to these.

In this way, it is possible to perform minute adjustments of performance, which is required for the resin used in the composition according to the present invention, such as: (1) solubility in a coating solvent, (2) film-forming properties (glass transition point), (3) alkali developability, (4) film thinning (selection of hydrophilicity or hydrophobicity, or alkali-solubility), (5) adhesiveness to the substrate at unexposed areas, and (6) dry etching resistance.

Examples of such a monomer may include compounds having one addition polymerizable unsaturated bond selected from acrylic acid esters, methacrylic acid esters, acrylamides, methacrylamides, aryl compounds, vinyl ethers, vinyl esters and the like.

In addition to these, addition-polymerizable unsaturated compounds, which are copolymerizable with monomers corresponding to a variety of repeating structural units described above, may be copolymerized.

In the resin (A) used in the composition of the present invention, the content molar ratio of respective repeating structural units is appropriately set to adjust the dry etching resistance of the actinic ray-sensitive or radiation-sensitive resin composition (I), suitability for a standard developer, adhesion to a substrate, resist profile, and performance that is generally required for the actinic ray-sensitive or radiation-sensitive resin composition (I), such as resolution, heat resistance, and sensitivity.

When the composition of the present invention is intended for ArF exposure, from the viewpoint of transparency to ArF light, it is preferable that the resin (A) used in the composition of the present invention substantially do not have an aromatic ring (specifically, the proportion of a repeating unit having an aromatic group in the resin be preferably 5% by mole or less, more preferably 3% by mole or less, and ideally 0% by mole, that is, the resin have no aromatic group), and it is preferable that the resin (A) have a monocyclic or polycyclic alicyclic hydrocarbon structure.

The form of the resin (A) in the present invention may be any of a random type, a block type, a comb type and a star type. The resin (A) can be synthesized by, for example, radical, cation, or anion polymerization of unsaturated monomers corresponding to the respective structures. A target resin may also be obtained from a polymer reaction after polymerization using unsaturated monomers corresponding to the precursors of each structure.

When the composition of the present invention is intended for ArF exposure, from the viewpoint of transparency to ArF light, it is preferable that the resin (A) used in the composition of the present invention substantially do not have an aromatic ring (specifically, the proportion of a repeating unit having an aromatic group in the resin be preferably 5% by mole or less, more preferably 3% by mole or less, and ideally 0% by mole, that is, the resin have no aromatic group), and it is preferable that the resin (A) have a monocyclic or polycyclic alicyclic hydrocarbon structure.

When the composition of the present invention contains the resin (D) to be described below, it is preferable that the resin (A) have neither a fluorine atom nor a silicon atom from the viewpoint of compatibility with the resin (D).

A preferred example of the resin (A) used in the composition of the present invention is a resin in which the repeating units entirely consist of (meth)acrylate-based repeating units. In this case, any of the resin (A) in which all repeating units are methacrylate-based repeating units, the resin (A) in which all repeating units are acrylate-based repeating units, and the resin (A) in which all repeating units are methacrylate-based repeating units and acrylate-based repeating units may be used, however, the content of acrylate-based repeating unit is preferably 50% by mole or less based on the total content of the repeating units in the resin (A).

When the composition of the present invention is irradiated with KrF excimer laser light, an electron beam, X-rays, a high energy light (EUV or the like) having a wavelength of 50 nm or less, it is preferable that the resin (A) further have a hydroxystyrene-based repeating unit. It is more preferable to include a hydroxystyrene-based repeating unit, a hydroxystyrene-based repeating unit protected by an acid-decomposable group and an acid-decomposable repeating unit such as tertiary alkyl(meth)acrylic ester.

Examples of the repeating unit having a preferable hydroxystyrene-based acid-decomposable group may include a repeating unit consisting of t-butoxycarbonyloxy styrene, 1-alkoxyethoxy styrene, tertiary alkyl(meth)acrylic ester or the like, and a repeating unit consisting of 2-alkyl-2-adamantyl(meth)acrylate and dialkyl(1-adamantyl)methyl (meth)acrylate is more preferable.

The resin (A) in the present invention can be synthesized by conventional techniques (for example, radical polymerization). For example, as the general synthesis method, a bulk polymerization method in which polymerization is carried out by dissolving monomer species and an initiator in a solvent and heating the solution, a dropwise adding and polymerization method in which a solution of monomer species and an initiator is added dropwise to a heating solvent over 1 to 10 hours, or the like may be included, and a dropwise adding polymerization method is preferable. Examples of the reaction solvent may include a solvent which dissolves the composition of the present invention such as ethers such as tetrahydrofuran, 1,4-dioxane or diisopropyl ether, ketones such as methylethyl ketone or methyl isobutyl ketone, ester solvents such as ethyl acetate, amide solvents such as dimethyl formamide or dimethyl acetamide, propylene glycol monomethyl ether acetate described below, propylene glycol monomethyl ether or cyclohexanone. It is more preferable to perform polymerization using the same solvent as the solvent used in the photosensitive composition of the present invention. Thereby, generation of the particles during storage can be suppressed.

It is preferable that the polymerization reaction be carried out in an inert gas atmosphere such as nitrogen or argon. As the polymerization initiator, commercially available radical initiators (an azo-based initiator, peroxide, or the like) are used to initiate the polymerization. As the radical initiator, an azo-based initiator is preferable, and the azo-based initiator having an ester group, a cyano group or a carboxyl group is preferable. Preferable initiators may include azobisisobutyronitrile, azobisdimethylvaleronitrile, dimethyl 2,2'-azobis(2-methyl propionate), or the like. The initiator is added or added in installments, if necessary, and the desired polymer is recovered after the reaction is completed, and the reaction mixture is poured into a solvent and then a method such as powder or solid recovery is used. The concentration of the reaction is 5% by mass to 50% by mass and preferably 10% by mass to 30% by mass. The reaction temperature is normally 10° C. to 150° C., preferably 30° C. to 120° C., and more preferably 60° C. to 100° C.

After the reaction is completed, the resultant is allowed to be cooled to the room temperature and purified. Purification may be carried out using common methods such as a liquid-liquid extraction method in which residual monomers and oligomer components are removed by washing with water or combining appropriate solvents, a purification method in a solution state such as ultrafiltration in which only those with less than or equal to a specific molecular weight are extracted and removed, a re-precipitation method in which residual monomers and the like are removed by coagulating the resin in a poor solvent through dropwise addition of the resin solution to a poor solvent, and a purification method in a solid state in which separated resin slurry is washed with a poor solvent.

For example, the resin is precipitated as solids by contacting the resin with a sparingly soluble or insoluble solvent (a poor solvent) in 10 times or less of the volume of the reaction solution, and preferably 5 to 10 times of the volume.

The solvent used during precipitation or reprecipitation from the polymer solution (precipitation or reprecipitation solvent) may be a poor solvent of the polymer, and may be appropriately selected and used from hydrocarbons, halogenated hydrocarbons, nitro compounds, ethers, ketones, esters, carbonates, alcohols, carboxylic acids, water, and a mixed solvent including these solvents, depending on the type of polymer. Among these, as the precipitation or reprecipitation solvent, a solvent containing at least alcohols (particularly, methanol or the like) or water is preferable.

The used amount of the precipitation or reprecipitation solvent may be appropriately selected considering efficiency and yield, however, is 100 parts by mass to 10,000 parts by mass, preferably 200 parts by mass to 2,000 parts by mass, and is more preferably 300 parts by mass to 1,000 parts by mass based on 100 parts by mass of the polymer solution, in general.

The precipitation or re-precipitation temperature may be appropriately selected considering efficiency and operability, however, is normally 0° C. to 50° C., and preferably around the room temperature (for example, approximately, 20° C. to 35° C.). Precipitation or re-precipitation operation may be carried out by well-known methods of batch-type or continuous-type using a common mixing vessel such as a stirring tank.

In general, the precipitated or reprecipitated polymer is provided for use after being subjected to common solid-liquid separation such as filtration and centrifugation, and then dried. Filtration is carried out using a filtration material with solvent resistance, preferably under pressure. Drying is carried out at a temperature of approximately 30° C. to 100° C., preferably approximately 30° C. to 50° C. under the normal pressure or reduced pressure (preferably under reduced pressure).

In addition, after the resin is precipitated and separated once, the resin is re-dissolved in a solvent, and the resin may be contacted with a sparingly soluble or insoluble solvent. In other words, after the radical polymerization reaction above is completed, a method may be used in which the polymer is brought into contact with a sparingly soluble or insoluble solvent, and the resin is precipitated (process A), the resin is separated from the solution (process B), then, the resin is re-dissolved in a solvent and the resin solution A is prepared (process C), after that, the resin solid is precipitated by contacting the resin solution A with the sparingly soluble or insoluble solvent in 10 times or less volume of the resin solution A (preferably 5 times or less volume) (process D), and the precipitated resin is separated (process E).

In addition, in order to suppress aggregation of the resin after the composition is prepared, a process, in which the resin synthesized is dissolved in a solvent so as to prepare a solution, and the solution is heated at approximately 30° C. to 90° C. for approximately 30 minutes to 4 hours, may be added as disclosed in, for example, JP2009-037108A.

The weight average molecular weight of the resin (A) of the present invention in terms of polystyrene as measured by GPC is preferably 7000 or less, more preferably 7000 to 200,000, still more preferably 7000 to 50,000, particularly preferably 7000 to 40,000, and most preferably 7000 to 30,000. In the case where the weight average molecular weight is 7000 or less, the solubility in the organic-based developer is exceedingly increased, this causes a concern that an accurate pattern may not be formed.

The dispersity (molecular weight distribution, Mw/Mn) is preferably 1.0 to 3.0, preferably 1.0 to 2.6, more preferably 1.0 to 2.0, and particularly preferably 1.4 to 2.0. As the molecular weight distribution is smaller, the resolution and resist shape are superior, the side wall of the resist pattern is smoother, and the roughness is more improved. In the present invention, the weight average molecular weight (Mw) and the number average molecular weight (Mn) of the resin (A) may be calculated by using, for example, an HLC-8120 (manufactured by Tosoh Corporation) and using a TSK gel Multipore HXL-M column (manufactured by Tosoh Corporation, 7.8 mm IDx30.0 cm), and THF (tetrahydrofuran) as an eluent.

In the actinic ray-sensitive or radiation-sensitive resin composition (I) of the present invention, the blending ratio of the resin (A) in the entire composition is preferably 30% by mass to 99% by mass, and more preferably 60% by mass to 95% by mass, of the total solid content.

In addition, as for the resin (A) of the present invention, one kind of resin may be used or a plurality of resins may be used in combination.

[2] Compound (B) which Generates an Acid by Irradiation of Actinic Rays or Radiation The composition of the present invention preferably further contains the compound (B) generates an acid by irradiation of actinic rays or radiation (hereinafter, also referred to as an "acid generator"). The compound (B) which generates an acid by irradiation of actinic rays or radiation is preferably a compound which generates an organic acid by irradiation of actinic rays or radiation.

As the acid generator, a photoinitiator for photocationic polymerization, a photoinitiator for photoradical polymerization, a photo-decoloring agent for coloring agents, photo-discoloring agent, or a known compound which generates an acid by irradiation of actinic rays or radiation, or a mixture of such compounds, which is used in microresists or the like can be appropriately selected and used.

For example, a diazonium salt, a phosphonium salt, a sulfonium salt, an iodonium salt, imide sulfonate, oxime sulfonate, diazo disulfone, disulfone, and o-nitrobenzyl sulfonate may be included.

Preferable compounds for the acid generator include a compound represented by following the general formulae (ZI), (ZII), and (ZIII).

[Chem. 26]

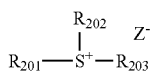
(ZI)

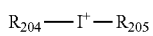
(ZII)

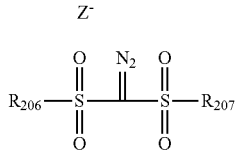
(ZIII)

In the general formula (ZI) above, $R_{201}$, $R_{202}$, and $R_{203}$ each independently represent an organic group.

The number of carbons of the organic group as $R_{201}$, $R_{202}$ and $R_{203}$ is generally 1 to 30, and preferably 1 to 20.

In addition, two of $R_{201}$ to $R_{203}$ may be bonded to form a ring structure, and may include an oxygen atom, a sulfur atom, an ester bond, an amide bond or a carbonyl group in the ring. As the group formed by two of $R_{201}$ to $R_{203}$ being bonded, an alkylene group (for example, a butylene group or a pentylene group) may be included.

$Z^-$ represents a non-nucleophilic anion.

The non-nucleophilic anion as $Z^-$, for example, a sulfonate anion, a carboxylate anion, a sulfonylimide anion, a bis(alkylsulfonyl)imide anion, a tris(alkylsulfonyl)methyl anion or the like may be included.

The non-nucleophilic anion is an anion of which the capacity to initiate a nucleophilic reaction is extremely low, and an anion capable of suppressing decomposition over time by an intramolecular nucleophilic reaction, thereby improving the stability over time of the resist composition.

Examples of the sulfonate anion may include an aliphatic sulfonate anion, an aromatic sulfonate anion, and a camphorsulfonate anion.

Examples of the carboxylate anion may include an aliphatic carboxylate anion, an aromatic carboxylate anion, and an aralkylcarboxylate anion.

The aliphatic site in the aliphatic sultanate anion and the aliphatic carboxylate anion may be an alkyl group or a cycloalkyl group, is preferably an alkyl group having 1 to 30 carbon atoms and a cycloalkyl group having 3 to 30 carbon atoms, and examples thereof may include a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, an eicosyl group, a cyclopropyl group, a cyclopentyl group, a cyclohexyl group, an adamantyl group, a norbornyl group, a bornyl group.

The aromatic group in the aromatic sulfonate anion and the aromatic carboxylate anion is preferably an aryl group having 6 to 14 carbon atoms, and examples thereof may include a phenyl group, a tolyl group, a naphthyl group.

The alkyl group, the cycloalkyl group, and the aryl group in the aliphatic sulfonate anion and the aromatic sulfonate anion may have a substituent. As the substituent of the alkyl group, the cycloalkyl group, and the aryl group in the aliphatic sultanate anion and the aromatic sulfonate anion, for example, a nitro group, a halogen atom (a fluorine atom, a chlorine atom, a bromine atom, an iodine atom), a carboxyl group, a hydroxyl group, an amino group, a cyano group, an alkoxy group (preferably 1 to 15 carbon atoms), a cycloalkyl group (preferably 3 to 15 carbon atoms), an aryl group (preferably 6 to 14 carbon atoms), an alkoxycarbonyl group (preferably 2 to 7 carbon atoms), an acyl group (preferably 2 to 12 carbon atoms), an alkoxycarbonyloxy group (preferably 2 to 7 carbon atoms), an alkylthio group (preferably 1 to 15 carbon atoms), an alkylsulfonyl group (preferably 1 to 15 carbon atoms), an alkyliminosulfonyl group (preferably 1 to 15 carbon atoms), an aryloxysulfonyl group (preferably 6 to 20 carbon atoms), an alkyl aryloxysulfonyl group (preferably 7 to 20 carbon atoms), a cycloalkyl aryloxysulfonyl group (preferably 10 to 20 carbon numbers), an alkyloxy alkyloxy group (preferably 5 to 20 carbon atoms), a cycloalkyl alkyloxy alkyloxy group (preferably 8 to 20 carbon atoms), or the like, may be included. Regarding the aryl group and the ring structure each group has, an alkyl group (preferably 1 to 15 carbon atoms) or a cycloalkyl group (preferably 3 to 15 carbon atoms) may be further included as a substituent.

The aralkyl group in the aralkyl carboxylate anion may preferably include an aralkyl group having 7 to 12 carbon atoms, and may include, for example, a benzyl group, a phenethyl group, a naphthylmethyl group, a naphthylethyl group, a naphthylbutyl group, or the like.

The alkyl group, the cycloalkyl group, the aryl group, and the aralkyl group in the aliphatic carboxylate anion, the aromatic carboxylate anion and the aralkyl carboxylate anion may have a substituent. Examples of the substituent include a halogen atom, an alkyl group, a cycloalkyl group, an alkoxy group, and an alkylthio group which are the same as those in the aromatic sulfonate anion.

As the sulfonylimide anion, for example, a saccharin anion may be included.

The alkyl group in the bis(alkylsulfonyl)imide anion and the tris(alkylsulfonyl)methide anion is preferably an alkyl group having 1 to 5 carbon atoms, and may include, for example, a methyl group, an ethyl group, a propyl group, an isopropyl group, an n-butyl group, an isobutyl group, a sec-butyl group, a pentyl group, a neopentyl group, or the like.

Two alkyl groups in the bis(alkylsulfonyl)imide may be linked to each other to form an alkylene group (preferably having 2 to 4 carbon atoms), and form a ring together with an imide group and two sulfonyl groups. Examples of the substituent that the alkylene group formed by linking two alkyl groups in the alkyl groups and the bis(alkylsulfonyl)imide anion may have include a halogen atom, an alkyl group substituted with a halogen atom, an alkoxy group, an alkylthio group, an alkyloxysulfonyl group, an aryloxysulfonyl group, and a cycloalkyl aryloxysulfonyl group, and an alkyl group substituted with a fluorine atom is preferred.

Examples of other non-nucleophilic anions may include fluorophosphate (for example, $PF_6^-$), fluoroborate (for example, $BF_4^-$), fluoroantimonate (for example, $SbF_6^-$) or the like.

As the non-nucleophilic anion of $Z^-$, an aliphatic sulfonate anion in which at least α-position of the sulfonic acid is substituted with a fluorine atom, an aromatic sulfonate anion substituted with a fluorine atom or a group having a fluorine atom, a bis(alkylsulfonyl)imide anion of which an alkyl group is substituted with a fluorine atom or a tris (alkylsulfonyl)methide anion of which an alkyl group is substituted with a fluorine atom is preferable. The non-nucleophilic anion is more preferably a perfluoro aliphatic sulfonate anion having 4 to 8 carbon atoms or a benzene sulfonate anion having a fluorine atom, and is even more preferably a nonafluorobutane sulfonate anion, a perfluorooctane sulfonate anion, a pentafluorobenzene sulfonate anion or 3,5-bis(trifluoromethyl)benzene sulfonate anion.

The acid generator is preferably a compound which generates an acid by irradiation of actinic rays or radiation, which is represented by the following general formula (V) or (VI). Since a compound which generates an acid represented by the following general formula (V) or (VI) has a cyclic organic group, resolution and roughness performance can be further improved.

The non-nucleophilic anion may be an anion which generates an organic acid represented by the following general formula (V) or (VI).

[Chem. 27]

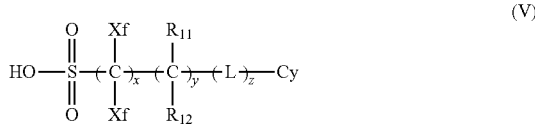

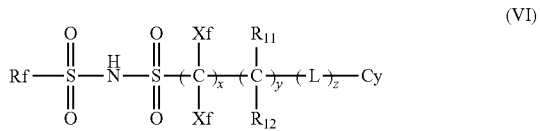

In the general formulae described above, Xf's each independently represent a fluorine atom or an alkyl group substituted with at least one fluorine atom.

$R_{11}$ and $R_{12}$ each independently represent a hydrogen atom, a fluorine atom, or an alkyl group.

L's each independently represent a divalent linking group.

Cy represents a cyclic organic group.

Rf is a group including a fluorine atom.

x represents an integer of 1 to 20.

y represents an integer of 0 to 10.

z represents an integer of 0 to 10.

Xf represents a fluorine atom or an alkyl group substituted with at least one fluorine atom. The number of carbon atoms of this alkyl group is preferably 1 to 10, more preferably 1 to 4. In addition, the alkyl group substituted with at least one fluorine atom is preferably a perfluoroalkyl group.

Xf is preferably a fluorine atom or a perfluoroalkyl group having 1 to 4 carbon atoms. More specifically, Xf is preferably a fluorine atom, $CF_3$, $C_2F_5$, $C_3F_7$, $C_4F_9$, $C_5F_{11}$, $C_6F_{13}$, $C_7F_{15}$, $C_8F_{17}$, CH2CF3, CH2CH2CF3, CH2C2F5, CH2CH2C2F5, CH2C3F7, CH2CH2C3F7, CH2C4F9, or $CH_2CH_2C_4F_9$, and more preferably a fluorine atom or $CF_3$. In particular, it is preferable that both Xf's are fluorine atoms.

$R_{11}$ and $R_{12}$ each dependently represent a hydrogen atom, a fluorine atom, or an alkyl group. The alkyl group may have a substituent (preferably a fluorine atom) and is preferably an alkyl group having 1 to 4 carbon atoms. More preferably, the alkyl group is a perfluoroalkyl group having 1 to 4 carbon atoms. Specific examples of the alkyl group having a substituent as $R_{11}$ and $R_{12}$ may include $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$, or $CH_2CH_2C_4F_9$, and among these, $CF_3$ is preferable.

L represents a divalent linking group. As the divalent linking group, for example, —COO—, —OCO—, —CONH—, —NHCO—, —CO—, —O—, —S—, —SO—, —SO$_2$—, an alkylene group (preferably 1 to 6 carbon atoms), a cycloalkylene group (preferably 3 to 10 carbon atoms), an alkenylene group (preferably 2 to 6 carbon atoms), a divalent linking group combining a plurality of these or the like may be included. Among these, —COO—, —OCO—, —CONH—, —NHCO—, —CO—, —O—, —SO$_2$—, —COO-alkylene group-, —OCO-alkylene group-, —CONH-alkylene group- or —NHCO-alkylene group-, is preferable, and —COO—, —OCO—, —CONH—, —SO$_2$—, —COO-alkylene group- or —OCO-alkylene group- is more preferable.

Cy represents a cyclic organic group. As the cyclic organic group, for example, an alicyclic group, an aryl group, and a heterocyclic group may be included.

The alicyclic group may be monocyclic or polycyclic. As the monocyclic alicyclic group, for example, a monocyclic cycloalkyl group such as a cyclopentyl group, a cyclohexyl group and a cyclooctyl group may be included. As the polycyclic alicyclic group, for example, a polycyclic cycloalkyl group such as a norbornyl group, a tricyclodecanyl group, a tetracyclodecanyl group, a tetracyclododecanyl group and an adamantyl group may be included. Among these, an alicyclic group having a bulky structure of 7 or more carbon atoms such as a norbornyl group, a tricyclodecanyl group, a tetracyclodecanyl group, a tetracyclododecanyl group and an adamantyl group is preferable from the viewpoint of suppressing diffusivity in a film in PEB process (heating after exposure) and improving MEEF (Mask Error Enhancement Factor).

The aryl group may be monocyclic or polycyclic. As the aryl group, for example, a phenyl group, a naphthyl group, a phenanthryl group, and an anthryl group may be included. Among these, a naphthyl group of which light absorbance at 193 nm is relatively low is preferable.

The heterocyclic group may be monocyclic or polycyclic, however, a polycyclic heterocyclic group can suppress diffusion of acids more. In addition, the heterocyclic group may or may not have aromaticity. As the heterocyclic group which has aromaticity, for example, a furan ring, a thiophene ring, a benzofuran ring, a benzothiophene ring, a dibenzofuran ring, a dibenzothiophene ring and pyridine ring may be included. As the heterocyclic group which does not have aromaticity, for example, a tetrahydropyran ring, a lactone ring, a sultone ring, or a decahydroisoquinoline ring may be included. As the heterocyclic ring in the heterocyclic group, a furan ring, a thiophene ring, a pyridine ring, or a decahydroisoquinoline ring is particularly preferable. Further, examples of the lactone ring or the sultone ring includes the lactone structure or the sultone structure which are exemplified in the above-described resin (A).

The above cyclic organic group may have a substituent. Examples of the substituent may include an alkyl group (may be linear or branched, and preferably having 1 to 12 carbon atoms), a cycloalkyl group (may be monocyclic, polycyclic or spirocyclic, and preferably having 3 to 20 carbon atoms), an aryl group (preferably having 6 to 14 carbon atoms), a hydroxyl group, an alkoxy group, an ester group, an amide group, a urethane group, an ureido group, a thioether group, a sulfonamide group, and a sulfonic acid ester group. In addition, the carbon constituting the cyclic organic group (carbon contributing to the ring formation) may also be carbonyl carbon.

x is preferably 1 to 8, preferably 1 to 4, among these, and particularly preferably 1. y is preferably 0 to 4 and more preferably 0. z is preferably 0 to 8, among these, more preferably 0 to 4.

As the group containing a fluorine atom represented by Rf, for example, an alkyl group having at least one fluorine atom, a cycloalkyl group having at least one fluorine atom, and an aryl group having at least one fluorine atom may be included.

These alkyl group, cycloalkyl group and aryl group may be substituted with a fluorine atom or may be substituted with other substituents containing a fluorine atom. In the case where Rf is a cycloalkyl group having at least one fluorine atom or an aryl group having at least one fluorine atom, the other substituents containing a fluorine atom may include, for example, an alkyl group substituted with at least one fluorine atom.

In addition, these alkyl group, cycloalkyl group and aryl group may be further substituted with a substituent which does not contain a fluorine atom. As this substituent, for example, substituents which do not contain a fluorine atom among the substituents described above for Cy may be included.

As the alkyl group having at least one fluorine atom represented by Rf, for example, the same alkyl group substituted with at least one fluorine atom represented by Xf described above may be included. As the cycloalkyl group having at least one fluorine atom represented by Rf, for example, a perfluorocyclopentyl group and a perfluorocyclohexyl group may be included. As the aryl group having at least one fluorine atom represented by Rf, for example, a perfluorophenyl group may be included.

In addition, the above-described non-nucleophilic anion is preferably an anion represented by any one of the following general formulae (B-1) to (B-3).

Firstly, the anion represented by the general formula (B-1) will be described.

[Chem. 28]

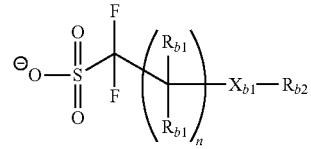

(B-1)

In the general formula (B-1) above, $R_{b1}$'s each independently represent a hydrogen atom, a fluorine atom, or a trifluoromethyl group ($CF_3$).

n represents an integer of 1 to 4.

n is preferably an integer of 1 to 3, and more preferably 1 or 2.

$X_{b1}$ represents a single bond, an ether bond, an ester bond (—OCO— or —COO—) or a sulfonic acid ester bond (—OSO$_2$ or —SO$_3$—).

$X_{b1}$ is preferably an ester bond (—OCO— or —COO—) or a sulfonic acid ester bond (—OSO$_2$ or —SO$_3$—).

$R_{b2}$ represents a substituent having 6 or more carbon atoms.

The substituent having 6 or more carbon atoms for $R_{b2}$ is preferably a bulky group, and examples thereof include an alkyl group, an alicyclic group, an aryl group, and a heterocyclic group, which have 6 or more carbon atoms.

The alkyl group having 6 or more carbon atoms for Rb$_2$ may be linear or branched, and preferably a linear or branched alkyl group having 6 to 20 carbon atoms, examples thereof include a linear or branched hexyl group, a linear or branched heptyl group, and a linear or branched octyl group. From the viewpoint of the bulkiness of a group, a branched alkyl group is preferred.

An alicyclic group having 6 or more carbon atoms for $R_{b2}$ may be monocyclic or polycyclic. Examples of the monocyclic alicyclic group include a monocyclic cycloalkyl group such as a cyclohexyl group and a cyclooctyl group. As the polycyclic alicyclic group, for example, a polycyclic cycloalkyl group such as a norbornyl group, a tricyclodecanyl group, a tetracyclodecanyl group, a tetracyclododecanyl group and an adamantyl group may be included. Among these, an alicyclic group having a bulky structure of 7 or more carbon atoms such as a norbornyl group, a tricyclodecanyl group, a tetracyclodecanyl group, a tetracyclododecanyl group and an adamantyl group is preferable from the viewpoint of suppressing diffusivity in a film in PEB process (heating after exposure) and improving MEEF (Mask Error Enhancement Factor).

The aryl group having 6 or more carbon atoms for $R_{b2}$ may be monocyclic or polycyclic. As this aryl group, for example, a phenyl group, a naphthyl group, a phenanthryl group, and an anthryl group may be included. Among these, a naphthyl group of which light absorbance at 193 nm is relatively low is preferable.

The heterocyclic group having 6 or more carbon atoms for $R_{b2}$ may be monocyclic or polycyclic, but a polycyclic heterocyclic group can suppress diffusion of acids more. In addition, the heterocyclic group may or may not have aromaticity. Examples of the heterocyclic group having aromaticity include a benzofuran ring, a benzothiophen ring, a dibenzofuran ring, and a dibenzothiophen ring. As the heterocyclic group which does not have aromaticity, for example, a tetrahydropyran ring, a lactone ring, or a decahydroisoquinoline ring may be included. As the heterocyclic ring in the heterocyclic group, a benzofuran ring or a decahydroisoquinoline ring is particularly preferred. Further, examples of the lactone ring include the lactone structure exemplified in the above-described resin (P).

The substituent having 6 or more carbon atoms for $R_{b2}$ described above may further have a substituent. Examples of this substituent may include an alkyl group (may be linear or branched, and preferably having 1 to 12 carbon atoms), a cycloalkyl group (may be monocyclic, polycyclic or spirocyclic, and preferably having 3 to 20 carbon atoms), an aryl group (preferably having 6 to 14 carbon atoms), a hydroxyl group, an alkoxy group, an ester group, an amide group, a urethane group, an ureido group, a thioether group, a sulfonamide group, and a sulfonic acid ester group. In addition, the carbon (carbon contributing to forming a ring) constituting the alicyclic group, the aryl group, or the heterocyclic group described above may be a carbonyl carbon.

Specific examples of the anion represented by the general formula (B-1) will be shown below, but the present invention is not limited thereto.

[Chem. 29]

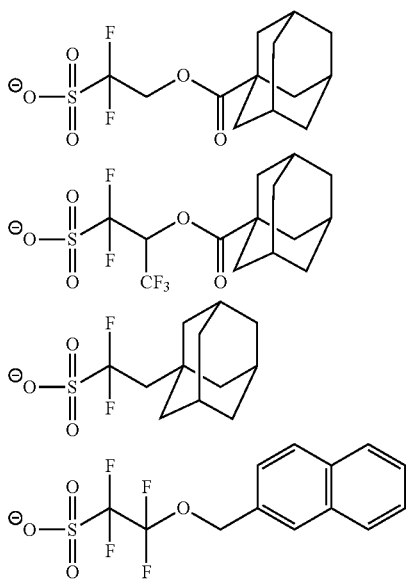

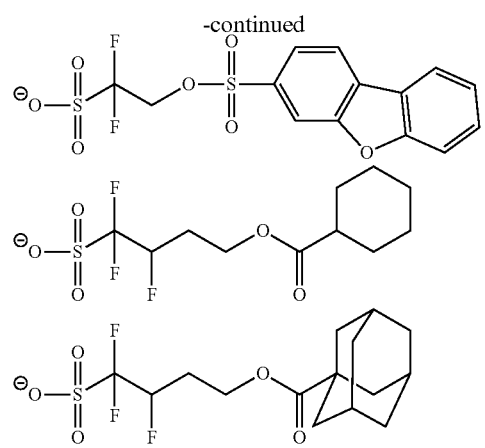

Next, the anion represented by the general formula (B-2) below will be described.

[Chem. 30]

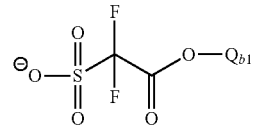

(B-2)

In the general formula (B-2) above, $Q_{b1}$ represents a group having a lactone structure, a group having a sultone structure, or a group having a cyclic carbonate structure.

Examples of the lactone structure and the sultone structure for $Q_{b1}$ are the same as those of the lactone structure and the sultone structure in the repeating unit having the lactone structure and the sultone structure described previously in the section for the resin (P). Specifically, the lactone structure represented by the general formulae (LC1-1) to (LC1-17) above and the sultone structure represented by the general formulae (SL1-1) to (SL1-3) are included.

The lactone structure or the sultone structure may be directly bonded to an oxygen atom of the ester group in the general formula (B-2) above, or may be bonded to an oxygen atom of the ester group through an alkylene group (for example, a methylene group, an ethylene group, or the like). In this case, the group having the lactone structure or the sultone structure may be an alkyl group having the lactone structure or the sultone structure as a substituent.

The cyclic carbonate structure for $Q_{b1}$ is preferably a cyclic carbonate structure having a 5- to 7-membered ring, examples thereof include 1,3-dioxolane-2-one, and 1,3-dioxane-2-one.

The cyclic carbonate structure may be directly bonded to an oxygen atom of the ester group in the general formula (B-2), or may be bonded to an oxygen atom of the ester group through an alkylene group (for example, a methylene group, an ethylene group, or the like). In this case, the group having the cyclic carbonate structure may be an alkyl group having the cyclic carbonate structure as a substituent.

Specific examples of the anion represented by the general formula (B-2) will be shown below, but the present invention is not limited thereto.

[Chem. 31]

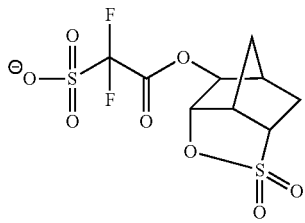

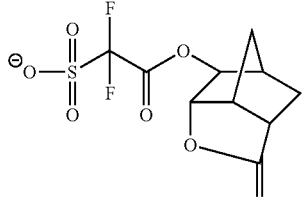

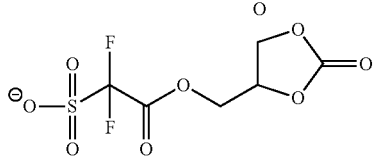

Next, the anion represented by the general formula (B-3) below will be described.

[Chem. 32]

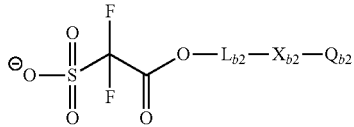

(B-3)

In the general formula (B-3) above, $L_{b2}$ represents an alkylene group having 1 to 6 carbon atoms, examples thereof include a methylene group, an ethylene group, a propylene group, and a butylene group, and an alkylene group having 1 to 4 carbon atoms is preferred.

$X_{b2}$ represents an ether bond or an ester bond (—OCO— or —COO—).

$Q_{b2}$ represents a group containing an alicyclic group or an aromatic ring.

The alicyclic group for $Q_{b2}$ may be monocyclic or polycyclic. As the monocyclic alicyclic group, for example, a monocyclic cycloalkyl group such as a cyclopentyl group, a cyclohexyl group and a cyclooctyl group may be included. As the polycyclic alicyclic group, for example, a polycyclic cycloalkyl group such as a norbornyl group, a tricyclodecanyl group, a tetracyclodecanyl group, a tetracyclododecanyl group and an adamantyl group may be included. Among these, an alicyclic group with a bulky structure having 7 or more carbon atoms such as a norbornyl group, a tricyclodecanyl group, a tetracyclodecanyl group, a tetracyclododecanyl group, and an adamantyl group are preferable.

The aromatic ring in the group containing the aromatic ring for $Q_{b2}$ is preferably an aromatic ring having 6 to 20 carbon atoms, examples thereof include a benzene ring, a naphthalene ring, a phenanthrene ring, and an anthracene ring, and among these, a benzene ring or a naphthalene ring are more preferred. The aromatic ring may be substituted with at least one fluorine atom, and examples thereof include a perfluorophenyl group.

The aromatic ring may be directly bonded to $X_{b2}$, or may be bonded to $X_{b2}$ through an alkylene group (for example, a methylene group, an ethylene group, or the like). In this case, the group containing the aromatic group may be an alkyl group having the aromatic group as a substituent.

Specific examples of the anion structure represented by the general formula (B-3) are shown below, but the present invention is not limited thereto.

[Chem. 33]

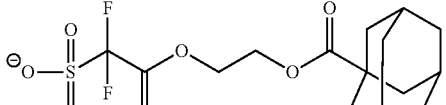

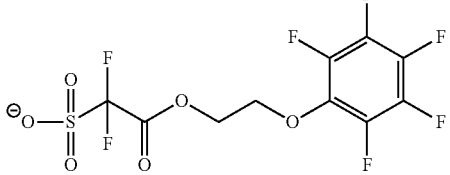

As the organic group represented by $R_{201}$, $R_{202}$, and $R_{203}$, for example, corresponding groups in compounds (ZI-1), (ZI-2), (ZI-3) and (ZI-4) described later may be included.

In addition, the organic group may be a compound having a plurality of structures represented by the general formula (ZI). For example, a compound having a structure in which at least one of $R_{201}$ to $R_{203}$ of the compound represented by the general formula (ZI) is bonded to at least one of $R_{201}$ to $R_{203}$ of another compound represented by the general formula (ZI) through a single bond or a linking group may be included.

The more preferable component (ZI) may include compounds (ZI-1), (ZI-2), (ZI-3) and (ZI-4) described below.

The compound (ZI-1) is an aryl sulfonium compound in which at least one of $R_{201}$ to $R_{203}$ of the general formula (ZI) described above is an aryl group, that is, a compound in which the aryl sulfonium is a cation.

In the aryl sulfonium compound, all of $R_{201}$ to $R_{203}$ may be an aryl group, or a part of $R_{201}$ to $R_{203}$ may be an aryl group and the rest is an alkyl group or a cycloalkyl group.

The aryl sulfonium compound may include, for example, a triarylsulfonium compound, a diaryl alkyl sulfonium compound, an aryl dialkyl sulfonium compound, a diaryl cycloalkyl sulfonium compound or an aryl dicycloalkyl sulfonium compound.

As the aryl group of the aryl sulfonium compound, a phenyl group or a naphthyl group is preferable, and a phenyl group is more preferable. The aryl group may be an aryl group containing a heterocyclic structure having an oxygen atom, a nitrogen atom, a sulfur atom or the like. The heterocyclic structure may include a pyrrole residue, a furan residue, a thiophene residue, an indole residue, a benzofuran residue, a benzothiophene residue, or the like. When the aryl sulfonium compound has two or more aryl groups, the two or more aryl groups may be the same as or different from each other.

The alkyl group or the cycloalkyl group which the aryl sulfonium compound has when necessary is preferably a linear or branched alkyl group having 1 to 15 carbon atoms and a cycloalkyl group having 3 to 15 carbon atoms, and may include, for example, a methyl group, an ethyl group, a propyl group, an n-butyl group, a sec-butyl group, a t-butyl group, a cyclopropyl group, a cyclobutyl group, a cyclohexyl group, or the like.

The aryl group, the alkyl group, and the cycloalkyl group of $R_{201}$ to $R_{203}$ may have an alkyl group (for example, 1 to 15 carbon atoms), a cycloalkyl group (for example, 3 to 15 carbon atoms), an aryl group (for example, 6 to 14 carbon atoms), an alkoxy group (for example, 1 to 15 carbon atoms), a halogen atom, a hydroxyl group, a phenylthio group as a substituent. The substituent is preferably a linear or branched alkyl group having 1 to 12 carbon atoms, a cycloalkyl group having 3 to 12 carbon atoms or a linear, branched, or cyclic alkoxy group having 1 to 12 carbon atoms, and more preferably an alkyl group having 1 to 4 carbon atoms or an alkoxy group having 1 to 4 carbon atoms. The substituent may be substituted with any one of three $R_{201}$ to $R_{203}$, or may be substituted with all three. In addition, when $R_{201}$ to $R_{203}$ are an aryl group, the substituent is preferably substituted with p-position of the aryl group.

Next, a compound (ZI-2) will be described.

The compound (ZI-2) is a compound in which $R_{201}$ to $R_{203}$ in the Formula (ZI) each independently represent an organic group which does not have an aromatic ring. Here, the aromatic ring also includes an aromatic ring containing a hetero atom.

In the organic group which does not contain an aromatic ring as $R_{201}$ to $R_{203}$, the number of carbon atoms is generally 1 to 30 and the number of carbon atoms is preferably 1 to 20.

$R_{201}$ to $R_{203}$ are each independently preferably an alkyl group, a cycloalkyl group, an allyl group or a vinyl group, more preferably a linear or branched 2-oxo alkyl group, a 2-oxo cycloalkyl group, an alkoxycarbonyl methyl group, and particularly preferably a linear or branched 2-oxo alkyl group.

As the alkyl group and the cycloalkyl group of $R_{201}$ to $R_{203}$, a linear or branched alkyl group having 1 to 10 carbon atoms (for example, a methyl group, an ethyl group, a propyl group, a butyl group or a pentyl group), a cycloalkyl group having 3 to 10 carbon atoms (a cyclopentyl group, a cyclohexyl group or a norbornyl group) may be preferably included. As the more preferable alkyl group, a 2-oxo alkyl group or an alkoxycarbonyl methyl group may be included. As the more preferable cycloalkyl group, a 2-oxo cycloalkyl group may be included.

The 2-oxo alkyl group may be either linear or branched and preferably include a group having >C=O at 2-position of the above alkyl group.

The 2-oxo cycloalkyl group may preferably include a group having >C=O at 2-position of the above cycloalkyl group.

The alkoxy group in the alkoxycarbonyl methyl group may preferably include an alkoxy group having 1 to 5 carbon atoms (a methoxy group, an ethoxy group, a propoxy group, a butoxy group or a pentoxy group).

$R_{201}$ to $R_{203}$ may be further substituted with a halogen atom, an alkoxy group (for example, 1 to 5 carbon atoms), a hydroxyl group, a cyano group or a nitro group.

Next, a compound (ZI-3) will be described.

The compound (ZI-3) is a compound represented by the general formula (ZI-3) below, and is a compound having a phenacylsulfonium salt structure.

[Chem. 34]

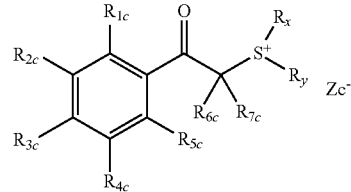

(ZI-3)

In the general formula (ZI-3), $R_{1c}$ to $R_{5c}$ each independently represent a hydrogen atom, an alkyl group, a cycloalkyl group, an aryl group, an alkoxy group, an aryloxy group, an alkoxycarbonyl group, an alkylcarbonyloxy group, a cycloalkylcarbonyloxy group, a halogen atom, a hydroxyl group, a nitro group, an alkylthio group or an arylthio group.

$R_{6c}$ and $R_{7c}$ each independently represent a hydrogen atom, an alkyl group, a cycloalkyl group, a halogen atom, a cyano group or an aryl group.

$R_x$ and $R_y$ each independently represent an alkyl group, a cycloalkyl group, and a 2-oxoalkyl group, a 2-oxocycloalkyl group, an alkoxycarbonyl alkyl group, an allyl group or a vinyl group.

Two or more of $R_{1c}$ to $R_{5c}$, $R_{5c}$ and $R_{6c}$, $R_{6c}$ and $R_{7c}$, $R_{5c}$ and $R_x$, and $R_x$ and $R_y$, may be bonded to each other to form a ring structure, and this ring structure may include an oxygen atom, a sulfur atom, a ketone group, an ester bond or an amide bond.

The ring structure may include an aromatic or non-aromatic hydrocarbon ring, an aromatic or non-aromatic heterocyclic ring, or a polycyclic condensed ring formed by two or more of these rings being combined. As the ring structure, a 3- to 10-membered ring may be included, a 4- to 8-membered ring is preferable, and a 5- or 6-membered ring is more preferable.

The group formed by two or more of $R_{1c}$ to $R_{5c}$, $R_{6c}$ and $R_{7c}$, and $R_x$ and $R_y$ being bonded may include a butylene group, pentylene group or the like.

The group formed by $R_{5c}$ and $R_{6c}$, and $R_{5c}$ and $R_x$ being bonded to each other may preferably include a single bond or an alkylene group, and as an alkylene group, a methylene group, an ethylene group or the like may be included.

Zc⁻ represents a non-nucleophilic anion, and may include the same non-nucleophilic anion as Z⁻ in the general formula (ZI).

The alkyl group as $R_{1c}$ to $R_{7c}$ may be either linear or branched, and may include, for example, an alkyl group having 1 to 20 carbon atoms, preferably a linear or branched alkyl group having 1 to 12 carbon atoms (for example, a methyl group, an ethyl group, a linear or branched propyl group, a linear or branched butyl group, or a linear or branched pentyl group), and the cycloalkyl group may include a cycloalkyl group having 3 to 10 carbon atoms (for example, a cyclopentyl group or a cyclohexyl group).

The aryl group as $R_{1c}$ to $R_{5c}$ preferably has 5 to 15 carbon atoms, and may include, for example, a phenyl group or a naphthyl group.

The alkoxy group as $R_{1c}$ to $R_{5c}$ may be any of linear, branched and cyclic, and may include, for example, an alkoxy group having 1 to 10 carbon atoms, preferably, a linear and branched alkoxy group having 1 to 5 carbon atoms (for example, a methoxy group, an ethoxy group, a linear or branched propoxy group, a linear or branched butoxy group, or a linear or branched pentoxy group), a cyclic alkoxy group having 3 to 10 carbon atoms (for example, a cyclopentyloxy group or a cyclohexyloxy group).

Specific examples of the alkoxy group in the alkoxycarbonyl group as $R_{1c}$ to $R_{5c}$ are the same as specific examples of the alkoxy group as $R_{1c}$ to $R_{5c}$ described above.

Specific examples of the alkyl group in the alkylcarbonyloxy group and the alkylthio group as $R_{1c}$ to $R_{5c}$ are the same as specific examples of the alkyl group as $R_{1c}$ to $R_{5c}$ described above.

Specific examples of the cycloalkyl group in the cycloalkyl carbonyloxy group as $R_{1c}$ to $R_{5c}$ are the same as specific examples of the cycloalkyl group as $R_{1c}$ to $R_{5c}$ described above.

Specific examples of the aryl group in the aryloxy group and the arylthio group as $R_{1c}$ to $R_{5c}$ are the same as specific examples of the aryl group as $R_{1c}$ to $R_{5c}$ described above.

Preferably, any of $R_{1c}$ to $R_{5c}$ is a linear or branched alkyl group, a cycloalkyl group, or a linear, branched or cyclic alkoxy group, and more preferably, the sum of the number of carbon atoms in $R_{1c}$ to $R_{5c}$ is 2 to 15. As a result, solvent solubility is further improved and the generation of particles is suppressed at the time of storing.

As the ring structure which may be formed by two or more of $R_{1c}$ to $R_{5c}$ being bonded to each other, a 5-membered or 6-membered ring may be preferably included, and a 6-membered ring (for example, a phenyl ring) may be particularly preferably included.

The ring structure which may be formed by $R_{5c}$ and $R_{6c}$ being bonded to each other may include a 4-membered ring or more (particularly preferably a 5- to 6-membered ring) formed together with a carbonyl carbon atom and a carbon atom in the general formula (ZI-3) by $R_{5c}$ and $R_{6c}$ being bonded to each other and constituting a single bond or an alkylene group (a methylene group, an ethylene group, or the like).

The aryl group as $R_{6c}$ and $R_{7c}$ preferably has 5 to 15 carbon atoms, and may include, for example, a phenyl group or a naphthyl group.

As an aspect of $R_{6c}$ and $R_{7c}$, it is preferable that both of them be an alkyl group. In particular, it is preferable that each of $R_{6c}$ and $R_{7c}$ be a linear or branched alkyl group having 1 to 4 carbon atoms, and particularly, it is preferable that both be a methyl group.

In addition, when $R_{6c}$ and $R_{7c}$ are bonded to each other to form a ring, the group formed by $R_{6c}$ and $R_{7c}$ being bonded to each other is preferably an alkylene group having 2 to 10 carbon atoms, and may include, for example, an ethylene group, a propylene group, a butylene group, a pentylene group, a hexylene group, or the like. In addition, the ring formed by $R_{6c}$ and $R_{7c}$ being bonded to each other may have a hetero atom such as an oxygen atom in the ring.

The alkyl group and the cycloalkyl group as $R_x$ and $R_y$ may include the same alkyl group and the cycloalkyl group as $R_{1c}$ to $R_{7c}$.

The 2-oxoalkyl group and the 2-oxocycloalkyl group as $R_x$ and $R_y$ may include the group having >C=O at 2-position of the alkyl group and the cycloalkyl group as $R_{1c}$ to $R_{7c}$.

The alkoxy group in the alkoxycarbonyl alkyl group as $R_x$ and $R_y$ may include the same alkoxy group in $R_{1c}$ to $R_{5c}$, and the alkyl groups may include, for example, an alkyl group having 1 to 12 carbon atoms, and preferably include a linear alkyl group having 1 to 5 carbon atoms (for example, a methyl group or an ethyl group).

The ally group as $R_x$ and $R_y$ is not particularly limited, however, an unsubstituted allyl group, or an allyl group substituted with a monocyclic or polycyclic cycloalkyl group (preferably a cycloalkyl group having 3 to 10 carbon atoms) is preferable.

The vinyl group as $R_x$ and $R_y$ is not particularly limited, however, an unsubstituted vinyl group, or a vinyl group substituted with a monocyclic or polycyclic cycloalkyl group (preferably a cycloalkyl group having 3 to 10 carbon atoms) is preferable.

The ring structure which may be formed by $R_{5c}$ and $R_x$ being bonded to each other may include a 5-membered ring or more (particularly preferably a 5-membered ring) formed together with a sulfur atom and a carbonyl carbon atom in the general formula (ZI-3) by $R_{5c}$ and $R_x$ being bonded to each other and constituting a single bond or an alkylene group (a methylene group, an ethylene group, or the like).

The ring structure which may be formed by $R_x$ and $R_y$ being bonded to each other may include a 5-membered or 6-membered ring, particularly preferably a 5-membered ring (that is, a tetrahydrothiophene ring) formed by divalent $R_x$ and $R_y$ (for example, a methylene group, an ethylene group, a propylene group or the like) together with a sulfur atom in the general formula (ZI-3).

$R_x$ and $R_y$ are preferably an alkyl group having 4 or more carbon atoms or a cycloalkyl group, and are more preferably an alkyl group having 6 or more carbon atoms, even more preferably an alkyl group having 8 or more carbon atoms, or a cycloalkyl group.

$R_{1c}$ to $R_{7c}$, $R_x$, and $R_y$ may have further substituents and examples of the substituent may include a halogen atom (for example, a fluorine atom), a hydroxyl group, a carboxyl group, a cyano group, a nitro group, an alkyl group, a cycloalkyl group, an aryl group, an alkoxy group, an aryloxy group, an acyl group, an arylcarbonyl group, an alkoxyalkyl group, an aryloxy alkyl group, an alkoxycarbonyl group, an aryloxycarbonyl group, an alkoxycarbonyloxy group, an aryloxy carbonyloxy group, or the like.

$R_{1c}$, $R_{2c}$, $R_{4c}$, and $R_{5c}$ in the general formula (ZI-3) described above each independently represent a hydrogen atom, and, more preferably, $R_{1c}$ represents a group other than a hydrogen atom, that is, an alkyl group, a cycloalkyl group, an aryl group, an alkoxy group, an aryloxy group, an alkoxycarbonyl group, an alkylcarbonyloxy group, a cycloalkylcarbonyloxy group, a halogen atom, a hydroxyl group, a nitro group, an alkylthio group or an arylthio group.

As the cation of the compound represented by the general formula (ZI-2) or (ZI-3) in the present invention, the following specific examples are included.

[Chem. 35]

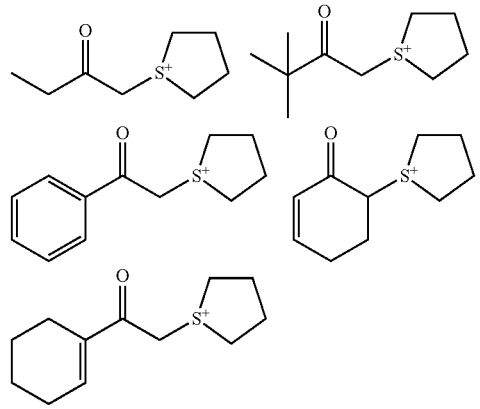

85
-continued
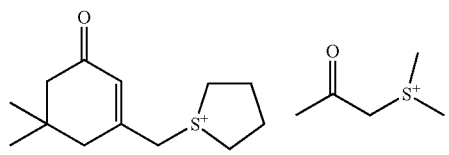
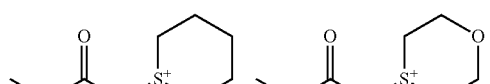
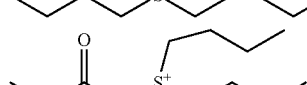
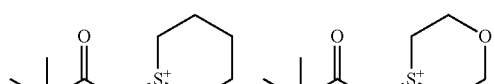
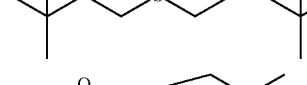
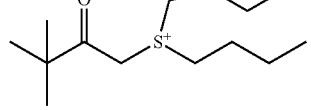
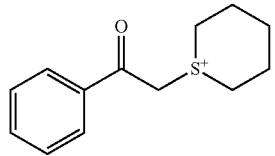
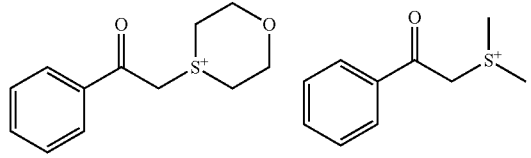
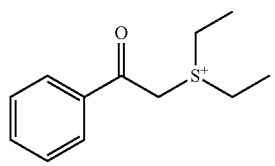
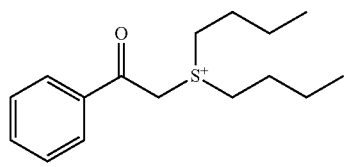
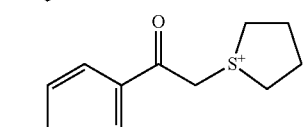
86
-continued
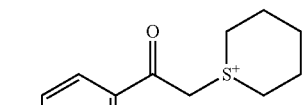
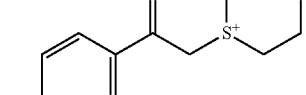
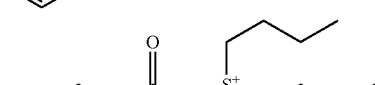
[Chem. 36]
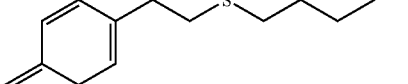
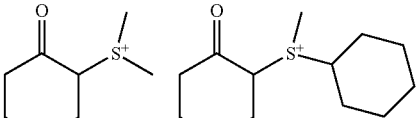
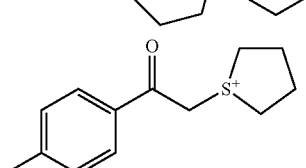
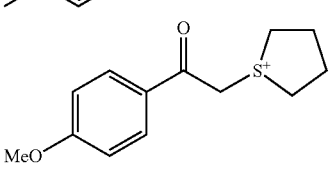

87
-continued
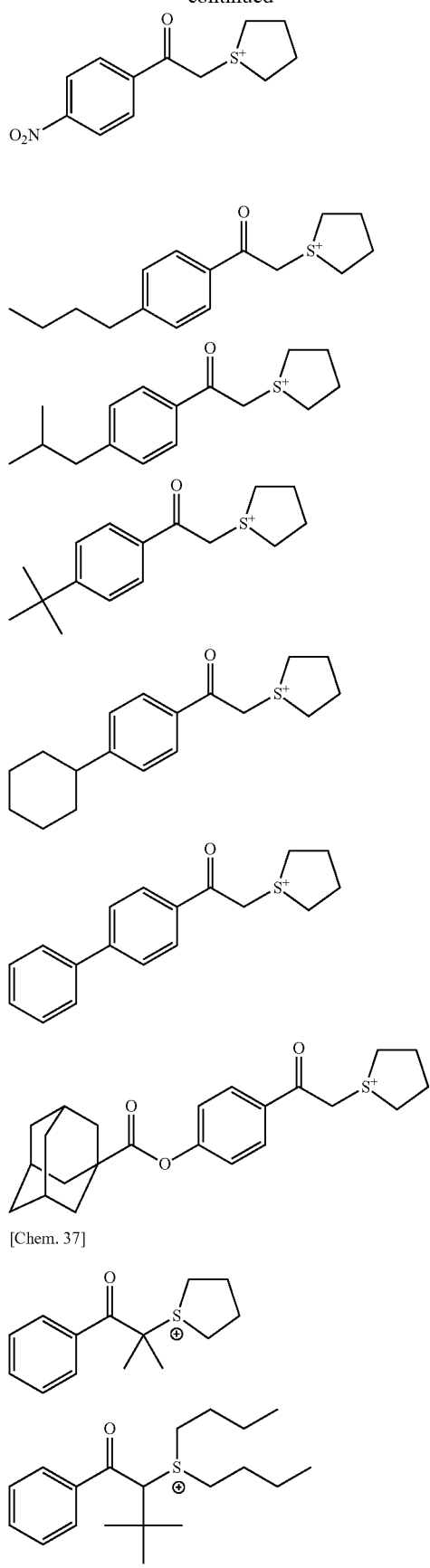
[Chem. 37]
88
-continued
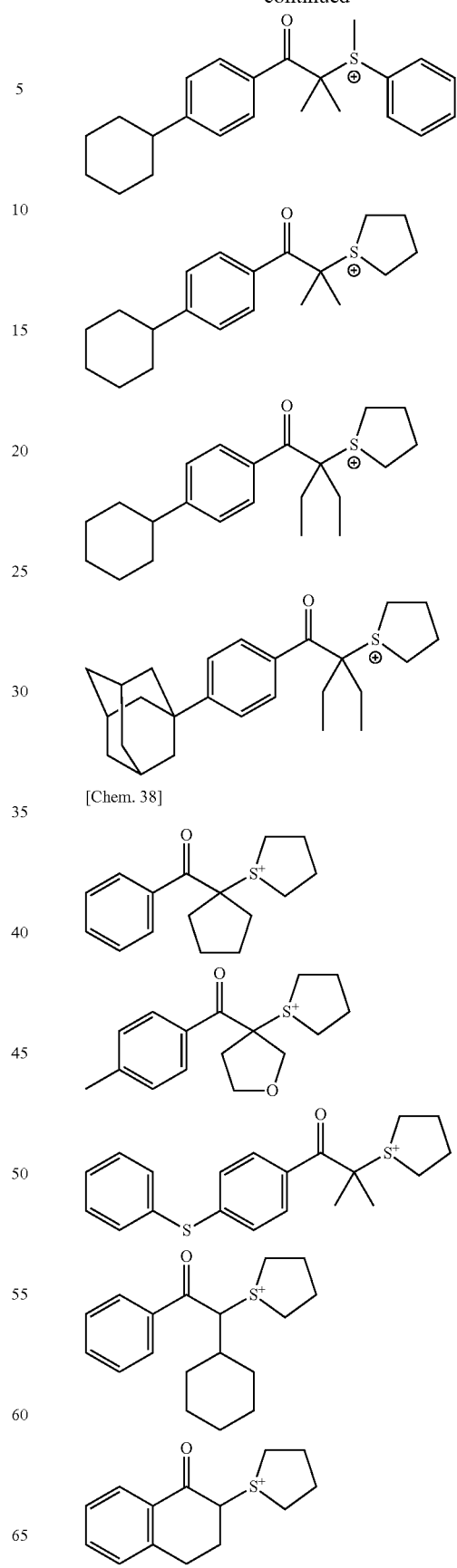
[Chem. 38]

89
-continued
90
-continued
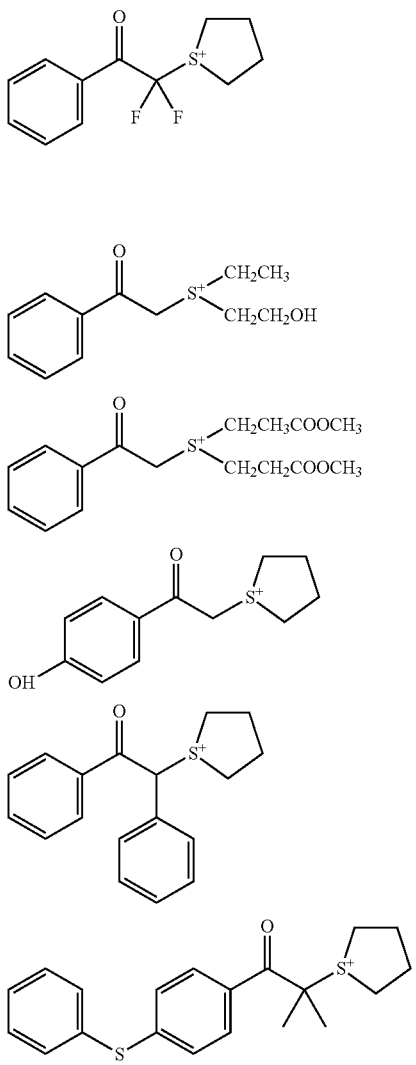
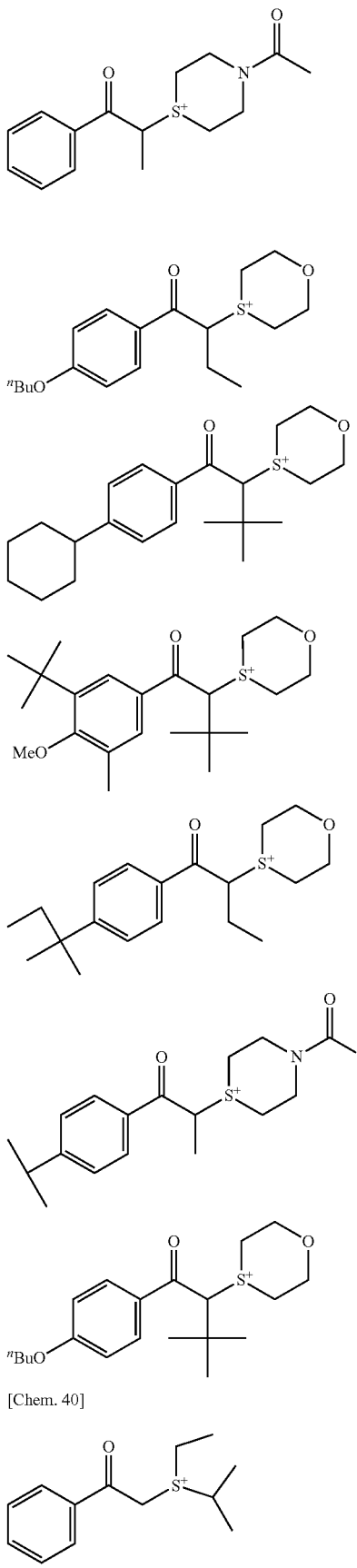
[Chem. 39]
[Chem. 40]

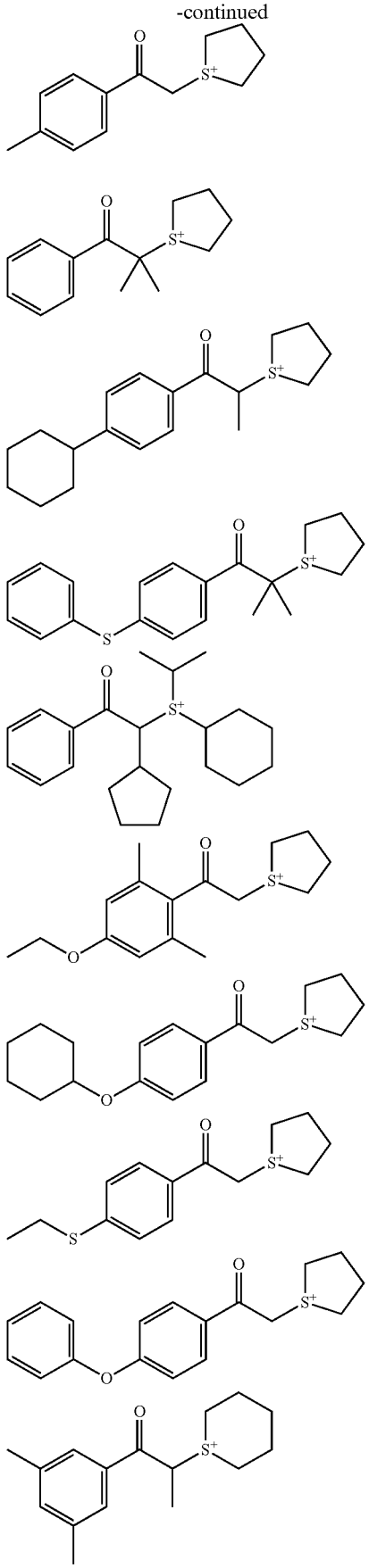

Next, a compound (ZI-4) will be described.

The compound (ZI-4) is represented by the following general formula (ZI-4).

[Chem. 41]

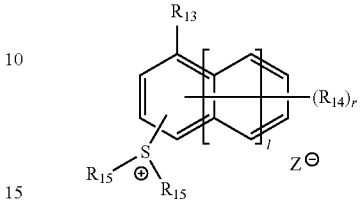

(ZI-4)

In the general formula (ZI-4), $R_{13}$ represents a hydrogen atom, a fluorine atom, a hydroxyl group, an alkyl group, a cycloalkyl group, an alkoxy group, an alkoxycarbonyl group or a group having a cycloalkyl group. These groups may have a substituent.

In the case where a plurality of $R_{14}$'s are present, $R_{14}$'s each independently represent a group having a hydroxyl group, an alkyl group, a cycloalkyl group, an alkoxy group, an alkoxycarbonyl group, an alkylcarbonyl group, an alkylsulfonyl group, a cycloalkylsulfonyl group or a group having a cycloalkyl group. These groups may have a substituent.

$R_{15}$'s each independently represent an alkyl group, a cycloalkyl group or a naphthyl group. Two $R_{15}$'s may be bonded to each other to form a ring. These groups may have a substituent.

l represents an integer of 0 to 2.

r represents an integer of 0 to 8.

$Z^-$ represents a non-nucleophilic anion, and may include the same non-nucleophilic anion as $Z^-$ in the general formula (ZI).

In the general formula (ZI-4), the alkyl group of $R_{13}$, $R_{14}$, and $R_{15}$ has a linear shape or a branched shape, preferably has 1 to 10 carbon atoms, and is preferably a methyl group, an ethyl group, an n-butyl group, a t-butyl group, or the like.

The cycloalkyl group of $R_{13}$, $R_{14}$, and $R_{15}$ may include a monocyclic or polycyclic cycloalkyl group (preferably a cycloalkyl group having 3 to 20 carbon atoms), and is preferably cyclopropyl, cyclopentyl, cyclohexyl, cycloheptyl or cyclooctyl.

The alkoxy group of $R_{13}$ and $R_{14}$ has a linear shape or a branched shape, preferably has 1 to 10 carbon atoms, and is preferably a methoxy group, an ethoxy group, an n-propoxy group, an n-butoxy group, or the like.

The alkoxycarbonyl group of $R_{13}$ and $R_{14}$ has a linear shape or a branched shape, preferably has 2 to 11 carbon atoms, and is preferably a methoxycarbonyl group, an ethoxycarbonyl group, an n-butoxycarbonyl group, or the like.

As the group having a cycloalkyl group of $R_{13}$, and $R_{14}$, may include a monocyclic or polycyclic cycloalkyl group (preferably a cycloalkyl group having 3 to 20 carbon atoms), and may include, for example, a monocyclic or polycyclic cycloalkyloxy group, or an alkoxy group having a monocyclic or polycyclic cycloalkyl group. These groups may further have a substituent.

As the monocyclic or polycyclic cycloalkyloxy group of $R_{13}$, and $R_{14}$, the number of total carbon atoms is preferably 7 or more, the number of total carbon atoms is more preferably greater than or equal to 7 and less than or equal to 15, and, furthermore, having a monocyclic cycloalkyl group is preferable. The monocyclic cycloalkyloxy group having 7 or more total carbon atoms is a monocyclic cycloalkyloxy group in which a cycloalkyloxy group such as a cyclopropyloxy group, a cyclobutyloxy group, a cyclopentyloxy group, a cyclohexyloxy group, a cycloheptyloxy group, a cyclooctyloxy group, a cyclododecanyloxy groups has an arbitrary substituent such as an alkyl group such as a methyl group, an ethyl group, a propyl group, a butyl group, a pentyl group, a hexyl group, a heptyl group, an octyl group, a dodecyl group, a 2-ethylhexyl group, an isopropyl group, a sec-butyl group, a t-butyl group or an iso-amyl group, an alkoxy group such as a hydroxyl group, a halogen atom (fluorine, chlorine, bromine, and iodine), a nitro group, a cyano group, an amide group, a sulfonamide group, a methoxy group, an ethoxy group, a hydroxyethoxy group, a propoxy group, a hydroxypropoxy group or a butoxy group, an alkoxycarbonyl group such as a methoxycarbonyl group or an ethoxycarbonyl group, an acyl group such as a formyl group, an acetyl group or a benzoyl group, an acyloxy group such as an acetoxy group or a butyryloxy group, a carboxyl group, or the like, and represents a monocyclic cycloalkyloxy group in which the number of total carbon atoms combined with an arbitrary substituent on the cycloalkyl group is 7 or more.

In addition, the polycyclic cycloalkyloxy group having a 7 or more total carbon atoms may include a norbornyloxy group, a tricyclodecanyloxy group, a tetracyclodecanyloxy group, an adamantyloxy group, or the like.

As the alkoxy group having a monocyclic or polycyclic cycloalkyl group of $R_{13}$ and $R_{14}$, the number of total carbon atoms is preferably 7 or more, the number of total carbon atoms is more preferably greater than or equal to 7 and less than or equal to 15, and, furthermore, an alkoxy group having a monocyclic cycloalkyl group is preferable. The alkoxy group having a monocyclic cycloalkyl group having 7 or more total carbon atoms is the one in which the monocyclic cycloalkyl group that may have the above-described substituent is substituted with an alkoxy group such as a methoxy group, an ethoxy group, a propoxy group, a butoxy group, a pentyloxy group, a hexyloxy group, a heptoxy group, an octyloxy group, a dodecyloxy group, a 2-ethylhexyloxy group, an isopropoxy group, a sec-butoxy group, a t-butoxy group or an iso-amyloxy group, and represents a group in which the number of total carbon atoms including the substituent is 7 or more. For example, a cyclohexylmethoxy group, a cyclopentylethoxy group, a cyclohexylethoxy group or the like may be included, and a cyclohexylmethoxy group is preferable.

In addition, the alkoxy group having a polycyclic cycloalkyl group having a 7 or more total carbon atoms may include a norbornylmethoxy group, a norbornylethoxy group, a tricyclodecanylmethoxy group, a tricyclodecanylethoxy group, a tetracyclodecanylmethoxy group, a tetracyclodecanylethoxy group, an adamantylmethoxy group, an adamantylethoxy group or the like, and is preferably a norbornylmethoxy group, a norbornylethoxy group, or the like.

As the alkyl group of the alkylcarbonyl group of $R_{14}$, the same specific examples as the alkyl group as $R_{13}$ to $R_{15}$ described above may be included.

The alkylsulfonyl group and the cycloalkylsulfonyl group of $R_{14}$ have a linear shape, a branched shape or a cyclic shape, and preferably has 1 to 10 carbon atoms, and is preferably, for example, a methanesulfonyl group, an ethanesulfonyl group, an n-propanesulfonyl group, an n-butanesulfonyl group, a cyclopentane sulfonyl group, a cyclohexanesulfonyl group, or the like.

As the substituent which each group described above may have, a halogen atom (for example, a fluorine atom), a hydroxyl group, a carboxyl group, a cyano group, a nitro group, an alkoxy group, an alkoxyalkyl group, an alkoxycarbonyl group, an alkoxycarbonyloxy group or the like may be included.

The alkoxy group includes, for example, a linear, branched, or cyclic alkoxy group having 1 to 20 carbon atoms such as a methoxy group, an ethoxy group, an n-propoxy group, an i-propoxy group, an n-butoxy group, a 2-methylpropoxy group, a 1-methylpropoxy group, a t-butoxy group, a cyclopentyloxy group a cyclohexyloxy group, or the like.

The alkoxyalkyl group includes, for example, a linear, branched, or cyclic alkoxyalkyl group having 2 to 21 carbon atoms such as a methoxymethyl group, an ethoxymethyl group, a 1-methoxyethyl group, a 2-methoxyethyl group, a 1-ethoxyethyl group or a 2-ethoxyethyl group, or the like.

The alkoxycarbonyl group includes, for example, a linear, branched, or cyclic alkoxycarbonyl group having 2 to 21 carbon atoms such as a methoxycarbonyl group, an ethoxycarbonyl group, an n-propoxycarbonyl group, an i-propoxycarbonyl group, an n-butoxycarbonyl group, a 2-methylpropoxycarbonyl group, a 1-methylpropoxycarbonyl group, a t-butoxycarbonyl group, a cyclopentyloxycarbonyl group or a cyclohexyloxycarbonyl group, or the like.

The alkoxycarbonyloxy group includes, for example, a linear, branched, or cyclic alkoxycarbonyloxy group having 2 to 21 carbon atoms such as a methoxycarbonyloxy group, an ethoxycarbonyloxy group, an n-propoxycarbonyloxy group, an i-propoxycarbonyloxy group, an n-butoxycarbonyloxy group, a t-butoxycarbonyloxy group, a cyclopentyloxycarbonyloxy group or a cyclohexyloxycarbonyloxy, or the like.

The ring structure which may be formed by two $R_{15}$'s being bonded to each other may include a 5-membered or 6-membered ring, particularly preferably a 5-membered ring (that is, a tetrahydrothiophene ring) formed by two $R_{15}$'s together with a sulfur atom in the general formula (ZI-4), and may be a ring condensed with an aryl group or a cycloalkyl group. This divalent $R_{15}$ may have a substituent, and examples of the substituent include a hydroxyl group, a carboxyl group, a cyano group, a nitro group, an alkyl group, a cycloalkyl group, an alkoxy group, an alkoxyalkyl group, an alkoxycarbonyl group, an alkoxycarbonyloxy group, and the like. The substituent for the ring structure may be present in plural numbers and these may be bonded to each other to form a ring (an aromatic or non-aromatic hydrocarbon ring, an aromatic or non-aromatic heterocyclic ring, or a polycyclic condensed ring formed by combining two or more of these rings).

$R_{15}$ in the general formula (ZI-4) is preferably a methyl group, an ethyl group, a naphthyl group, a divalent group in which two $R_{15}$'s are bonded to each other and form a tetrahydrothiophene ring structure together with a sulfur atom.

The substituent which $R_{13}$ and $R_{14}$ may have is preferably a hydroxyl group, an alkoxy group, an alkoxycarbonyl group, or a halogen atom (particularly, a fluorine atom).

As l, 0 or 1 is preferable, and 1 is more preferable.

As r, 0 to 2 is preferable.

Specific examples of the cation of the compound represented by the general formula (ZI-4) in the present invention will be shown below.

[Chem. 42]
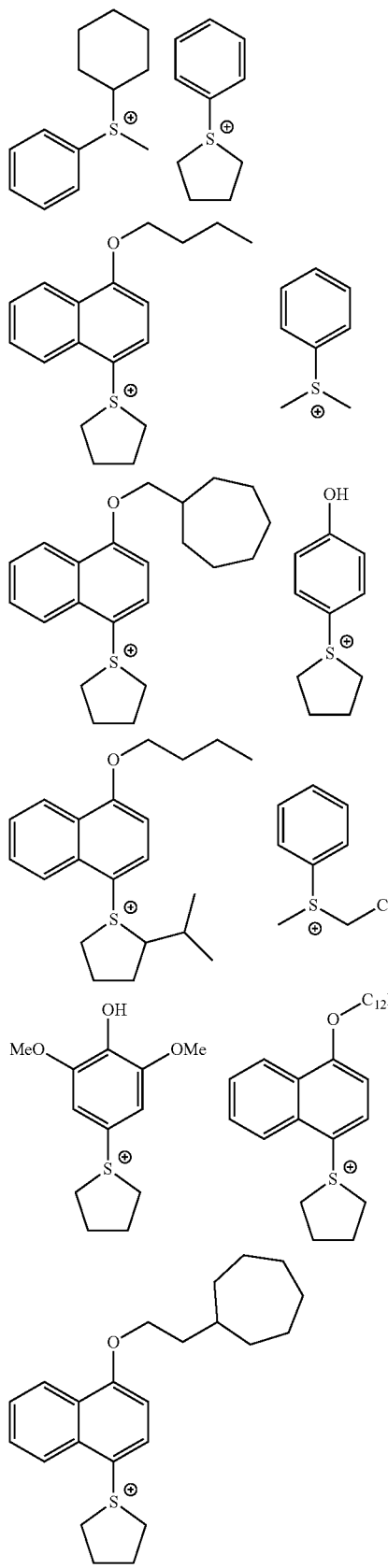
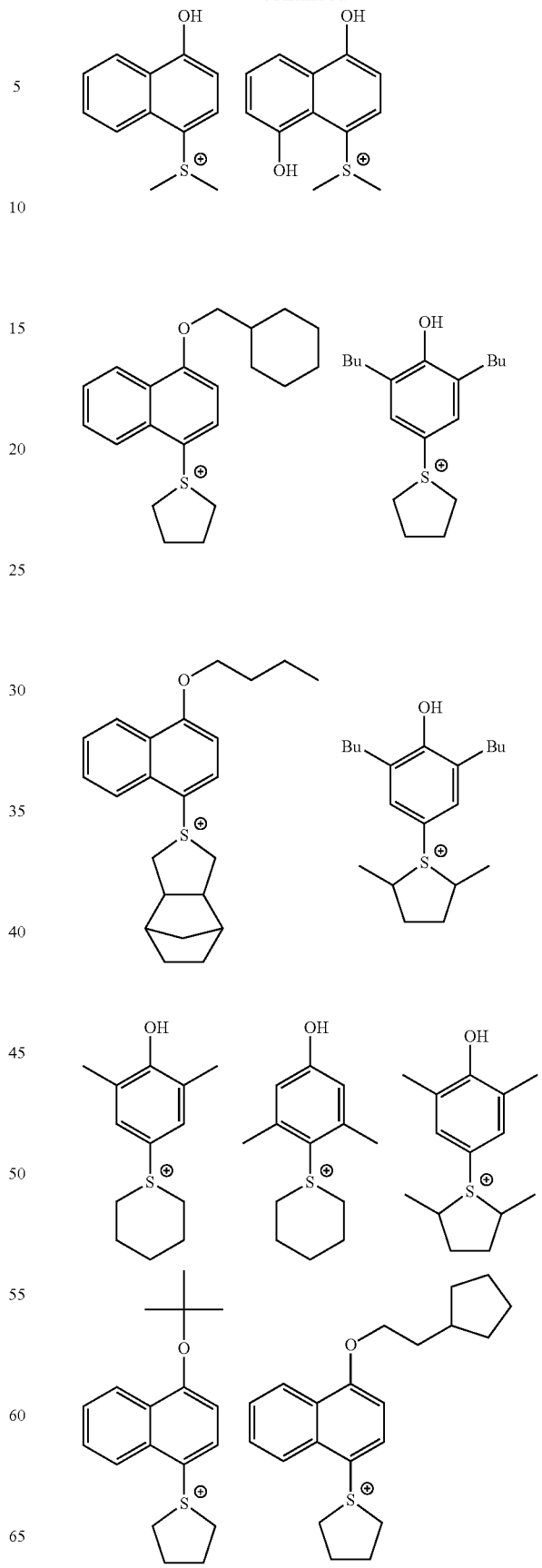

97
-continued
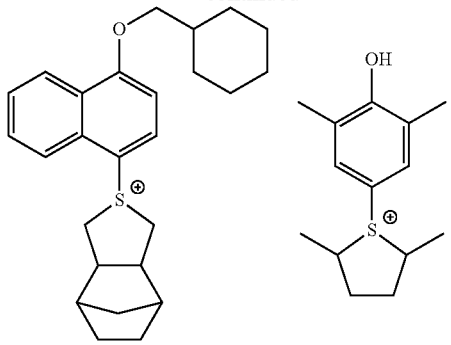
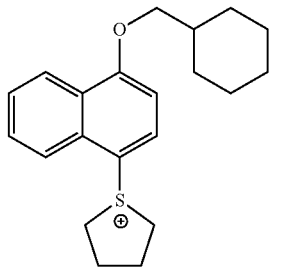
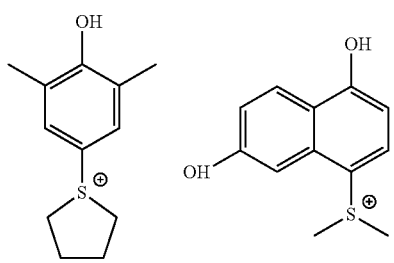
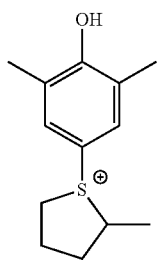
[Chem. 43]
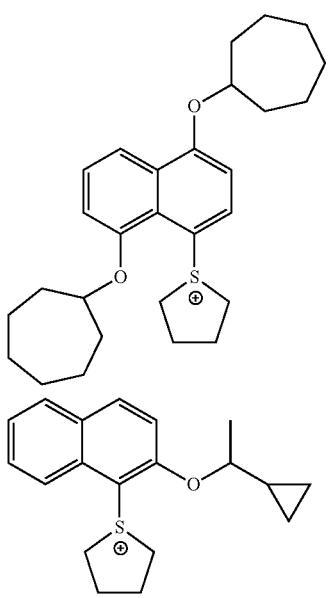
98
-continued
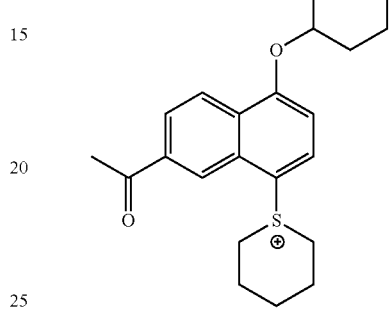
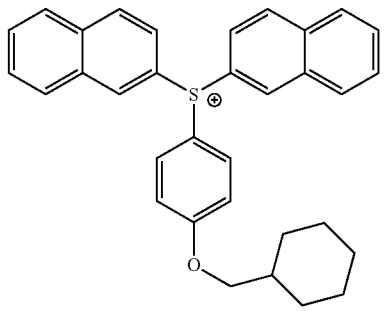

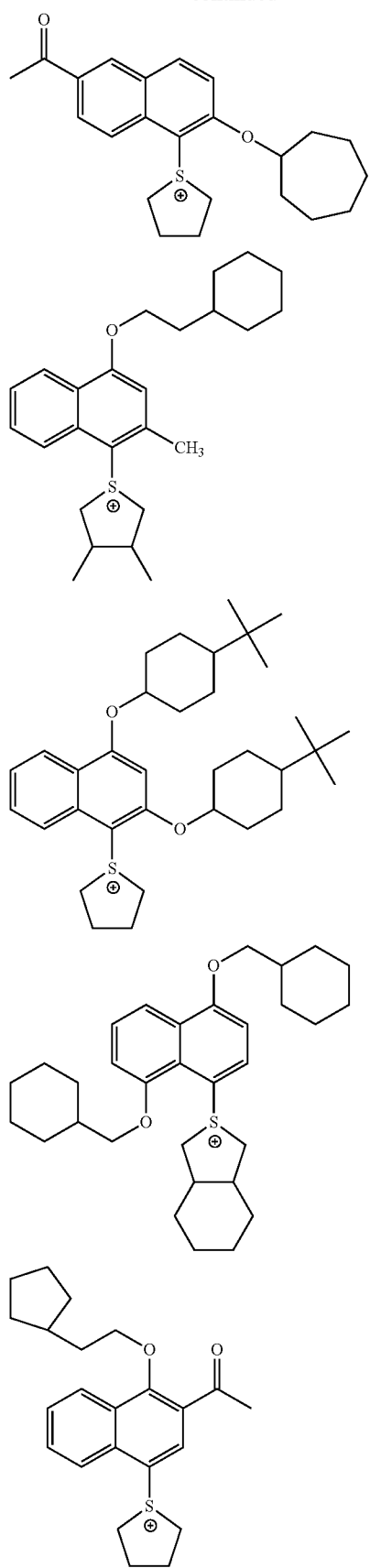
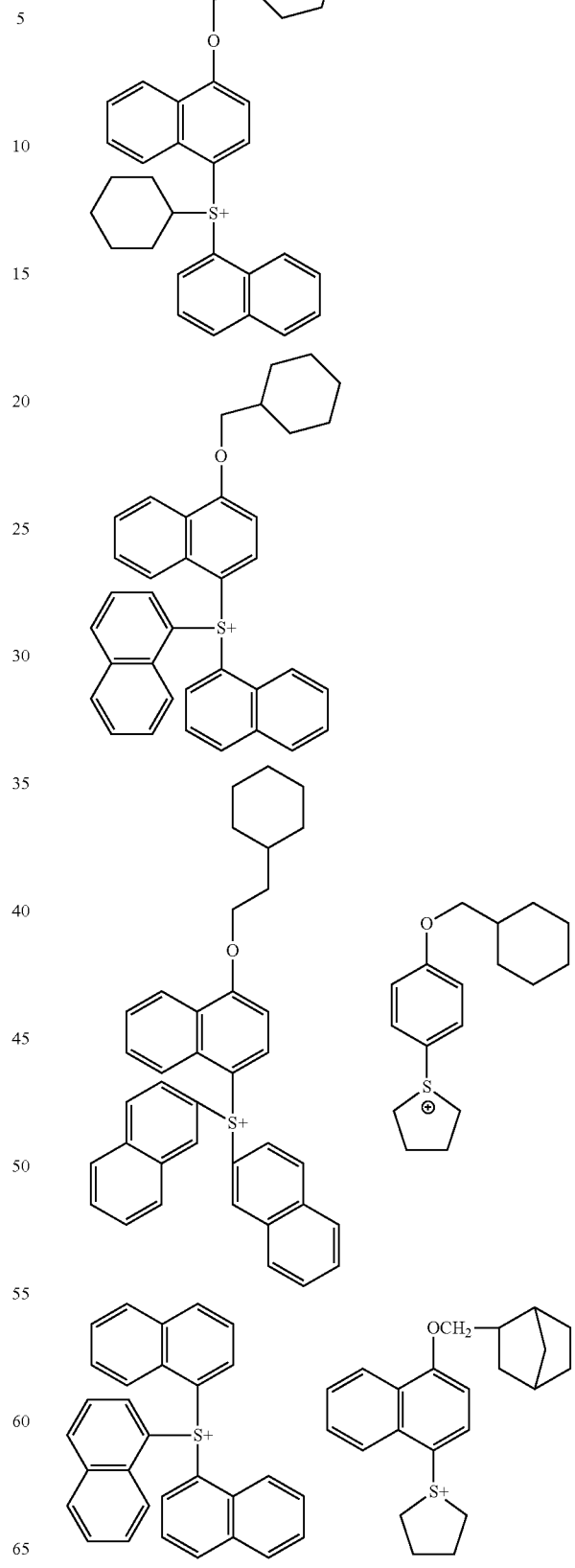

Next, the general formulae (ZII) and (ZIII) will be described.

In the general formulae (ZII) and VIM, $R_{204}$ to $R_{207}$ each independently represent an aryl group, an alkyl group, or a cycloalkyl group.

The aryl group of $R_{204}$ to $R_{207}$ is preferably a phenyl group or a naphthyl group, and more preferably a phenyl group. The aryl group of $R_{204}$ to $R_{207}$ may also be an aryl group having a heterocyclic structure having an oxygen atom, a nitrogen atom, a sulfur atom or the like. As the skeleton of the aryl group having a heterocyclic structure, for example, pyrrole, furan, thiophene, indole, benzofuran, benzothiophene, or the like, may be included.

The alkyl group and the cycloalkyl group in $R_{204}$ to $R_{207}$ may preferably include a linear or branched alkyl group having 1 to 10 carbon atoms (for example, a methyl group, an ethyl group, a propyl group, a butyl group or a pentyl group), a cycloalkyl group having 3 to 10 carbon atoms (a cyclopentyl group, a cyclohexyl group, or a norbornyl group).

The aryl group, the alkyl group, and the cycloalkyl group of $R_{204}$ to $R_{207}$ may have a substituent. As the substituent, the aryl group, the alkyl group, and the cycloalkyl group of $R_{204}$ to $R_{207}$ may have, for example, an alkyl group (for example, 1 to 15 carbon atoms), a cycloalkyl group (for example, 3 to 15 carbon atoms), an aryl group (for example, 6 to 15 carbon atoms), an alkoxy group (for example, 1 to 15 carbon atoms), a halogen atom, a hydroxyl group, a phenylthio group, or the like, may be included.

$Z^-$ represents a non-nucleophilic anion, and may include the same non-nucleophilic anion as $Z^-$ in the general formula (ZI).

As the acid generator, compounds represented by the following the general formulae (ZIV), (ZV) and (ZVI) may also be exemplified.

[Chem. 44]

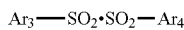

(ZIV)

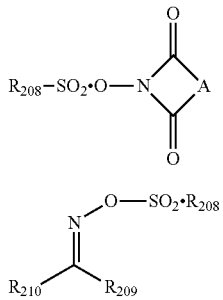

(ZV)

(ZVI)

In the general formulae (ZIV) to (ZVI), $Ar_3$ and $Ar_4$ each independently represent an aryl group.

$R_{208}$, $R_{209}$, and $R_{210}$ each independently represent an alkyl group, a cycloalkyl group or an aryl group.

A represents an alkylene group, an alkenylene group or an arylene group.

Specific examples of the aryl group of $Ar_3$, $Ar_4$, $R_{208}$, $R_{209}$, and $R_{210}$ may include the same specific examples of the aryl group of $R_{201}$, $R_{202}$, and $R_{203}$ in the general formula (ZI-1) described above.

Specific examples of the alkyl group and the cycloalkyl group of $R_{208}$, $R_{209}$, and $R_{210}$ may include the same specific examples of the alkyl group and the cycloalkyl group of $R_{201}$, $R_{202}$, and $R_{203}$ in the general formula (ZI-2) described above, respectively.

The alkylene group of A may include an alkylene group having 1 to 12 carbon atoms (for example, a methylene group, an ethylene group, a propylene group, an isopropylene group, a butylene group, an isobutylene group, or the like), the alkenylene group of A may include an alkenylene group having 2 to 12 carbon atoms (for example, an ethenylene group, a propenylene group, a butenylene group, or the like), and the arylene group of A may include an arylene group having 6 to 10 carbon atoms (for example, a phenylene group, a tolylene group, a naphthylene group, or the like), respectively.

In the acid generator, a compound represented by the general formulae (ZI) to (ZIII) is more preferable.

In addition, the acid generator is preferably a compound which generates an acid having one sulfonic acid group or an imide group, more preferably a compound which generates a monovalent perfluoroalkanesulfonic acid, a compound which generates a monovalent aromatic sulfonic acid substituted with a fluorine atom or a group containing a fluorine atom, a compound which generates a monovalent imide acid substituted with a fluorine atom or a group containing a fluorine atom, and even more preferably a fluorine-substituted alkanesulfonic acid, a fluorine-substituted benzenesulfonic acid, a fluorine-substituted imide acid, or a sulfonium salt of a fluorine-substituted methide acid. The acid generator that can be used is particularly preferably a fluorinated substituted alkanesulfonic acid, a fluorinated substituted benzenesulfonic acid, or a fluorinated substituted imide acid, which generates an acid having a pKa of not more than −1, and the sensitivity is enhanced.

Among the acid generators, particularly preferable examples are shown below.

[Chem. 45]

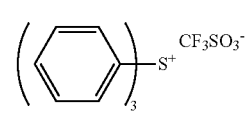

(z1)

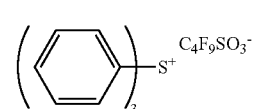

(z2)

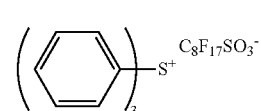

(z3)

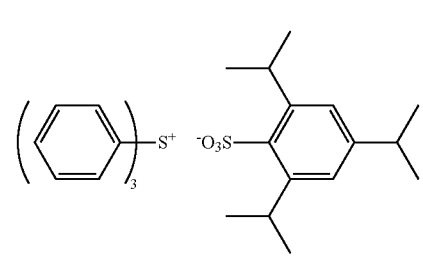

(z4)

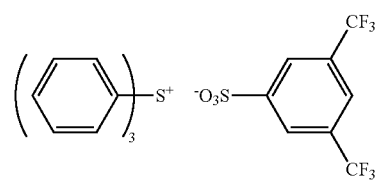 (z5)
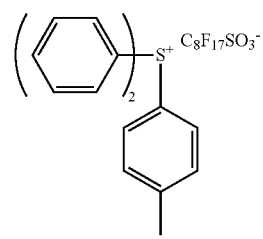 (z6)
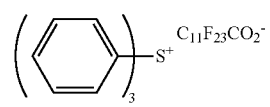 (z7)
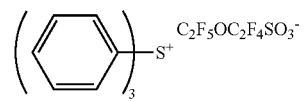 (z8)
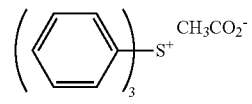 (z9)
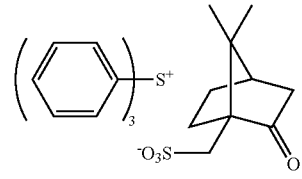 (z10)
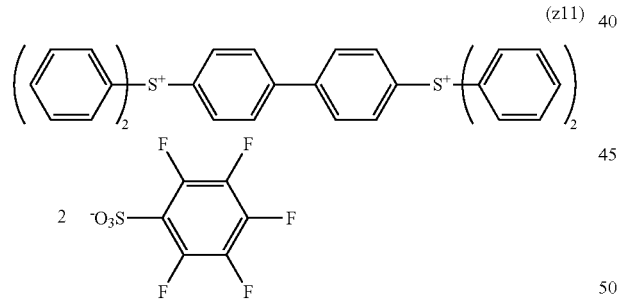 (z11)
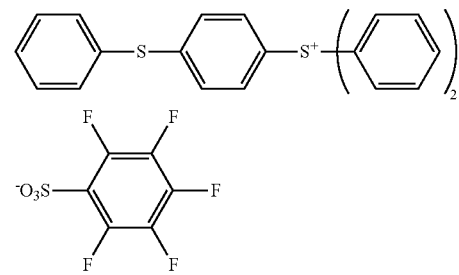 (z12)
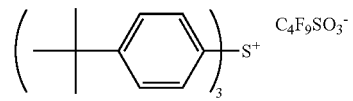 (z13)
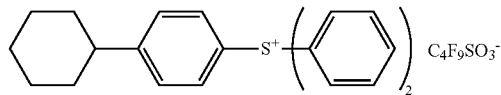 (z14)
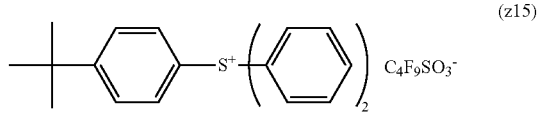 (z15)
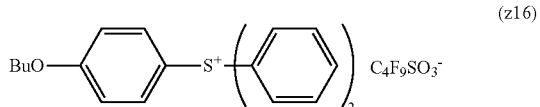 (z16)
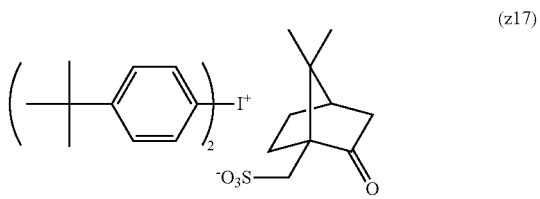 (z17)
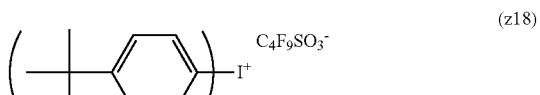 (z18)
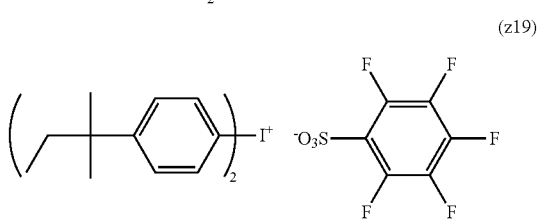 (z19)
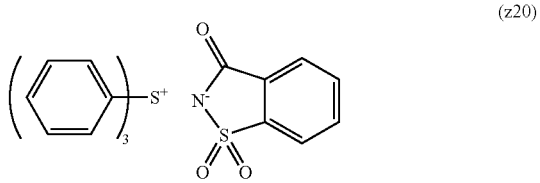 (z20)
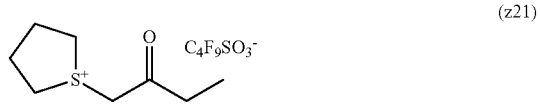 (z21)
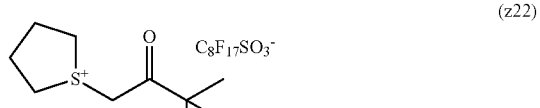 (z22)
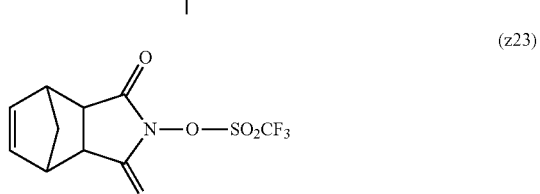 (z23)
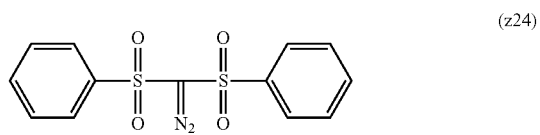 (z24)

-continued
(z25) 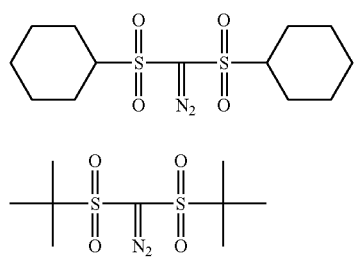
(z26) 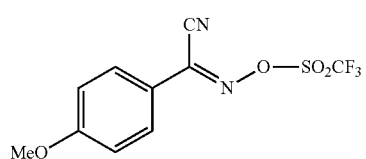
(z27) 
(z28) 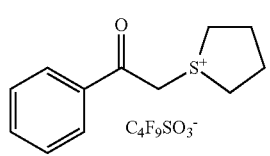
(z29) 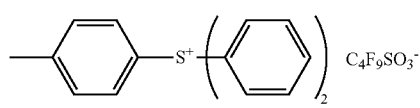
(z30) 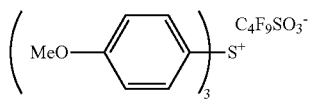
(z31) 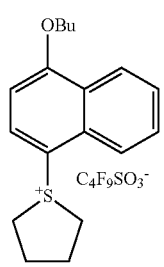
(z32) 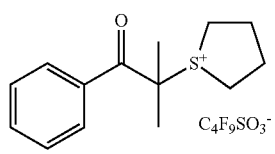
(z33) 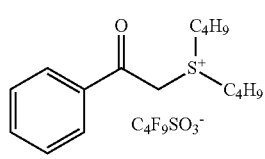
-continued
(z34) 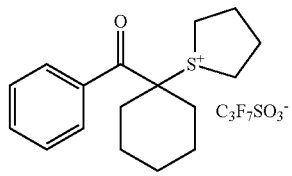
(z35) 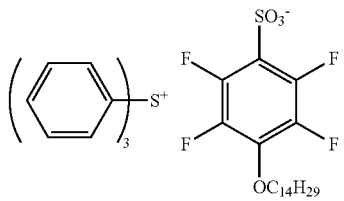
(z36) 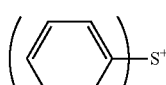
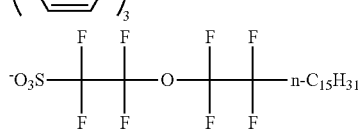
(z37) 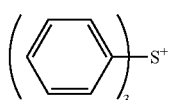
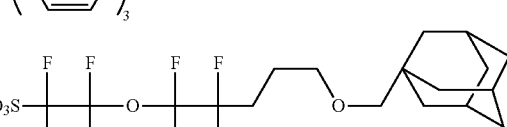
(z38) 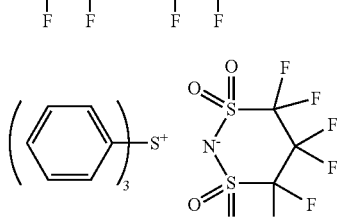
(z39) 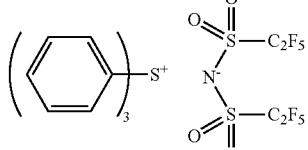
(z40) 
[Chem. 46]
(z41) 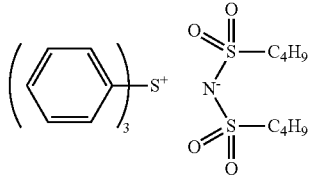

-continued
(z42) 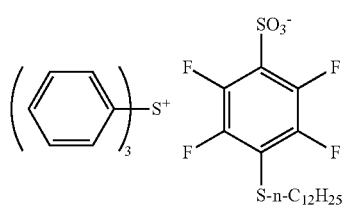
(z43) 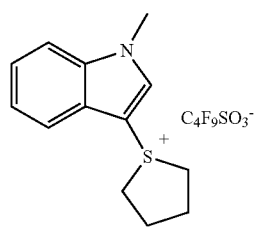
(z44) 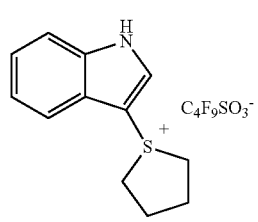
(z45) 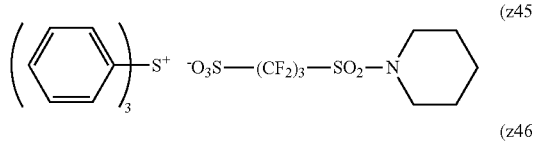
(z46) 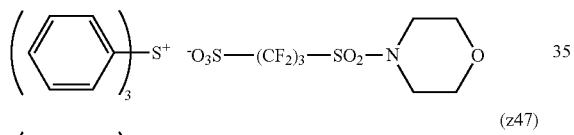
(z47) 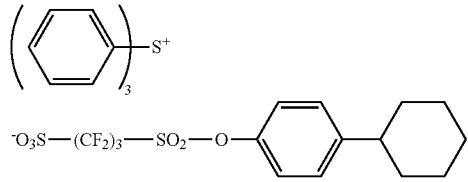
(z48) 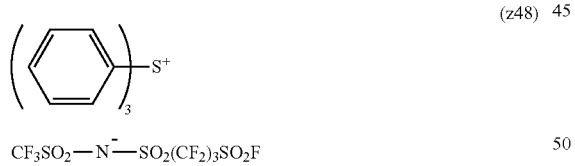
(z49) 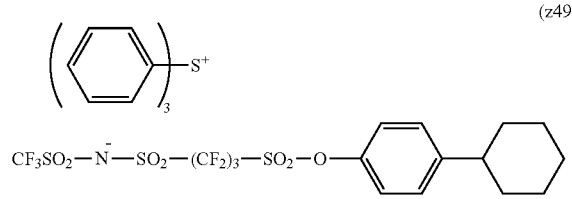
(z50) 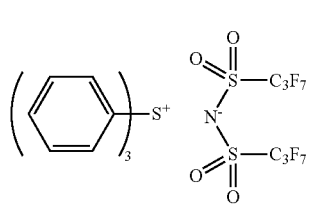
-continued
(z51) 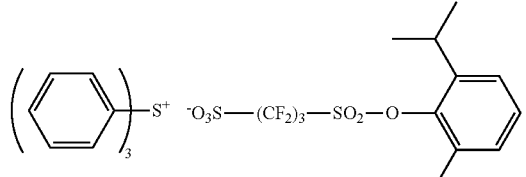
(z52) 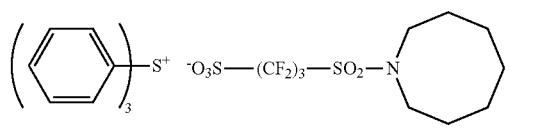
(z53) 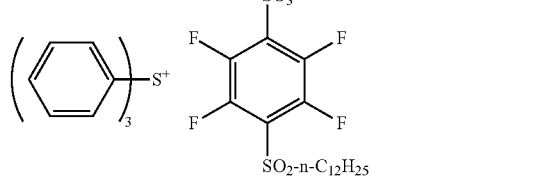
(z54) 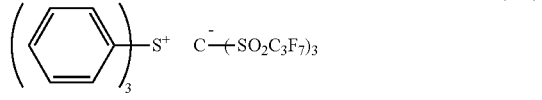
(z55) 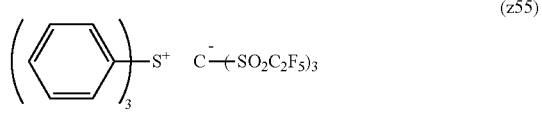
(z56) 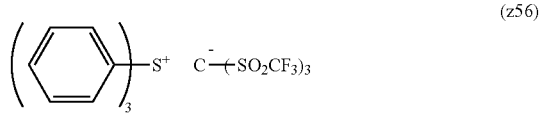
(z57) 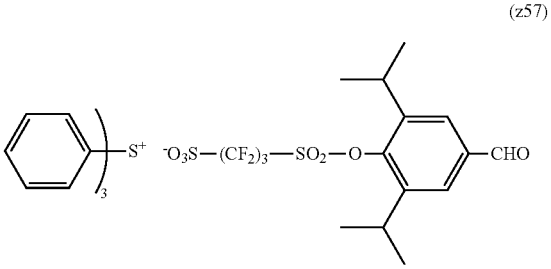
(z58) 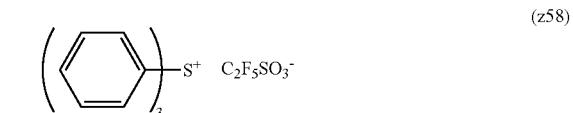
(z59) 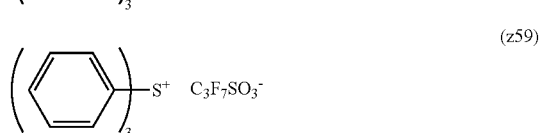
(z60) 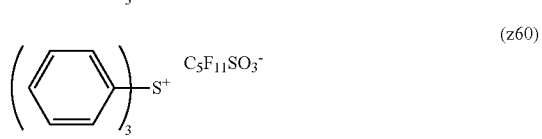

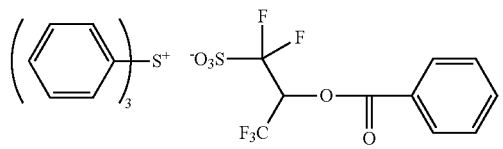
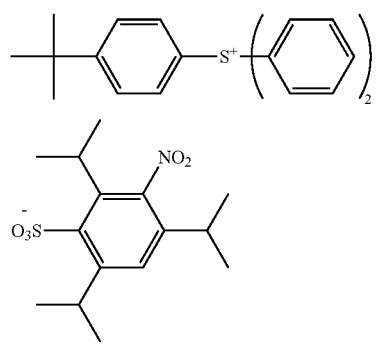
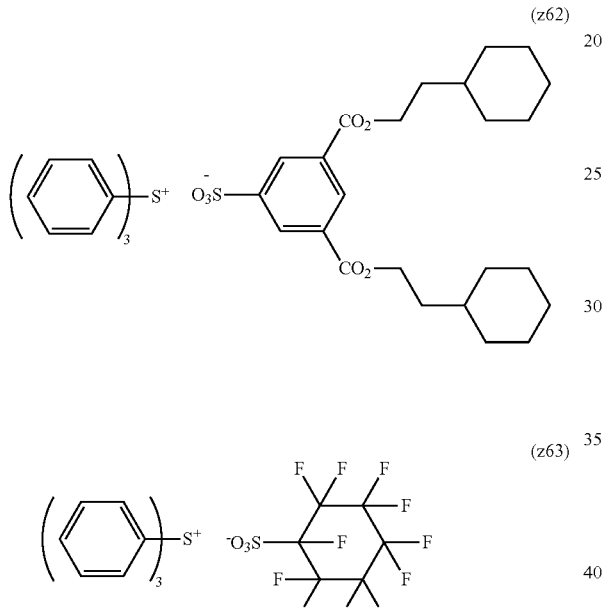

-continued
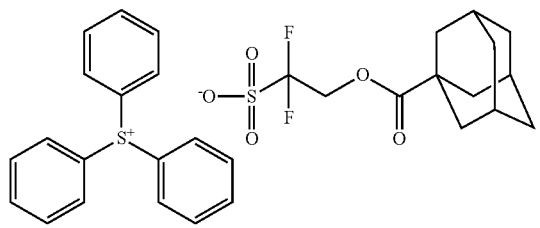
(z73)
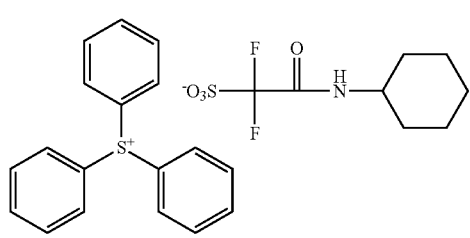
(z74)
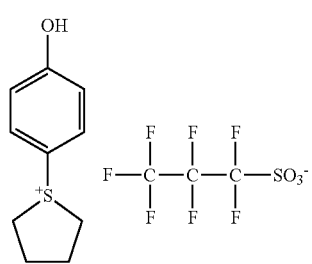
(z75)
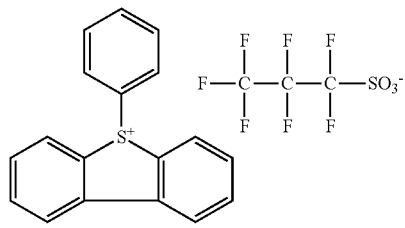
(z76)
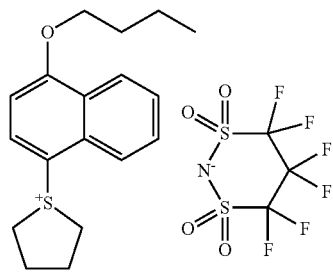
(z77)
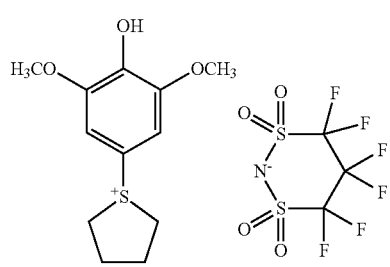
(z78)
-continued
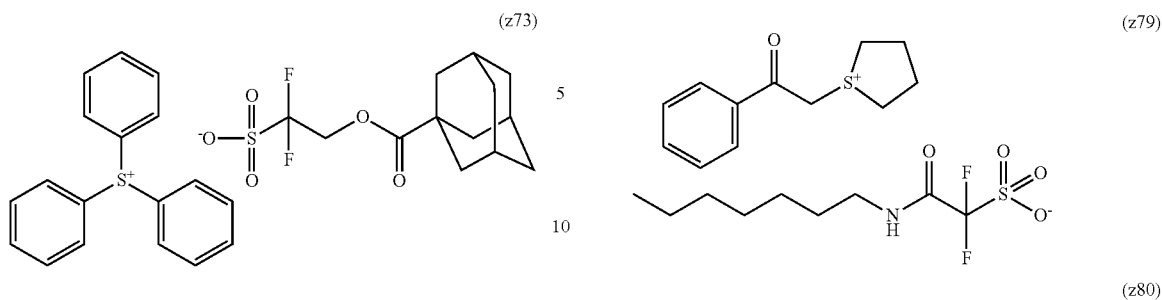
(z79)
(z80)
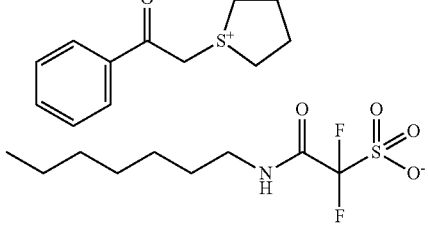
(z81)
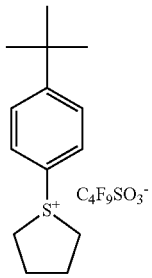
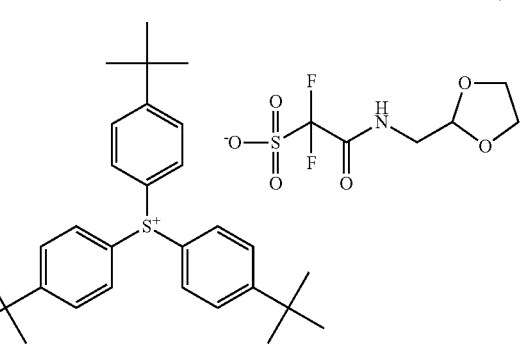
(z82)
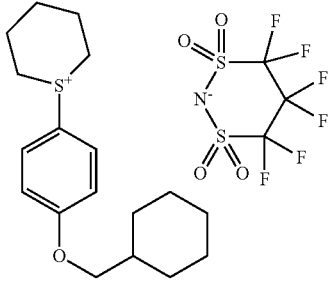
(z83)
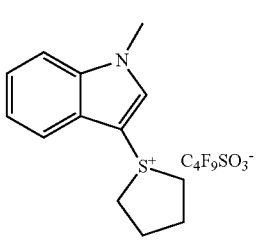
(z84)
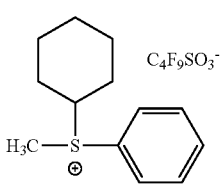

-continued
(z85) 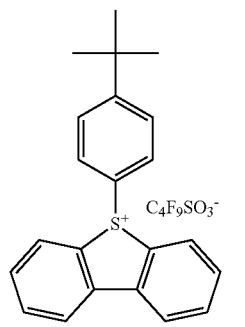
(z86) 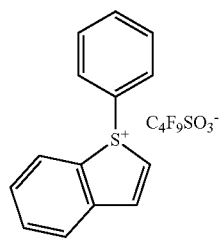
(z87) 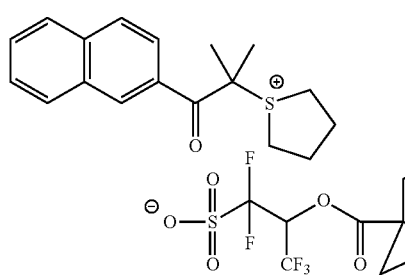
(z88) 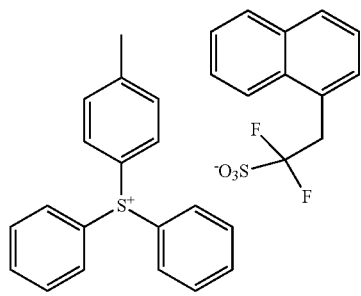
[Chem. 48]
(z89) 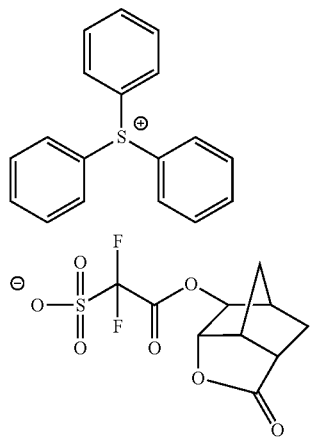
-continued
(z90) 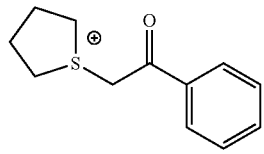
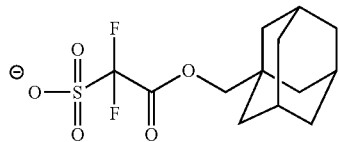
(z91) 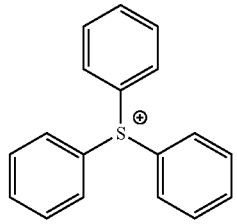
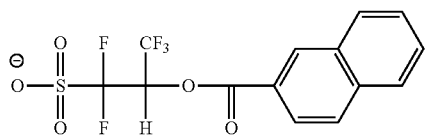
(z92) 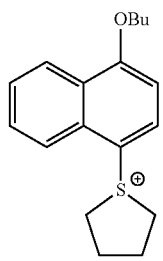
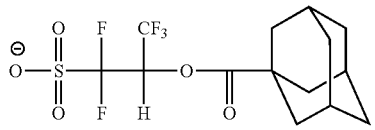
[Chem. 49]
(z93) 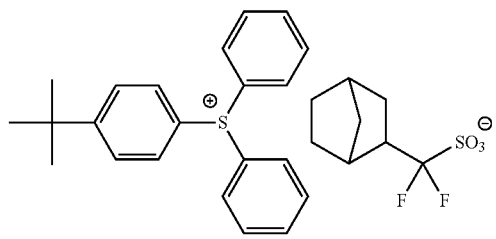
(z94) 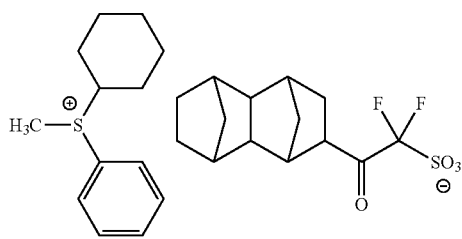

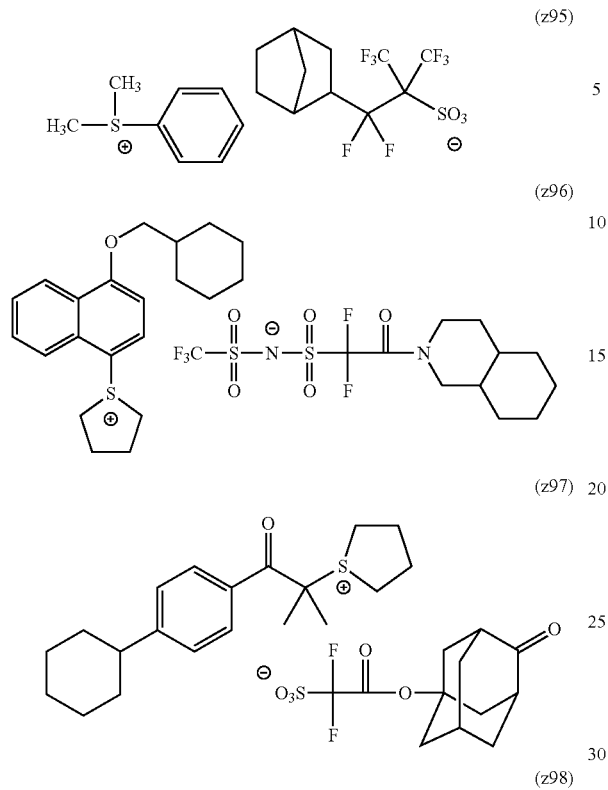
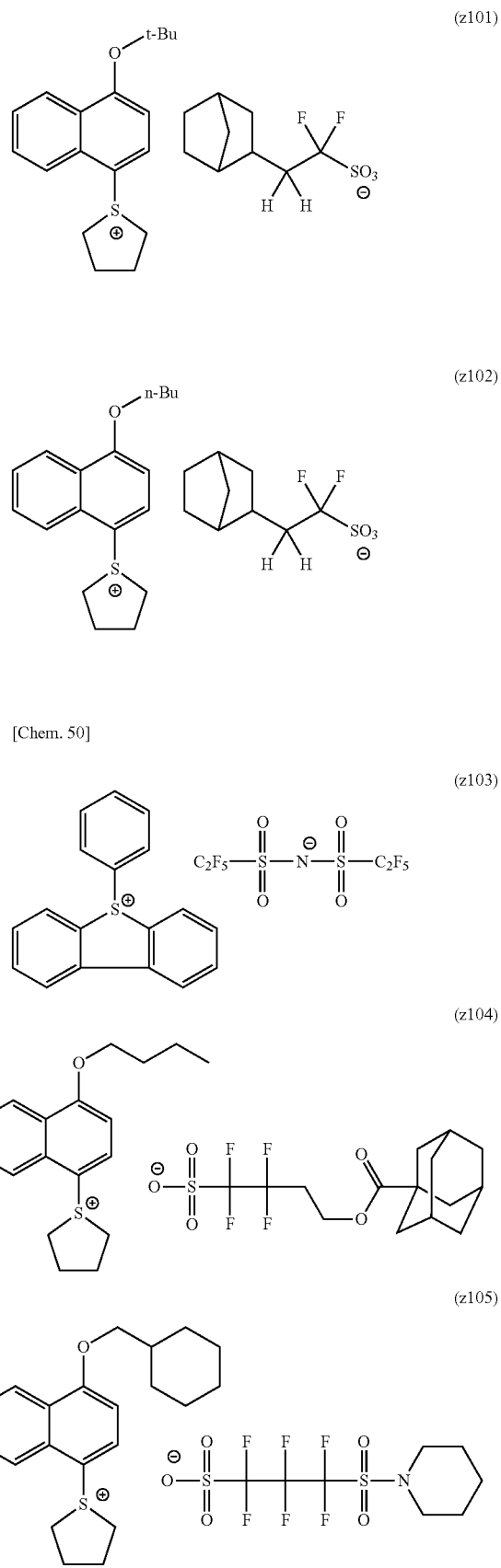

-continued
(z106)
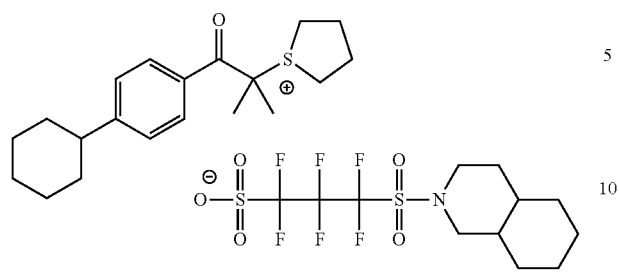
(z107)
(z108)
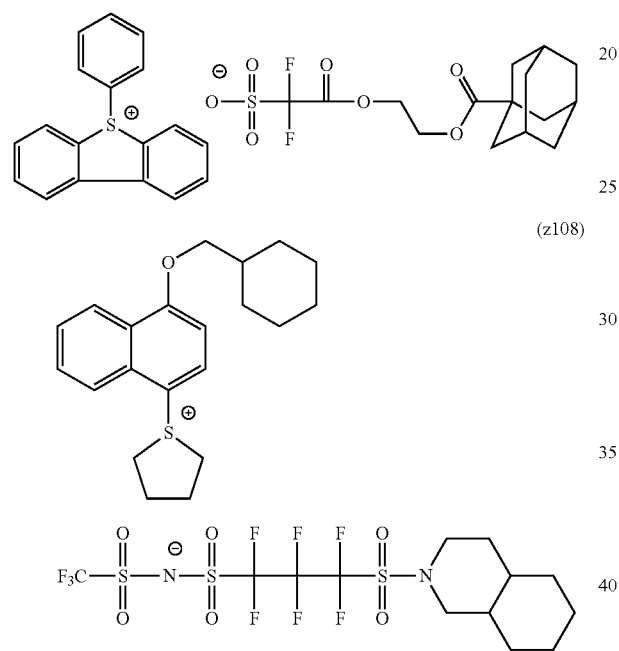
Further, in the compound (B), particularly preferred examples of the one having anion represented by any one of the general formulae (B-1) to (B-3) above will be described below, but the present invention is not limited thereto.
[Chem. 51]
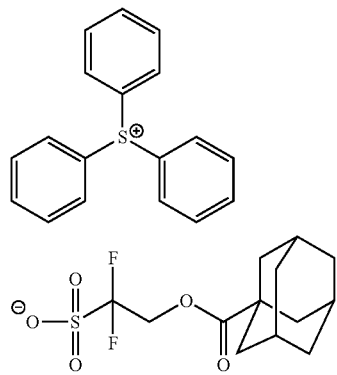
-continued
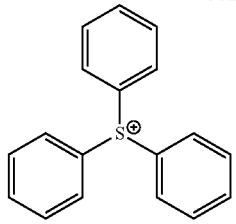
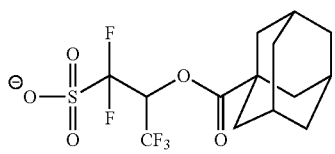
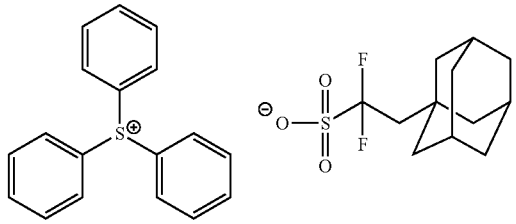
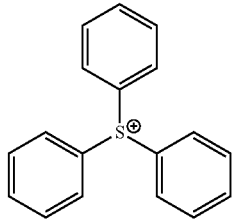
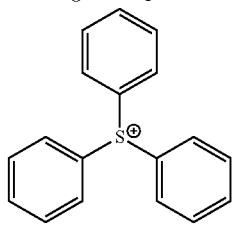

119
-continued
120
-continued
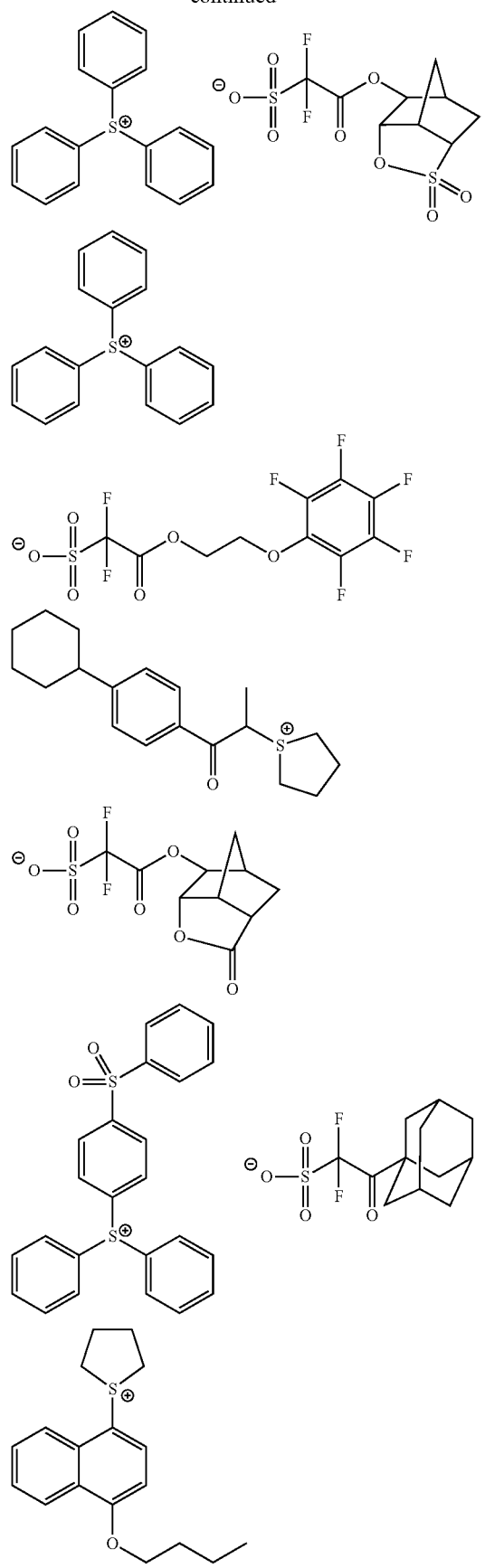
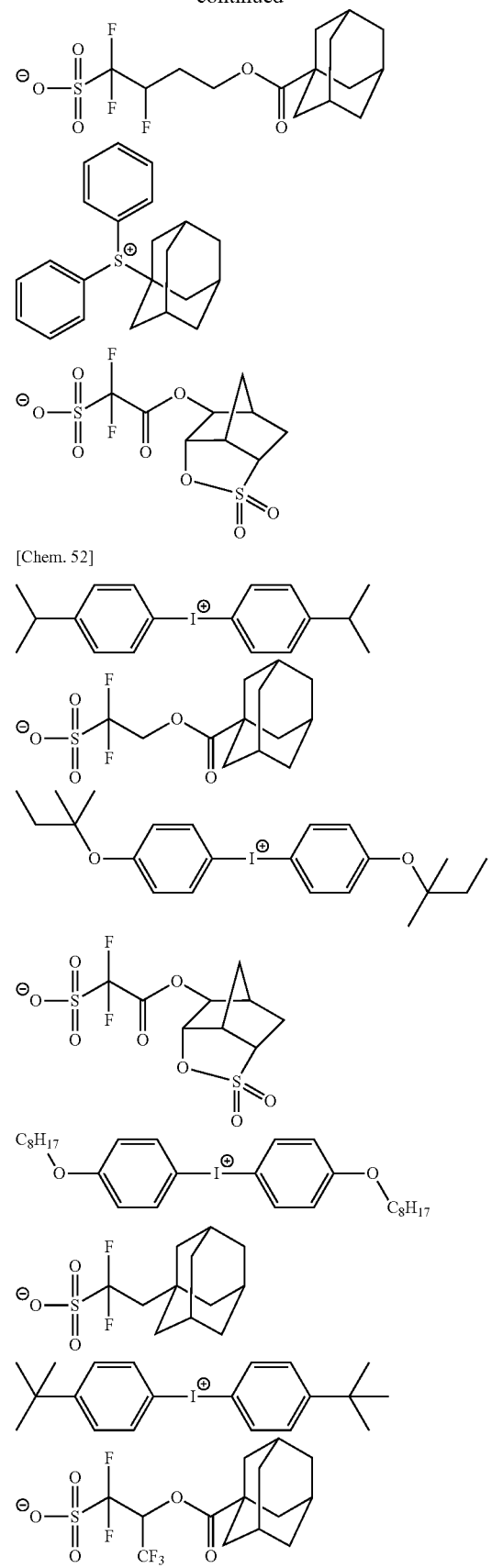
[Chem. 52]

The acid generator may be synthesized by known methods, for example, the acid generator may be synthesized in accordance with the methods disclosed in JP2007-161707A, paragraphs 0200 to 0210 of JP2010-100595A, paragraphs 0051 to 0058 of WO2011/093280A, paragraphs 0382 to 0385 of WO2008/153110, and JP2007-161707.

The acid generator can be used either alone or as a combination of two or more.

The content of the composition of the compound that generates an acid by irradiation of the actinic rays or radiation is preferably 0.1% by mass or more, more preferably 0.5% by mass or more, still more preferably 2% by mass or more, and particularly preferably 5% by mass or more based on the total solid content of the actinic ray-sensitive or radiation-sensitive resin composition (I). Thereby, a negative pattern which is rarely damaged from a solution formed of the actinic ray-sensitive or radiation-sensitive resin composition (II) may be formed by particularly carrying out the process (d). On the other hand, particularly, when the above-described process (d) is carried out, from the viewpoint of capable of suppressing the decrease in volume of the negative pattern which is resulted from the decomposition of the compound generating an acid by irradiation of the actinic rays or radiation, the content of the composition of the compound generating an acid by irradiation of the actinic rays or radiation is preferably 30% by mass or less, more preferably 25% by mass or less, and still more preferably 15% by mass or less based on the total solid content of the actinic ray-sensitive or radiation-sensitive resin composition (I).

[3] Solvent (C)

The actinic ray-sensitive or radiation-sensitive resin composition (I) may contain a solvent (C).

Examples of the solvent that may be used when the actinic ray-sensitive or radiation sensitive resin composition (I) is prepared may include an organic solvent such as alkylene glycol monoalkyl ether carboxylate, alkylene glycol monoalkyl ether, alkyl lactic acid ester, alkyl alkoxypropionate, cyclic lactone (preferably having 4 to 10 carbon atoms), a monoketone compound that may have a ring (preferably having 4 to 10 carbon atoms), alkylene carbonate, alkyl alkoxy acetate, or alkyl pyruvate.

Specific examples of these solvents may include those disclosed in paragraphs 0441 to 0455 of US2008/0187860A.

In the present invention, a mixed solvent in which a solvent containing a hydroxyl group in the structure is mixed with a solvent not containing a hydroxyl group may be used as an organic solvent.

As the solvent containing a hydroxyl group and the solvent not containing a hydroxyl group, the compounds exemplified above may be appropriately selected, however, as a solvent containing a hydroxyl group, alkylene glycol monoalkyl ether, alkyl lactate or the like is preferable, and propylene glycol monomethyl ether (PGME, alias 1-methoxy-2-propanol) or ethyl lactate is more preferable. In addition, alkylene glycol monoalkyl ether acetate or alkyl alkoxy propionate, a monoketone compound which may also have a ring, cyclic lactone, alkyl acetate or the like is preferable as the solvent not containing a hydroxyl group, propylene glycol monomethyl ether acetate (PGMEA, alias 1-methoxy-2-acetoxypropane), ethyl ethoxy propionate, 2-heptanone, γ-butyrolactone, cyclohexanone or butyl acetate is particularly preferable, propylene glycol monomethyl ether acetate, ethyl ethoxy propionate, or 2-heptanone is the most preferable.

The mixing ratio (mass) of the solvent containing a hydroxyl group and a solvent containing no hydroxyl group is 1/99 to 99/1, preferably 10/90 to 90/10, more preferably is a 20/80 to 60/40. The mixed solvent containing 50% by mass or more of the solvent containing no hydroxyl group is particularly preferable in terms of coating uniformity.

The solvent may preferably contain propylene glycol monomethyl ether acetate, and is preferably a single solvent of propylene glycol monomethyl ether acetate or a mixed solvent of two or more containing propylene glycol monomethyl ether acetate.

[4] Hydrophobic Resin (D)

The actinic ray-sensitive or radiation-sensitive resin composition (I) of the present invention may contain a hydrophobic resin (hereinafter, also referred to a "hydrophobic resin (D)" or simply a "resin (D)") when particularly used in the liquid immersion exposure. In addition, it is preferable that the hydrophobic resin (D) be different from the resin (A).

Thereby, the hydrophobic resin (D) is unevenly distributed in the film surface layer, and when the immersion medium is water, the static/dynamic contact angle of the surface of the resist film against water is increased, and thereby the followability to the liquid for liquid immersion can be enhanced.

It is preferable that the hydrophobic resin (D) be designed so as to be unevenly distributed at the interface as described above. However, since the hydrophobic resin (D) is different from surfactants, it is not necessary for the hydrophobic resin to have a hydrophilic group in the molecule, and the hydrophobic resin may not contribute to uniform mixing of polar/non-polar substances.

The hydrophobic resin (D) preferably include any one or more kinds of "a fluorine atom", "a silicon atom", and "a $CH_3$ partial structure contained in a side chain portion of a resin" from the viewpoint of uneven distribution at the film surface layer, and more preferably include two or more kinds thereof.

When the hydrophobic resin (D) contains a fluorine atom and/or a silicon atom, the fluorine atom and/or the silicon atom in the hydrophobic resin (D) may be included in the main chain of the resin, or may be included in a side chain.

When the hydrophobic resin (D) contains a fluorine atom, the resin preferably has an alkyl group containing a fluorine atom, a cycloalkyl group containing a fluorine atom, or an aryl group containing a fluorine atom, as a partial structure containing a fluorine atom.

The alkyl group having a fluorine atom (preferably 1 to 10 carbon atoms and more preferably 1 to 4 carbon atoms) is a linear or branched alkyl group in which at least one hydrogen atom is substituted with a fluorine atom, and may have further substituents in addition to a fluorine atom.

The cycloalkyl group having a fluorine atom is a monocyclic or polycyclic cycloalkyl group in which at least one hydrogen atom is substituted with a fluorine atom, and may have further substituents in addition to a fluorine atom.

The aryl group having a fluorine atom is an aryl group such as a phenyl group, a naphthyl group, in which at least one hydrogen atom is substituted with a fluorine atom, and may have further substituents in addition to a fluorine atom.

As the alkyl group having a fluorine atom, the cycloalkyl group having a fluorine atom, and the aryl group having a fluorine atom, preferably, a group represented by the following the general formulae (F2) to (F4) may be included, however, the present invention is not limited to these.

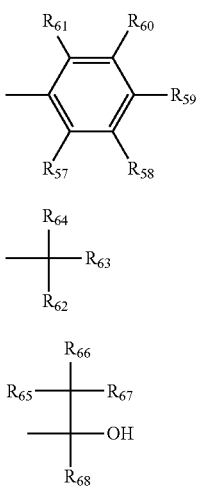

In the general formulae (F2) to (F4), $R_{57}$ to $R_{68}$ each independently represent a hydrogen atom, a fluorine atom, or an alkyl group (linear or branched). However, at least one of $R_{57}$ to $R_{61}$, at least one of $R_{62}$ to $R_{64}$ and at least one of $R_{65}$ to $R_{68}$ each independently represent a fluorine atom or an alkyl group in which at least one hydrogen atom is substituted with a fluorine atom (preferably 1 to 4 carbon atoms).

$R_{57}$ to $R_{61}$ and $R_{65}$ to $R_{67}$ are preferably all fluorine atoms. $R_{62}$, $R_{63}$, and $R_{68}$ are preferably an alkyl group in which at least one hydrogen atom is substituted with a fluorine atom (preferably 1 to 4 carbon atoms), and more preferably a perfluoroalkyl group having 1 to 4 carbon atoms. $R_{62}$ and $R_{63}$ may be bonded to each other to form a ring.

Specific examples of the group represented by the general formula (F2) may include, for example, a p-fluorophenyl group, a pentafluorophenyl group, and a 3,5-di(trifluoromethyl)phenyl group.

Specific examples of the group represented by the general formula (F3) may include, for example, a trifluoromethyl group, a pentafluoropropyl group, a pentafluoroethyl group, a heptafluorobutyl group, a hexafluoroisopropyl group, a heptafluoroisopropyl group, a hexafluoro(2-methyl)isopropyl group, a nonafluorobutyl group, an octafluoroisobutyl group, a nonafluorohexyl group, a nonafluoro-t-butyl group, a perfluoro isopentyl group, a perfluorooctyl group, a perfluoro(trimethyl)hexyl group, a 2,2,3,3-tetrafluorocyclobutyl group, a perfluorocyclohexyl group, or the like. A hexafluoroisopropyl group, a heptafluoroisopropyl group, a hexafluoro(2-methyl) isopropyl group, an octafluoroisobutyl group, a nonafluoro-t-butyl group or a perfluoroisopentyl group is preferable, and a hexafluoroisopropyl group or a heptafluoroisopropyl group is more preferable.

Specific examples of the group represented by the general formula (F4) may include —C(CF$_3$)$_2$OH, —C(C$_2$F$_5$)$_2$OH, —C(CF$_3$)(CH$_3$)OH, —CH(CF$_3$)OH, or the like, and —C(CF$_3$)$_2$OH is preferable.

The partial structure including a fluorine atom may be bonded directly to the main chain, or may be bonded to the main chain through a group selected from a group consisting of an alkylene group, a phenylene group, an ether bond, a thioether bond, a carbonyl group, an ester bond, an amide bond, a urethane bond, and a ureylene bond, or a group combining two or more of these.

Specific examples of the repeating unit having a fluorine atom are shown below, however, the present invention is not limited to these.

In the specific examples, $X_1$ represents a hydrogen atom, —CH$_3$, —F or —CF$_3$. $X_2$ represents —F or —CF$_3$.

[Chem. 54]

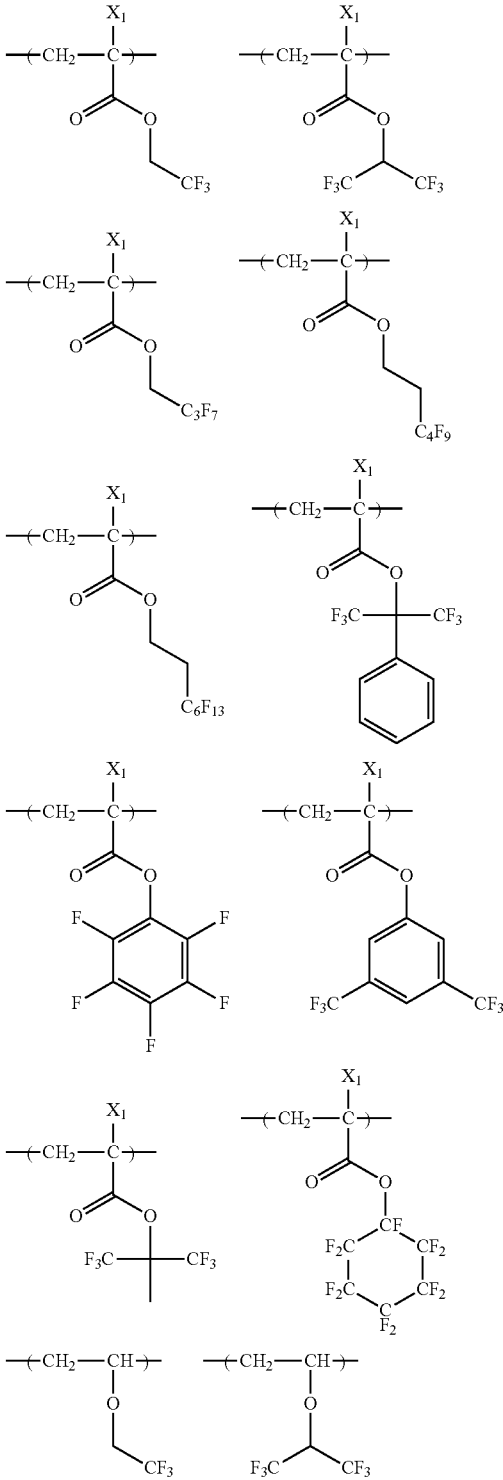

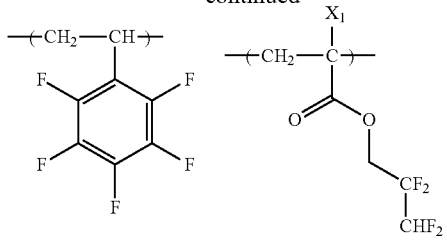
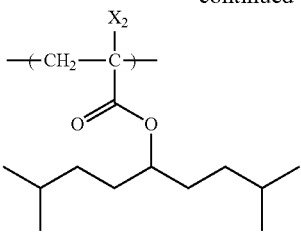

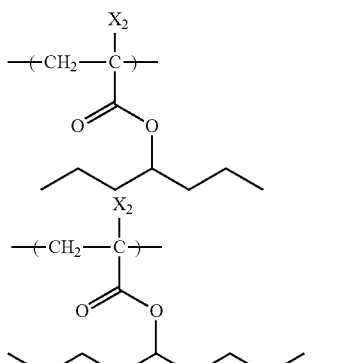
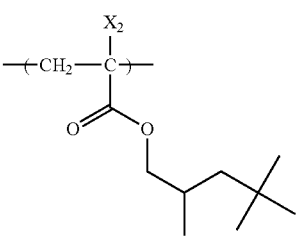
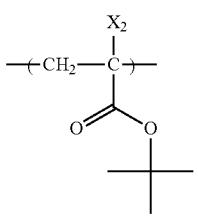

[Chem. 55]

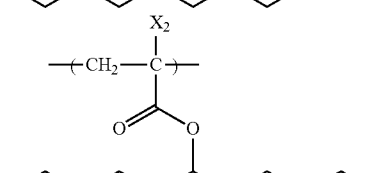
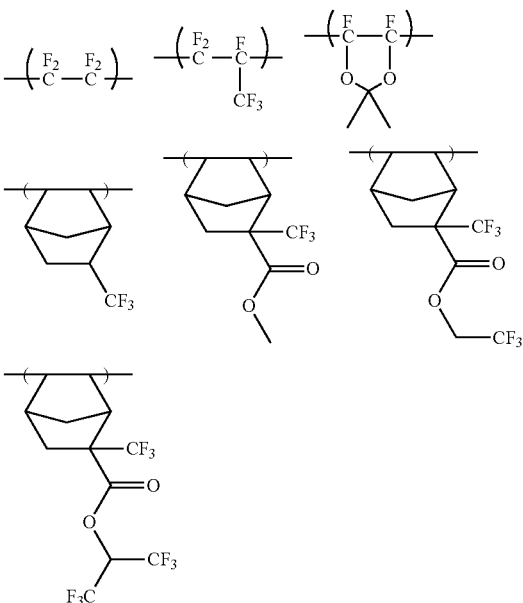

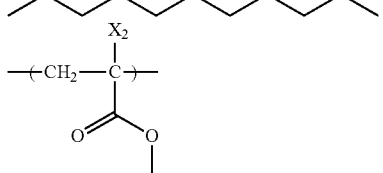

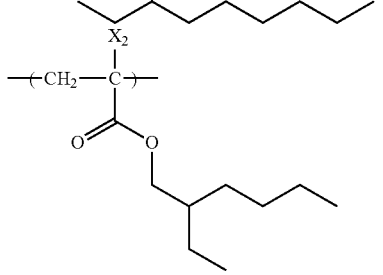

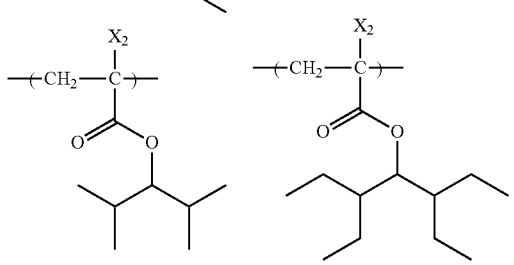

The hydrophobic resin (D) may contain a silicon atom. As a partial structure having a silicon atom, a resin having an alkylsilyl structure (preferably a trialkylsilyl group) or a cyclic siloxane structure is preferable.

The alkylsilyl structure or the cyclic siloxane structure may include, specifically, a group represented by the following the general formulae (CS-1) to (CS-3).

[Chem. 56]

(CS-1)

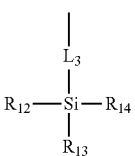

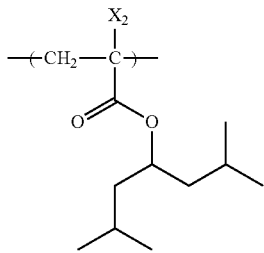

-continued

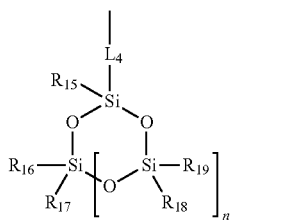
(CS-2)

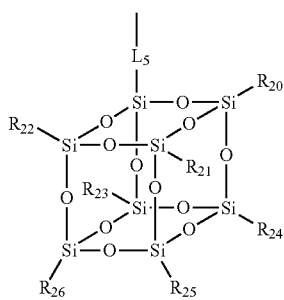
(CS-3)

In the general formulae (CS-1) to (CS-3), $R_{12}$ to $R_{26}$ each independently represent a linear or branched alkyl group (preferably 1 to 20 carbon atoms) or a cycloalkyl group (preferably 3 to 20 carbon atoms).

$L_3$ to $L_5$ represent a single bond or a divalent linking group. As the divalent linking group, a single group or a combination of two or more groups (preferably 12 or less total carbon atoms) selected from a group consisting of an alkylene group, a phenylene group, an ether bond, a thioether bond, a carbonyl group, an ester bond, an amide bond, a urethane bond and a urea bond, may be included.

n represents an integer of 1 to 5. n is preferably an integer of 2 to 4.

Specific examples of the repeating units having a group represented by the general formulae (CS-1) to (CS-3) are shown below, however, the present invention is not limited to these. In addition, in the specific examples, $X_1$ represents a hydrogen atom, —$CH_3$, —F or —$CF_3$.

[Chem. 57]

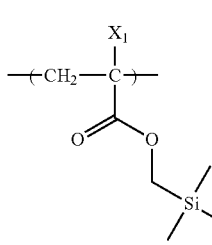

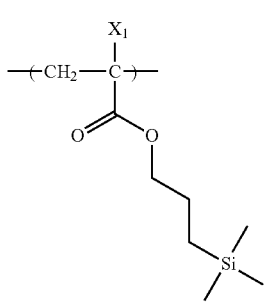

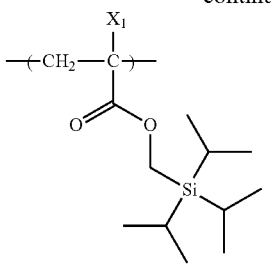 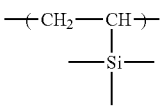

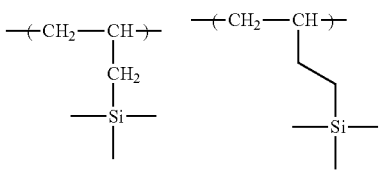

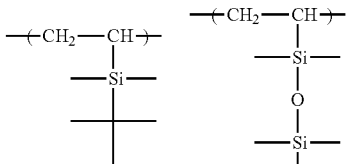

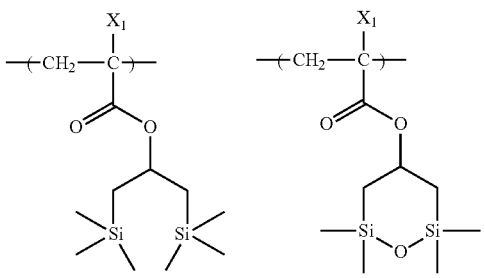

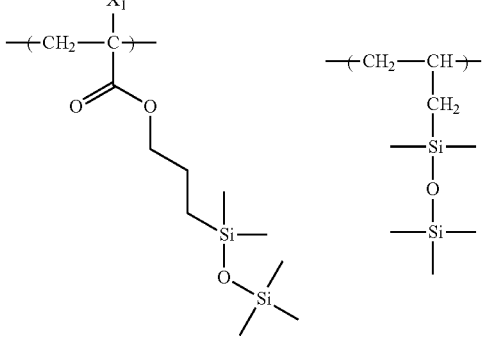

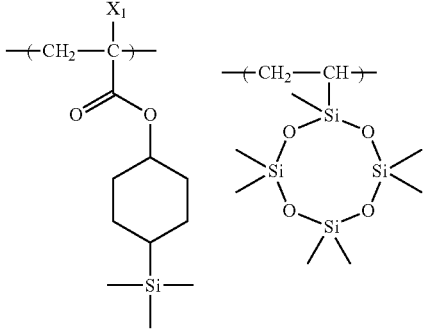

-continued

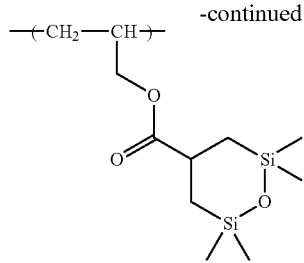

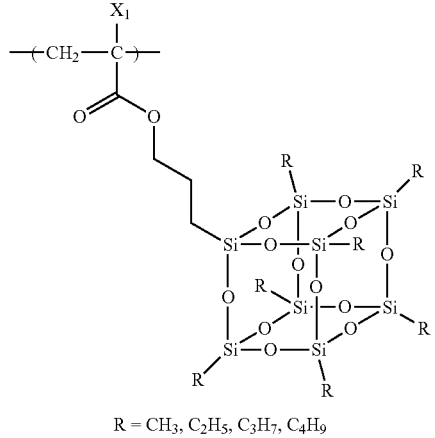

R = CH₃, C₂H₅, C₃H₇, C₄H₉

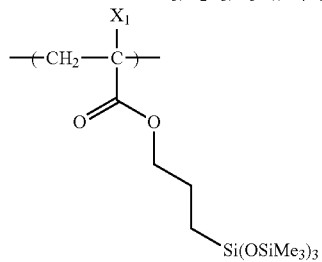

Si(OSiMe₃)₃

Furthermore, as described above, it is also preferable that the hydrophobic resin (D) contain the CH₃ partial structure in a side chain moiety of the resin.

As described herein, the CH₃ partial structure which the side chain moiety in the resin (D) has (hereinafter, simply referred to as a "side chain CH₃ partial structure") includes a CH₃ partial structure which an ethyl group, a propyl group, and the like have.

On the other hand, a methyl group which is bonded directly to the main chain of the resin (D) (for example, an α-methyl group of a repeating unit having a methacrylic acid structure) is not included in the CH₃ partial structure of the present invention because of small contribution to the uneven distribution of the resin (D) at a surface due to an effect of the main chain.

More specifically, when the resin (D) includes a repeating unit derived from a monomer having a polymerizable moiety, which has a carbon-carbon double bond, such as a repeating unit represented by the following the general formula (M) and when $R_{11}$ to $R_{14}$ represent CH₃ "itself", the CH₃ is not included in the CH₃ partial structure which the side chain moiety of the present invention has.

On the other hand, a CH₃ partial structure which is present from a C—C main chain through any atoms corresponds to the CH₃ partial structure of the present invention. For example, when $R_{11}$ represents an ethyl group (CH₂CH₃), $R_{11}$ is considered to have "one" CH₃ partial structure of the present invention.

[Chem. 58]

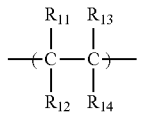

(M)

In the general formula (M) described above, $R_{11}$ to $R_{14}$ each independently represent a side chain moiety.

As $R_{11}$ to $R_{14}$ of the side chain moiety, a hydrogen atom, a monovalent organic group and the like are included.

As the monovalent organic group in $R_{11}$ to $R_{14}$, an alkyl group, a cycloalkyl group, an aryl group, an alkyloxycarbonyl group, a cycloalkyloxycarbonyl group, an aryloxycarbonyl group, an alkylaminocarbonyl group, a cycloalkylaminocarbonyl group, an arylaminocarbonyl group and the like are included. These groups may further have substituents.

The hydrophobic resin (D) is preferably a resin which has a repeating unit having a CH₃ partial structure in the side chain moiety and it is more preferable that the resin have, as this repeating unit, at least one kind of repeating unit (x) among a repeating unit represented by the following the general formula (II) and a repeating unit represented by the following the general formula (III).

Hereinafter, the repeating unit represented by the general formula (II) will be described in detail.

[Chem. 59]

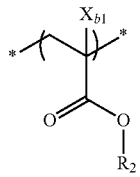

(II)

In the general formula (II) described above, $X_{b1}$ represents a hydrogen atom, an alkyl group, a cyano group or a halogen atom and $R_2$ represents an organic group which has one or more CH₃ partial structures and is stable to an acid. As described herein, more specifically, the organic group stable to an acid is preferably an organic group not having a "group which is decomposed by the action of an acid and produces a polar group" described in the resin (A).

The alkyl group of $X_{b1}$ preferably has 1 to 4 carbon atoms and examples thereof may include a methyl group, an ethyl group, a propyl group, a hydroxymethyl group, a trifluoromethyl group, or the like. Among these, a methyl group is preferable.

$X_{b1}$ is preferably a hydrogen atom or a methyl group.

As $R_2$, an alkyl group, a cycloalkyl group, an alkenyl group, a cycloalkenyl group, an aryl group, and an aralkyl group which have one or more CH₃ partial structures are included. The above-described cycloalkyl group, alkenyl group, cycloalkenyl group, aryl group and aralkyl group may further have an alkyl group as a substituent.

$R_2$ is preferably an alkyl group or an alkyl-substituted cycloalkyl group which has one or more CH₃ partial structures.

The organic group which has one or more CH₃ partial structures and is stable to acid, as $R_2$, preferably has more than or equal to 2 and less than or equal to 10 CH₃ partial structures and more preferably has more than or equal to 2 and less than or equal to 8 $CH_3$ partial structures.

The alkyl group having one or more $CH_3$ partial structures in $R_2$ is preferably a branched alkyl group having 3 to 20 carbon atoms. Preferred specific examples of the alkyl group may include an isopropyl group, an isobutyl group, a 3-pentyl group, a 2-methyl-3-butyl group, 3-hexyl group, a 2-methyl-3-pentyl group, a 3-methyl-4-hexyl group, a 3,5-dimethyl-4-pentyl group, an isooctyl group, a 2,4,4-trimethylpentyl group, a 2-ethylhexyl group, a 2,6-dimethylheptyl group, a 1,5-dimethyl-3-heptyl group, a 2,3,5,7-tetramethyl-4-heptyl group and the like. An isobutyl group, a t-butyl group, a 2-methyl-3-butyl group, a 2-methyl-3-pentyl group, a 3-methyl-4-hexyl group, a 3,5-dimethyl-4-pentyl group, a 2,4,4-trimethylpentyl group, a 2-ethylhexyl group, a 2,6-dimethylheptyl group, a 1,5-dimethyl-3-heptyl group, and a 2,3,5,7-tetramethyl-4-heptyl group are more preferable.

The cycloalkyl group having one or more $CH_3$ partial structures in $R_2$ may be monocyclic or polycyclic. Specific examples thereof may include a group having a monocyclo, bicyclo, tricyclo or tetracyclo structure, which have 5 or more carbon atoms. The carbon number thereof is preferably 6 to 30 and particularly preferably 7 to 25. Preferred examples of the cycloalkyl group may include an adamantyl group, a noradamantyl group, a decalin residue, a tricyclodecanyl group, a tetracyclododecanyl group, a norbornyl group, a cedrol group, a cyclopentyl group, a cyclohexyl group, a cycloheptyl group, a cyclooctyl group, a cyclodecanyl group and a cyclododecanyl group. An adamantyl group, a norbornyl group, a cyclohexyl group, a cyclopentyl group, a tetracyclododecanyl group and a tricyclodecanyl group are more preferable. A norbornyl group, a cyclopentyl group, a cyclohexyl group are still more preferable.

The alkenyl group having one or more $CH_3$ partial structures in $R_2$ is preferably a linear or branched alkenyl group having 1 to 20 carbon atoms and more preferably a branched alkenyl group.

The aryl group having one or more $CH_3$ partial structures in $R_2$ is preferably an aryl group having 6 to 20 carbon atoms and examples thereof may include a phenyl group and a naphthyl group. A phenyl group is preferable.

The aralkyl group having one or more $CH_3$ partial structures in $R_2$ is preferably an aralkyl group having 7 to 12 carbon atoms and examples thereof may include a benzyl group, a phenethyl group, a naphthylmethyl group and the like.

Specific examples of the hydrocarbon group having two or more $CH_3$ partial structures in $R_2$ may include an isopropyl group, an isobutyl group, a t-butyl group, a 3-pentyl group, a 2-methyl-3-butyl group, a 3-hexyl group, a 2,3-dimethyl-2-butyl group, a 2-methyl-3-pentyl group, a 3-methyl-4-hexyl group, a 3,5-dimethyl-4-pentyl group, an isooctyl group, a 2,4,4-trimethylpentyl group, a 2-ethylhexyl group, a 2,6-dimethylheptyl group, a 1,5-dimethyl-3-heptyl group, a 2,3,5,7-tetramethyl-4-heptyl group, a 3,5-dimethylcyclohexyl group, a 4-isopropylcyclohexyl group, a 4-t-butylcyclohexyl group, an isobornyl group and the like. Further, an isobutyl group, a t-butyl group, a 2-methyl-3-butyl group, a 2,3-dimethyl-2-butyl group, a 2-methyl-3-pentyl group, a 3-methyl-4-hexyl group, a 3,5-dimethyl-4-pentyl group, a 2,4,4-trimethylpentyl group, a 2-ethylhexyl group, a 2,6-dimethylheptyl group, a 1,5-dimethyl-3-heptyl group, a 2,3,5,7-tetramethyl-4-heptyl group, a 3,5-dimethylcyclohexyl group, a 3,5-di-tert-butylcyclohexyl group, a 4-isopropylcyclohexyl group, a 4-t-butylcyclohexyl group and an isobornyl group are more preferable.

Preferred specific examples of the repeating unit represented by the general formula (II) will be shown below. In addition, the present invention is not limited to these.

[Chem. 60]

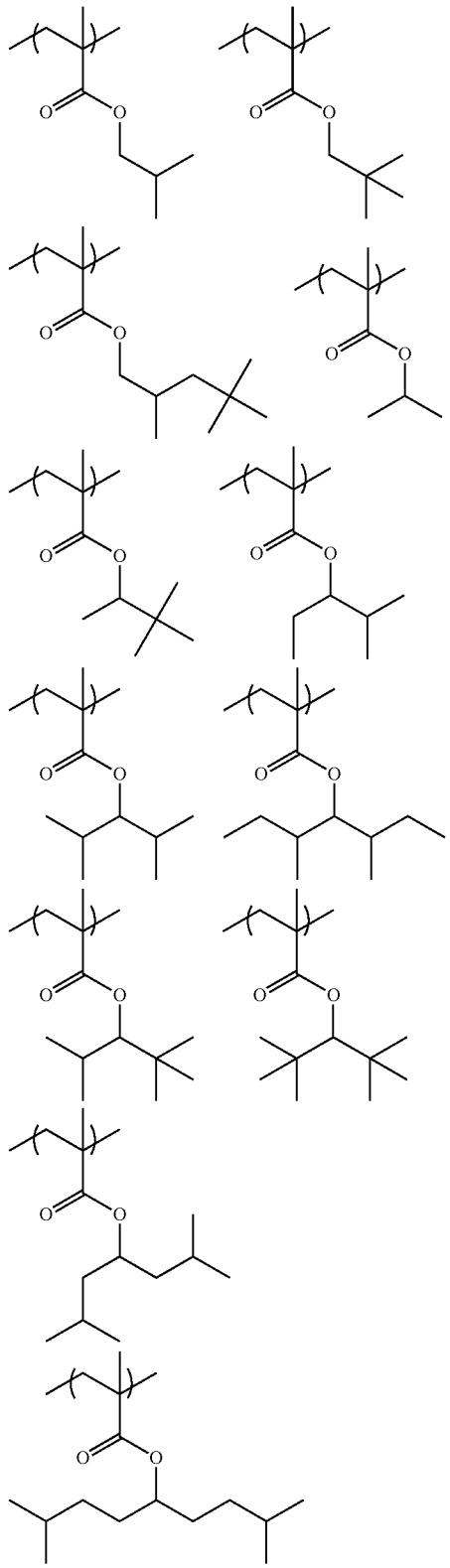

-continued

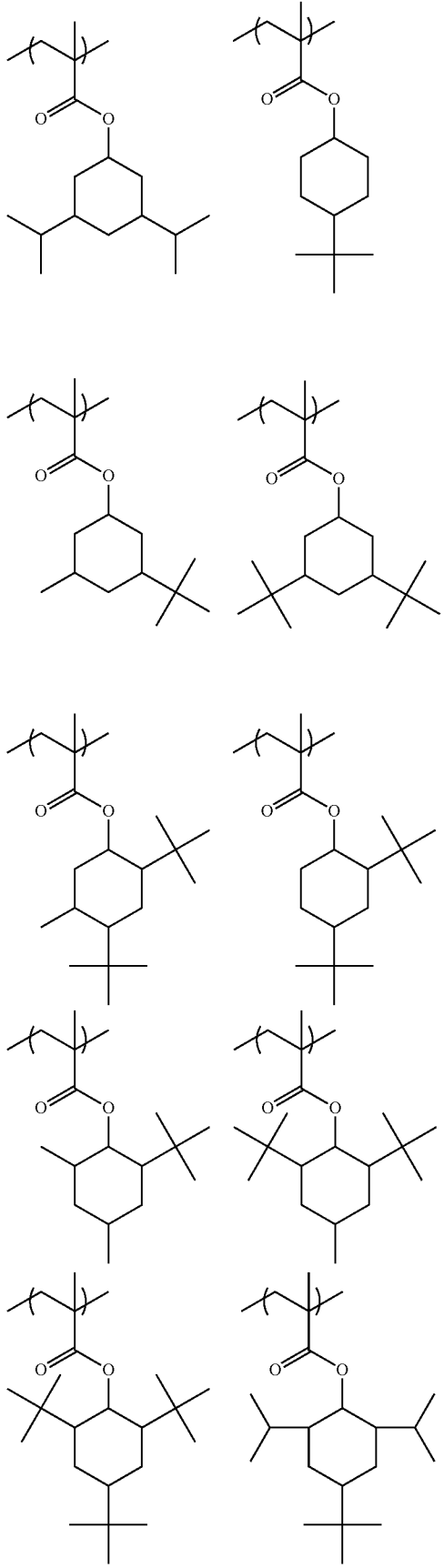

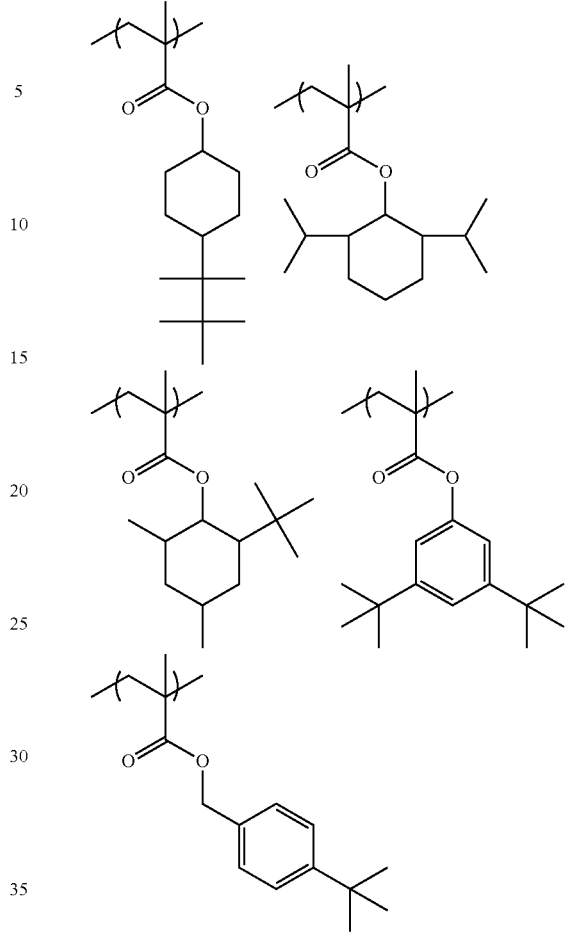

The repeating unit represented by the general formula (II) is preferably a repeating unit stable to an acid (acid non-decomposable repeating unit) and, specifically, a repeating unit which is decomposed by the action of an acid and does not have a group producing a polar group is preferable.

Hereinafter, the repeating unit represented by the general formula (III) will be described in detail.

[Chem. 61]

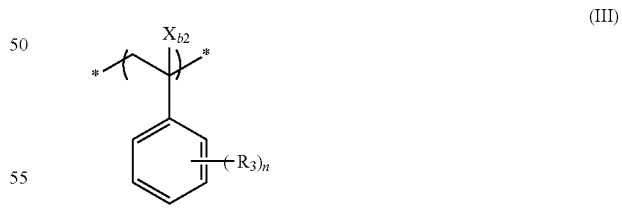

(III)

In the general formula (III) described above, $X_{b2}$ represents a hydrogen atom, an alkyl group, a cyano group, or a halogen atom; $R_3$ represents an organic group which has one or more $CH_3$ partial structures and is stable to an acid; and n represents an integer of 1 to 5.

The alkyl group of $X_{b2}$ preferably has 1 to 4 carbon atoms and examples thereof may include a methyl group, an ethyl group, a propyl group, a hydroxymethyl group, a trifluoromethyl group or the like, but a hydrogen atom is preferable.

$X_{b2}$ is preferably a hydrogen atom.

Since $R_3$ represents an organic group stable to acid, more specifically, it is preferable that $R_3$ be an organic group not having a "group which is decomposed by the action of an acid and produces a polar group" described in the resin (A).

As $R_3$, an alkyl group having one or more $CH_3$ partial structures is included.

The organic group which has one or more $CH_3$ partial structures and is stable to an acid, as $R_3$, preferably has more than or equal to 1 and less than or equal to 10 $CH_3$ partial structures, more preferably has more than or equal to 1 and less than or equal to 8 $CH_3$ partial structures and still more preferably has more than or equal to 1 and less than or equal to 4 $CH_3$ partial structures.

The alkyl group having one or more $CH_3$ partial structures in $R_3$ is preferably a branched alkyl group having 3 to 20 carbon atoms. Preferred specific examples of the alkyl group may include an isopropyl group, an isobutyl group, a 3-pentyl group, a 2-methyl-3-butyl group, a 3-hexyl group, a 2-methyl-3-pentyl group, a 3-methyl-4-hexyl group, a 3,5-dimethyl-4-pentyl group, an isooctyl group, a 2,4,4-trimethylpentyl group, a 2-ethylhexyl group, a 2,6-dimethylheptyl group, a 1,5-dimethyl-3-heptyl group, a 2,3,5,7-tetramethyl-4-heptyl group and the like. An isobutyl group, a t-butyl group, a 2-methyl-3-butyl group, a 2-methyl-3-pentyl group, a 3-methyl-4-hexyl group, a 3,5-dimethyl-4-pentyl group, a 2,4,4-trimethylpentyl group, a 2-ethylhexyl group, a 2,6-dimethylheptyl group, a 1,5-dimethyl-3-heptyl group, and a 2,3,5,7-tetramethyl-4-heptyl group are more preferable.

Specific examples of the alkyl group having two or more $CH_3$ partial structures in $R_3$ may include an isopropyl group, an isobutyl group, a t-butyl group, a 3-pentyl group, a 2,3-dimethylbutyl group, a 2-methyl-3-butyl group, a 3-hexyl group, a 2-methyl-3-pentyl group, a 3-methyl-4-hexyl group, a 3,5-dimethyl-4-pentyl group, an isooctyl group, a 2,4,4-trimethylpentyl group, a 2-ethylhexyl group, a 2,6-dimethylheptyl group, a 1,5-dimethyl-3-heptyl group, a 2,3,5,7-tetramethyl-4-heptyl group and the like. The alkyl group more preferably has 5 to 20 carbon atoms and examples thereof include an isopropyl group, a t-butyl group, a 2-methyl-3-butyl group, a 2-methyl-3-pentyl group, a 3-methyl-4-hexyl group, a 3,5-dimethyl-4-pentyl group, a 2,4,4-trimethylpentyl group, a 2-ethylhexyl group, a 2,6-dimethylheptyl group, a 1,5-dimethyl-3-heptyl group, a 2,3,5,7-tetramethyl-4-heptyl group, and a 2,6-dimethylheptyl group.

n represents an integer of 1 to 5, more preferably represents an integer of 1 to 3, and still more preferably represents an integer of 1 or 2.

Preferred specific examples of the repeating unit represented by the general formula (III) will be shown below. In addition, the present invention is not limited to these.

[Chem. 62]

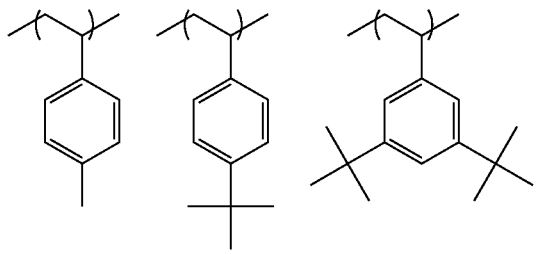

-continued

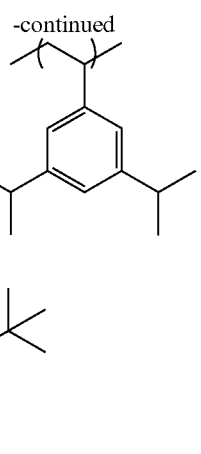

The repeating unit represented by the general formula (III) is preferably a repeating unit stable to an acid (acid non-decomposable repeating unit) and, specifically, a repeating unit which is decomposed by the action of an acid and does not have a group producing a polar group is preferable.

When the resin (D) has a $CH_3$ partial structure in a side chain moiety and, further, does not have a fluorine atom and a silicon atom, the content of at least one kind of repeating unit (x) among the repeating unit represented by the following the general formula (II) and the repeating unit represented by the following the general formula (III) is preferably 90% by mole or more and more preferably 95% by mole or more, based on the total content of the repeating units in the resin (C). The content of the repeating unit is generally 100% by mole or less, based on the total content of the repeating units in the resin (C).

When the resin (D) contains 90% by mole or more of at least one kind of repeating unit (x) among the repeating unit represented by the following the general formula (II) and the repeating unit represented by the following the general formula (III) based on the total content of the repeating units in the resin (D), the surface free energy of the resin (C) increases. As a result, the resin (D) is not likely to be unevenly distributed in the resist film surface and the static/dynamic contact angle of the surface of the resist film against water is increased. Therefore, the followability to the liquid for liquid immersion can be enhanced.

Furthermore, the hydrophobic resin (D) may have at least one group selected from the group of the following (x) to (z), in (i) a case where the hydrophobic resin (D) contains a fluorine atom and/or a silicon atom and in (ii) a case where a $CH_3$ partial structure is contained in a side chain moiety of the resin.

(x) an acid group,
(y) a group having a lactone structure, an acid anhydride group, or an acid imide group, and
(z) a group which is decomposed by the action of an acid.

As the acid group (x), a phenolic hydroxyl group, a carboxylic acid group, a fluorinated alcohol group, a sulfonic acid group, a sulfonamide group, a sulfonylimide group, an (alkylsulfonyl)(alkylcarbonyl)methylene group, an (alkylsulfonyl)(alkylcarbonyl) imide group, a bis(alkylcarbonyl)methylene group, a bis(alkylcarbonyl) imide group, a bis(alkylsulfonyl)methylene group, a bis(alkylsulfonyl) imide group, a tris(alkylcarbonyl)methylene group, a tris(alkylsulfonyl)methylene group or the like, may be included.

The preferable acid group may include a fluorinated alcohol group (preferably hexafluoroisopropanol), a sulfonamide group, and a bis(alkylcarbonyl)methylene group.

As the repeating unit having an acid group (x), a repeating unit in which the acid group is directly bonded to the main chain of the resin such as a repeating unit consisting of an acrylic acid and a methacrylic acid, or a repeating unit in which the acid group is bonded to the main chain of the resin through a linking group, or the like, may be included, or introducing the repeating unit to the end of the polymer chain using a polymerization initiator or a chain transfer agent having an acid group at the time of polymerized is also possible, and any of the cases is preferable. The repeating unit having an acid group (x) may have at least one of a fluorine atom and a silicon atom.

The content of the repeating unit having an acid group (x) is preferably 1% by mole to 50% by mole, more preferably 3% by mole to 35% by mole, and even more preferably 5% by mole to 20% by mole, based on the total content of the repeating units in the hydrophobic resin (D).

Specific examples of the repeating unit having an acid group (x) are shown below, however, the present invention is not limited to these. In the formula, Rx represents a hydrogen atom, $CH_3$, $CF_3$, or $CH_2OH$.

[Chem. 63]

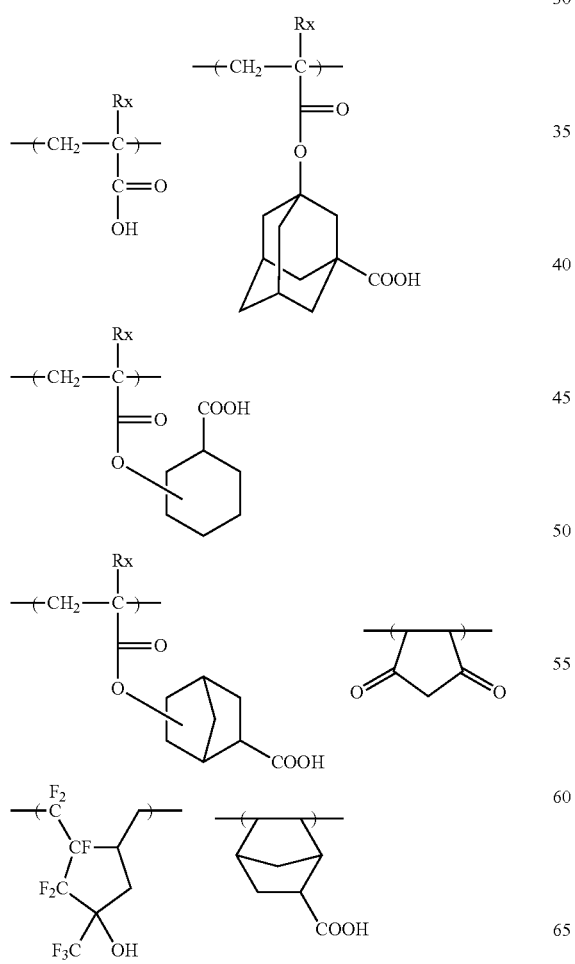

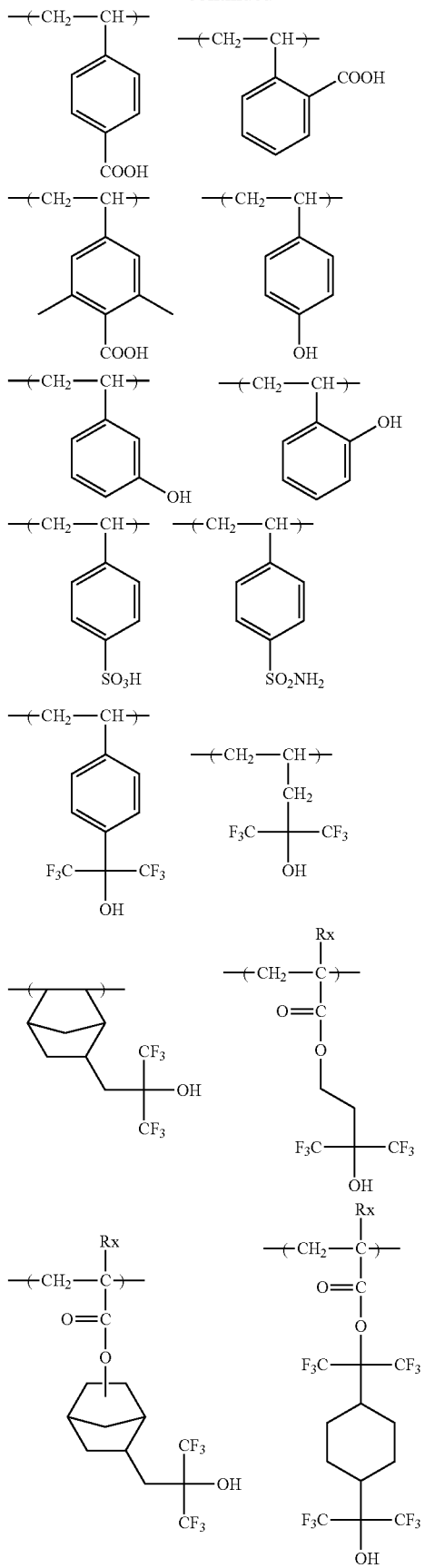

-continued

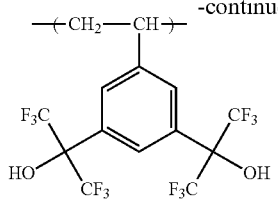

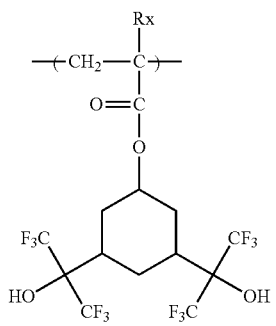

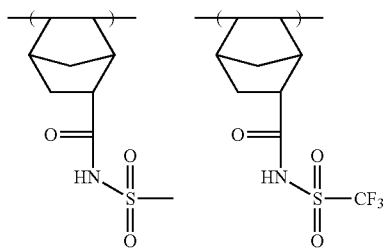

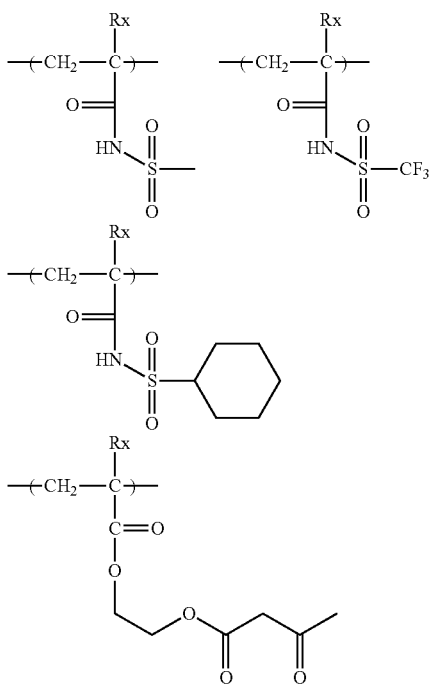

-continued

[Chem. 64]

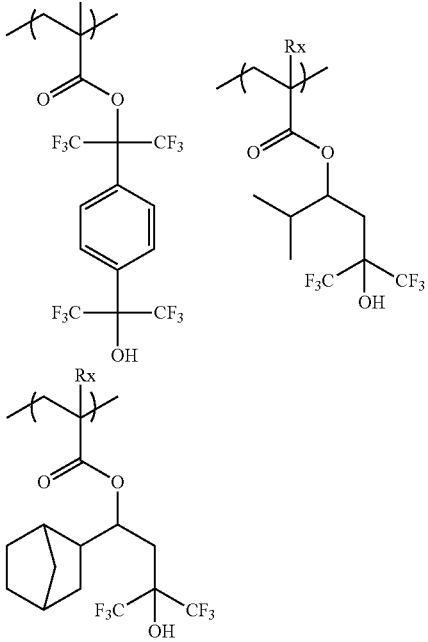

As the group having a lactone structure, the acid anhydride group, or the acid imide group (y), a group having a lactone structure is particularly preferable.

The repeating unit including these groups is, for example, a repeating unit in which this group is directly bonded to the main chain of the resin, such as a repeating unit consisting of acrylic acid ester and methacrylic acid ester. This repeating unit may alternatively be a repeating unit in which this group is bonded to the main chain of the resin through a linking group. This repeating unit may also be introduced at the end of the resin using a polymerization initiator or a chain transfer agent having this group at the time of polymerization.

Examples of the repeating unit having a group having a lactone structure may include the same repeating units as those having a lactone structure, which have been described previously in the section for the acid-degradable resin (A).

The content of the repeating unit having a group having a lactone structure, an acid anhydride group, or an acid imide group is preferably 1% by mole to 100% by mole, more preferably 3% by mole to 98% by mole, and even more preferably 5% by mole to 95% by mole, based on the total content of the repeating units in the hydrophobic resin (D).

In the hydrophobic resin (D), the repeating unit having a group (z) which is decomposed by the action of an acid may be the same as the repeating unit having an acid-decomposable group as mentioned for the resin (A). The repeating unit having a group (z) decomposed by the action of an acid may have at least one of a fluorine atom and a silicon atom. The content of the repeating unit having a group (z) which is decomposed by the action of an acid in the hydrophobic resin (D) is preferably 1% by mole to 80% by mole, more preferably 10% by mole to 80% by mole, and still more preferably 20% by mole to 60% by mole, based on the total content of the repeating units in the resin (D).

The hydrophobic resin (D) may further have a repeating unit represented by the following general formula (III).

[Chem. 65]

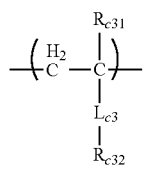

(III)

In the general formula (III), $R_{c31}$ represents a hydrogen atom, an alkyl group (may be substituted with a fluorine atom or the like), a cyano group, or —$CH_2$—O-$Rac_2$. In the formula, $Rac_2$ represents a hydrogen atom, an alkyl group or an acyl group. $R_{c31}$ is preferably a hydrogen atom, a methyl group, a hydroxymethyl group or a trifluoromethyl group, and particularly preferably a hydrogen atom or a methyl group.

$R_{c32}$ represents a group having an alkyl group, a cycloalkyl group, an alkenyl group, a cycloalkenyl group or an aryl group. These groups may be substituted with a group containing a fluorine atom or a silicon atom.

$L_{c3}$ represents a single bond or a divalent linking group.

In the general formula (III), the alkyl group of $R_{c32}$ is preferably a linear or branched alkyl group having 3 to 20 carbon atoms.

The cycloalkyl group is preferably a cycloalkyl group having 3 to 20 carbon atoms.

The alkenyl group is preferably an alkenyl group having 3 to 20 carbon atoms.

The cycloalkenyl group is preferably a cycloalkenyl group having 3 to 20 carbon atoms.

The aryl group is preferably an aryl group having 6 to 20 carbon atoms, more preferably a phenyl group or a naphthyl group, and these may have a substituent.

$R_{c32}$ is preferably an unsubstituted alkyl group or an alkyl group substituted with a fluorine atom.

The divalent linking group of $L_{c3}$ is preferably an alkylene group (preferably having 1 to 5 carbon atoms), an ether bond, a phenylene group, or an ester bond (a group represented by —COO—).

The content of the repeating unit represented by the general formula (III) is preferably 1% by mole to 100% by mole, more preferably 10% by mole to 90% by mole, and even more preferably 30% by mole to 70% by mole, based on the total content of the repeating units in the hydrophobic resin.

Furthermore, it is also preferable that the hydrophobic resin (D) have a repeating unit represented by the following the general formula (CII-AB).

[Chem. 66]

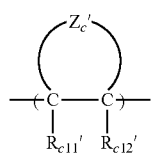

(CII-AB)

In the formula (CII-AB), $R_{c11}'$ and $R_{c12}'$ each independently represent a hydrogen atom, a cyano group, a halogen atom or an alkyl group.

$Zc'$ represents an atomic group to form an alicyclic structure, including two bonded carbon atoms (C—C).

The content of the repeating unit represented by the general formula (CII-AB) is preferably 1% by mole to 100% by mole, more preferably 10% by mole to 90% by mole, and even more preferably 30% by mole to 70% by mole, based on the total content of the repeating units in the hydrophobic resin.

Specific examples of the repeating units represented by the general formulae (III) and (CII-AB) will be shown below, but the present invention is not limited to these. In the formula, Ra represents H, $CH_3$, $CH_2OH$, $CF_3$, or CN.

[Chem. 67]

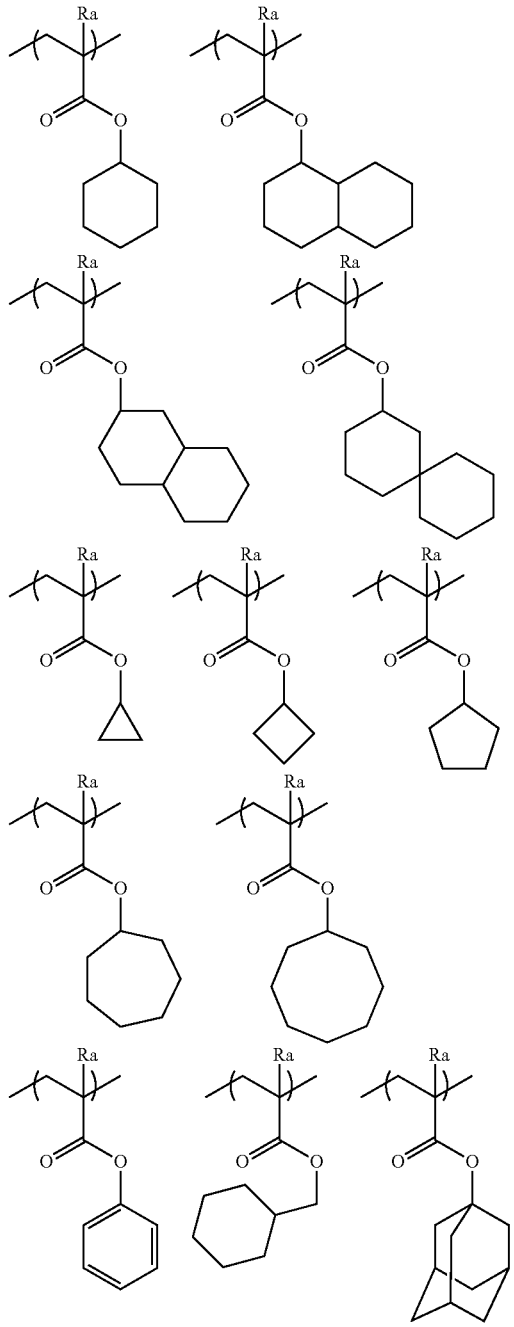

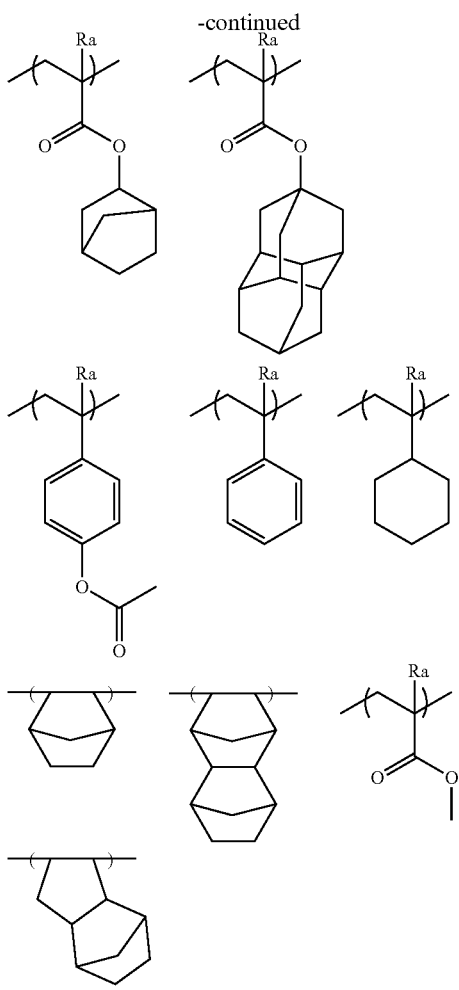

When the hydrophobic resin (D) has fluorine atoms, the content of the fluorine atoms is preferably 5% by mass to 80% by mass, and more preferably 10% by mass to 80% by mass, based on the weight average molecular weight of the hydrophobic resin (D). In addition, the content of the repeating unit containing a fluorine atom is preferably 10% by mole to 100% by mole, and more preferably 30% by mole to 100% by mole, based on the total content of the repeating units included in the hydrophobic resin (D).

When the hydrophobic resin (D) has silicon atoms, the content of the silicon atoms is preferably 2% by mass to 50% by mass, and more preferably 2% by mass to 30% by mass, based on the weight average molecular weight of the hydrophobic resin (D). In addition, the content of the repeating unit containing a silicon atom is preferably 10% by mole to 100% by mole, and more preferably 20% by mole to 100% by mole, based on the total content of the repeating units included in the hydrophobic resin (D).

On the other hand, particularly, when the resin (D) contains the CH3 partial structure in a side chain moiety thereof, it is also preferable that the resin (D) do not substantially contain a fluorine atom and a silicon atom. In this case, specifically, the content of the repeating units having a fluorine atom and a silicon atom is preferably 5% by mole or less, more preferably 3% by mole or less, still more preferably 1% by mole or less, and ideally 0% by mole, that is, the resin has no fluorine atom and silicon atom, based on the total content of the repeating units in the resin (D). In addition, it is preferable that the resin (D) substantially consist of only repeating units consisting of only atoms selected from a carbon atom, an oxygen atom, a hydrogen atom, a nitrogen atom, and a sulfur atom. More specifically, the content of the repeating units consisting of only atoms selected from a carbon atom, an oxygen atom, a hydrogen atom, a nitrogen atom, and a sulfur atom is preferably 95% by mole or more, more preferably 97% by mole or more, still more preferably 99% by mole or more, and ideally 100% by mole, based on the total content of the repeating units in the resin (D).

The weight average molecular weight of the hydrophobic resin (D) relative to polystyrene standards is preferably 1,000 to 100,000, more preferably 1,000 to 50,000, and still more preferably 2,000 to 15,000.

Furthermore, the hydrophobic resin (D) may be used individually, or plural resins may be used in combination.

The content of the hydrophobic resin (D) in the composition is preferably 0.01% by mass to 35% by mass, more preferably 0.05% by mass to 30% by mass, and still more preferably 0.1% by mass to 25% by mass based on the total solid content in the actinic ray-sensitive or radiation sensitive resin composition (I).

For the hydrophobic resin (D), it is natural that the resin contains less impurities such as metals, as in the case of the resin (A), and the content of the residual monomer or oligomer components is preferably 0.01 to 5% by mass, more preferably 0.01 to 3% by mass, and still more preferably 0.05 to 1% by mass. Thus, an actinic ray-sensitive or radiation-sensitive resin composition (I) that does not have temporal changes in the impurities in the liquid or sensitivity or the like may be obtained. In addition, a molecular weight distribution (Mw/Mn, also referred to as dispersity) is preferably in the range of 1 to 5, more preferably in the range of 1 to 3, and even more preferably in the range of 1 to 2 from the viewpoint of resolution, a resist shape, a sidewall of the resist pattern, roughness, and the like.

In regard to the hydrophobic resin (D), various commercially available products can be used, or the resin can be synthesized according to a routine method (for example, by radical polymerization). For example, as the general synthesis method, a bulk polymerization method in which polymerization is carried out by dissolving monomer species and an initiator in a solvent and heating the solution, a dropwise adding polymerization method in which a solution of monomer species and an initiator is added dropwise to a heating solvent over 1 hour to 10 hours, or the like may be included, and a dropwise adding polymerization method is preferable.

Matters concerning the reaction solvent, polymerization initiator, reaction conditions (temperature, concentration, and the like), and the purification method after reaction, are the same as those described with regard to the resin (A), however, in the synthesis of the hydrophobic resin (D), the concentration of the reaction is preferably 30% by mass to 50% by mass.

Specific examples of the hydrophobic resin (D) will be shown below. In addition, the molar ratio of the repeating unit in each resin (corresponding to each repeating unit from left to right), the weight-average molecular weight, and the dispersity are shown in the tables below.

[Chem. 68]
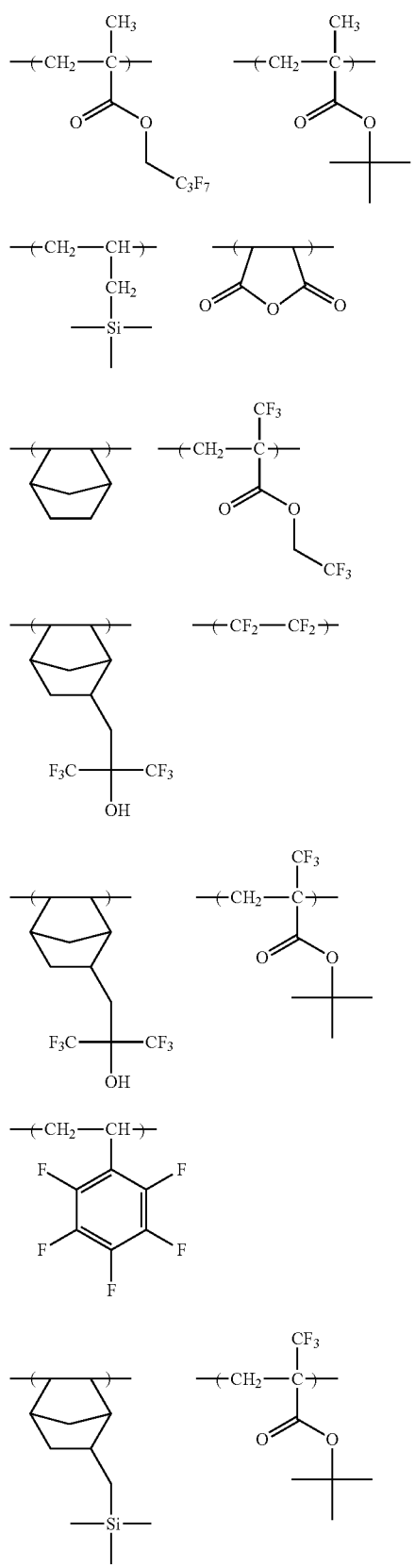
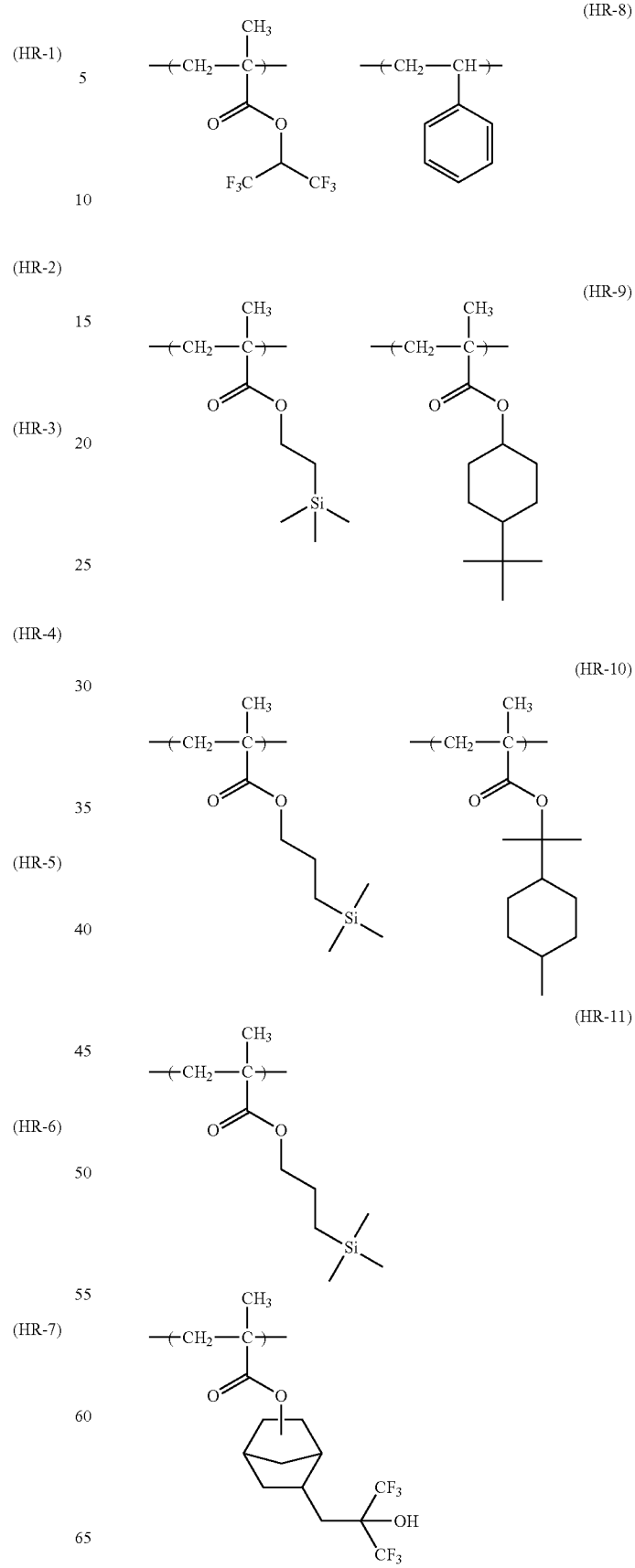

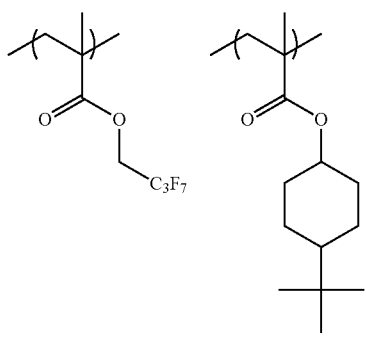
(HR-12)
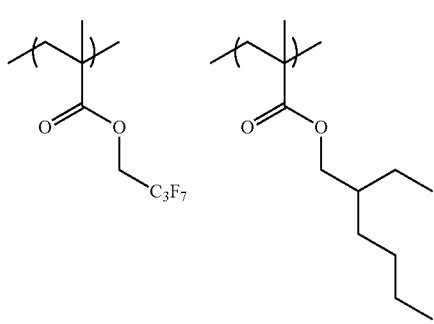
(HR-13)
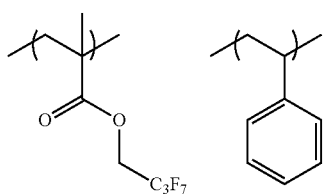
(HR-14)
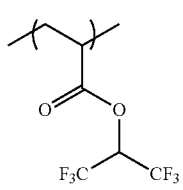
(HR-15)
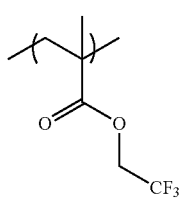
(HR-16)
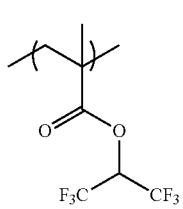
(HR-17)
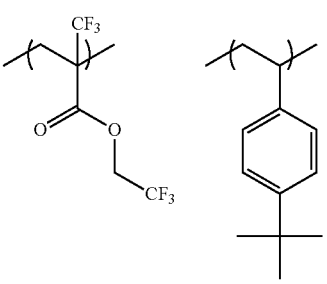
(HR-18)
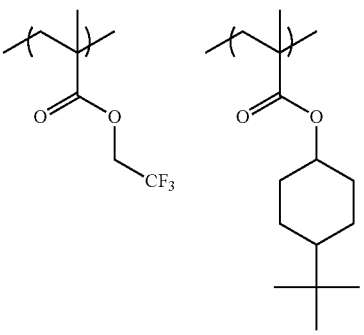
(HR-19)
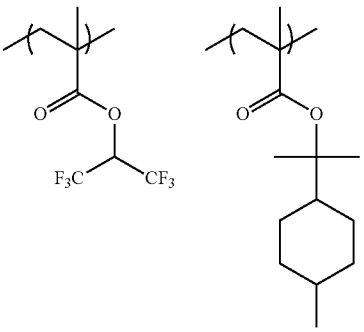
(HR-20)
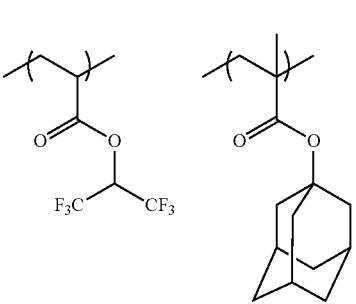
(HR-21)
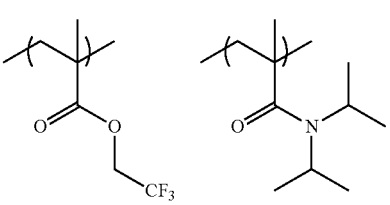
(HR-22)

-continued
(HR-23)
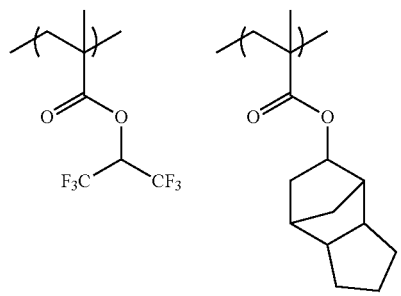
(HR-24)
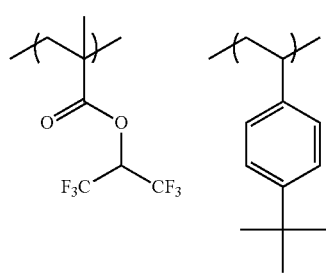
(HR-25)
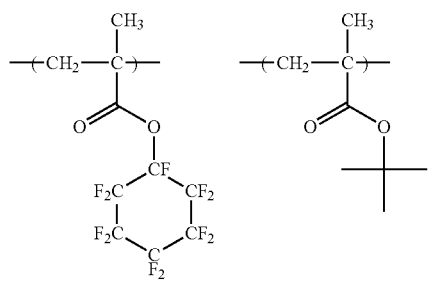
(HR-26)
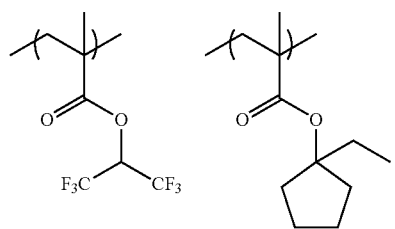
[Chem. 69]
(HR-27)
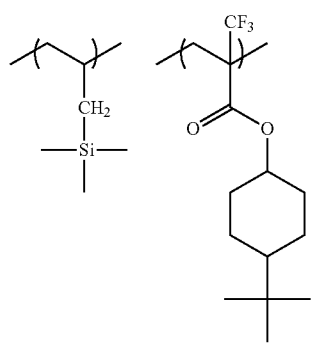
-continued
(HR-28)
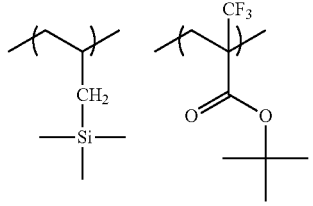
(HR-29)
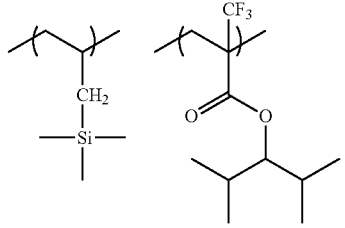
(HR-30)
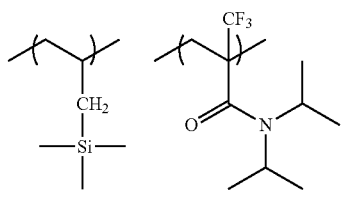
(HR-31)
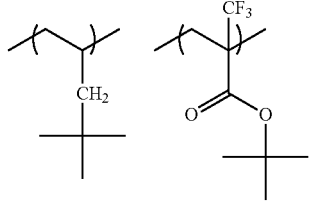
(HR-32)
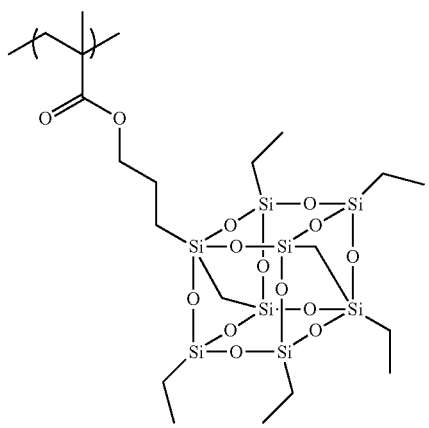
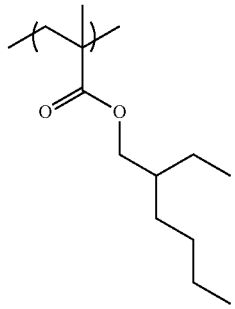

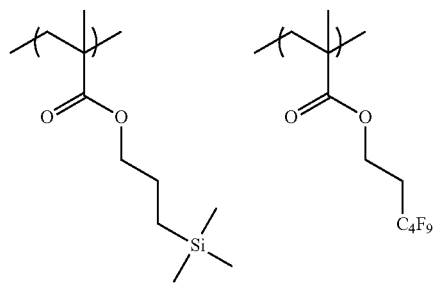
(HR-33)
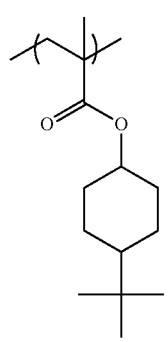
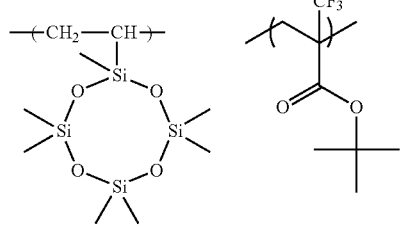
(HR-34)
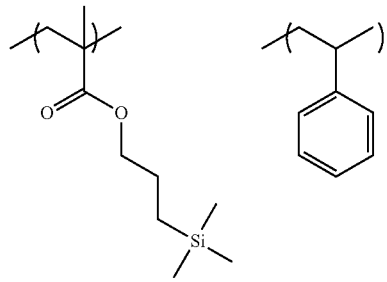
(HR-35)
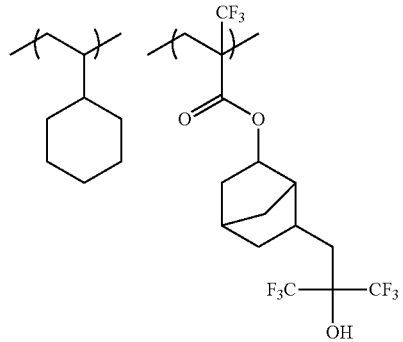
(HR-36)
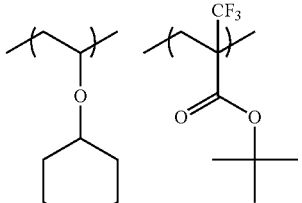
(HR-37)
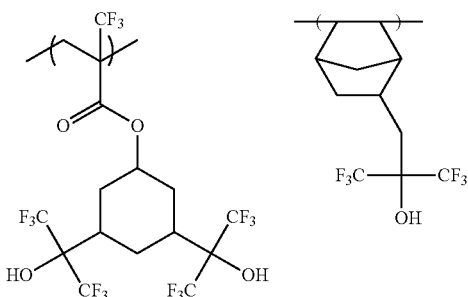
(HR-38)
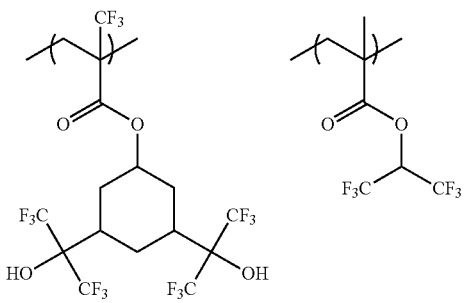
(HR-39)
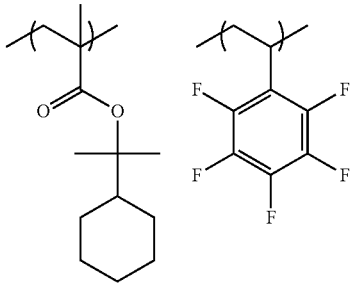
(HR-40)
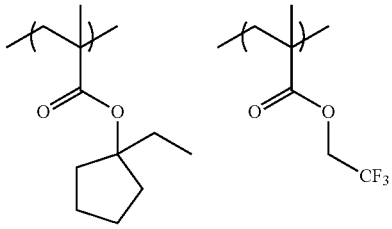
(HR-41)
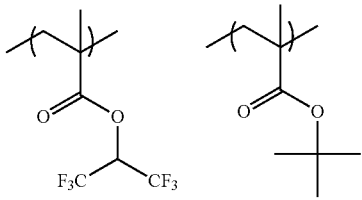
(HR-42)

-continued
(HR-43)
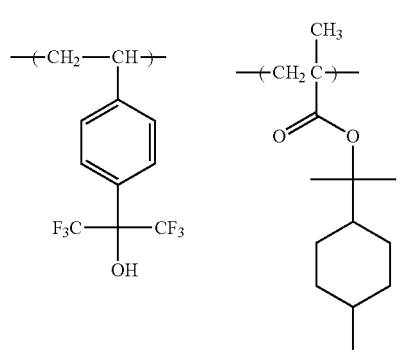
(HR-44)
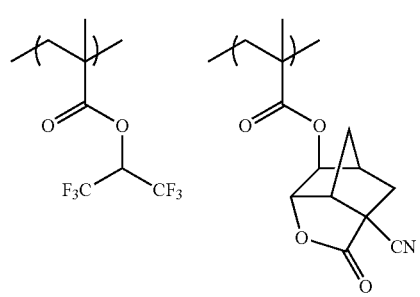
(HR-45)
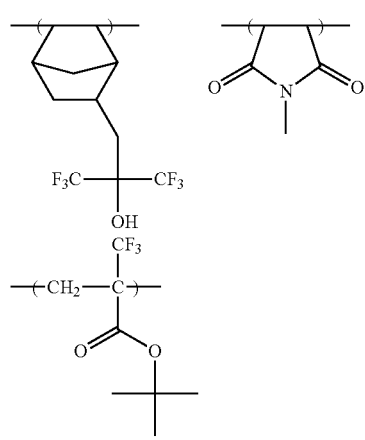
(HR-46)
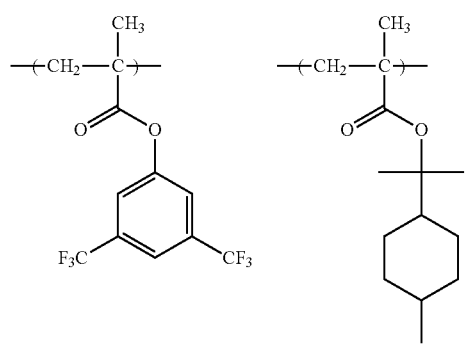
-continued
(HR-47)
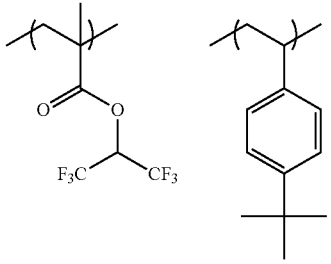
(HR-48)
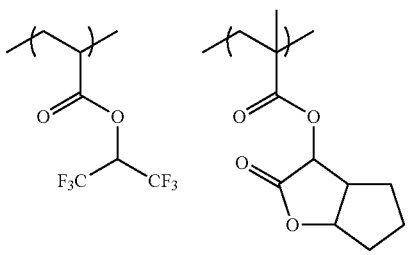
[Chem. 70]
(HR-49)
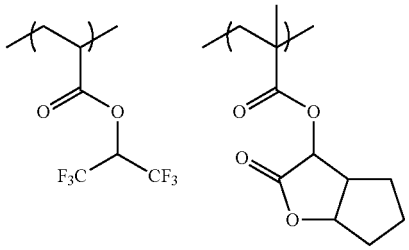
(HR-50)
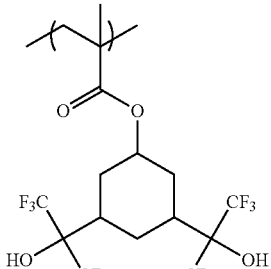
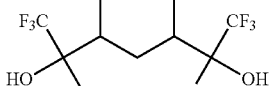
(HR-51)
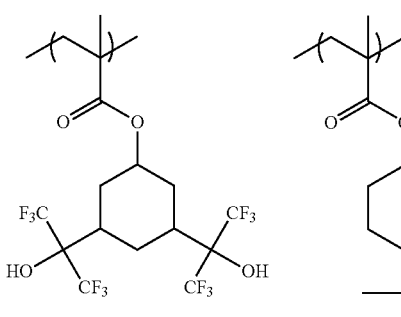
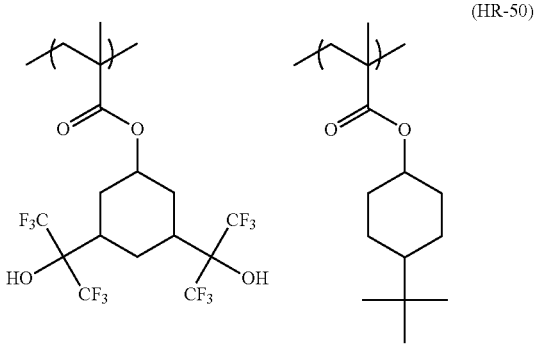
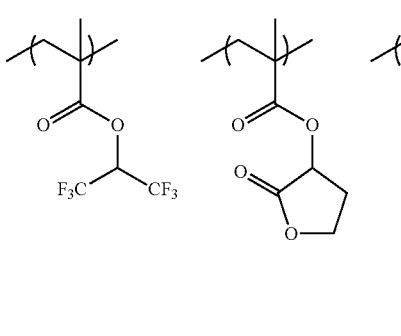

(HR-52)
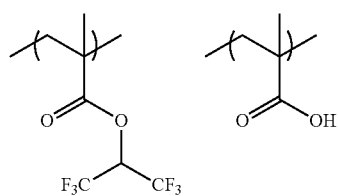
(HR-53)
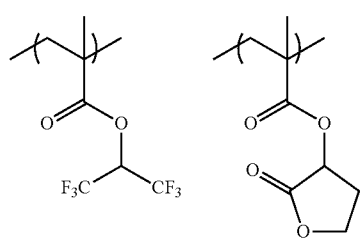
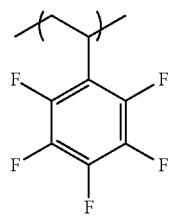
(HR-54)
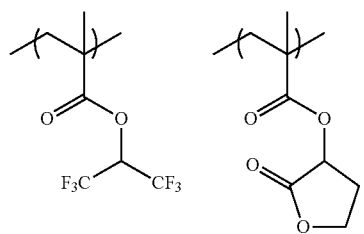
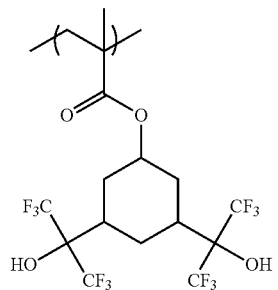
(HR-55)
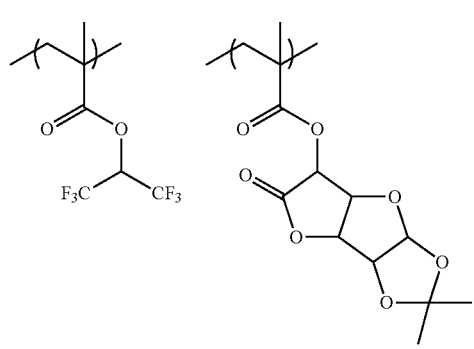
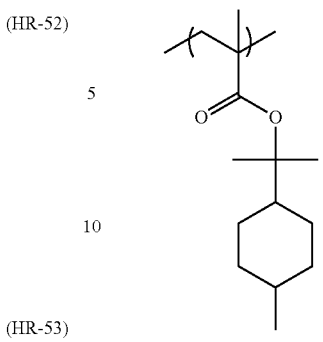
(HR-56)
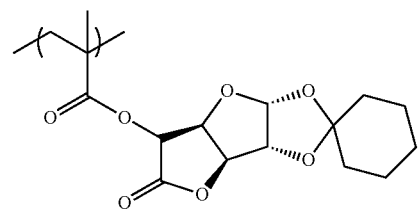
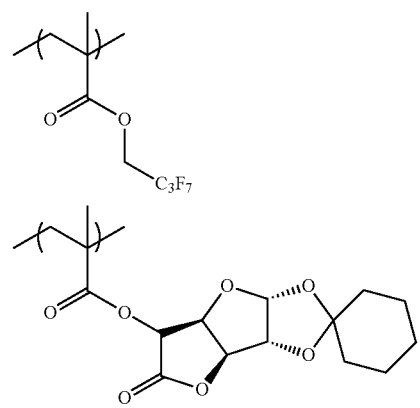
(HR-57)
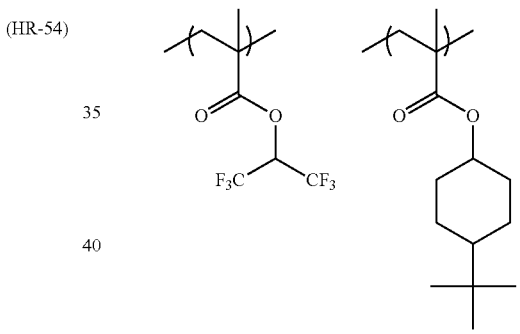
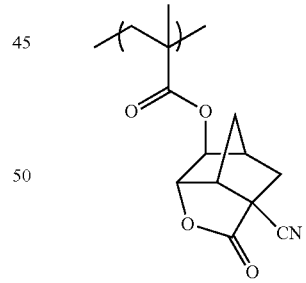
(HR-58)
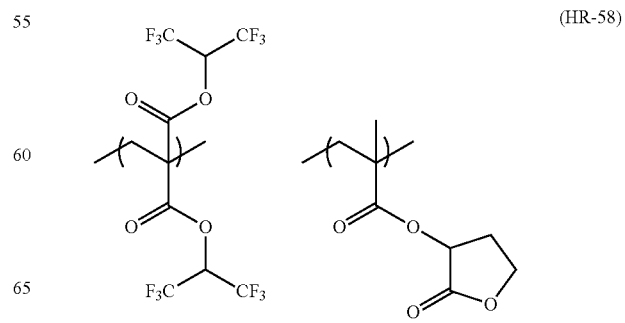

-continued
(HR-59)
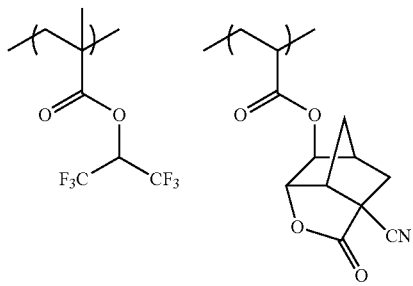
(HR-60)
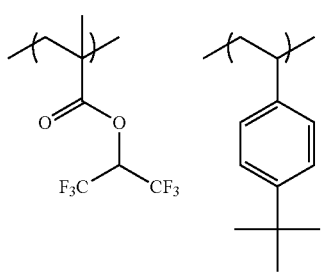
(HR-61)
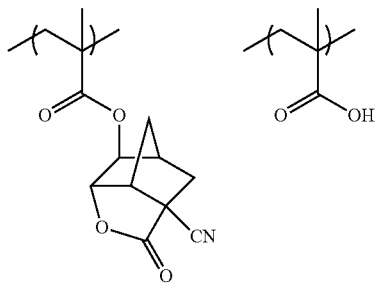
(HR-62)
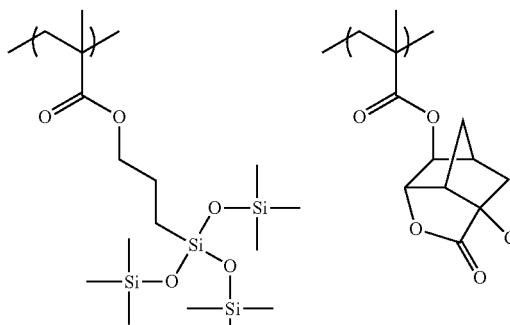
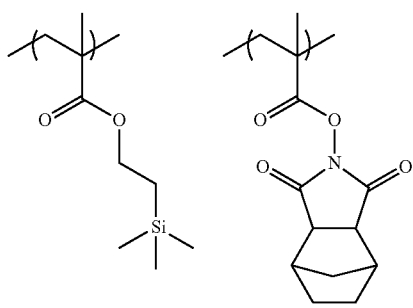
-continued
(HR-63)
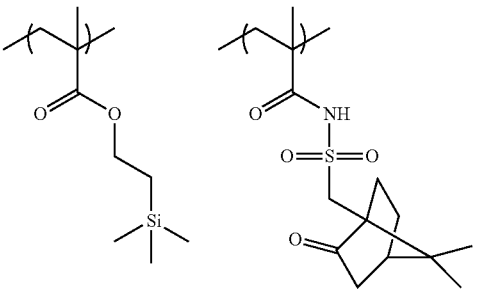
(HR-64)
(HR-65)
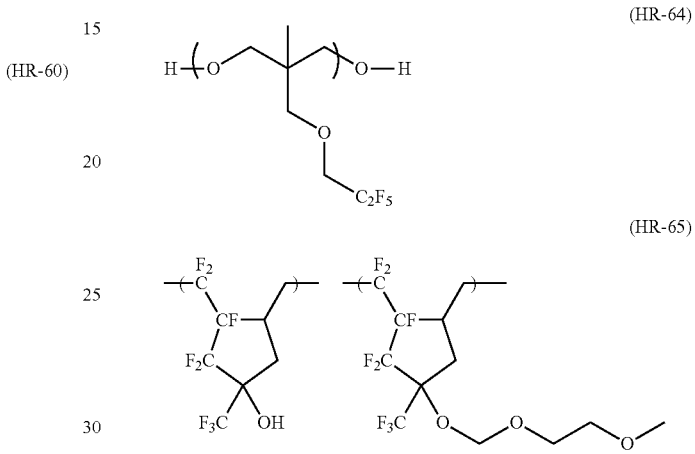
TABLE 1
| Resin | Composition | Mw | Mw/Mn |
|---|---|---|---|
| HR-1 | 50/50 | 4900 | 1.4 |
| HR-2 | 50/50 | 5100 | 1.6 |
| HR-3 | 50/50 | 4800 | 1.5 |
| HR-4 | 50/50 | 5300 | 1.6 |
| HR-5 | 50/50 | 4500 | 1.4 |
| HR-6 | 100 | 5500 | 1.6 |
| HR-7 | 50/50 | 5800 | 1.9 |
| HR-8 | 50/50 | 4200 | 1.3 |
| HR-9 | 50/50 | 5500 | 1.8 |
| HR-10 | 40/60 | 7500 | 1.6 |
| HR-11 | 70/30 | 6600 | 1.8 |
| HR-12 | 40/60 | 3900 | 1.3 |
| HR-13 | 50/50 | 9500 | 1.8 |
| HR-14 | 50/50 | 5300 | 1.6 |
| HR-15 | 100 | 6200 | 1.2 |
| HR-16 | 100 | 5600 | 1.6 |
| HR-17 | 100 | 4400 | 1.3 |
| HR-18 | 50/50 | 4300 | 1.3 |
| HR-19 | 50/50 | 6500 | 1.6 |
| HR-20 | 30/70 | 6500 | 1.5 |
| HR-21 | 50/50 | 6000 | 1.6 |
| HR-22 | 50/50 | 3000 | 1.2 |
| HR-23 | 50/50 | 5000 | 1.5 |
| HR-24 | 50/50 | 4500 | 1.4 |
| HR-25 | 30/70 | 5000 | 1.4 |
| HR-26 | 50/50 | 5500 | 1.6 |
| HR-27 | 50/50 | 3500 | 1.3 |
| HR-28 | 50/50 | 6200 | 1.4 |
| HR-29 | 50/50 | 6500 | 1.6 |
| HR-30 | 50/50 | 6500 | 1.6 |
| HR-31 | 50/50 | 4500 | 1.4 |
| HR-32 | 30/70 | 5000 | 1.6 |
| HR-33 | 30/30/40 | 6500 | 1.8 |
| HR-34 | 50/50 | 4000 | 1.3 |
| HR-35 | 50/50 | 6500 | 1.7 |
| HR-36 | 50/50 | 6000 | 1.5 |
| HR-37 | 50/50 | 5000 | 1.6 |

TABLE 1-continued
| Resin | Composition | Mw | Mw/Mn |
|---|---|---|---|
| HR-38 | 50/50 | 4000 | 1.4 |
| HR-39 | 20/80 | 6000 | 1.4 |
| HR-40 | 50/50 | 7000 | 1.4 |
| HR-41 | 50/50 | 6500 | 1.6 |
| HR-42 | 50/50 | 5200 | 1.6 |
| HR-43 | 50/50 | 6000 | 1.4 |
| HR-44 | 70/30 | 5500 | 1.6 |
| HR-45 | 50/20/30 | 4200 | 1.4 |
| HR-46 | 30/70 | 7500 | 1.6 |
| HR-47 | 40/58/2 | 4300 | 1.4 |
| HR-48 | 50/50 | 6800 | 1.6 |
| HR-49 | 100 | 6500 | 1.5 |
| HR-50 | 50/50 | 6600 | 1.6 |
| HR-51 | 30/20/50 | 6800 | 1.7 |
| HR-52 | 95/5 | 5900 | 1.6 |
| HR-53 | 40/30/30 | 4500 | 1.3 |
| HR-54 | 50/30/20 | 6500 | 1.8 |
| HR-55 | 30/40/30 | 7000 | 1.5 |
| HR-56 | 60/40 | 5500 | 1.7 |
| HR-57 | 40/40/20 | 4000 | 1.3 |
| HR-58 | 60/40 | 3800 | 1.4 |
| HR-59 | 80/20 | 7400 | 1.6 |
| HR-60 | 40/40/15/5 | 4800 | 1.5 |
| HR-61 | 60/40 | 5600 | 1.5 |
| HR-62 | 50/50 | 5900 | 2.1 |
| HR-63 | 80/20 | 7000 | 1.7 |
| HR-64 | 100 | 5500 | 1.8 |
| HR-65 | 50/50 | 9500 | 1.9 |
[Chem. 71]
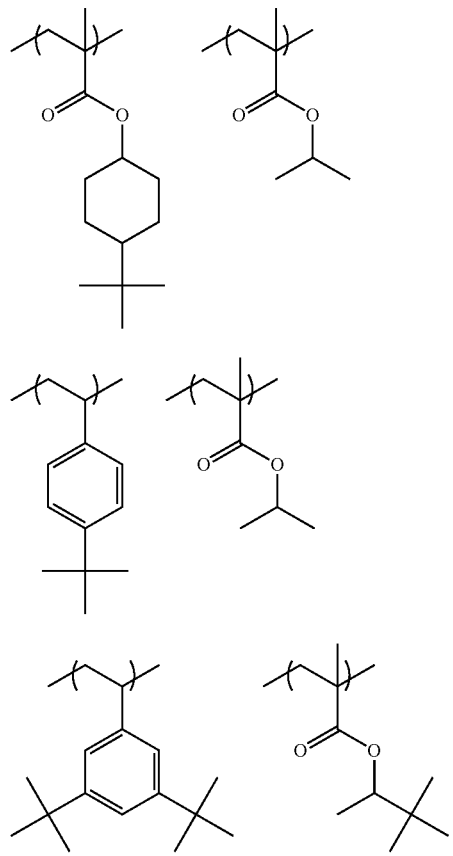
(C-1)
(C-2)
(C-3)
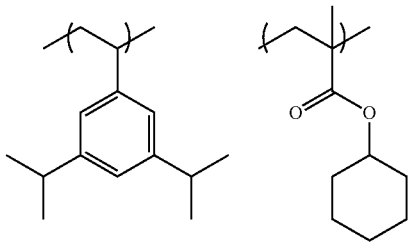
(C-4)
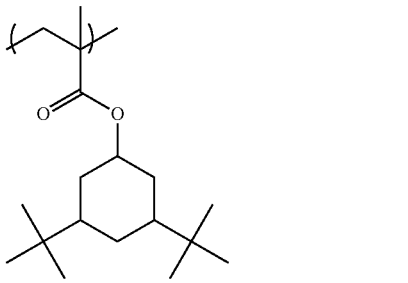
(C-5)
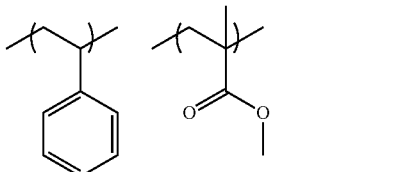
(C-6)
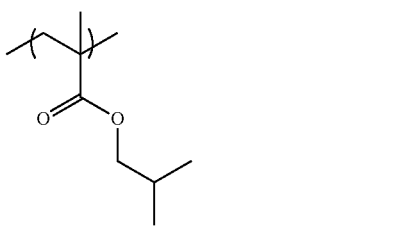
(C-7)
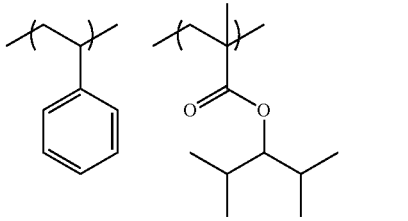
(C-8)
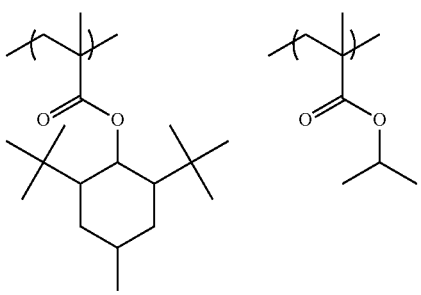
(C-9)

(C-10)
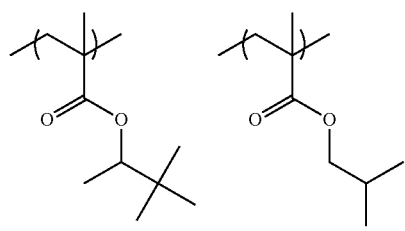
(C-11)
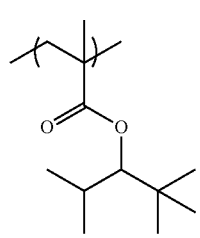
(C-12)
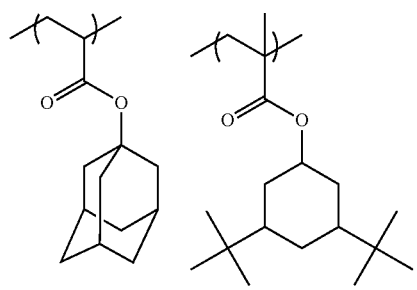
(C-13)
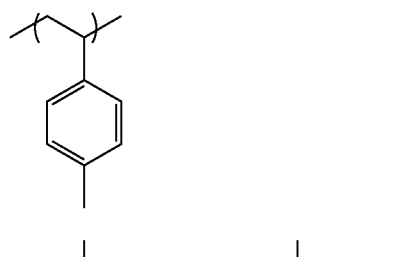
(C-14)
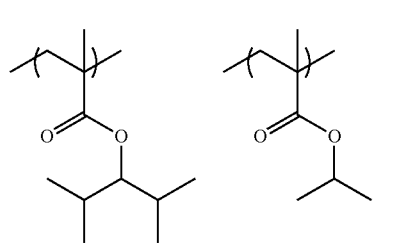
(C-15)
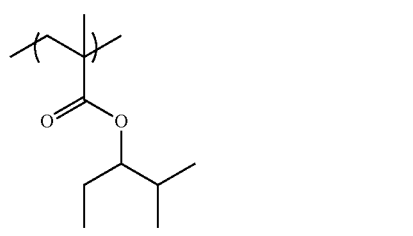
(C-16)
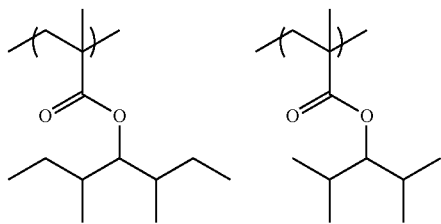
[Chem. 72]
(C-17)
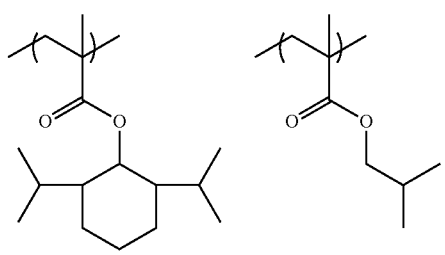
(C-18)
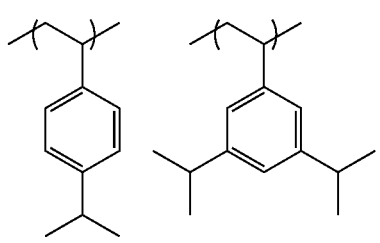
(C-19)
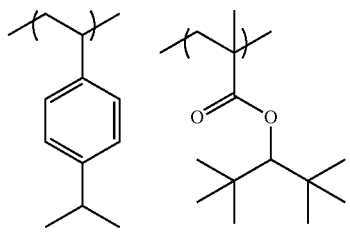
(C-20)
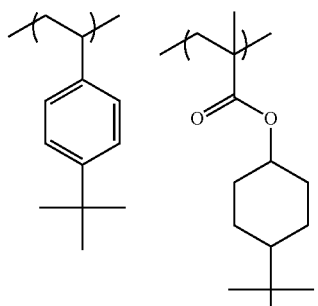
(C-21)
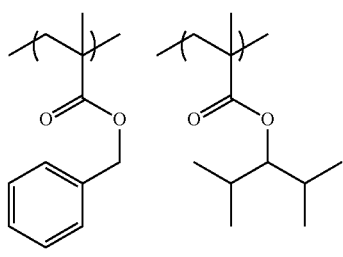

(C-22)
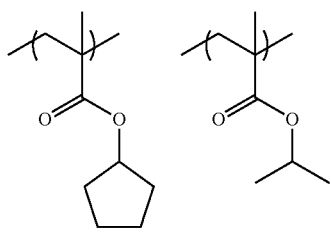
(C-23)
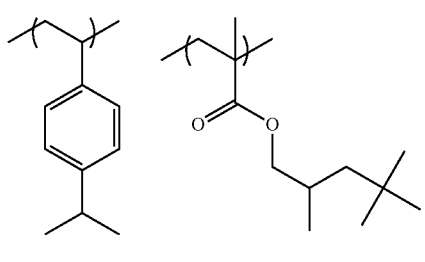
(C-24)
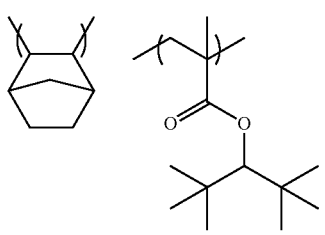
(C-25)
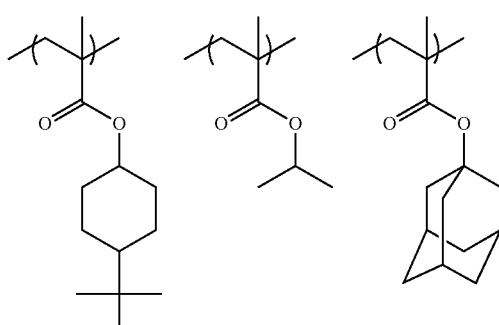
(C-26)
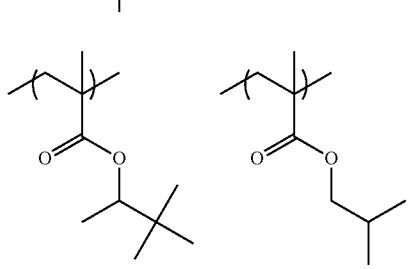
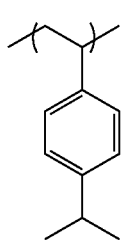
(C-27)
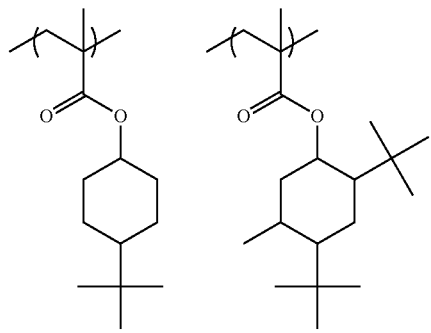
(C-28)
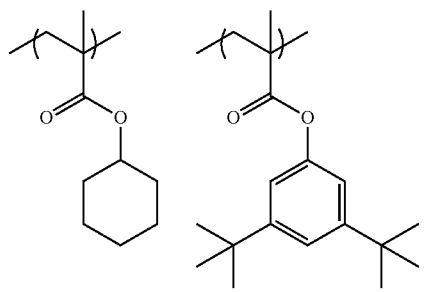
[Chem. 73]
(D-1)
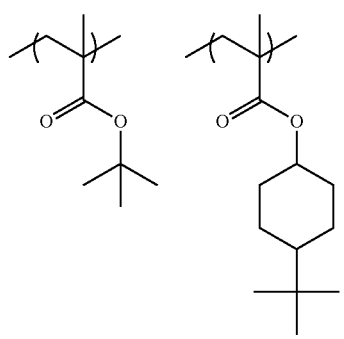
(D-2)
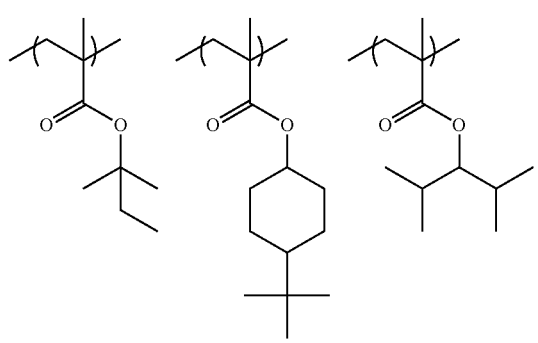
(D-3)
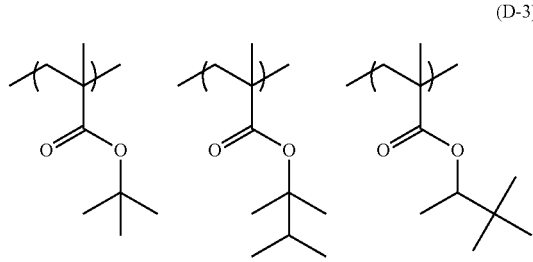

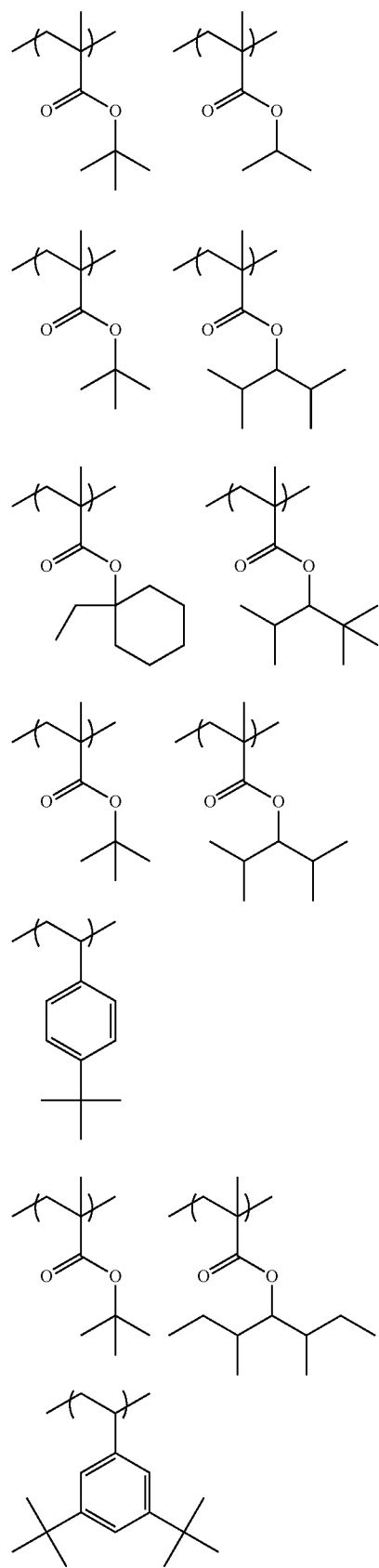
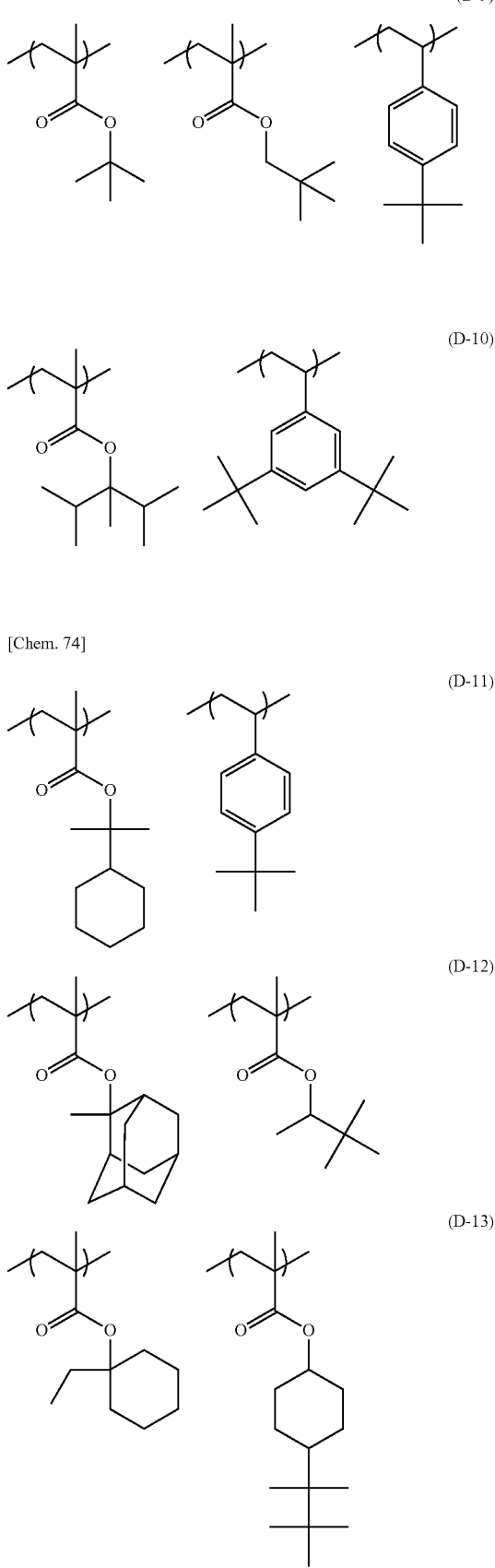

-continued

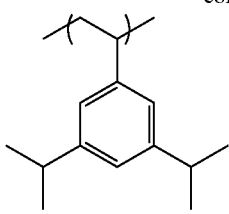

(D-14)

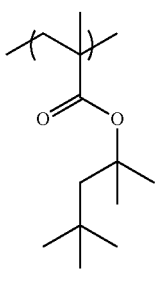
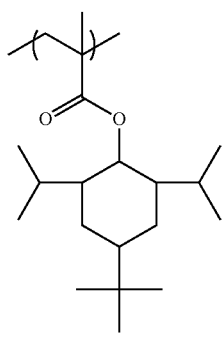

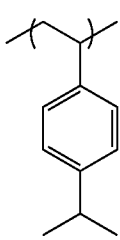

(D-15)

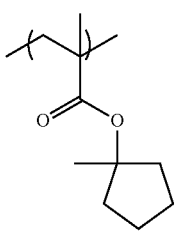
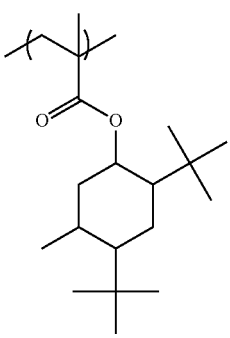

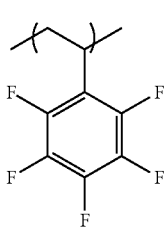

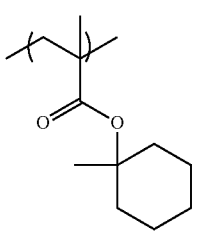

(D-16)

-continued

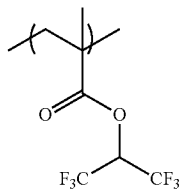

TABLE 2

| Resin | Composition | Mw | Mw/Mn |
|---|---|---|---|
| C-1 | 50/50 | 9600 | 1.74 |
| C-2 | 60/40 | 34500 | 1.43 |
| C-3 | 30/70 | 19300 | 1.69 |
| C-4 | 90/10 | 26400 | 1.41 |
| C-5 | 100 | 27600 | 1.87 |
| C-6 | 80/20 | 4400 | 1.96 |
| C-7 | 100 | 16300 | 1.83 |
| C-8 | 5/95 | 24500 | 1.79 |
| C-9 | 20/80 | 15400 | 1.68 |
| C-10 | 50/50 | 23800 | 1.46 |
| C-11 | 100 | 22400 | 1.57 |
| C-12 | 10/90 | 21600 | 1.52 |
| C-13 | 100 | 28400 | 1.58 |
| C-14 | 50/50 | 16700 | 1.82 |
| C-15 | 100 | 23400 | 1.73 |
| C-16 | 60/40 | 18600 | 1.44 |
| C-17 | 80/20 | 12300 | 1.78 |
| C-18 | 40/60 | 18400 | 1.58 |
| C-19 | 70/30 | 12400 | 1.49 |
| C-20 | 50/50 | 23500 | 1.94 |
| C-21 | 10/90 | 7600 | 1.75 |
| C-22 | 5/95 | 14100 | 1.39 |
| C-23 | 50/50 | 17900 | 1.61 |
| C-24 | 10/90 | 24600 | 1.72 |
| C-25 | 50/40/10 | 23500 | 1.65 |
| C-26 | 60/30/10 | 13100 | 1.51 |
| C-27 | 50/50 | 21200 | 1.84 |
| C-28 | 10/90 | 19500 | 1.66 |

TABLE 3

| Resin | Composition | Mw | Mw/Mn |
|---|---|---|---|
| D-1 | 50/50 | 16500 | 1.72 |
| D-2 | 10/50/40 | 18000 | 1.77 |
| D-3 | 5/50/45 | 27100 | 1.69 |
| D-4 | 20/80 | 26500 | 1.79 |
| D-5 | 10/90 | 24700 | 1.83 |
| D-6 | 10/90 | 15700 | 1.99 |
| D-7 | 5/90/5 | 21500 | 1.92 |
| D-8 | 5/60/35 | 17700 | 2.10 |
| D-9 | 35/35/30 | 25100 | 2.02 |
| D-10 | 70/30 | 19700 | 1.85 |
| D-11 | 75/25 | 23700 | 1.80 |
| D-12 | 10/90 | 20100 | 2.02 |
| D-13 | 5/35/60 | 30100 | 2.17 |
| D-14 | 5/45/50 | 22900 | 2.02 |
| D-15 | 15/75/10 | 28600 | 1.81 |
| D-16 | 25/55/20 | 27400 | 1.87 |

[5-1] Basic Compound or Ammonium Salt Compound (N) of which Basicity is Decreased by Irradiation of Actinic Rays or Radiation The actinic ray-sensitive or radiation-sensitive resin composition (I) of the present invention preferably contains a basic compound or an ammonium salt compound (hereinafter, also referred to as a "compound (N)") of which basicity is decreased by irradiation of actinic rays or radiation.

The compound (N) is preferably a compound (N-1) having a basic functional group or an ammonium group, and a group generating an acidic functional group by irradiation of actinic rays or radiation. That is, the compound (N) is preferably a basic compound having a basic functional group and a group generating an acidic functional group by irradiation of actinic rays or radiation, or an ammonium salt compound having an ammonium group and a group generating an acidic functional group by irradiation of actinic rays or radiation.

As the compound (N) or (N-1) generated by decomposition by irradiation of actinic rays or radiation, and of basicity is decreased, a compound represented by the following the general formula (PA-I), (PA-II), or (PA-III) is included, and a compound represented by the following the general formula (PA-II) or (PA-III) is particularly preferable from the viewpoint of highly balancing excellent effects regarding LWR, local pattern dimension uniformity, and DOF.

First, a compound represented by the general formula (PA-I) will be described.

 (PA-I)

In the general formula (PA-I), $A_1$ represents a single bond or a divalent linking group.

Q represents $-SO_3H$, or $-CO_2H$. Q is equivalent to an acidic functional group generated by irradiation of actinic rays or radiation.

X represents $-SO_2-$, or $-CO-$.

n represents 0 or 1.

B represents a single bond, an oxygen atom, or $-N(Rx)-$.

Rx represents a hydrogen atom or a monovalent organic group.

R represents a monovalent organic group having a basic functional group or a monovalent organic group having an ammonium group.

The divalent linking group in $A_1$ is preferably a divalent linking group having 2 to 12 carbon atoms, and may include, for example, an alkylene group, a phenylene group or the like. An alkylene group having at least one fluorine atom is more preferable, and the number of carbon atoms is preferably 2 to 6 and the number of carbon atoms is more preferably 2 to 4. A linking group such as an oxygen atom or a sulfur atom may be included in the alkylene chain. Particularly, the alkylene group is preferably an alkylene group in which 30% to 100% of the number of hydrogen atoms is substituted with a fluorine atom, and it is more preferable that the carbon atom bonded to a Q site have a fluorine atom. Furthermore, a perfluoroalkylene group is preferable, and a perfluoroethylene group, a perfluoropropylene group or a perfluorobutylene group, is more preferable.

The monovalent organic group in Rx has preferably 4 to 30 carbon atoms and examples thereof may include an alkyl group, a cycloalkyl group, an aryl group, an aralkyl group, an alkenyl group or the like.

The alkyl group in Rx may have a substituent, is preferably a linear or branched alkyl group having 1 to 20 carbon atoms, and may have an oxygen atom, a sulfur atom, a nitrogen atom in the alkyl chain.

As the alkyl group having a substituent, a group in which a linear or branched alkyl group is substituted with a cycloalkyl group (for example, an adamantylmethyl group, an adamantylethyl group, a cyclohexylethyl group, a camphor-residue, or the like) may be included.

The cycloalkyl group in Rx may have a substituent, is preferably a cycloalkyl group having 3 to 20 carbon atoms, and may have an oxygen atom in the ring.

The aryl group in Rx may have a substituent, and is preferably an aryl group having 6 to 14 carbon atoms.

The aralkyl group in Rx may have a substituent, and is preferably an aralkyl group having 7 to 20 carbon atoms.

The alkenyl group in Rx may have a substituent, and may include, for example, a group having a double bond at any position of the alkyl group included as Rx.

The preferable partial structure of the basic functional group may include, for example, crown ether, a primary to tertiary amine, nitrogen-containing heterocyclic ring (pyridine, imidazole, pyrazine, or the like).

The preferable partial structure of the ammonium group may include, for example, primary to tertiary ammonium, pyridinium, imidazolinium, pyrazinium or the like.

In addition, as the basic functional group, a functional group having a nitrogen atom is preferable, a structure having a primary to tertiary amino group or a nitrogen-containing heterocyclic structure is more preferable. In these structures, all the atoms adjacent to the nitrogen atom included in the structure are preferably a carbon atom or a hydrogen atom from the viewpoint of improving basicity. In addition, from the viewpoint of improving basicity, it is preferable that an electron-withdrawing functional group (a carbonyl group, a sulfonyl group, a cyano group, a halogen atom, or the like) be not directly bonded to the nitrogen atom.

The monovalent organic group in the monovalent organic group including such a structure (R group) preferably has 4 to 30 carbon atoms, and may include, for example, an alkyl group, a cycloalkyl group, an aryl group, an aralkyl group, an alkenyl group or the like, and each group may have a substituent.

The alkyl group, the cycloalkyl group, the aryl group, the aralkyl group and the alkyl group in the alkenyl group, the cycloalkyl group, the aryl group, the aralkyl group and the alkenyl group including the basic functional group or the ammonium group in R are the same alkyl group, cycloalkyl group, aryl group, aralkyl group, and alkenyl group included as Rx, respectively.

As the substituent that each group described above may have, for example, a halogen atom, a hydroxyl group, a nitro group, a cyano group, a carboxyl group, a carbonyl group, a cycloalkyl group (preferably 3 to 10 carbon atoms), an aryl group (preferably 6 to 14 carbon atoms), an alkoxy group (preferably 1 to 10 carbon atoms), an acyl group (preferably 2 to 20 carbon atoms), an acyloxy group (preferably 2 to 10 carbon atoms), an alkoxycarbonyl group (preferably 2 to 20 carbon atoms), an aminoacyl group (preferably, 2 to 20 carbon atoms), or the like, may be included. For a cyclic structure in the aryl group, the cycloalkyl group, and the like, the substituent may further include an alkyl group (preferably 1 to 20 carbon atoms). For the aminoacyl group, the substituent may further include one or two alkyl groups (preferably 1 to 20 carbon atoms).

When B is $-N(Rx)-$, it is preferable that R and Rx may be bonded to each other to form a ring. By forming the ring structure, stability is improved and storage stability of the composition using this is improved. The number of carbon atoms forming a ring is preferably 4 to 20, the ring may be a monocyclic type or a polycyclic type, and may contain an oxygen atom, a sulfur atom, or a nitrogen atom in the ring.

The monocyclic structure may include a 4- to 8-membered ring containing a nitrogen atom. As the polycyclic structure, a structure formed by combining two, three or more monocyclic structures. The monocyclic structure and the polycyclic structure may have a substituent, and is preferably, for example, a halogen atom, a hydroxyl group, a cyano group, a carboxyl group, a carbonyl group, a cycloalkyl group (preferably 3 to 10 carbon atoms), an aryl group (preferably 6 to 14 carbon atoms), an alkoxy group (preferably 1 to 10 carbon atoms), an acyl group (preferably 2 to 15 carbon atoms), an acyloxy group (preferably 2 to 15 carbon atoms), an alkoxycarbonyl group (preferably 2 to 15 carbon atoms), an aminoacyl group (preferably 2 to 20 carbon atoms), or the like. For a cyclic structure in the aryl group, the cycloalkyl group, and the like, the substituent may further include an alkyl group (preferably 1 to 15 carbon atoms). For the aminoacyl group, the substituent may further include one or two alkyl groups (preferably 1 to 15 carbon atoms).

Among the compounds represented by the general formula (PA-I), compounds of which Q site is a sulfonic acid can be synthesized using a general sulfonamide reaction. For example, a method in which a sulfonamide bond is formed by selectively reacting one of the sulfonyl halide parts of a bissulfonyl halide compound with an amine compound, and then, the other sulfonyl halide moiety is hydrolyzed, or a method in which a cyclic sulfonic acid anhydride is reacted with an amine compound and is ring-opened, may be used.

Next, a compound represented by the general formula (PA-II) will be described.

$Q_1\text{-}X_1\text{—}NH\text{—}X_2\text{-}Q_2$       (PA-II)

In the general formula (PA-II), $Q_1$ and $Q_2$ each independently represent a monovalent organic group. However, any one of $Q_1$ and $Q_2$ has a basic functional group. $Q_1$ and $Q_2$ are bonded to each other to form a ring, and the formed ring may have a basic functional group.

$X_1$ and $X_2$ each independently represent —CO— or —SO$_2$—.

In addition, —NH— is equivalent to an acidic functional group generated by irradiation of actinic rays or radiation.

In the general formula (PA-II), the monovalent organic group as $Q_1$ and $Q_2$ preferably has 1 to 40 carbon atoms, and may include, for example, an alkyl group, a cycloalkyl group, an aryl group, an aralkyl group, an alkenyl group, or the like.

The alkyl group in $Q_1$ and $Q_2$ may have a substituent, is preferably a linear or branched alkyl group having 1 to 30 carbon atoms, and may have an oxygen atom, a sulfur atom, a nitrogen atom in the alkyl chain.

The cycloalkyl group in $Q_1$ and $Q_2$ may have a substituent, is preferably a cycloalkyl group having 3 to 20 carbon atoms and may include an oxygen atom and a nitrogen atom in the ring.

The aryl group in $Q_1$ and $Q_2$ may have a substituent, and is preferably an aryl group having 6 to 14 carbon atoms.

The aralkyl group in $Q_1$ and $Q_2$ may have a substituent, and is preferably an aralkyl group having 7 to 20 carbon atoms.

The alkenyl group in $Q_1$ and $Q_2$ may have a substituent, and may include, for example, a group having a double bond at any position of the above alkyl group.

As the substituent that each group described above may have, for example, a halogen atom, a hydroxyl group, a nitro group, a cyano group, a carboxyl group, a carbonyl group, a cycloalkyl group (preferably 3 to 10 carbon atoms), an aryl group (preferably 6 to 14 carbon atoms), an alkoxy group (preferably 1 to 10 carbon atoms), an acyl group (preferably 2 to 20 carbon atoms), an acyloxy group (preferably 2 to 10 carbon atoms), an alkoxycarbonyl group (preferably 2 to 20 carbon atoms), an aminoacyl group (preferably, 2 to 10 carbon atoms), or the like, may be included. For a cyclic structure in the aryl group, the cycloalkyl group, and the like, the substituent may further include an alkyl group (preferably 1 to 10 carbon atoms). For the aminoacyl group, the substituent may further include an alkyl groups (preferably 1 to 10 carbon atoms). The alkyl group having a substituent may include, for example, a perfluoroalkyl group such as a perfluoromethyl group, a perfluoroethyl group, a perfluoropropyl group or a perfluorobutyl group.

As a preferable partial structure of the basic functional group that at least one of $Q_1$ and $Q_2$ may have, the same partial structure described as the basic functional group, which R of the general formula (PA-I) has, may be included.

As the structure in which $Q_1$ and $Q_2$ are bonded to each other to form a ring and the formed ring may have a basic functional group, for example, a structure in which the organic group of $Q_1$ and $Q_2$ is further bonded to an alkylene group, an oxy group, an imino group or the like, may be included.

In the general formula (PA-II), at least one of $X_1$ and $X_2$ is preferably —SO$_2$—.

Next, a compound represented by the general formula (PA-III) will be described.

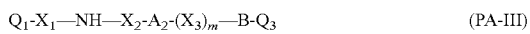
$Q_1\text{-}X_1\text{—}NH\text{—}X_2\text{-}A_2\text{-}(X_3)_m\text{—}B\text{-}Q_3$       (PA-III)

In the general formula (PA-III), $Q_1$ and $Q_3$ each independently represent a monovalent organic group. However, any one of $Q_1$ and $Q_3$ has a basic functional group. $Q_1$ and $Q_3$ are bonded to each other to form a ring, and the formed ring may have a basic functional group.

$X_1$, $X_2$ and $X_3$ each independently represent —CO— or —SO$_2$—.

$A_2$ represents a divalent linking group.

B represents a single bond, an oxygen atom or —N(Qx)-.

Qx represents a hydrogen atom or a monovalent organic group.

When B is —N(Qx)-, $Q_3$ and Qx may be bonded to each other to form a ring.

m represents 0 or 1.

In addition, —NH— is equivalent to an acidic functional group generated by irradiation of actinic rays or radiation.

$Q_1$ is synonymous with $Q_1$ in the general formula (PA-II).

The organic group of $Q_3$ may include the same organic group as $Q_1$ and $Q_2$ in the general formula (PA-II).

As the structure in which $Q_1$ and $Q_3$ are bonded to each other to form a ring and the formed ring may have a basic functional group, for example, a structure in which the organic group of $Q_1$ and $Q_3$ is further bonded to an alkylene group, an oxy group, an imino group or the like, may be included.

The divalent linking group in $A_2$ is preferably a divalent linking group having a fluorine atom of 1 to 8 carbon atoms, and may include, for example, an alkylene group having a fluorine atom of 1 to 8 carbon atoms, a phenylene group having a fluorine atom or the like. An alkylene group having a fluorine atom is more preferable, and the number of carbon atoms is preferably 2 to 6 and the number of carbon atoms is more preferably 2 to 4. A linking group such as an oxygen atom or a sulfur atom may be included in the alkylene chain. The alkylene group is preferably an alkylene group in which 30% to 100% of the number of hydrogen atoms is substituted with a fluorine atom, more preferably a perfluoroalkylene group, and particularly preferably a perfluoroalkylene group having 2 to 4 carbon atoms.

The monovalent organic group in Qx is preferably an organic group having 4 to 30 carbon atoms, and may include, for example, an alkyl group, a cycloalkyl group, an aryl group, an aralkyl group, an alkenyl group, or the like. The alkyl group, the cycloalkyl group, the aryl group, the aralkyl group and the alkenyl group are the same as Rx in the above Formula (PA-I).

In the general formula (PA-III), $X_1$, $X_2$, and $X_3$ are preferably —$SO_2$—.

The compound (N) is preferably a sulfonium salt compound of the compound represented by the general formula (PA-I), (PA-II) or (PA-III), or an iodonium salt compound of the compound represented by the general formula (PA-I), (PA-II) or (PA-III), and more preferably a compound represented by the following the general formula (PA1) or (PA2).

[Chem. 75]

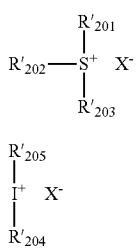

(PA1)

(PA2)

In the general formula (PA1), $R'_{201}$, $R'_{202}$ and $R'_{203}$ each independently represent an organic group, and specifically, is the same as $R_{201}$, $R_{202}$ and $R_{203}$ of Formula ZI in the above component (B).

$X^-$ represents a sulfonate anion or a carboxylate anion in which a hydrogen atom of the —$SO_3H$ site or the —COOH site of the compound represented by the general formula (PA-I) is detached, or an anion in which a hydrogen atom of the —NH— site of the compound represented by the general formula (PA-II) or (PA-III) is detached.

In the general formula (PA2), $R'_{204}$ and $R'_{205}$ each independently represent an aryl group, an alkyl group or a cycloalkyl group, and specifically, is the same as $R_{204}$ and $R_{205}$ of Formula ZII in the above component (B).

$X^-$ represents a sulfonate anion or a carboxylate anion in which a hydrogen atom of the —$SO_3H$ site or the —COOH site of the compound represented by the general formula (PA-I) is detached, or an anion in which a hydrogen atom of the —NH— site of the compound represented by the general formula (PA-II) or (PA-III) is detached.

The compound (N) is decomposed by irradiation of actinic rays or radiation, and produces, for example, a compound represented by the general formula (PA-I), (PA-II) or (PA-III).

The compound represented by the general formula (PA-I) is a compound of which basicity is reduced, eliminated, or changed to from basicity to acidity compared to the compound (N), by having a sulfonic acid group or a carboxylic acid group with a basic functional group or an ammonium group.

The compound represented by the general formula (PA-II) or (PA-III) is a compound of which basicity is reduced, eliminated, or changed from basicity to acidity compared to the compound (N), by having an organic sulfonylimino group or an organic carbonylimino group with a basic functional group.

In the present invention, basicity being reduced by irradiation of actinic rays or radiation means that an acceptor property of the compound (N) for protons (acid generated by irradiation of actinic rays or radiation) is reduced by irradiation with actinic rays or radiation. The acceptor property being reduced means that, when an equilibrium reaction in which a non-covalent bond complex, a proton adduct, is produced from the compound having a basic functional group and a proton is occurred, or an equilibrium reaction in which a counter-cation of the compound having an ammonium group is exchanged with a proton is occurred, an equilibrium constant in chemical equilibrium thereof is reduced.

As described above, when the compound (N) in which basicity is reduced by irradiation of actinic rays or radiation is incorporated in the resist film, the acceptor property of the compound (N) is sufficiently expressed in the unexposed areas, and the unintended reaction between the acid that has diffused from exposed areas or the like and the resin (A) can be suppressed. Also, in the exposed areas, since the acceptor property of the compound (N) is decreased, the intended reaction between the acid and the resin (A) occurs more reliably, and there is also contribution of such an operating mechanism. Thus, it is speculated that a pattern which is excellent in the line width roughness (LWR), local uniformity of the pattern dimensions, the depth of focus (DOF), and the pattern shape may be obtained.

In addition, basicity can be confirmed by a pH measurement, and the calculated value can be determined by commercially available software.

Hereinafter, specific examples of the compound (N) which produces a compound represented by the general formula (PA-I) by irradiation of actinic rays or radiation are shown below, however, the present invention is not limited to these.

[Chem. 76]

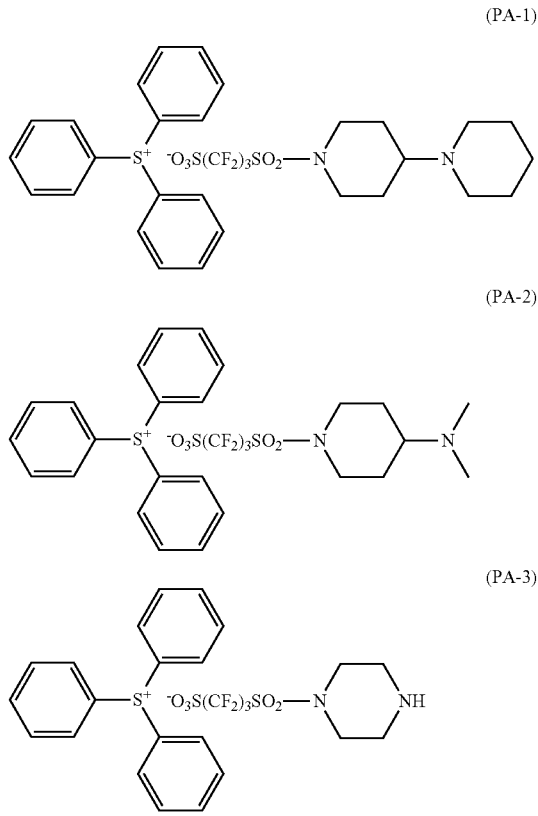

-continued
(PA-4)
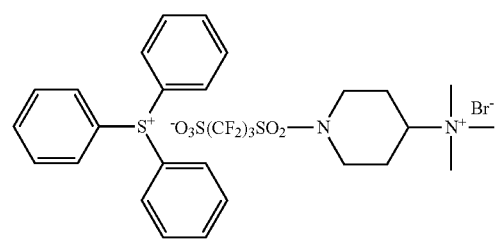
(PA-5)
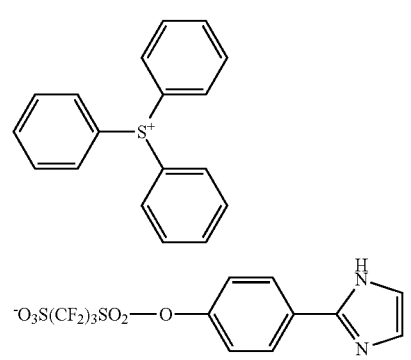
(PA-6)
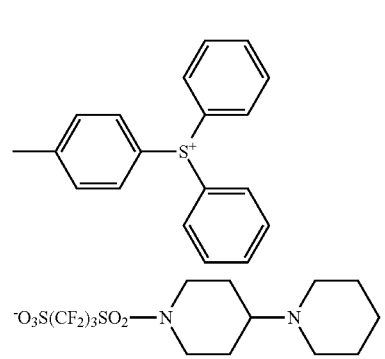
(PA-7)
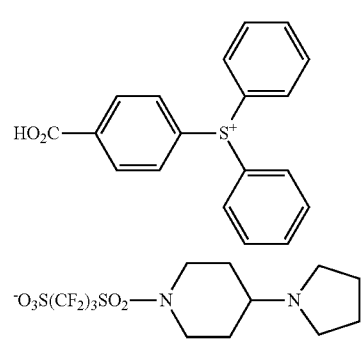
(PA-8)
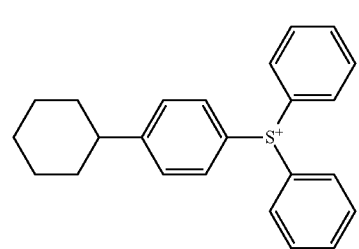
-continued
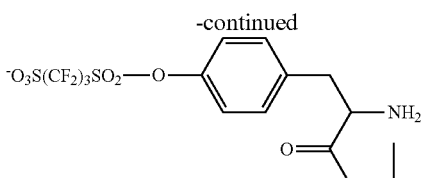
(PA-9)
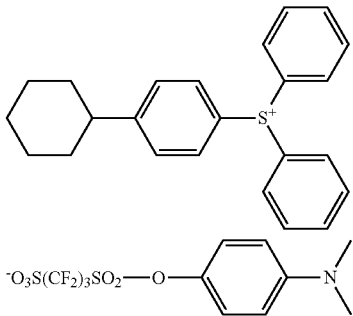
(PA-10)
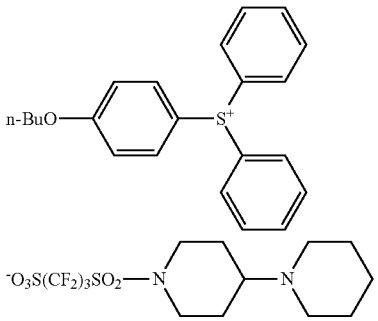
(PA-11)
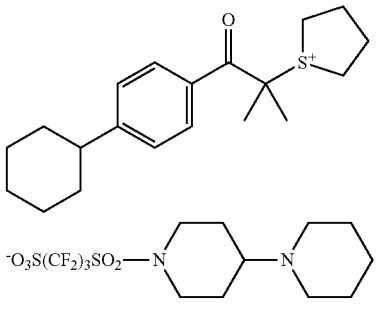
(PA-12)
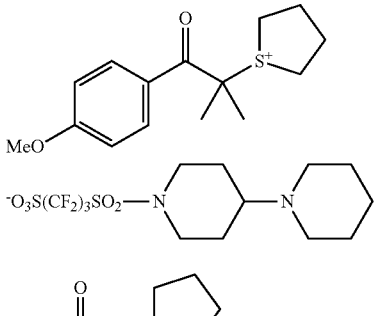
(PA-13)
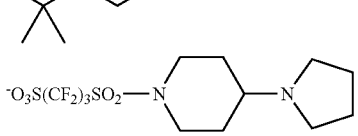

-continued
(PA-14)
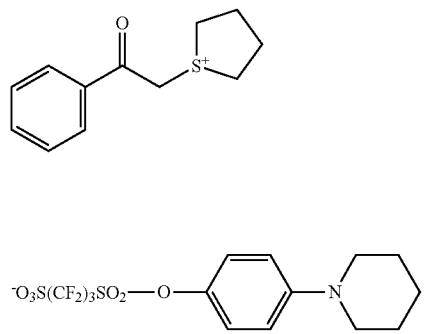
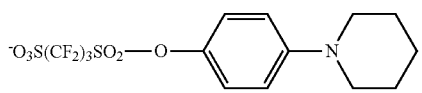
(PA-15)
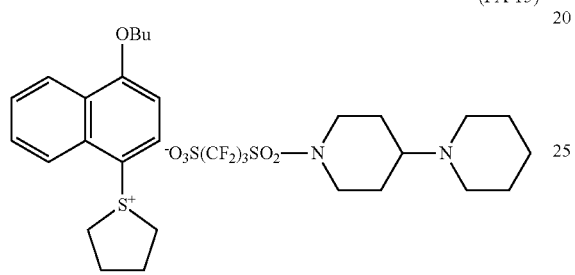
(PA-16)
(PA-17)
(PA-18)
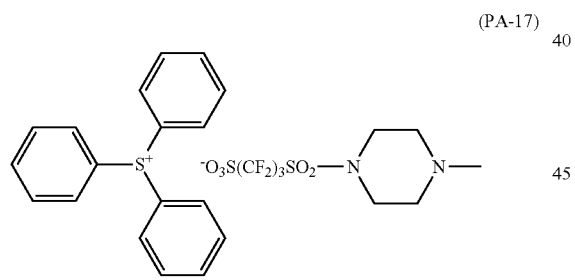
(PA-19)
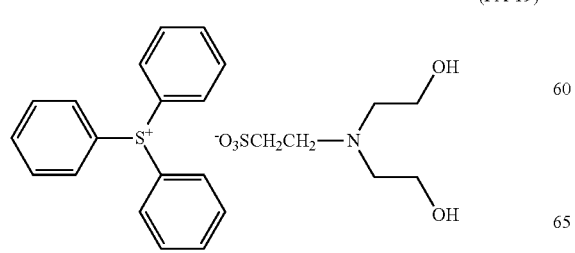
-continued
(PA-20)
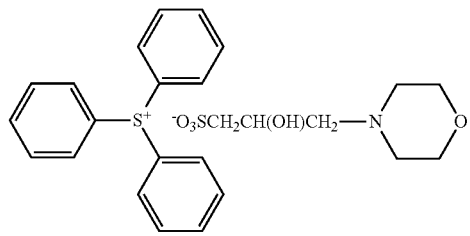
[Chem. 77]
(PA-21)
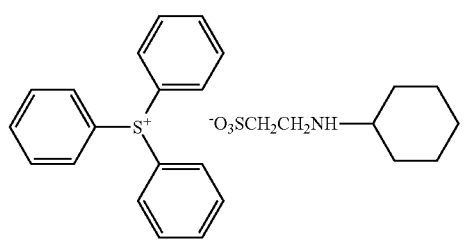
(PA-22)
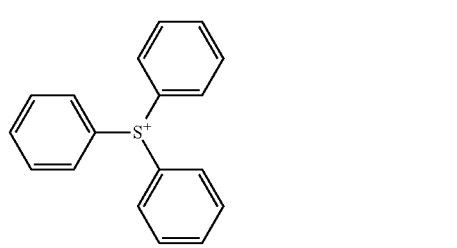
(PA-23)
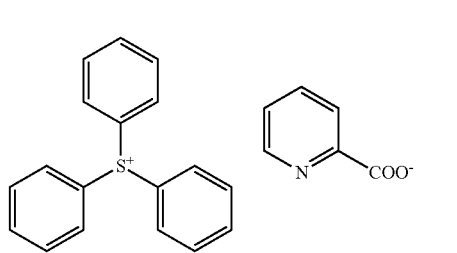
(PA-24)
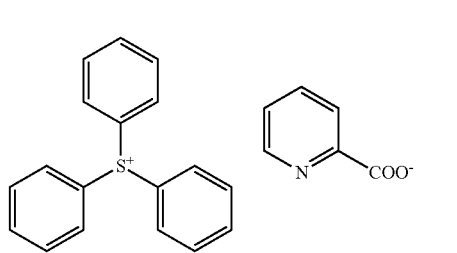

(PA-25)

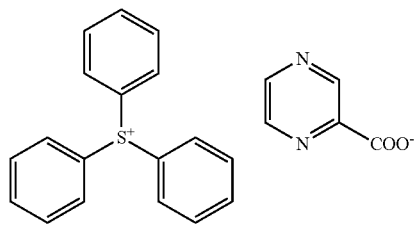

(PA-26)

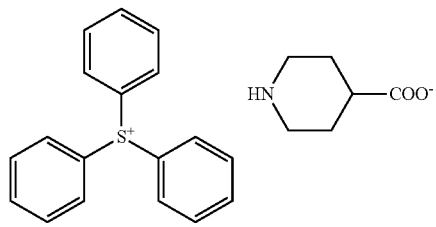

(PA-27)

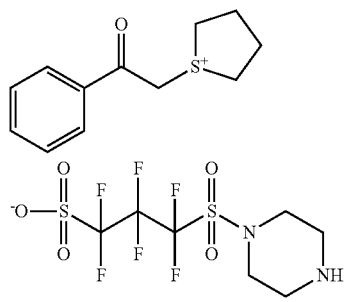

These compounds can be readily synthesized using a salt-exchange method disclosed in JP1999-501909A (JP-H11-501909A) or JP2003-246786A from a compound represented by the general formula (PA-I), or a lithium, a sodium and a potassium salt thereof, and a hydroxide, a bromide, or a chloride of iodonium or sulfonium. In addition, it can be synthesized in accordance with the synthesis methods disclosed in JP1995-333851A (JP-H07-333851A).

Hereinafter, specific examples of the compound (N) which produces a compound represented by the general formula (PA-II) or (PA-III) by irradiation of actinic rays or radiation are shown below, however, the present invention is not limited to these.

[Chem. 78]

(PA-28)

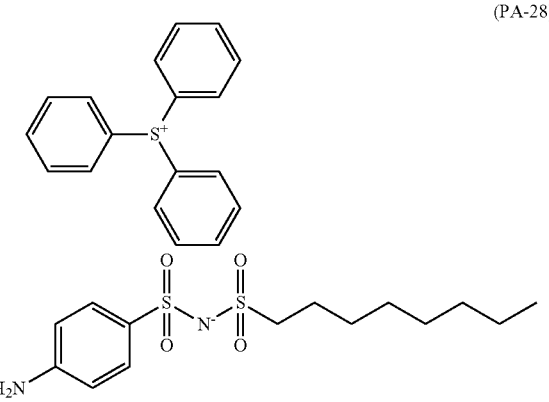

(PA-29)

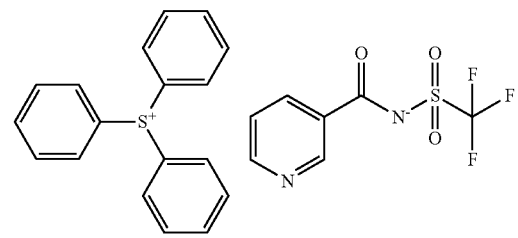

(PA-30)

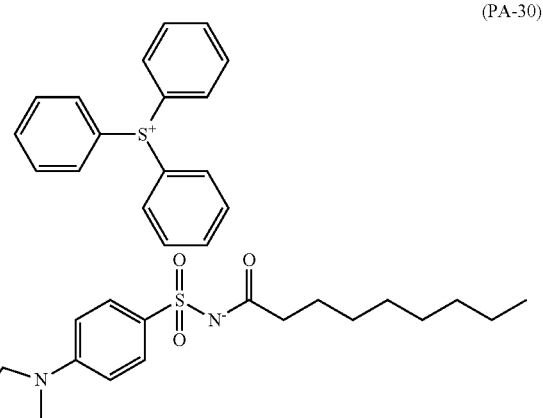

(PA-31)

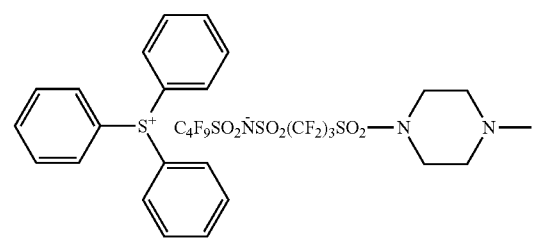

(PA-32)

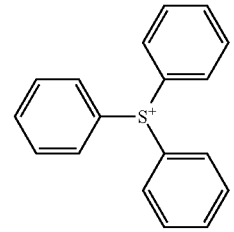
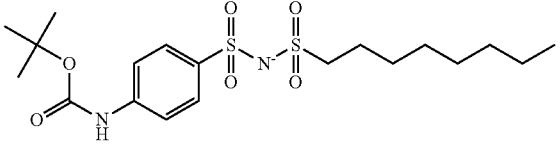

(PA-33)

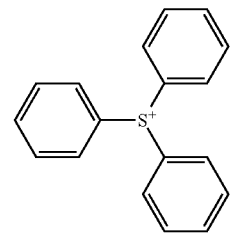
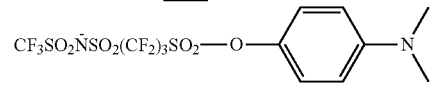

(PA-34)
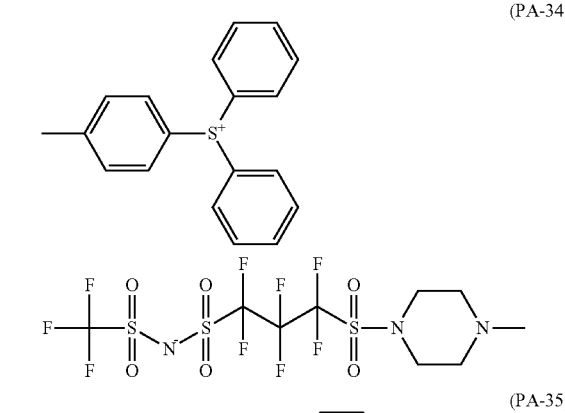
(PA-35)
(PA-39)
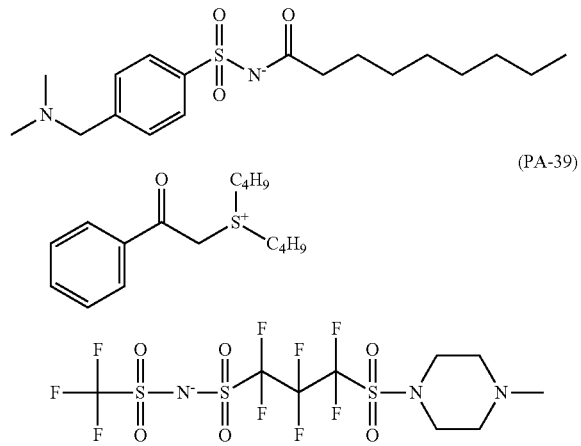
(PA-40)
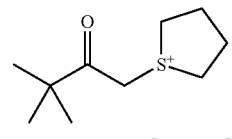
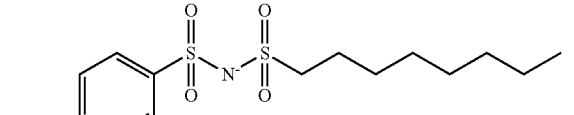
(PA-41)
(PA-36)
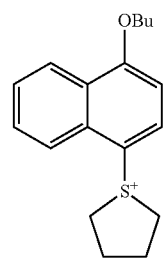
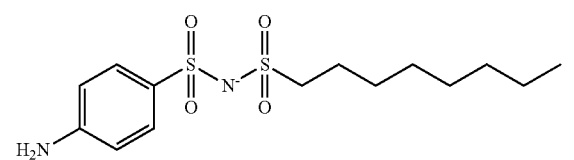
(PA-42)
(PA-37)
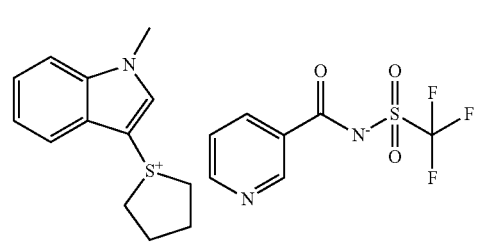
(PA-43)
(PA-38)
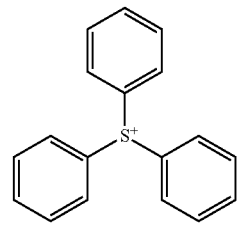

-continued
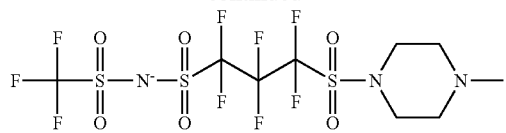
(PA-44)
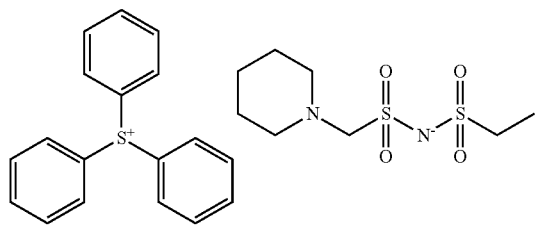
(PA-45)
(PA-46)
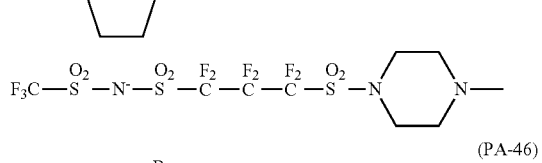
(PA-47)
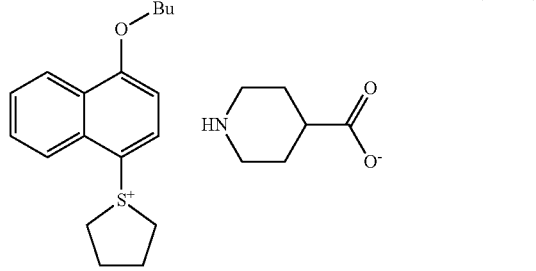
(PA-48)
-continued
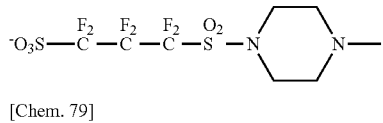
[Chem. 79]
(PA-49)
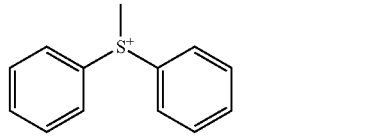
(PA-50)
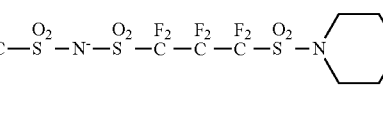
(PA-51)
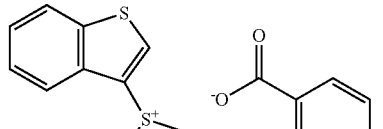
(PA-52)
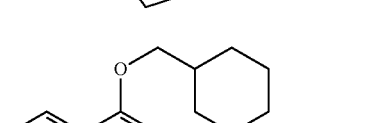
(PA-53)
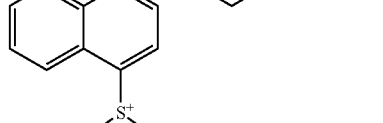

185
-continued
(PA-54)
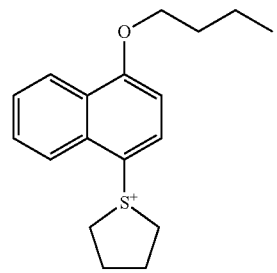
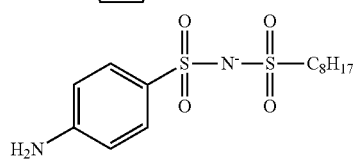
(PA-55)
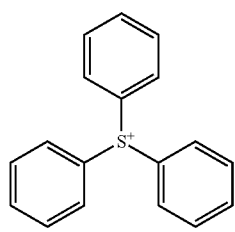
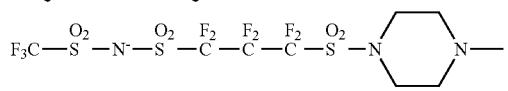
(PA-56)
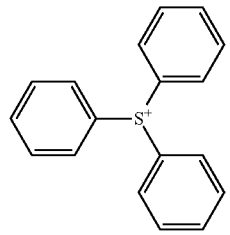
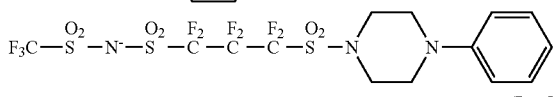
(PA-57)
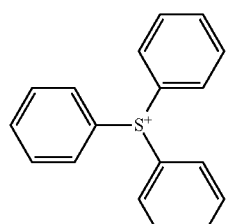
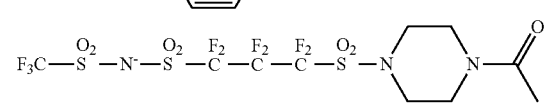
(PA-58)
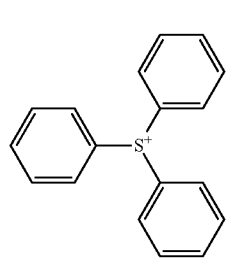
186
-continued
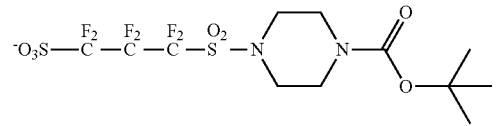
(PA-59)
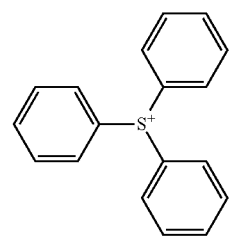
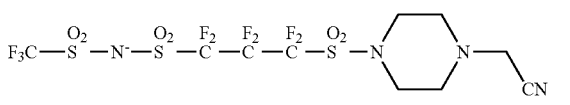
(PA-60)
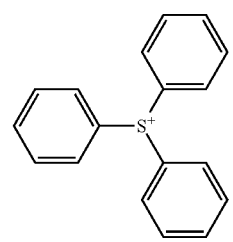
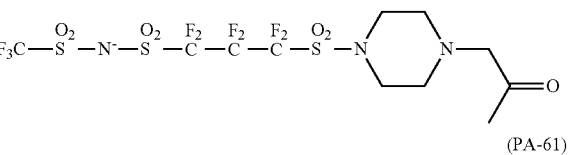
(PA-61)
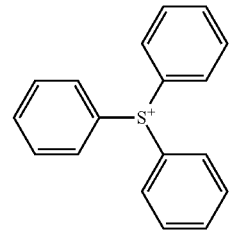
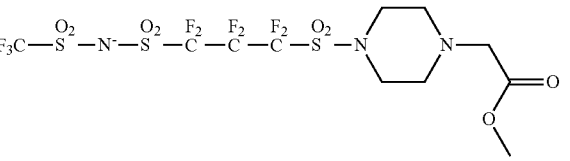
(PA-62)
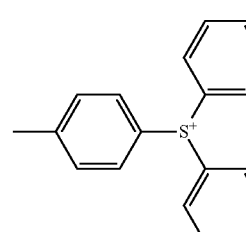
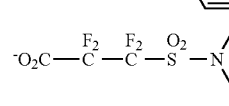

(PA-63)

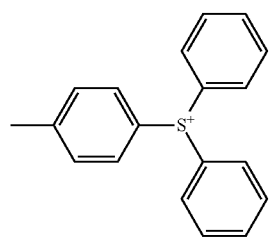

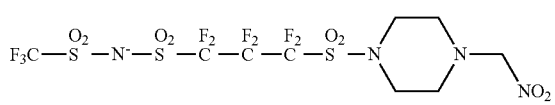

(PA-64)

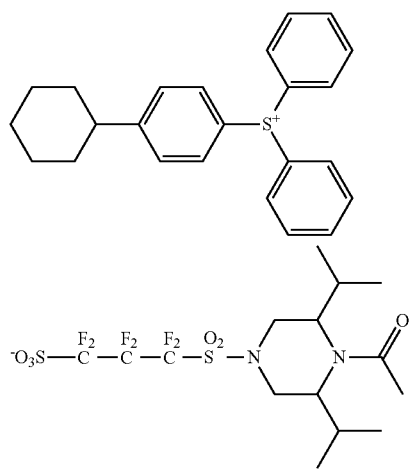

(PA-65)

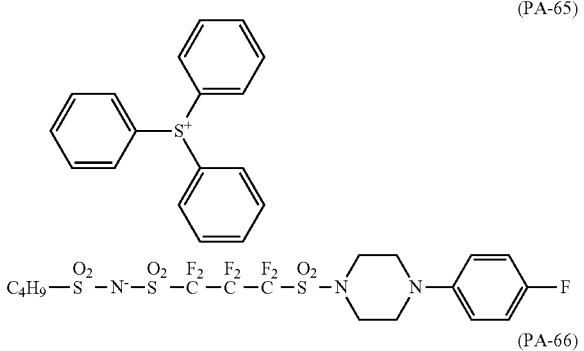

(PA-66)

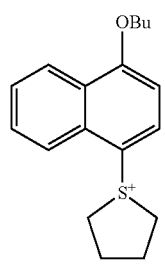

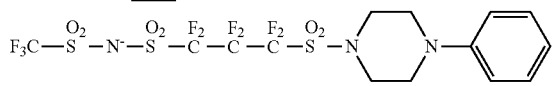

(PA-67)

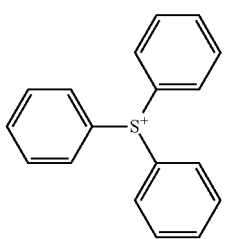

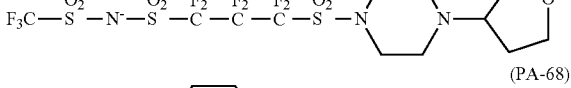

(PA-68)

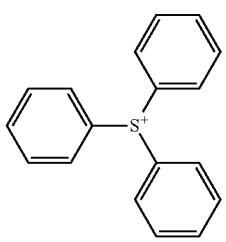

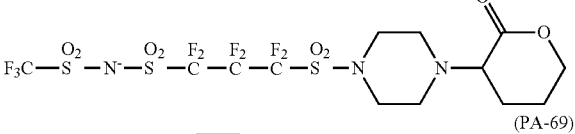

(PA-69)

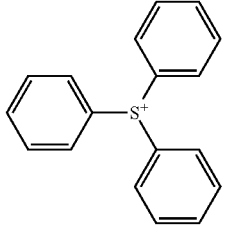

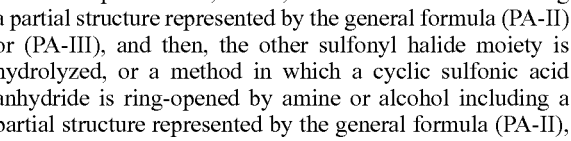

These compounds may be readily synthesized by using a general sulfonic acid esterification reaction or a sulfonamide reaction. For example, a method in which a sulfonamide bond or a sulfonic acid ester bond is formed by selectively reacting one of the sulfonyl halide moiety of a bissulfonyl halide compound with, amine, alcohol or the like including a partial structure represented by the general formula (PA-II) or (PA-III), and then, the other sulfonyl halide moiety is hydrolyzed, or a method in which a cyclic sulfonic acid anhydride is ring-opened by amine or alcohol including a partial structure represented by the general formula (PA-II), may be used. The amine or alcohol including a partial structure represented by the general formula (PA-II) or (PA-III) may be synthesized by reacting amine or alcohol with an anhydride such as $(R'O_2C)_2O$ or $(R'SO_2)_2O$, or an acid chloride compound such as $R'O_2CCl$ or $R'SO_2Cl$ (R' is a methyl group, an n-octyl group, a trifluoromethyl group, or the like) under a basic condition. In particular, these compounds can be synthesized in accordance with the synthesis examples disclosed in JP2006-330098A.

A molecular weight of the compound (N) is preferably 500 to 1,000.

The actinic ray-sensitive or radiation-sensitive resin composition (I) of the present invention may or may not contain the compound (N), however, when the composition contains the compound (N), the content of the compound (N) is preferably 0.1% by mass to 20% by mass and more preferably 0.1% by mass to 10% by mass, based on the total solids of the actinic ray-sensitive or radiation-sensitive resin composition.

[5-2] Basic Compound (N')

The actinic ray-sensitive or radiation-sensitive resin composition (I) of the present invention may contain a basic compound (N') which is different from the above-described compound (N), in order to reduce any change in the performance over time from the exposure to the heating.

Preferred examples of the basic compound (N') include compounds having structures represented by the following formulae (A') to (E').

[Chem. 80]

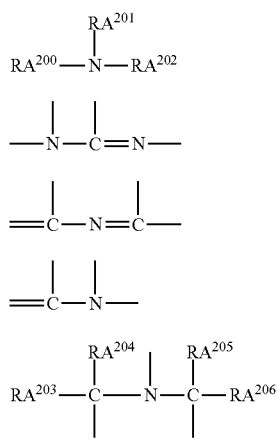

In the general formulae (A') and (E'), $RA^{200}$, $RA^{201}$ and $RA^{202}$ may be the same as or different from each other, represent a hydrogen atom, an alkyl group (preferably 1 to 20 carbon atoms), a cycloalkyl group (preferably 3 to 20 carbon atoms) or an aryl group (preferably 6 to 20 carbon atoms), and $RA^{201}$ and $RA^{202}$ may be bonded to each other to form a $RA^{203}$, $RA^{204}$, $RA^{205}$, and $RA^{206}$ may be the same as or different from each other, and represent an alkyl group (preferably 1 to 20 carbon atoms).

The alkyl group may have a substituent, as the alkyl group having a substituent, an aminoalkyl group having 1 to 20 carbon atoms, a hydroxyalkyl group having 1 to 20 carbon atoms, and a cyanoalkyl group having 1 to 20 carbon atoms are preferred.

The alkyl group in the general formulae (A') and (E') is preferably an unsubstituted alkyl group.

As the preferred examples of the basic compound (N'), guanidine, aminopyrrolidine, pyrazole, pyrazoline, piperazine, amino morpholine, aminoalkyl morpholine, piperidine or the like may be included, and as the more preferable compound, a compound having an imidazole structure, a diazabicyclo structure, an onium hydroxide structure, an onium carboxylate structure, a trialkylamine structure, an aniline structure, or a pyridine structure, an alkylamine derivative having a hydroxyl group and/or an ether bond, an aniline derivative having a hydroxyl group and/or an ether bond, or the like, may be included.

The compound having an imidazole structure may include imidazole, 2,4,5-triphenyl imidazole, benzimidazole, or the like. The compound having a diazabicyclo structure may include 1,4-diazabicyclo[2,2,2]octane, 1,5-diazabicyclo[4,3,0]nona-5-ene, 1,8-diazabicyclo[5,4,0]undeca-7-ene, or the like. The compound having an onium hydroxide structure may include triarylsulfonium hydroxide, phenacylsulfonium hydroxide, sulfonium hydroxide having a 2-oxo alkyl group, specifically, triphenylsulfonium hydroxide, tris(t-butylphenyl)sulfonium hydroxide, bis(t-butylphenyl)iodonium hydroxide, phenacylthiophenium hydroxide, 2-oxopropylthiophenium hydroxide, or the like. A compound having an onium carboxylate structure is a compound in which the anion moiety of a compound having an onium hydroxide structure has been converted to carboxylate, and examples thereof may include acetates, adamantane-1-carboxylates, perfluoroalkylcarboxylates, and the like. The compounds having a trialkylamine structure may include tri(n-butyl)amine, tri(n-octyl)amine, or the like. The compound having an aniline structure may include 2,6-diisopropyl aniline, N,N-dimethyl aniline, N,N-dibutyl aniline, N,N-dihexyl aniline, or the like. The alkylamine derivative having a hydroxyl group and/or an ether bond may include ethanolamine, diethanolamine, triethanolamine, and tris(methoxyethoxyethyl)amine, or the like. The aniline derivative having a hydroxyl group and/or an ether bond may include N,N-bis(hydroxyethyl)aniline, or the like.

Preferred examples of the basic compound may include an amine compound having a phenoxy group, an ammonium salt compound having a phenoxy group, an amine compound having a sulfonic acid ester group, and an ammonium salt compound having a sulfonic acid ester group.

In the amine compound having a phenoxy group, the ammonium salt compound having a phenoxy group, the amine compound having a sulfonic acid ester group, and the ammonium salt compound having a sulfonic acid ester group, at least one alkyl group is preferably bonded to the nitrogen atom. In addition, it is preferable that an oxygen atom be included and an oxyalkylene group be formed in the alkyl chain. The number of oxyalkylene groups is one or more in the molecule, preferably 3 to 9, and more preferably 4 to 6. As the oxyalkylene group, a structure of —CH$_2$CH$_2$O—, —CH(CH$_3$)CH$_2$O—, or —CH$_2$CH$_2$CH$_2$O— is preferable.

Specific examples of the amine compound having a phenoxy group, the ammonium salt compound having a phenoxy group, the amine compound having a sulfonic acid ester group, and the ammonium salt compound having a sulfonic acid ester group include the compounds (C1-1) to (C3-3) exemplified in paragraph 0066 of US2007/0224539A, however, are not limited to these.

Furthermore, as one kind of the basic compound, a nitrogen-containing organic compound having a group which is detached by the action of an acid can also be used. Examples of this compound may include a compound represented by the following the general formula (F). Meanwhile, a compound represented by the following the general formula (F) exhibits effective basicity in the system, when the group that is detached by the action of an acid is detached.

[Chem. 81]

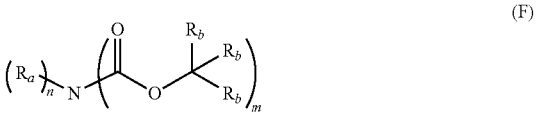

In the general formula (F), $R_a$'s each independently represent a hydrogen atom, an alkyl group, a cycloalkyl group, an aryl group, or an aralkyl group. In addition, when n=2, the two $R_a$'s may be the same as or different from each other, two of $R_a$'s may be bonded to each other and form a divalent heterocyclic hydrocarbon group (preferably 20 or less carbon atoms) or a derivative thereof.

$R_b$'s each independently represent a hydrogen atom, an alkyl group, a cycloalkyl group, an aryl group or an aralkyl group. However, in —C($R_b$)($R_b$)($R_b$), when one or more of $R_b$'s are a hydrogen atom, at least one of the rest $R_b$'s is a cyclopropyl group or a 1-alkoxyalkyl group.

At least two of $R_b$'s may be bonded to each other and form an alicyclic hydrocarbon group, an aromatic hydrocarbon group, a heterocyclic hydrocarbon group, or a derivative thereof.

n represents an integer of 0 to 2, m represents an integer of 1 to 3, respectively, and n+m=3.

In the general formula (F), the alkyl group, the cycloalkyl group, the aryl group and the aralkyl group representing $R_a$ and $R_b$ may be substituted with a functional group such as a hydroxyl group, a cyano group, an amino group, a pyrrolidino group, a piperidino group, a morpholino group or an oxo group, an alkoxy group, or a halogen atom.

Examples of the alkyl group, the cycloalkyl group, the aryl group, and the aralkyl group (these alkyl, cycloalkyl, aryl and aralkyl groups may be substituted with the above-described functional group, an alkoxy group, and a halogen atom) of the above R include a group derived from linear or branched alkane such as methane, ethane, propane, butane, pentane, hexane, heptane, octane, nonane, decane, undecane, and dodecane; a group in which a group derived from the alkane is substituted with one kind or more or one or more of a cycloalkyl group such as a cyclobutyl group, a cyclopentyl group, and a cyclohexyl group; a group derived from cycloalkane such as cyclobutane, cyclopentane, cyclohexane, cycloheptane, cyclooctane, norbornane, adamantane, and noradamantane; a group in which a group derived from the cycloalkane is substituted with one kind or more or one or more of a linear or branched alkyl group such as a methyl group, an ethyl group, an n-propyl group, an i-propyl group, an n-butyl group, a 2-methylpropyl group, a 1-methylpropyl group, and a t-butyl group; a group derived from an aromatic compound such as benzene, naphthalene, and antracene; a group in which a group derived from the aromatic compound is substituted with one kind or more or one or more of a linear or branched alkyl group such as a methyl group, an ethyl group, an n-propyl group, an i-propyl group, an n-butyl group, a 2-methypropyl group, a 1-methypropyl group, and a t-butyl group; a group derived from a heterocyclic compound such as pyrrolidine, piperidine, morpholine, tetrahydrofuran, tetrahydropyran, indole, indoline, quinoline, perhydroquinoline, indazole, and benzimidazole; a group in which a group derived from the heterocyclic compound is substituted with one kind or more or one or more of a group derived from a linear or branched alkyl group or an aromatic compound; a group in which a group derived from a linear or branched alkane and a group derived from cycloalkane are substituted with one kind or more or one or more of a group derived from an aromatic compound such as a phenyl group, a naphthyl group, and an anthracenyl group; and a group in which the substituent is substituted with a functional group such as a hydroxyl group, a cyano group, an amino group, a pyrrolidino group, a morpholino group, or an oxo group.

Further, examples of the divalent heterocyclic hydrocarbon group (preferably having 1 to 20 carbon atoms) formed by mutual linking of the above $R_a$'s and the derivatives thereof include a group derived from a heterocyclic compound such as pyrrolidine, pyperidine, morpholine, 1,4,5,6-tetrahydropyrimidine, 1,2,3,4-tetrahydroquinoline, 1,2,3,6-tetrahydropyridine, homopiperazine, 4-azabenzimidazole, benzotriazole, 5-azabenzotriazole, 1H-1,2,3-triazole, 1,4,7-triazacyclononane, tetrazole, 7-azaindole, indazole, benzimidazole, imidazo[1,2-a]pyridine, (1S,4S)-(+)-2,5-diazabicyclo[2.2.1]heptane, 1,5,7-triazabicyclo[4.4.0]dec-5-ene, indole, indoline, 1,2,3,4-tetrahydroquinoxaline, perhydroquinoline, and 1,5,9-triazacyclododecane; and a group in which a group derived from the heterocyclic compound is substituted with one kind or more or one or more of a functional group such as a group derived from linear or branched alkane, a group derived from cycloalkane, a group derived from an aromatic compound, a group derived from a heterocyclic compound, a hydroxyl group, a cyano group, an amino group, a pirrolidino group, a pyperidino group, a morpholino group, and an oxo group.

Specific examples of the compound represented by the general formula (F) will be shown below.

[Chem. 82]

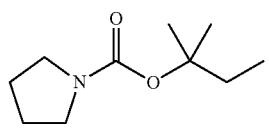

(D-1)

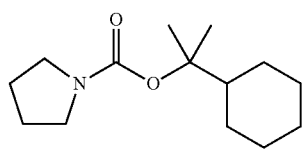

(D-2)

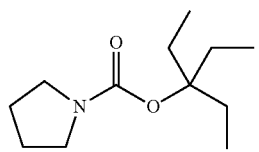

(D-3)

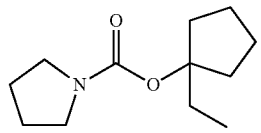

(D-4)

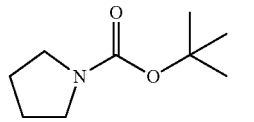

(D-5)

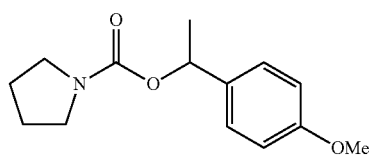

(D-6)

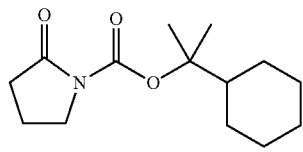

(D-7)

(D-8) 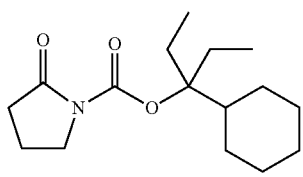
(D-9) 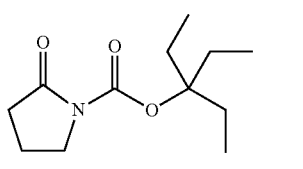
(D-10) 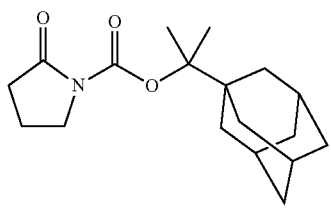
(D-11) 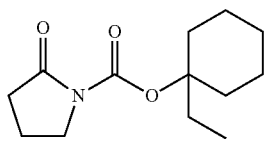
(D-12) 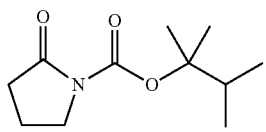
(D-13) 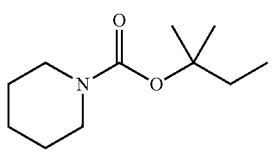
(D-14) 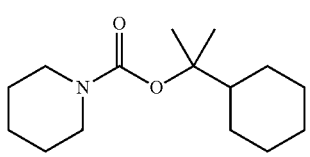
(D-15) 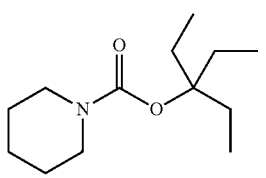
(D-16) 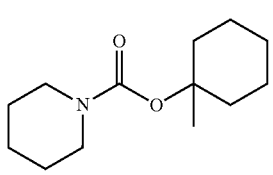
(D-17) 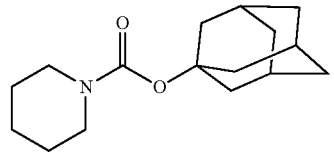
(D-18) 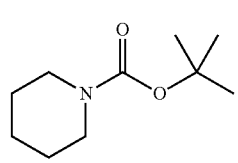
(D-19) 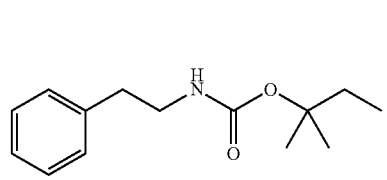
(D-20) 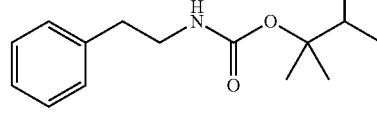
(D-21) 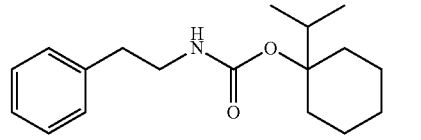
(D-22) 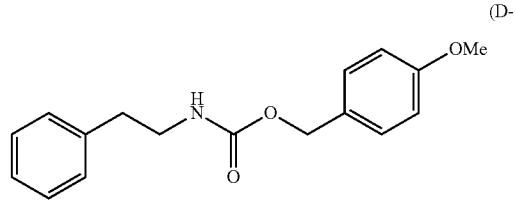
(D-23) 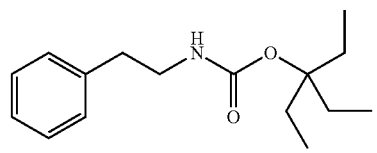
(D-24) 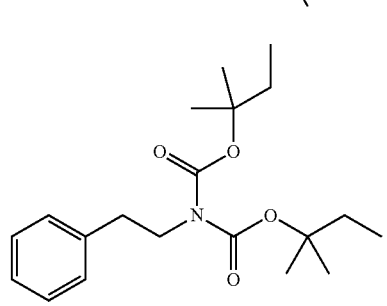

-continued
(D-25)
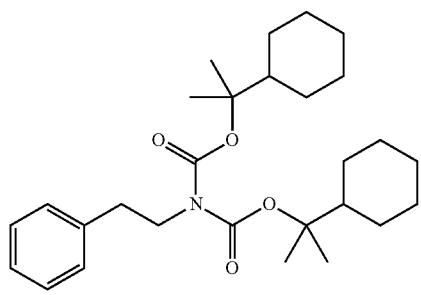
(D-26)
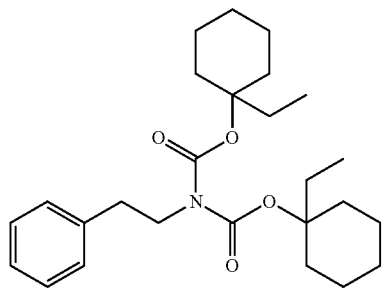
(D-27)
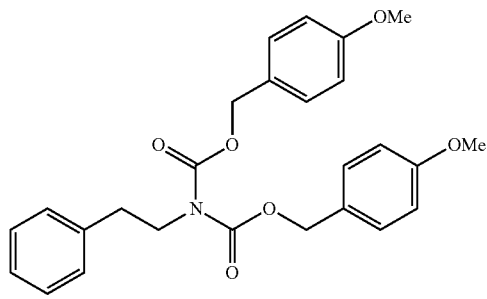
(D-28)
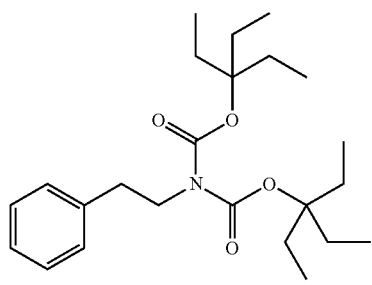
(D-29)
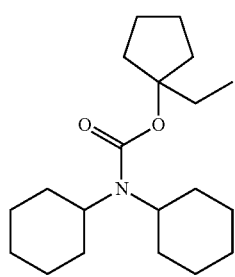
-continued
(D-30)
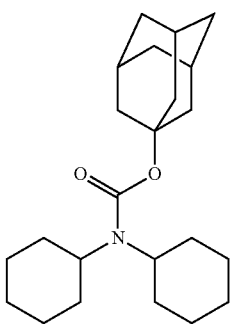
(D-31)
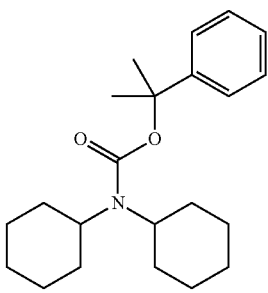
(D-32)
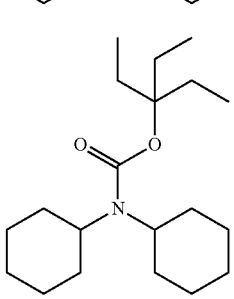
(D-33)
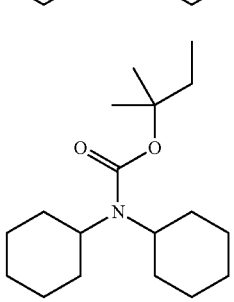
[Chem. 83]
(D-34)
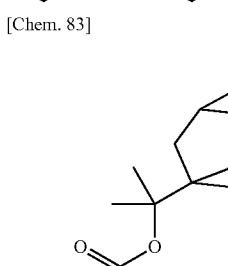

(D-35)
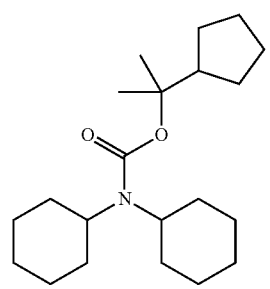
(D-36)
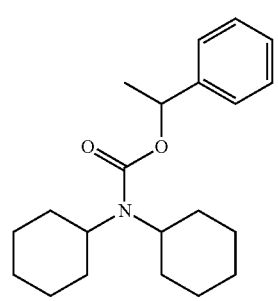
(D-37)
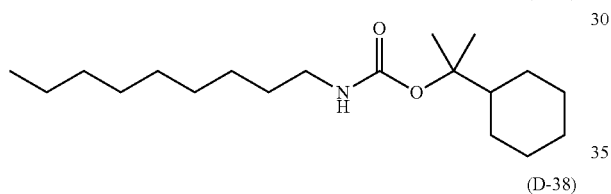
(D-38)
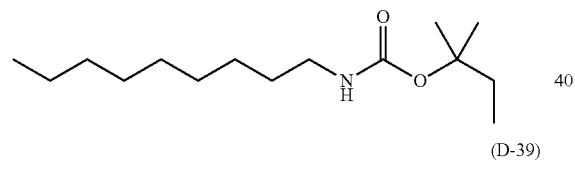
(D-39)
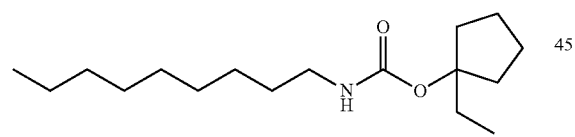
(D-40)
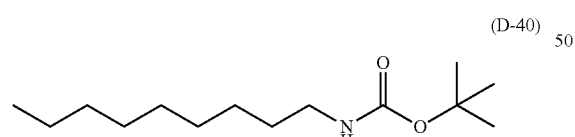
(D-41)
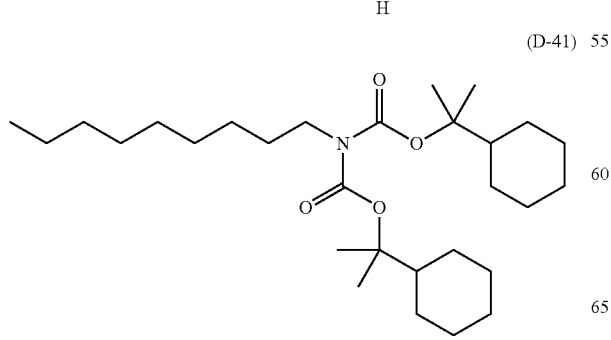
(D-42)
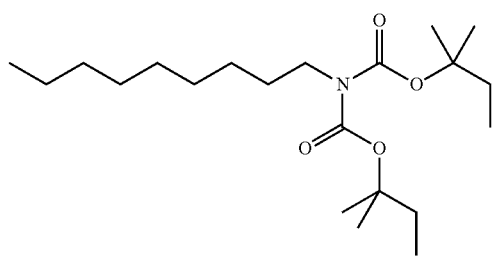
(D-43)
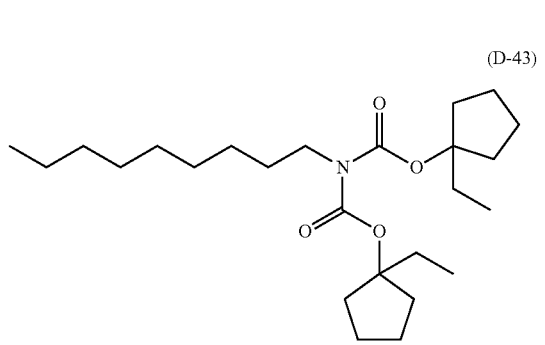
(D-44)
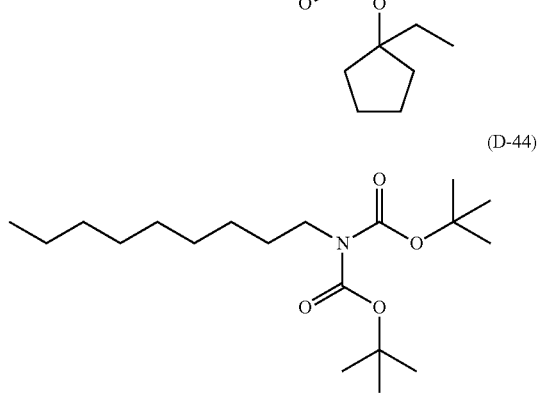
(D-45)
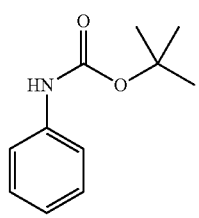
(D-46)
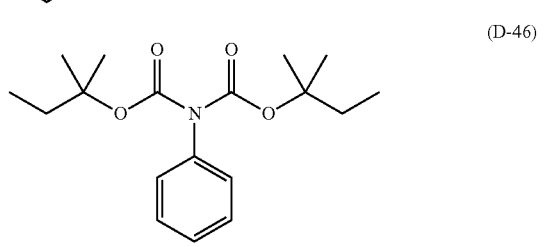
(D-47)
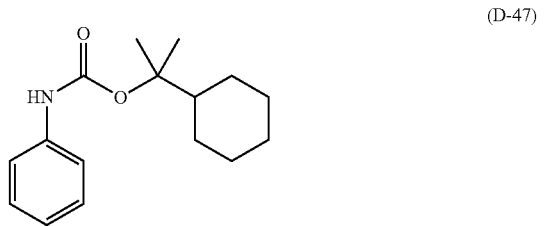

(D-48)
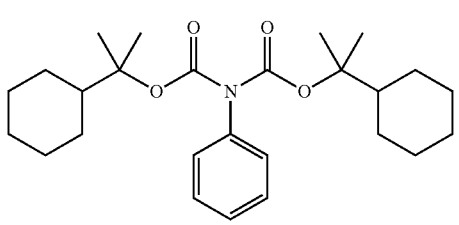

(D-49)
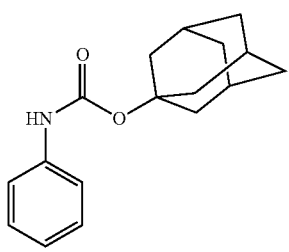

(D-50)
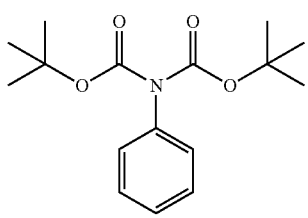

(D-51)
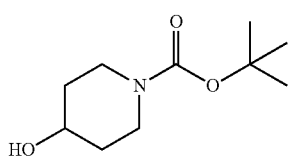

(D-52)
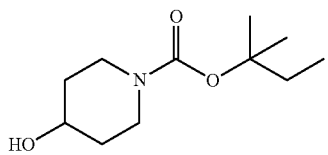

(D-53)
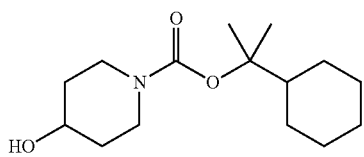

(D-54)
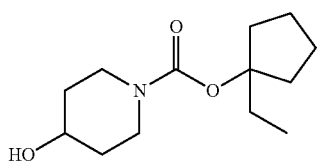

(D-55)
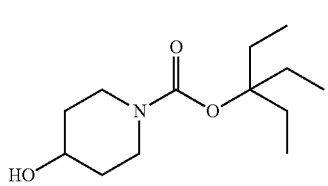

As the compounds represented by the general formula (F) described above, commercially available compounds may be used, or the compounds may be synthesized from commercially available amines using a method described in the Protective Groups in Organic Synthesis, fourth edition, and the like. As the most general method, for example, the compounds may be synthesized in accordance with the method disclosed in JP2009-199021A.

Further, as the basic compound (N'), a compound having an amine oxide structure may be used. Specific examples of the compound include triethylamine pyridine N-oxide, tributylamine N-oxide, triethanolamine N-oxide, tris(methoxyethyl)amine N-oxide, tris(2-(methoxymethoxy)ethyl)amine=oxide, 2,2',2''-nitrilotriethylpropionate N-oxide, and N-2-(2-methoxyethoxy)methoxyethylmorpholine N-oxide, in addition to an amineoxide compound exemplified in JP2008-102383A.

The molecular weight of the basic compound (N') is preferably 250 to 2,000, and even more preferably 400 to 1,000. The molecular weight of the basic compound is preferably is preferably 400 or more, more preferably 500 or more, and even more preferably 600 or more from the viewpoint of further reduction of LWR and local pattern dimension uniformity.

This basic compound (N') may be used in combination with the compound (N) or may be used alone or in combination of two or more kinds thereof.

The actinic ray-sensitive or radiation-sensitive resin composition (I) in the present invention may or may not contain the basic compound (N'), but when the actinic ray-sensitive or radiation-sensitive resin composition (I) contains the basic compound (N'), the used amount of the basic compound (N') is generally 0.001% by mass to 10% by mass, and preferably 0.01% by mass to 5% by mass, based on the solid content of the actinic ray-sensitive or radiation-sensitive resin composition (I).

[6] Surfactant (F)

The actinic ray-sensitive or radiation-sensitive resin composition (I) in the present invention may or may not include a further surfactant, however, when the composition does, may preferably contain any one of fluorine- and/or silicon-based surfactants (fluorine-based surfactants, silicon-based surfactants, surfactants having both a fluorine atom and a silicon atom) or two or more kinds of surfactants.

By the actinic ray-sensitive or radiation-sensitive resin composition (I) in the present invention containing a surfactant, a resist pattern with satisfactory sensitivity and resolution, therefore, less adhesion and developing defects may be obtained when exposure light source of 250 nm or less, particularly 220 nm or less, is used.

The fluorine- and/or silicon-based surfactant may include surfactants disclosed in paragraph 0276 of US2008/0248425A, and may include, for example, F-Top EF301 and EF303 (manufactured by Shin Akita Kasei Co., Ltd.), Fluorad FC430, 431, and 4430 (manufactured by Sumitomo 3M Limited), MEGAFAC F171, F173, F176, F189, F113, F110, F177, F120, and R08 (manufactured by DIC Corporation), Surflon S-382, SC101, 102, 103, 104, 105, 106, and KH-20 (manufactured by Asahi Glass Co., Ltd.), Troysol S-366 (manufactured by Troy Chemical Co., Ltd.), GF-300 and GF-150 (manufactured by Toa Synthetic Chemical Co., Ltd.), Surflon S-393 (manufactured by Seimi Chemical Co., Ltd.), F-top EF121, EF122A, EF122B, RF122C, EF125M, EF135M, EF351, EF352, EF801, EF802, and EF601 (manufactured by Jemco, Inc.), PF636, PF656, PF6320, and PF6520 (manufactured by OMNOVA Solutions Inc.), FTX-204G, 208G, 218G, 230G, 204D, 208D, 212D, 218D, and 222D (manufactured by Neos Co., Ltd.), or the like. In addition, a polysiloxane polymer KP-341 (manufactured by Shin-Etsu Chemical Co., Ltd.) may also be used as the silicon-based surfactant.

In addition, as the surfactant, a surfactant using a polymer having a fluoroaliphatic group derived from a fluoro aliphatic compound prepared by a telomerization method (also referred to as a telomer method) or an oligomerization method (also known as an oligomer method) in addition to those well-known in the art shown above may be used. The fluoro aliphatic compound may be synthesized by methods disclosed in JP2002-90991A.

The surfactant corresponding to the above may include MEGAFAC F178, F-470, F-473, F-475, F-476, F-472 (manufactured by DIC Corporation), a copolymer of acrylate (or methacrylate) having a $C_6F_{13}$ group and (poly(oxyalkylene)) acrylate (or methacrylate), a copolymer of acrylate (or methacrylate) having a $C_3F_7$ group, (poly(oxyethylene)) acrylate (or methacrylate), and (poly(oxypropylene)) acrylate (or methacrylate), or the like.

In addition, in the present invention, other surfactants, besides the fluorine-based and/or silicon-based surfactants, which is disclosed in paragraph 0280 of US2008/0248425A may be used.

These surfactants may be used either alone or as a combination of two or more.

When the actinic ray-sensitive or radiation-sensitive resin composition (I) contains the surfactant, the used amount of the surfactant is preferably 0.0001% by mass to 2% by mass, and more preferably 0.0005% by mass to 1% by mass with regard to total amount of the actinic ray-sensitive or radiation-sensitive resin composition (I) (excluding the solvent).

On the other hand, when the added amount of the surfactant is adjusted to 10 ppm or less based on the total amount (excluding the solvent) of the actinic ray-sensitive or radiation-sensitive resin composition (I), the uneven distribution at the surface of the hydrophobic resin is increased, and thereby the surface of the resist film can be made more hydrophobic. Thus, water followability at the time of liquid immersion exposure can be enhanced.

[7] Other Additives (G)

The actinic ray-sensitive or radiation-sensitive resin composition (I) in the present invention may or may not contain an onium salt carboxylate. The onium salt carboxylate may include those described in paragraphs 0605 and 0606 of US2008/0187860A.

The onium salt carboxylate can be synthesized by reacting sulfonium hydroxide, iodonium hydroxide, ammonium hydroxide and carboxylic acid with silver oxide in an appropriate solvent.

When the actinic ray-sensitive or radiation-sensitive resin composition (I) contains the onium salt carboxylate, the content is generally 0.1% by mass to 20% by mass, preferably 0.5% by mass to 10% by mass, and more preferably 1% by mass to 7% by mass based on total solids of the composition.

The actinic ray-sensitive or radiation-sensitive resin composition (I) in the present invention may further contain, if necessary, a cross-linking agent, a dye, a plasticizer, a light sensitizer, a light absorbent, an alkali-soluble resin, a dissolution inhibitor, a compound promoting solubility in a developer (for example, a phenol compound with a molecular weight of 1,000 or less, an alicyclic compound or aliphatic compound having a carboxyl group), and the like.

The phenol compound with a molecular weight of 1,000 or less may be readily synthesized by those skilled in the art with reference to the method disclosed in, for example, JP1992-122938A (JP-H04-122938A), JP1990-28531A (JP-H02-28531A), U.S. Pat. No. 4,916,210A, EP219294B, and the like.

Specific examples of the alicyclic compound or aliphatic compound having a carboxyl group may include a carboxylic acid derivative having a steroid structure such as a cholic acid, a deoxycholic acid or a lithocholic acid, an adamantane carboxylic acid derivative, an adamantane dicarboxylic acid, a cyclohexane carboxylic acid, a cyclohexane dicarboxylic acid, or the like, however, are not limited to these.

The actinic ray-sensitive or radiation-sensitive resin composition (I) in the present invention is preferably used at a film thickness of 30 to 250 nm, and more preferably used at a film thickness of 30 to 200 nm from the viewpoint of improving resolution. This film thickness is possible by improving coating properties and film formability through setting the solid concentration in the composition being in an appropriate range to have a moderate viscosity.

The solid concentration of the actinic ray-sensitive or radiation-sensitive resin composition (I) in the present invention is generally 1.0% by mass to 10% by mass, preferably 2.0% by mass to 5.7% by mass, and more preferably 2.0% by mass to 5.3% by mass. By having a solid concentration in this range, the resist solution may be uniformly applied on the substrate, and forming a resist pattern with excellent line width roughness is possible. The reason for this is not clear, however, it is believed that, by having the solid concentration at 10% by mass or less and preferably 5.7% by mass or less, aggregation of materials in the resist solution, particularly, the photoacid generator is suppressed and as a result, a uniform resist film may be formed.

The solid concentration is a weight percentage of the weight of other resist components except the solvent with regard to the total weight of the actinic ray-sensitive or radiation-sensitive resin composition (I).

The actinic ray-sensitive or radiation-sensitive resin composition (I) in the present invention is used by the above component being dissolved in a predetermined organic solvent, preferably the mixed solvent described above, filtered by a filter, and then coated on a predetermined support (substrate). The pore size of the filter used in the filtration by a filter is preferably 0.1 μm or less, more preferably 0.05 μm or less, and more preferably 0.03 μm or less made of polytetrafluoroethylene, polyethylene, or nylon. In the filtration by a filter, filtration may be carried out by cyclical filtration or by connecting a plurality of kinds of filters in series or in parallel, as disclosed in JP2002-62667A. In addition, the composition may also be filtered a plurality of times. Furthermore, a degassing treatment, or the like, may be carried out on the composition before and after filtration.

<Actinic Ray-Sensitive or Radiation-Sensitive Resin Composition (II)>

Next, the actinic ray-sensitive or radiation-sensitive resin composition (II) used in the pattern forming method of the present invention will be described.

The actinic ray-sensitive or radiation-sensitive resin composition (II) contains the resin of which solubility in the developing liquid containing an organic solvent decreases due to the polarity increased by the action of an acid. Examples of the resin may include the same resin of which solubility in the developer containing an organic solvent decreases due to the polarity increased by the action of an acid, described in the actinic ray-sensitive or radiation-sensitive resin composition (I), and the preferable range of the content of the resin to the total amount of the composition (II) is the same as those described for the actinic ray-sensitive or radiation-sensitive resin composition (I).

Further, the actinic ray-sensitive or radiation-sensitive resin composition (II) may contain the same respective components that may be contained in the actinic ray-sensitive or radiation-sensitive resin composition (I), and the preferable ranges of the content of the respective components to the total amount of the composition (II) are the same as those described for the actinic ray-sensitive or radiation-sensitive resin composition (I).

The actinic ray-sensitive or radiation-sensitive resin composition (II) is preferably the same as the actinic ray-sensitive or radiation-sensitive resin composition (I), thereby facilitating the pattern formation.

The present invention also relates to a method for producing an electronic device, which includes the method for forming a pattern of the present invention and an electronic device produced by this method.

The electronic device of the present invention is suitably installed in electrical and electronic devices (home appliances, OA and media-related apparatuses, optical apparatuses, communication apparatuses, and the like).

EXAMPLES

Synthesis Example

Synthesis of Resin A-1

102.3 parts by mass of cyclohexanone was heated at 80° C. under a nitrogen gas flow. While the liquid was being stirred, a mixed solution of 22.2 parts by mass of a monomer represented by the below structural formula M-1, 22.8 parts by mass of a monomer represented by the below structural formula M-2, 6.6 parts by mass of a monomer represented by the below structural formula M-3, 189.9 parts by mass of cyclohexanone, 2.40 parts by mass of dimethyl-2,2'-azobis isobutyrate (V-601, manufactured by Wako Pure Industries, Ltd.) was added dropwise to the liquid over 5 hours. After completion of the dropwise addition, the mixture was further stirred for 2 hours at 80° C. Subsequently, the reaction liquid was cooled, reprecipitated with a large amount of hexane or ethyl acetate (mass ratio=9:1), filtered, and then the obtained solid was dried in a vacuum, thereby obtaining 41.1 parts by mass of a resin (A-1) of the present invention.

[Chem. 84]

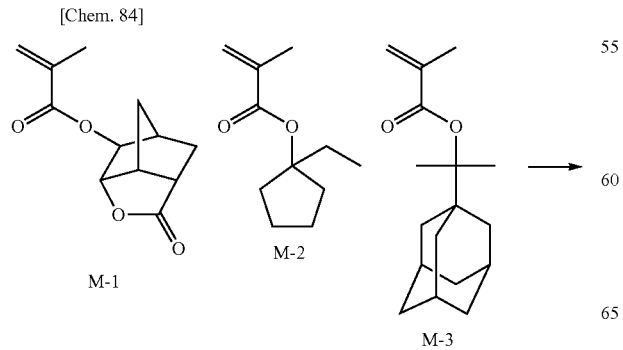

M-1  M-2  M-3

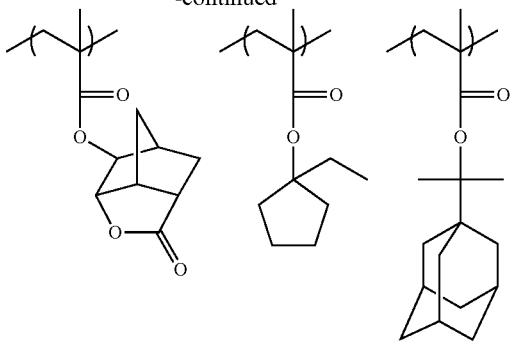

A-1

The weight average molecular weight (Mw: polystyrene conversion) of the obtained resin measured by GPC (carrier: tetrahydrofuran (THF)) was Mw=9,500 and the dispersity was Mw/Mn=1.60. The composition ratios (molar ratios) measured by $^{13}$C-NMR were 40:50:10.

<Resin (A)>

Hereinafter, resins A-2 to A-21 were synthesized in the same way. Moreover, in the resins A-2 to A-21 in addition to the resin A-1, the composition ratios (molar ratios: in order from the left) of each repeating unit, the weight average molecular weight (Mw), and the dispersity (Mw/Mn) are shown below.

[Chem. 85]

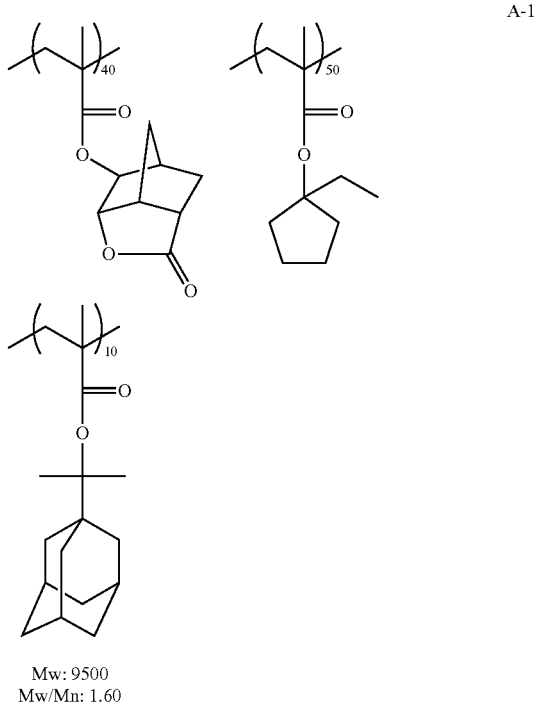

A-1

Mw: 9500
Mw/Mn: 1.60

-continued
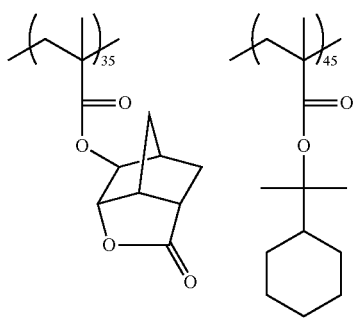
A-2
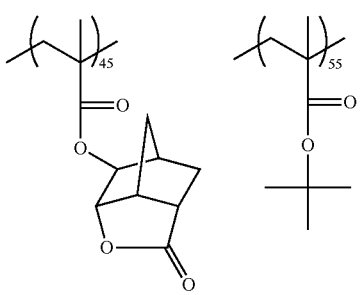
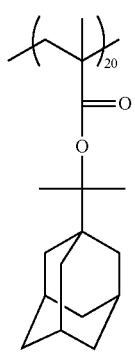
Mw: 16300
Mw/Mn: 1.65
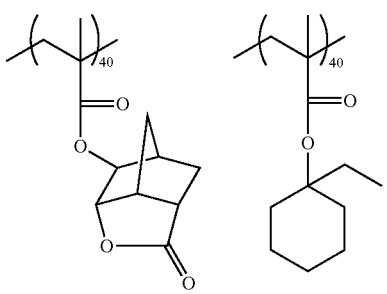
Mw: 18000
Mw/Mn: 1.70
A-4
A-5
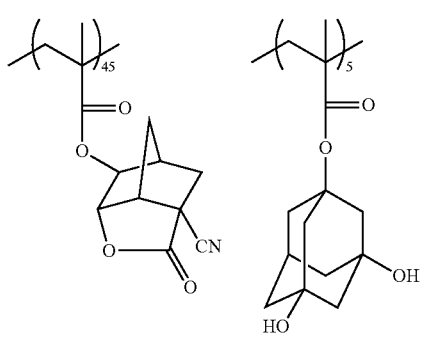
A-3
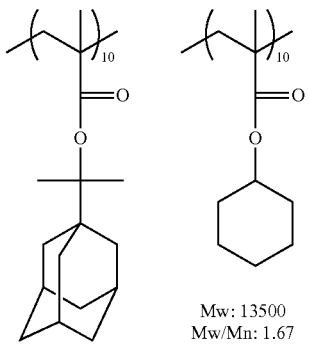
Mw: 13500
Mw/Mn: 1.67
A-6
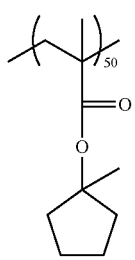
Mw: 11100
Mw/Mn: 1.63
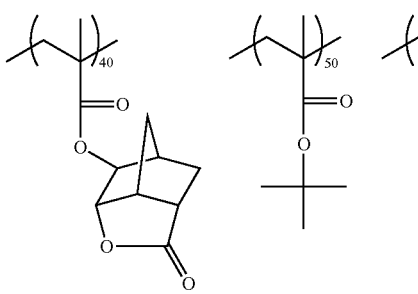
Mw: 15500
Mw/Mn: 1.71

[Chem. 86]
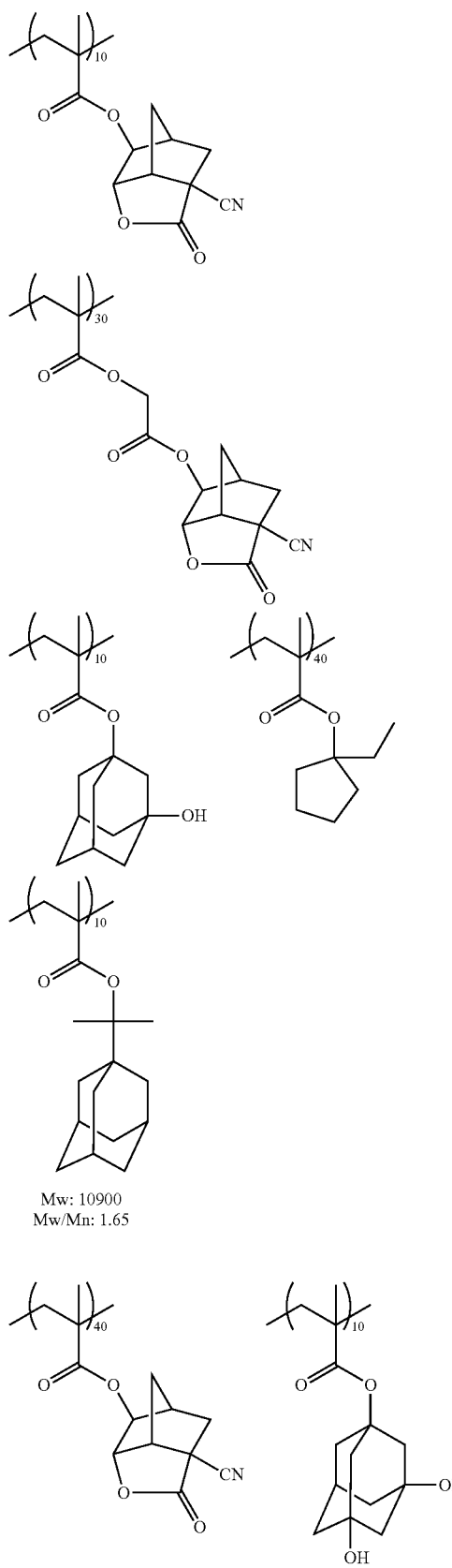
Mw: 10900
Mw/Mn: 1.65
A-7
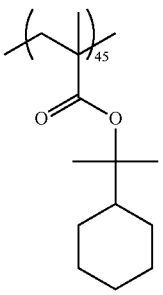 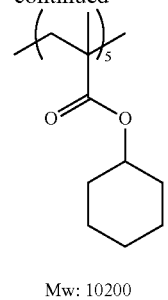
Mw: 10200
Mw/Mn: 1.66
A-8
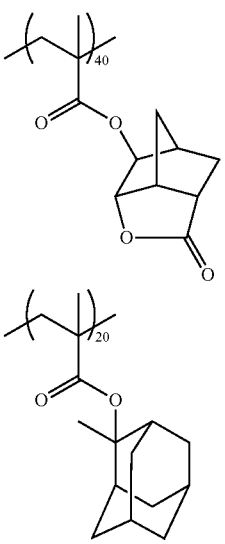 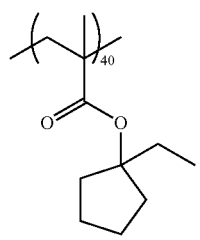
Mw: 10300
Mw/Mn: 1.71
A-9
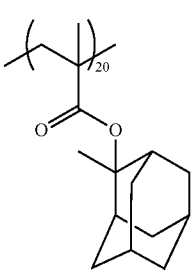
A-10
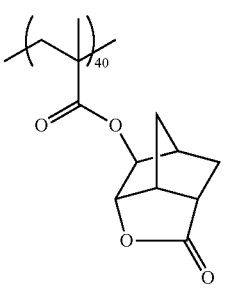 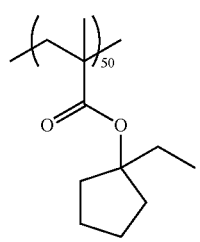
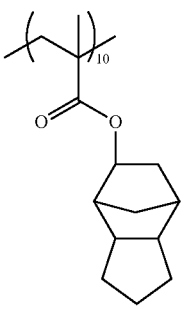
Mw: 9500
Mw/Mn: 1.66

A-11
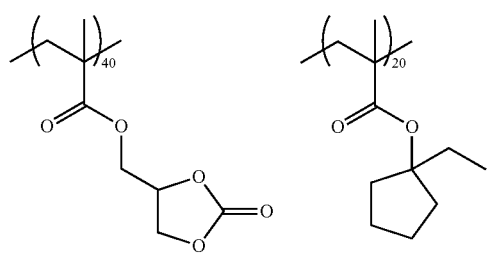
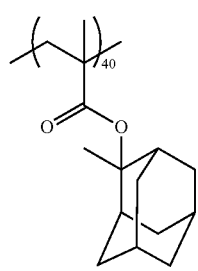
Mw: 7100
Mw/Mn: 1.62
A-12
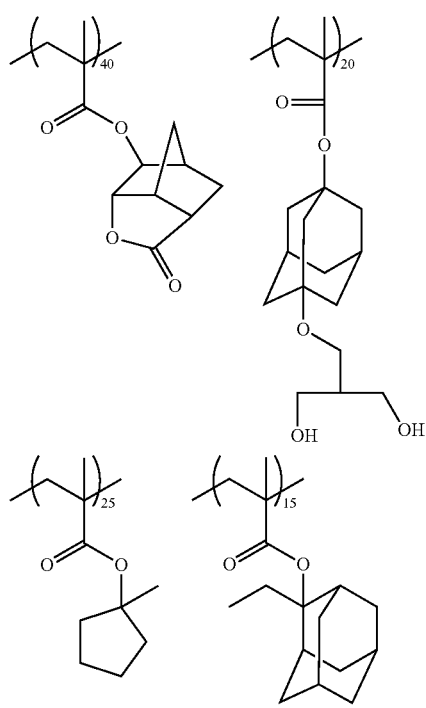
Mw: 6800
Mw/Mn: 1.65
[Chem. 87]
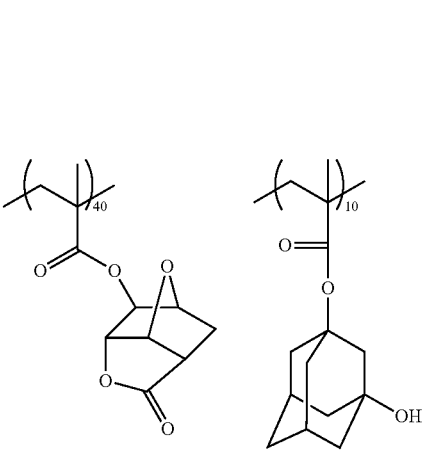
Mw: 10800
Mw/Mn: 1.71
A-13
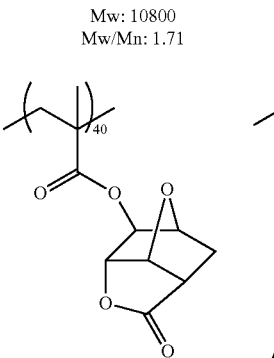
A-14
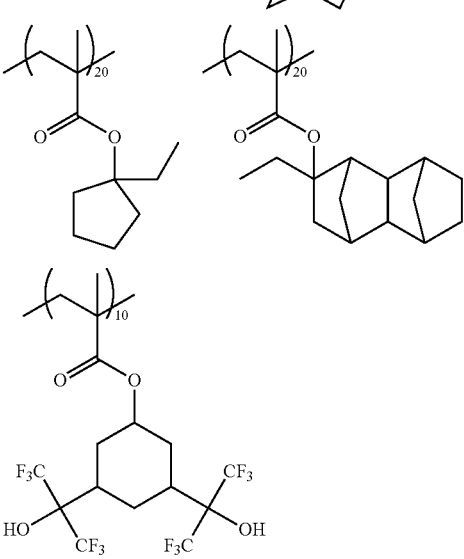
Mw: 9600
Mw/Mn: 1.72

-continued
A-15
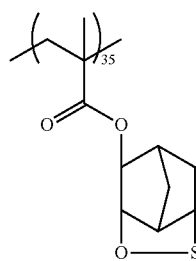
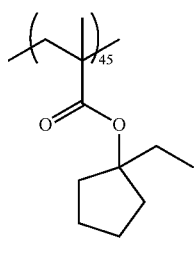
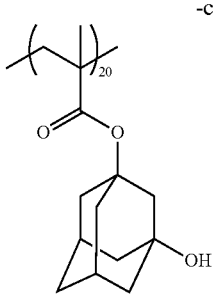
Mw: 11000
Mw/Mn: 1.68
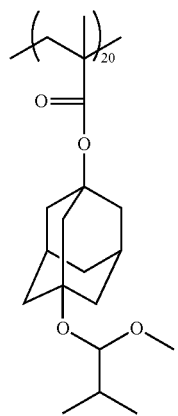
Mw: 10500
Mw/Mn: 1.62
A-18
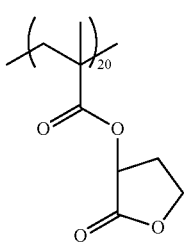
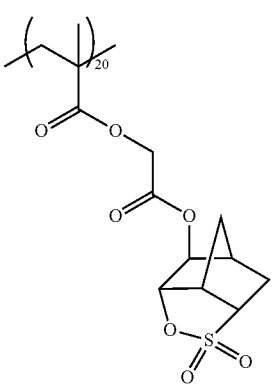
A-16
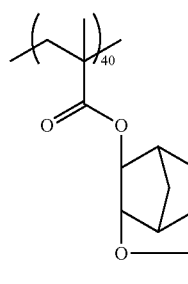
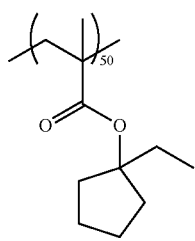
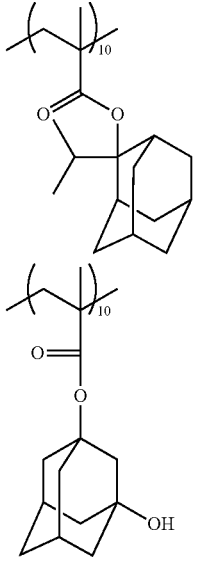
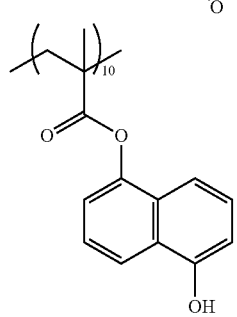
Mw: 11200
Mw/Mn: 1.65
Mw: 8900
Mw/Mn: 1.67
[Chem. 88]
A-17
A-19
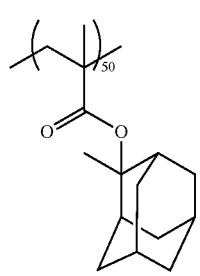
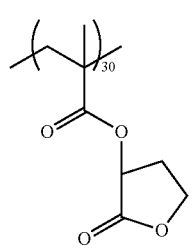
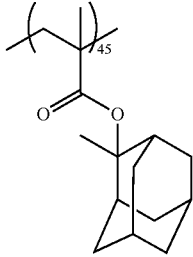
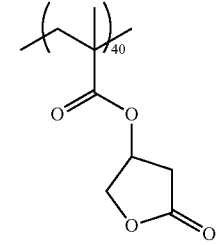

-continued
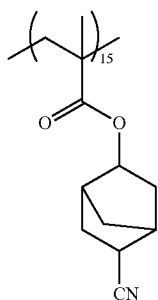
Mw: 9800
Mw/Mn: 1.70
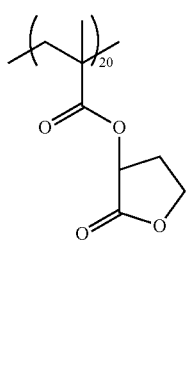
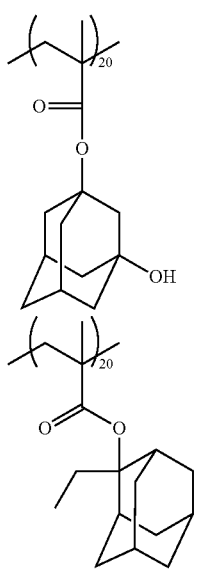
Mw: 9500
Mw/Mn: 1.68
-continued
A-21
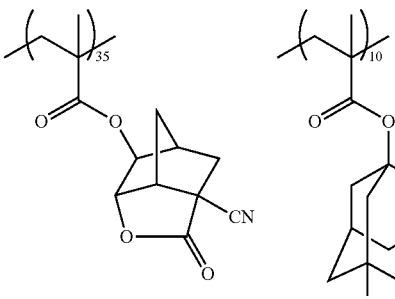
A-20
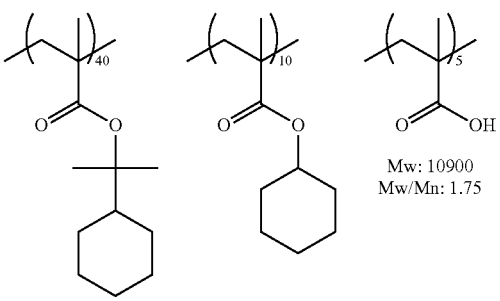
Mw: 10900
Mw/Mn: 1.75
<Hydrophobic Resin>
Hereinafter, resins D-1 to D-13 were synthesized in the same way. The composition ratios (molar ratios: in order from the left) of each repeating unit, the weight average molecular weight (Mw), and the dispersity (Mw/Mn) in the resins D-1 to D-13 are shown below.
[Chem. 89]
D-1
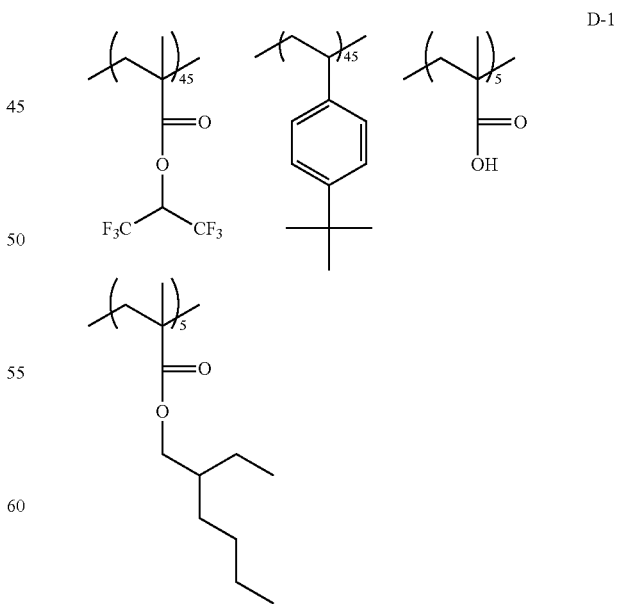
Mw: 7000
Mw/Mn: 1.66

-continued
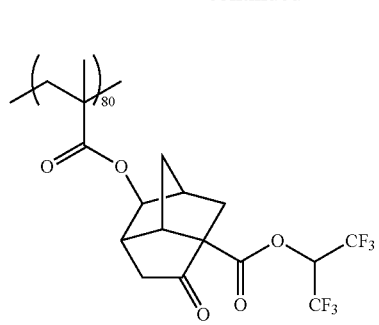 D-2
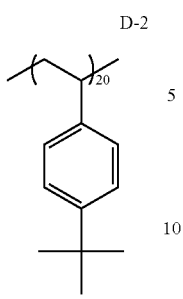
Mw: 12000
Mw/Mn: 1.71
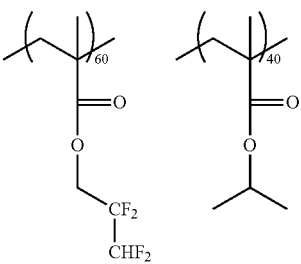 D-3
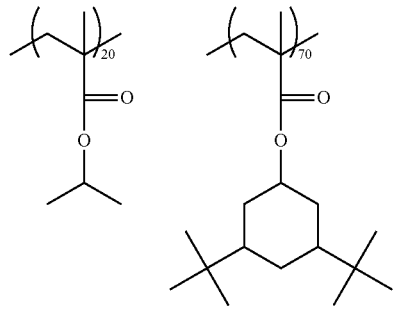
Mw: 8900
Mw/Mn: 1.62
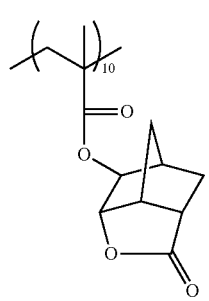 D-4
Mw: 22000
Mw/Mn: 1.67
-continued
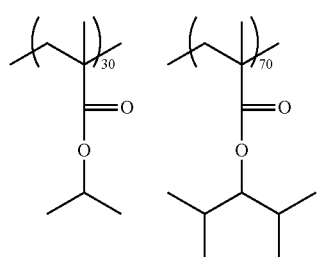 D-5
Mw: 14000
Mw/Mn: 1.61
[Chem. 90]
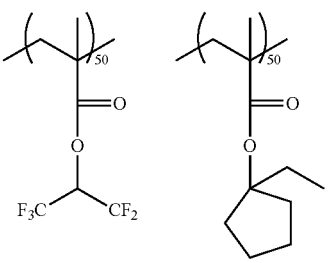 D-6
Mw: 9200
Mw/Mn: 1.60
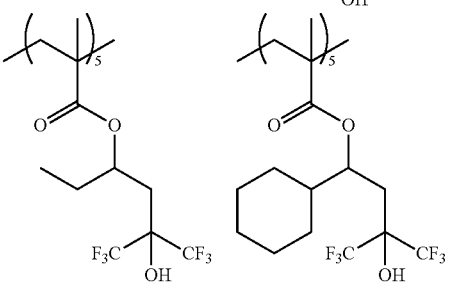 D-7
Mw: 9500
Mw/Mn: 1.72

-continued
D-8
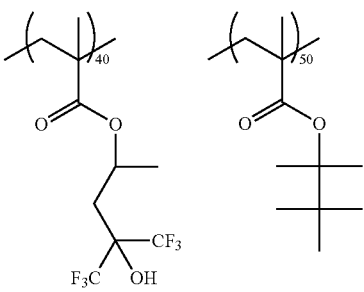
Mw: 9000
Mw/Mn: 1.65
D-12
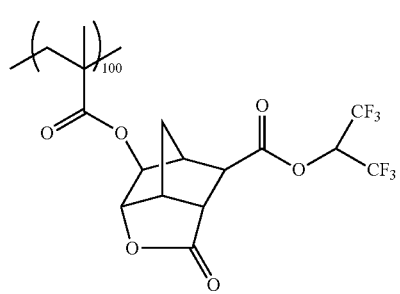
Mw: 12000
Mw/Mn: 1.73
D-13
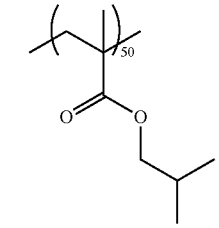 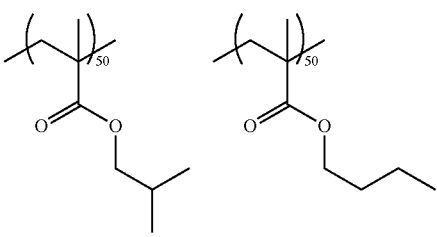
Mw: 13000
Mw/Mn: 1.65
D-9
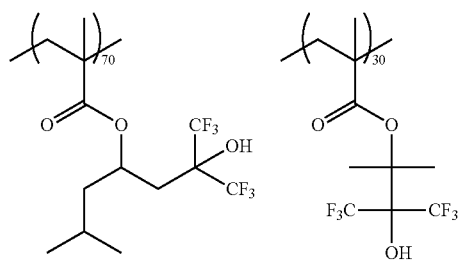
Mw: 9900
Mw/Mn: 1.65
<Acid Generator>
As the acid generator, the following compounds were used.
[Chem. 92]
D-10
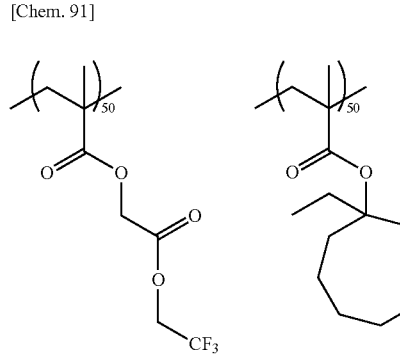
Mw: 10300
Mw/Mn: 1.60
PAG-1
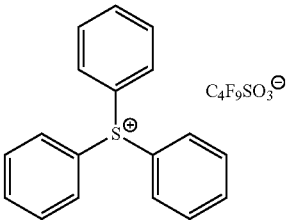
$C_4F_9SO_3^{\ominus}$
[Chem. 91]
PAG-2
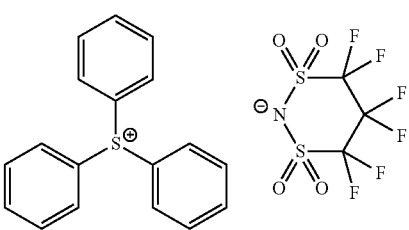
D-11
PAG-3
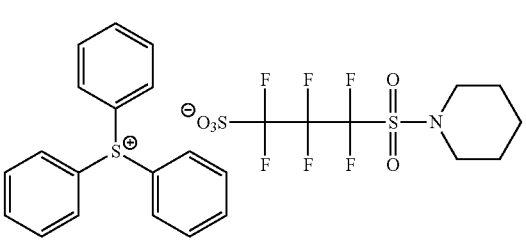
Mw: 11300
Mw/Mn: 1.68

PAG-4
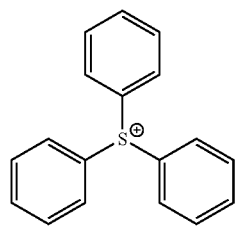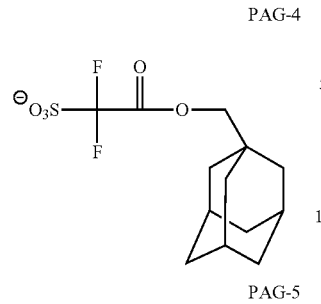
PAG-5
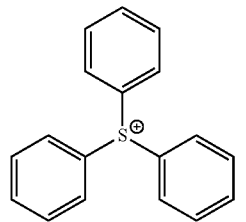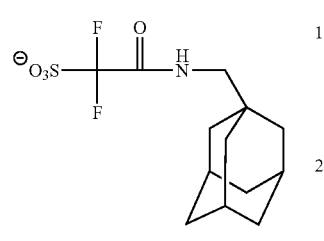
PAG-6
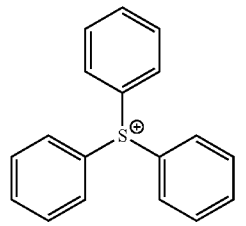
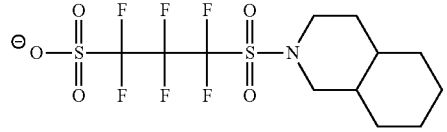
PAG-7
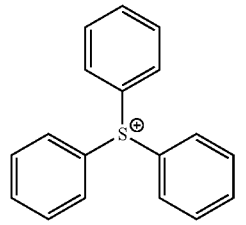
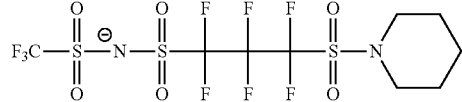
PAG-8
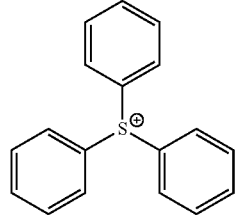
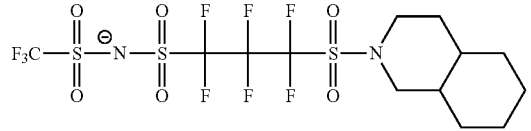
PAG-9
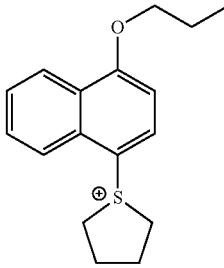
PAG-10
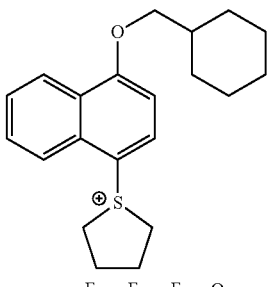
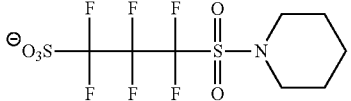
PAG-11
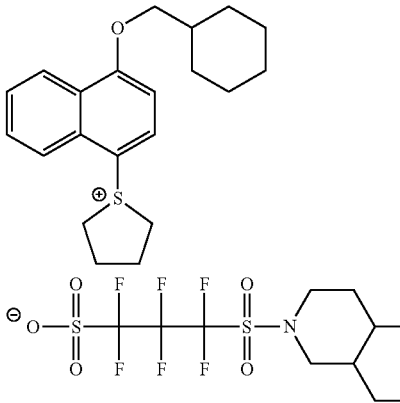
PAG-12
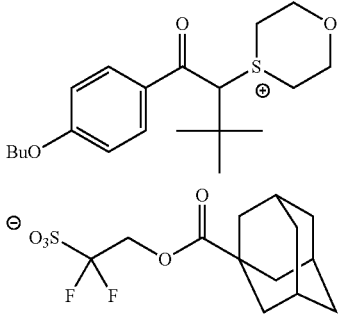
PAG-13
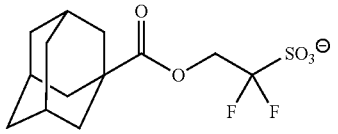

-continued

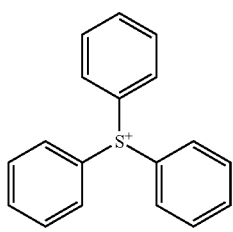

<Basic Compound (N) Decreasing Basicity by Irradiation of Actinic Rays or Radiation and Basic Compound (N')>

As basic compounds decreasing the basicity by irradiation of the actinic ray-sensitive or radiation or as basic compounds, the following compounds were used.

[Chem. 93]

C-1
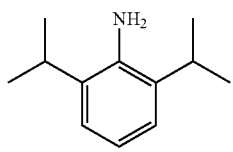

C-2
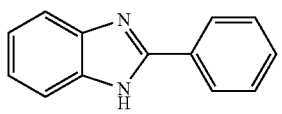

C-3
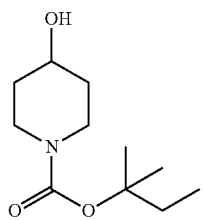

C-4
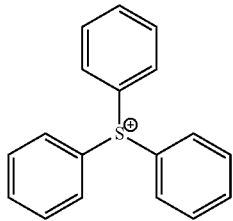

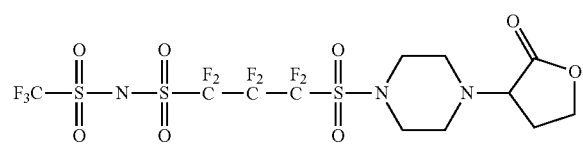

-continued

C-5
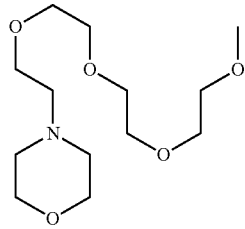

C-6
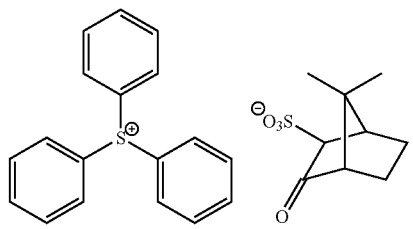

C-7: tri-n-pentylamine
<Surfactant>
The following were used as the surfactant.
W-1: MEGAFAC F176 (manufactured by DIC Corporation; fluorine-based)
W-2: MEGAFAC R08 (manufactured by DIC Corporation; fluorine-based and silicon-based)
W-3: polysiloxane polymer KP-341 (manufactured by Shin-Etsu Chemical Co., Ltd.; silicon-based)
W-4: Troysol S-366 (manufactured by Troy Chemical Co., Ltd.)
W-5: KH-20 (manufactured by Asahi Glass Co., Ltd.)
W-6: PolyFox PF-6320 (manufactured by OMNOVA Solutions Inc.; fluorine-based)
<Solvent>
As the solvents, the followings are used.
SL-1: propylene glycol monomethyl ether acetate (PGMEA)
SL-2: propylene glycol monomethyl ether propionate
SL-3: 2-heptanone
SL-4: ethyl lactate
SL-5: propylene glycol monomethyl ether (PGME)
SL-6: cyclohexanone
SL-7: γ-butyrolactone
SL-8: propylene carbonate Examples 1 to 22 and Comparative Example 1

Pattern Forming Method by First Resist (Preparation for Actinic Ray-Sensitive or Radiation-Sensitive Resin Composition (I))

The components listed in the following Table 1 were dissolved in the solvent listed in the same Table to prepare a solution of which the total solid content was 3.5% by mass, and then filtered by a polyethylene filter having a pore size of 0.03 μm respectively, thereby preparing actinic ray-sensitive or radiation-sensitive resin compositions (resist compositions) (I-1) to (I-22).

TABLE 1

| Composition (I) | Resin (A) | Acid generator (B) | (g) | Compound (N) or compound (N') | (g) | Resin (D) | (g) | Solvent | Mass ratio | Surfactant | (g) |
|---|---|---|---|---|---|---|---|---|---|---|---|
| I-1 | A-1 | PAG-2 | 10 | C-1 | 0.80 | D-1 | 0.14 | SL-1/SL-5 | 80/20 | W-1 | 0.003 |
| I-2 | A-2 | PAG-3 | 10 | C-2 | 0.90 | D-2 | 0.14 | SL-1 | 100 | W-2 | 0.003 |

TABLE 1-continued

| Composition (I) | Resin (A) | (g) | Acid generator (B) | (g) | Compound (N) or compound (N') | (g) | Resin (D) | (g) | Solvent | Mass ratio | Surfactant | (g) |
|---|---|---|---|---|---|---|---|---|---|---|---|---|
| I-3 | A-3 | 10 | PAG-4 | 0.85 | C-3 | 0.14 | D-3 | 4.0 | SL-1/SL-5 | 60/40 | W-3 | 0.003 |
| I-4 | A-4 | 10 | PAG-5 | 0.45 | C-4 | 0.45 | D-4 | 4.0 | SL-1/SL-5 | 80/20 | None | — |
| I-5 | A-5 | 10 | PAG-6 | 0.94 | C-5 | 0.11 | D-5 | 5.0 | SL-1/SL-2 | 90/10 | W-2 | 0.003 |
| I-6 | A-6 | 10 | PAG-7 | 1.10 | C-6 | 0.30 | D-6 | 1.5 | SL-1/SL-5/SL-7 | 92/5/3 | W-1 | 0.003 |
| I-7 | A-7 | 10 | PAG-8 | 1.15 | C-7 | 0.15 | D-7 | 1.1 | SL-5/SL-6 | 30/70 | None | — |
| I-8 | A-8 | 10 | PAG-2/PAG-3 | 0.40/0.40 | C-3 | 0.16 | D-8 | 1.3 | SL-1/SL-7 | 95/5 | W-1 | 0.003 |
| I-9 | A-9 | 10 | PAG-1/PAG-9 | 0.20/1.00 | C-3 | 0.15 | D-9 | 1.4 | SL-1/SL-6/SL-7 | 75/20/5 | W-5 | 0.003 |
| I-10 | A-10 | 10 | PAG-3/PAG-10 | 0.30/1.00 | C-3 | 0.17 | D-10 | 1.0 | SL-1/SL-5 | 60/40 | W-4 | 0.003 |
| I-11 | A-11 | 10 | PAG-6/PAG-11 | 0.15/1.00 | C-3 | 0.14 | D-11 | 1.5 | SL-1/SL-3 | 60/40 | W-1 | 0.003 |
| I-12 | A-12 | 10 | PAG-6/PAG-12 | 0.25/1.00 | C-3 | 0.15 | D-12 | 1.8 | SL-1/SL-5 | 70/30 | W-5 | 0.003 |
| I-13 | A-13 | 10 | PAG-3 | 0.50 | C-3/C-4 | 0.06/0.25 | D-13 | 2.0 | SL-1/SL-5 | 70/30 | W-1 | 0.001 |
| I-14 | A-14 | 10 | PAG-4 | 0.78 | C-2 | 0.13 | D-1 | 1.0 | SL-1/SL-8 | 95/5 | None | — |
| I-15 | A-15 | 10 | PAG-5 | 1.20 | C-2 | 0.15 | D-2 | 1.5 | SL-1 | 100 | W-1 | 0.003 |
| I-16 | A-16 | 10 | PAG-6 | 1.50 | C-2 | 0.17 | D-3 | 2.0 | SL-1/SL-5 | 70/30 | W-6 | 0.003 |
| I-17 | A-17 | 10 | PAG-7 | 1.10 | C-2 | 0.14 | D-4 | 2.0 | SL-1/SL-4 | 80/20 | W-1 | 0.003 |
| I-18 | A-18 | 10 | PAG-13 | 0.88 | C-2 | 0.16 | D-5 | 2.0 | SL-1/SL-5 | 60/40 | None | — |
| I-19 | A-19 | 10 | PAG-3 | 0.90 | C-2 | 0.15 | D-6 | 1.0 | SL-1 | 100 | W-3 | 0.003 |
| I-20 | A-20 | 10 | PAG-4 | 0.85 | C-2 | 0.13 | D-7 | 2.0 | SL-1/SL-5 | 60/40 | W-1 | 0.003 |
| I-21 | A-21 | 10 | PAG-4 | 1.15 | C-2 | 0.01 | D-1 | 0.1 | SL-1/SL-5 | 60/40 | W-6 | 0.030 |
| I-22 | A-1/A-2 | 5/5 | PAG-5 | 0.90 | C-2 | 0.14 | D-8 | 2.0 | SL-1/SL-5 | 70/30 | W-4 | 0.003 |

(Formation of Resist Film (First Film))

A silicon wafer was coated with ARC29SR (manufactured by Nissan Chemical Industries, Ltd.) for forming an organic antireflection film, baked at 205° C. for 60 seconds, and then an antireflection film having a film thickness of 95 nm is formed. Subsequently, the actinic ray-sensitive or radiation-sensitive resin compositions (I-1) to (I-22) were coated thereon, and the resultant was baked (first heating, PAB1) at the temperature listed in Table 2 over 60 seconds, thereby forming a resist film (first film) of which a film thickness was 90 nm.

However, the film thickness of the first film in the Comparative Example 1 was set to 100 nm which was the same as that of JP2009-282224A.

(Formation of First Resist Pattern)

An ArF excimer laser liquid immersion scanner (XT1700i, manufactured by ASML Holding N.V., NA: 1.20, sigma: 0.50, Y deflection) was used to carry out pattern exposure (first exposure) of the first film through a halftone mask. Ultra-pure water was used as the liquid for liquid immersion. Next, the second heating (PEB1) listed in Table 2 was carried out for 60 seconds. Subsequently, the resultant was developed under the developing condition listed in Table 2, and rinsed with the rinsing solution listed in Table 2 (however, in the examples with no description of the rinsing solution in the "process of forming pattern" of Table 2, the rinsing process was not carried out), thereby obtaining a pattern. Subsequent to the development, the resultant was baked (third heating: corresponding to the process (d)) at the temperature listed in Table 2 for 60 seconds.

<Pattern Forming Method by Second Resist>

(Preparation of Actinic Ray-Sensitive or Radiation-Sensitive Resin Composition (II))

An actinic ray-sensitive or radiation-sensitive resin composition (II) was used by selecting from the actinic ray-sensitive or radiation-sensitive resin composition (I).

(Formation of Resist Film (Second Film))

The substrate on which the first resist pattern was formed was coated with the actinic ray-sensitive or radiation-sensitive resin compositions (II) listed in Table 2, and the baked (fourth heating, PAB2) at the temperature listed in Table 2 over 60 seconds, thereby forming a resist film (second film) with a film thickness of 90 nm.

However, the film thickness of the second film in the Comparative Example 1 was set to 120 nm which was the same as that of JP2009-282224A.

(Formation of Second Resist Pattern)

The ArF excimer laser liquid immersion scanner (XT1700i, manufactured by ASML Holding N.V., NA: 1.20, sigma: 0.50, Y deflection) was used to carry out pattern exposure (second exposure) of the second film through the halftone mask. Subsequently, the mask position of the second exposure was set and exposed such that the line center of the second resist pattern was adjusted to be positioned in the space center of the first resist pattern. Further, the exposure amount of the second exposure was equivalent to the exposure amount of the first exposure. Ultra-pure water was used as the liquid for liquid immersion. Next, the fifth heating (PEB2) listed in Table 2 was carried out for 60 seconds. Subsequently, the resultant was developed under the developing condition listed in Table 2, and rinsed with the rinsing solution listed in Table 2 (however, in the examples with no description of the rinsing solution in the "process of forming pattern" of Table 2, the rinsing process was not carried out), thereby obtaining a pattern. Subsequent to the development, the resultant was baked (sixth heating) at 240° C. for 60 seconds (however, in Comparative Example 1, the sixth heating was not carried out).

TABLE 2

Process of forming first resist pattern

| Example | Composition (I) | First heating (PAB 1) (° C.) | Second heating (PEB 1) (° C.) | Developer | Mass ratio | Rinse solution | Mass ratio | Third heating (° C.) |
| --- | --- | --- | --- | --- | --- | --- | --- | --- |
| Example 1 | I-1 | 100 | 105 | SG-1 | 100 | SR-1 | 100 | 200 |
| Example 2 | I-2 | 100 | 105 | SG-1/SG-5 | 95/5 | SR-1 | 100 | 240 |
| Example 3 | I-3 | 100 | 105 | SG-1 | 100 | SR-1 | 100 | 240 |
| Example 4 | I-4 | 100 | 105 | SG-1 | 100 | SR-1 | 100 | 240 |
| Example 5 | I-5 | 100 | 105 | SG-1 | 100 | SR-1 | 100 | 240 |
| Example 6 | I-6 | 100 | 105 | SG-1 | 100 | SR-1 | 100 | 240 |
| Example 7 | I-7 | 100 | 105 | SG-1/SG-4 | 50/50 | SR-1/SR-4 | 90/10 | 240 |
| Example 8 | I-8 | 100 | 105 | SG-1 | 100 | SR-1 | 100 | 240 |
| Example 9 | I-9 | 100 | 105 | SG-1 | 100 | SR-1 | 100 | 240 |
| Example 10 | I-10 | 100 | 105 | SG-1 | 100 | SR-2 | 100 | 240 |
| Example 11 | I-11 | 100 | 105 | SG-1 | 100 | SR-1 | 100 | 240 |
| Example 12 | I-12 | 100 | 105 | SG-1/SG-3 | 90/10 | SR-1 | 100 | 240 |
| Example 13 | I-13 | 100 | 105 | SG-1 | 100 | SR-1/SR-5 | 90/10 | 240 |
| Example 14 | I-14 | 100 | 105 | SG-1 | 100 | SR-1 | 100 | 240 |
| Example 15 | I-15 | 100 | 105 | SG-1 | 100 | SR-1 | 100 | 240 |
| Example 16 | I-16 | 100 | 105 | SG-2 | 100 | SR-1/SR-3 | 90/10 | 240 |
| Example 17 | I-17 | 100 | 105 | SG-1 | 100 | — | — | 240 |
| Example 18 | I-18 | 100 | 105 | SG-1 | 100 | SR-1 | 100 | 240 |
| Example 19 | I-19 | 100 | 105 | SG-1/SG-5 | 95/5 | SR-1 | 100 | 240 |
| Example 20 | I-20 | 100 | 105 | SG-1 | 100 | SR-1 | 100 | 240 |
| Example 21 | I-21 | 100 | 105 | SG-1 | 100 | SR-1 | 100 | 240 |
| Example 22 | I-22 | 100 | 105 | SG-1 | 100 | SR-1 | 100 | 240 |
| Comparative Example 1 | Composition of Table 3 in Example disclosed in JP2009-282224A | 80 | 90 | aqueous solution of 2.38% by mass tetramethyl-ammonium hydroxide | 100 | Pure water | 100 | — |

Process of forming second resist pattern

| Example | Composition (II) | Fouth heating (PAB 2) (° C.) | Fifth heating (PEB 2) (° C.) | Developer | Mass ratio | Rinse solution | Mass ratio |
| --- | --- | --- | --- | --- | --- | --- | --- |
| Example 1 | I-1 | 100 | 105 | SG-1 | 100 | SR-1 | 100 |
| Example 2 | I-2 | 100 | 105 | SG-1/SG-5 | 95/5 | SR-1 | 100 |
| Example 3 | I-3 | 100 | 105 | SG-1 | 100 | SR-1 | 100 |
| Example 4 | I-4 | 100 | 105 | SG-1 | 100 | SR-1 | 100 |
| Example 5 | I-5 | 100 | 105 | SG-1 | 100 | SR-1 | 100 |
| Example 6 | I-6 | 100 | 105 | SG-1 | 100 | SR-1 | 100 |
| Example 7 | I-7 | 100 | 105 | SG-1/SG-4 | 50/50 | SR-1/SR-4 | 90/10 |
| Example 8 | I-8 | 100 | 105 | SG-1 | 100 | SR-1 | 100 |
| Example 9 | I-9 | 100 | 105 | SG-1 | 100 | SR-1 | 100 |
| Example 10 | I-10 | 100 | 105 | SG-1 | 100 | SR-2 | 100 |
| Example 11 | I-11 | 100 | 105 | SG-1 | 100 | SR-1 | 100 |
| Example 12 | I-12 | 100 | 105 | SG-1/SG-3 | 90/10 | SR-1 | 100 |
| Example 13 | I-13 | 100 | 105 | SG-1 | 100 | SR-1/SR-5 | 90/10 |
| Example 14 | I-14 | 100 | 105 | SG-1 | 100 | SR-1 | 100 |
| Example 15 | I-15 | 100 | 105 | SG-1 | 100 | SR-1 | 100 |
| Example 16 | I-16 | 100 | 105 | SG-2 | 100 | SR-1/SR-3 | 90/10 |
| Example 17 | I-17 | 100 | 105 | SG-1 | 100 | — | — |
| Example 18 | I-18 | 100 | 105 | SG-1 | 100 | SR-1 | 100 |
| Example 19 | I-19 | 100 | 105 | SG-1/SG-5 | 95/5 | SR-1 | 100 |
| Example 20 | I-20 | 100 | 105 | SG-1 | 100 | SR-1 | 100 |
| Example 21 | I-21 | 100 | 105 | SG-1 | 100 | SR-1 | 100 |
| Example 22 | I-22 | 100 | 105 | SG-1 | 100 | SR-1 | 100 |
| Comparative Example 1 | Composition 2 for evaluation of Table 4 in Example disclosed in JP2009-282224A | 80 | 90 | aqueous solution of 2.38% by mass tetramethyl-ammonium hydroxide | 100 | Pure water | 100 |

<Developer>
The following were prepared as the developer.
SG-1: butyl acetate
SG-2: methyl amyl ketone
SG-3: ethyl-3-ethoxypropionate
SG-4: pentyl acetate
SG-5: cyclohexanone
<Rinsing Solution>
The following were prepared as the rinsing solution.
SR-1: 4-methyl-2-pentanol
SR-2: 1-hexanol
SR-3: butyl acetate
SR-4: methyl amyl ketone
SR-5: ethyl-3-ethoxypropionate
<Evaluation of Resist Pattern>
(Decision of Exposure Amount and Pattern for Evaluation)

After a wafer in which only the first resist pattern was formed was observed with a Critical Dimension Scanning Electron Microscope (CG4100, manufactured by Hitachi, Ltd.), the exposure amount of which the line size was 45 nm was decided to be the exposure amount for evaluation, in the pattern formation using a mask which had a line and space pattern including a line portion as a light shielding portion and a space portion as a light transmission portion, of which the width of the space portion was 64 nm and the pitch was 180 nm (that is, the width of the line portion was 116 nm). On the other hand, in Comparative Example 1, the exposure amount of which the line size was 45 nm was decided to be the exposure amount for evaluation, in the pattern formation using a mask which had a line and space pattern including a line portion as a light shielding portion and a space portion as a light transmission portion, of which the width of the space portion was 116 nm and the pitch was 180 nm (that is, the width of the line portion was 64 nm), As masks, in the exposure amount for evaluation of the wafer in which only the first resist pattern was formed, a mask forming a resist pattern of which the pitch was 180 nm and the line size was 45 nm (hereinafter, referred to as a pattern for evaluation having the pitch of 180 nm), a mask forming a resist pattern of which the pitch was 160 nm and the line size was 40 nm (hereinafter, referred to as a pattern for evaluation of which the pitch was 160 nm), and a mask forming a resist pattern of which the pitch was 140 nm and the line size was 35 nm (hereinafter, referred to as a pattern for evaluation of which the pitch was 140 nm) were respectively used.

In the exposure amount and the pattern for evaluation which were decided in this way, if the first resist pattern and the second resist pattern were ideally formed without influencing each other, a 45 nm line and a 45 nm space (45 nmLS evaluation pattern) were eventually formed when each patterning was the evaluation pattern with the pitch of 180 nm, a 40 nm line and a 40 nm space (40 nmLS evaluation pattern) were eventually formed when each patterning was the evaluation pattern with the pitch of 160 nm, and a 35 nm line and a 35 nm space (35 nmLS evaluation pattern) were eventually formed when each patterning was the evaluation pattern with the pitch of 140 nm.

The above-described exposure amount and the pattern for evaluation in each Example and each Comparative Example were decided, and the pattern in the substrate in which the second negative pattern was also formed was observed with the Critical Dimension Scanning Electron Microscope (CG4100, manufactured by Hitachi, Ltd.). Further, among the evaluation patterns of 45 nmLS, 40 nmLS, and 35 nmLS, the finest line width dimension in which the line and space were completely separated from each other, and the line pattern was formed without breakage was set to resolution. As the resolution is smaller, the performance thereof is excellent.

Furthermore, the difference between the line width of the first resist pattern and the line width of the second resist pattern in the 45 nmLS evaluation pattern was defined as ΔCD, and the evaluation was performed in a way that ΔCD of which the value was less than 3 nm was set to A, ΔCD of which the value was in the range of from 3 nm to less than 5 nm was set to B, and ΔCD of which the value was 5 nm or more was set to C.

The results were listed in Table 3.

TABLE 3

| Example | Evaluation result | |
|---|---|---|
| | Resolution | ΔCD |
| Example 1 | 35 nmLS | A |
| Example 2 | 35 nmLS | A |
| Example 3 | 35 nmLS | B |
| Example 4 | 35 nmLS | A |
| Example 5 | 35 nmLS | A |
| Example 6 | 35 nmLS | A |
| Example 7 | 35 nmLS | A |
| Example 8 | 40 nmLS | A |
| Example 9 | 35 nmLS | A |
| Example 10 | 35 nmLS | B |
| Example 11 | 35 nmLS | A |
| Example 12 | 40 nmLS | B |
| Example 13 | 35 nmLS | B |
| Example 14 | 40 nmLS | B |
| Example 15 | 40 nmLS | B |
| Example 16 | 35 nmLS | B |
| Example 17 | 35 nmLS | B |
| Example 18 | 35 nmLS | B |
| Example 19 | 40 nmLS | B |
| Example 20 | 40 nmLS | B |
| Example 21 | 40 nmLS | B |
| Example 22 | 35 nmLS | A |
| Comparative Example 1 | 45 nmLS | C |

As shown from the results listed in Table 3, it is understood that the results of both the resolution and ΔCD were excellent in Examples 1 to 22 compared to Comparative Example 1 in which the positive pattern forming method was used.

That is, according to the present invention, it is understood that an ultrafine line and space pattern (for example, a line and space pattern of which the line width and the space width were 40 nm or less) can be easily formed.

What is claimed is:

1. A pattern forming method comprising:
   (a) forming a first film on a substrate using an actinic ray-sensitive or radiation-sensitive resin composition (I) which contains a resin of which solubility in a developer containing an organic solvent decreases due to polarity increased by an action of an acid;
   (b) exposing the first film;
   (c) developing the exposed first film using a developer to form a first negative pattern the developer containing an organic solvent in an amount greater than or equal to 90% by mass and less than or equal to 100% by mass based on the total amount of the developer;
   (e) forming a second film on the substrate on which the first negative pattern is formed using an actinic ray-sensitive or radiation-sensitive resin composition (II) which contains a resin of which solubility in a developer containing an organic solvent decreases due to polarity increased by an action of an acid;

(f) exposing the second film; and
(g) developing the exposed second film using a developer to form a second negative pattern, in this order, the developer containing an organic solvent in an amount greater than or equal to 90% by mass and less than or equal to 100% by mass based on the total amount of the developer,
wherein the actinic ray-sensitive or radiation-sensitive resin composition (I) does not contain a compound having a cross-linking group.

2. The pattern forming method according to claim 1, further comprising (d) a process of heating which is carried out between the process (c) and the process (e).

3. The pattern forming method according to claim 2, wherein the heating temperature of the process (d) is 150° C. or more.

4. The pattern forming method according to claim 1, wherein the film thickness of the second film to be formed by the process (e) is thinner than that of the first film to be formed by the process (a).

5. The pattern forming method according to claim 1, wherein the resin contained in the actinic ray-sensitive or radiation-sensitive resin composition (I), of which solubility in the developer containing an organic solvent decreases due to the polarity increased by the action of an acid includes a repeating unit represented by the following general formula (AI):

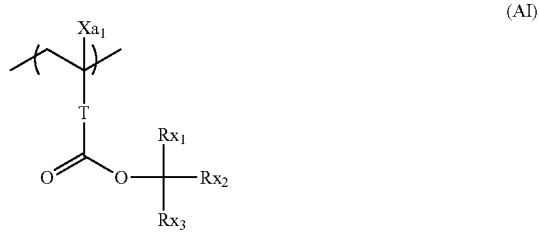

in the general formula (AI);
$Xa_1$ represents a hydrogen atom, an alkyl group, a cyano group, or a halogen atom;

T represents a single bond or a divalent linking group;
$Rx_1$ to $Rx_3$ each independently represents an alkyl group or a cycloalkyl group; and
two of $Rx_1$ to $Rx_3$ may be bonded to each other to form a ring structure.

6. The pattern forming method according to claim 5,
wherein $Rx_1$ to $Rx_3$ each independently represents an alkyl group, and
two of $Rx_1$ to $Rx_3$ are not bonded to each other to form a ring structure in the general formula (AI).

7. The pattern forming method according to claim 5, wherein the content of the repeating unit represented by the general formula (AI) is 40% by mole or more based on the total content of the repeating units of the resin which is contained in the actinic ray-sensitive or radiation-sensitive resin composition (I), of which solubility in the developer containing an organic solvent decreases due to the polarity increased by the action of an acid.

8. The pattern forming method according to claim 6, wherein the content of the repeating unit represented by the general formula (AI) is 40% by mole or more based on the total content of the repeating units of the resin which is contained in the actinic ray-sensitive or radiation-sensitive resin composition (I), of which solubility in the developer containing an organic solvent decreases due to the polarity increased by the action of an acid.

9. The pattern forming method according to claim 1, wherein the actinic ray-sensitive or radiation-sensitive resin composition (I) and the actinic ray-sensitive or radiation-sensitive resin composition (II) are the same compositions.

10. A method of producing an electronic device, comprising the pattern forming method according to claim 1.

* * * * *